United States Patent [19]

Kanai

[11] Patent Number: 5,629,054
[45] Date of Patent: May 13, 1997

[54] METHOD FOR CONTINUOUSLY FORMING A FUNCTIONAL DEPOSIT FILM OF LARGE AREA BY MICRO-WAVE PLASMA CVD METHOD

[75] Inventor: Masahiro Kanai, Hikone, Japan

[73] Assignee: Canon Kabushiki Kaisha, Tokyo, Japan

[21] Appl. No.: 528,330

[22] Filed: Sep. 14, 1995

Related U.S. Application Data

[60] Continuation of Ser. No. 255,815, Jun. 7, 1994, abandoned, which is a division of Ser. No. 91,729, Jul. 15, 1993, abandoned, which is a continuation of Ser. No. 794,051, Nov. 19, 1991, abandoned.

[30] Foreign Application Priority Data

| Nov. 20, 1990 | [JP] | Japan | 2-316247 |
| Nov. 29, 1990 | [JP] | Japan | 2-332678 |
| Jan. 23, 1991 | [JP] | Japan | 3-6391 |

[51] Int. Cl.⁶ .................................................. H05H 1/30
[52] U.S. Cl. ................................. 427/575; 118/723 MW
[58] Field of Search .............................. 427/569, 575; 118/718, 719, 723 MW, 723 MA, 723 MP, 723 AN

[56] References Cited

U.S. PATENT DOCUMENTS

| 3,814,893 | 6/1974 | Helms et al. | 219/69 E |
| 4,400,409 | 8/1983 | Izu et al. | 427/39 |
| 4,438,723 | 3/1984 | Cannella et al. | 118/718 |
| 4,504,518 | 3/1985 | Ovshinsky et al. | 427/38 |
| 4,512,717 | 4/1985 | Pancotti et al. | 416/134 |
| 4,517,223 | 5/1985 | Ovshinsky et al. | 427/39 |
| 4,674,434 | 6/1987 | Ishihara | 118/719 X |
| 4,729,341 | 3/1988 | Fournier et al. | 118/723 |
| 4,834,023 | 5/1989 | Saitoh et al. | 118/730 |
| 4,951,602 | 8/1990 | Kanai | 118/719 |
| 4,995,341 | 2/1991 | Matsuyama | 118/723 |
| 5,038,713 | 8/1991 | Kawakami et al. | 118/723 |
| 5,114,770 | 5/1992 | Echizen et al. | 427/575 |
| 5,126,169 | 6/1992 | Ishihara et al. | 427/575 X |
| 5,130,170 | 7/1992 | Kanai et al. | 427/575 |
| 5,510,151 | 4/1996 | Matsuyama et al. | 427/509 |
| 5,520,740 | 5/1996 | Kanai et al. | 118/718 |

FOREIGN PATENT DOCUMENTS

| 57-133636 | 8/1982 | Japan . |
| 61-283116 | 12/1986 | Japan . |
| 61-288074 | 12/1986 | Japan . |
| 2-133577 | 5/1990 | Japan . |

*Primary Examiner*—R. Bruce Breneman
*Assistant Examiner*—Joni Y. Chang
*Attorney, Agent, or Firm*—Fitzpatrick, Cella, Harper & Scinto

[57] ABSTRACT

A method for continuously forming a functional deposited film of large area with a microwave plasma-assisted CVD method, characterized by including:

continuously moving a strip member in a longitudinal direction, while forming halfway a columnar film formation space with said moving strip member as a side wall;

introducing individually at least two or more kinds of source gases for the formation of deposited film having different compositions via a plurality of respective gas supply means into said film formation space;

introducing source gases for the formation of deposited film via said gas supply means into said film formation space;

at the same time exciting a microwave plasma within said film formation space by radiating or transmitting said microwave energy with microwave applicator means which allows the microwave energy to be radiated or transmitted directionally in one direction perpendicular to a propagating direction of microwave; and forming the deposited film having its composition controlled on a surface of said continuously moving strip member making up said side wall exposed to said microwave plasma.

11 Claims, 29 Drawing Sheets

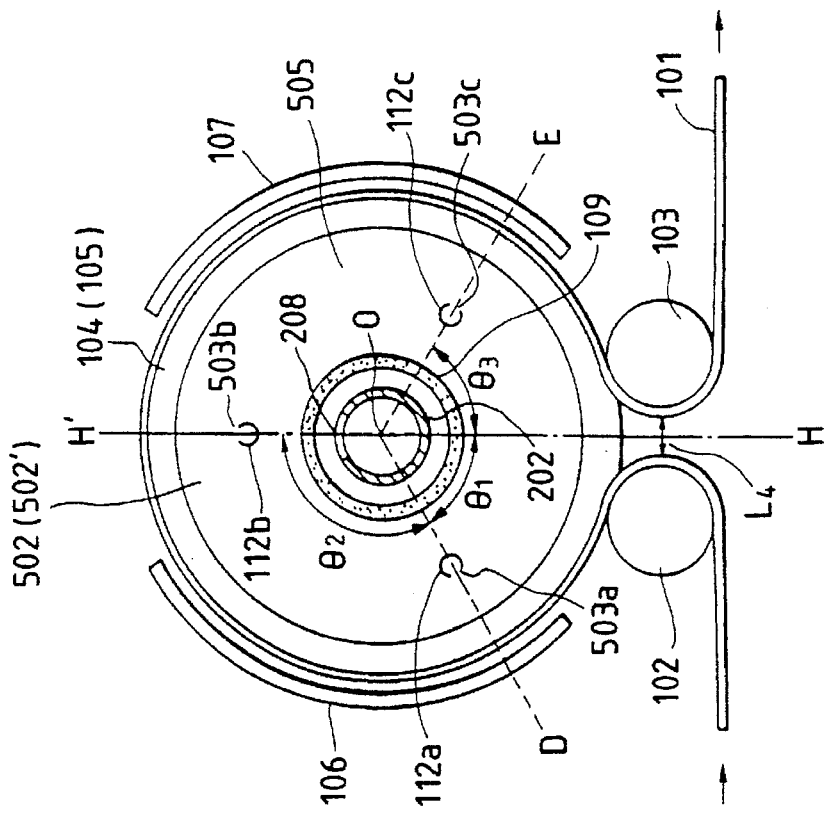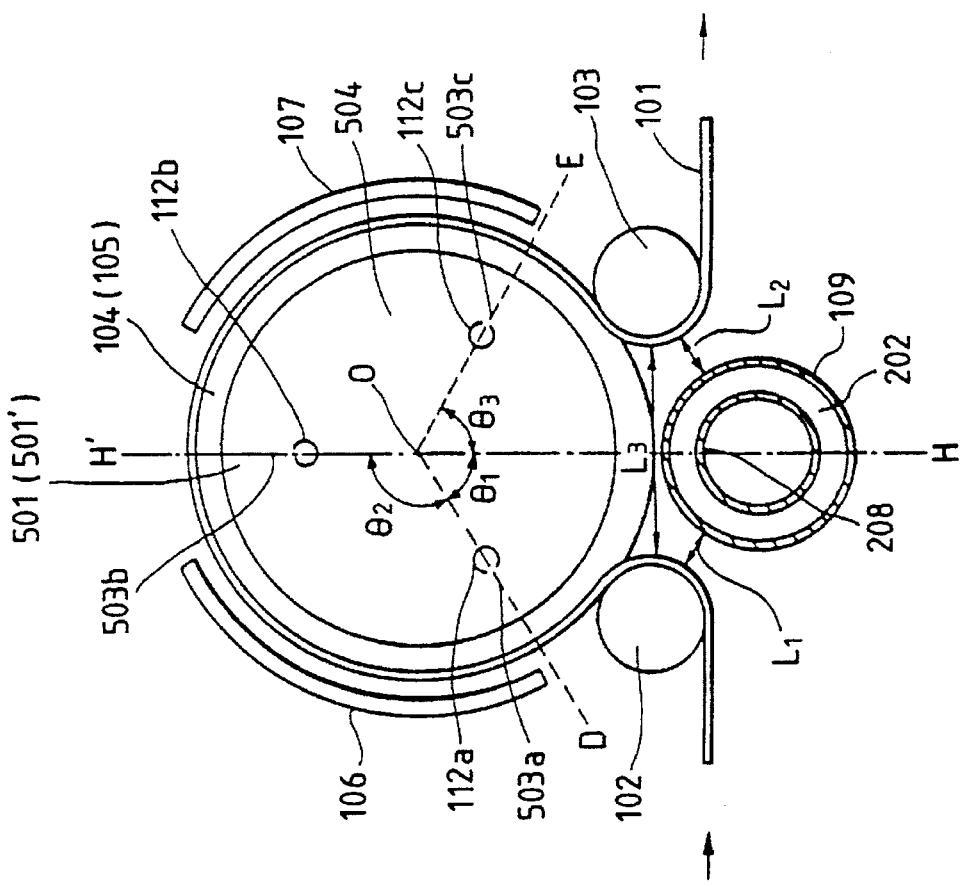
FIG. 5A
FIG. 5B

METHOD FOR CONTINUOUSLY FORMING A FUNCTIONAL DEPOSIT FILM OF LARGE AREA BY MICRO-WAVE PLASMA CVD METHOD

This application is a continuation of application Ser. No. 08/255,815 filed Jun. 7, 1994, abandoned, which is a division of application Ser. No. 08/091,729 filed Jul. 15, 1993, abandoned, which is a continuation of application Ser. No. 07/794,051 filed Nov. 19, 1991, abandoned.

BACKGROUND OF THE INVENTION

1. Field of the Invention

The present invention relates to a method and an apparatus for continuously forming a functional deposited film of a large area having its composition controlled, by decomposing and ionizing the source gas with the plasma reaction which is caused by the use of a new microwave energy supply device capable of exciting a uniform microwave plasma over the large area.

More particularly, this invention relates to a method and an apparatus for continuously forming a uniform functional deposited film over a large area at a high speed with greatly increased utilization efficiency of the source gas, and specifically, for allowing for the mass production of thin film semiconductor devices with large area such as photovoltaic devices at low costs.

2. Related Background Art

In recent years, the demands of electric power are rapidly increasing all over the world, and the contamination of the environment has become a serious problem as the production of electric power has been actively made to meet such demands.

Hence, in the atomic power generation, which is expected to be used as a power generating method substituted for the steam power generation and has already been put to practical use, a situation may occur where serious radioactive contamination, as particularly seen from a Chernobyl atomic power plant accident, which may injure human bodies and damage the natural environment. Therefore, with great fears for the future of atomic power generation, some countries have rejected new construction of atomic power plants.

Also, in the steam power generation, the consumption amount of fossil fuel, typically coal and petroleum, steadily increases in order to meet increasing demand of electric power, so that the discharge amount of carbon dioxide increases, raising the concentration of green house effect gas such as carbon dioxide in the atmosphere, and bringing about the warmer earth phenomenon, with steadily rising annual average temperature on the earth. Therefore, the IEA (International Energy Agency) has proposed that the discharge amount of carbon dioxide should be reduced 20% by the year 2005.

On the other hand in developing countries, due to the increasing population, the increasing demand for electric power is inevitable, and in present situations, the supply of electric power must be examined worldwide, in conjunction with increased electric power consumption rate per man owing to further progress of electronics on the life style in advanced countries.

Under these situations, the solar-cell power generating method using the solar radiation has been noted as a clean power generating method which can cope with the demand for a future increase of electric power demand, without causing any environmental damage. Because any problems such as the radioactive contamination or warmer earth phenomenon as previously described are not evoked, the energy source is maldistributed, owing to the solar radiation falling on almost everywhere on the earth, and a relatively high efficiency of power generation can be obtained without requiring any complex large equipment, whereby various researches and developments have been made for the practical utilization.

With the power generation method using solar cells, it is fundamentally required that a solar cell has a sufficiently high photoelectric transfer efficiency, with an excellent stability of characteristics, and can be fabricated in mass production in order to meet the power demand.

Hence, in order to meet a necessary electric power in a general home, solar cells having an output of about 3 kW for each household are required, but if the photoelectric transfer efficiency of solar cell is about 10%, for example, the area of solar cells to obtain a necessary output is about 30 m$^2$. And for example, to supply an electric power necessary for 100,000 general homes, solar cells having an area of 3,000,000 m$^2$ are required.

Thus, a solar cell which is fabricated by using a source gas such as silane which is easily available and decomposed with the glow discharge to deposit a semiconductor thin film such as amorphous silicone on a relatively cheap substrate such as glass or metallic sheet is superior in the mass productivity, and noted for its possibility of lower cost production, as compared with the solar cell fabrication using a monocrystal silicone, in which various proposals have been made for its fabrication method.

In the power generating method using the solar cell, a method is often used in which unit modules are connected in series or parallel to have a unitary structure in order to obtain a desired current or voltage, each module being required to have no disconnection or short-circuit. In addition, it is important that there is no dispersion of output voltage or current between each module. For these reasons, it is required that the uniformity of characteristics for the semiconductor layer itself, which is the greatest factor of determining the characteristics, may be assured at least at the stage of fabricating a unit module. From the viewpoint of making the module design easier and simplifying the module assembling process, the semiconductor deposited film superior in the uniformity of characteristics over large area can provide for the solar cell at increased mass productivity and greatly reduced production cost.

In the solar cell, the semiconductor layer which is its important constituent is formed as a semiconductor junction such as pn junction or pin junction. Such a semiconductor junction is accomplished by laminating semiconductor layers of different conduction types in sequence, doping a semiconductor layer of one conduction type with a dopant of a different conduction type by ion implantation, or thermally diffusing impurities.

In this respect, considering a solar cell using the thin film semiconductor such as amorphous silicone to be noteworthy as previously described, it is known that in the fabrication, a source gas containing an element which is a dopant such as phosphine ($PH_3$) or diborane ($B_2H_6$) is mixed into a main source gas such as silane, and decomposed with the glow discharge, so that a semiconductor film with a desired conduction type can be obtained, and the semiconductor junction can be easily accomplished by laminating these semiconductor layers on a desired substrate in sequence. For the fabrication of the solar cell of amorphous silicones, a method has been proposed in which each semiconductor layer is formed in a separate film formation chamber.

In U.S. Pat. No. 4,400,409 specification, a continuous plasma-assisted CVD apparatus using the Roll to Roll method has been disclosed. With this apparatus, a plurality of glow discharge regions are provided, a sufficiently long, flexible substrate having a desired width is placed along a path in which the substrate penetrates sequentially through each glow discharge region, and continuously conveyed in its longitudinal direction while in each glow discharge region, a semiconductor layer of necessary conduction type is deposited, so that an element having the semiconductor junction can be continuously formed. Note that in this specification, gas gate is used to prevent a dopant gas for the formation of semiconductor layer from diffusing or mixing into other glow discharge regions. Specifically, the glow discharge regions are separated from each other by slit-like separation passage, and means for forming the flow of a scavenging gas such as Ar or $H_2$ is adopted in the separation passage. By virtue of these respects, it is mentioned that the roll to roll method is suitable for the mass production of semiconductor devices.

However, as the formation of each semiconductor layer is performed with the plasma-assisted CVD method using a RF (radio frequency), there is intrinsically a limit in maintaining the characteristics of film continuously formed and improving the deposition rate of film. That is, even if forming a semiconductor layer having at most a thickness of 5000 Å, for example, in depositing on a significantly long substrate, it is necessary to produce a predetermined plasma over large area at all times and to maintain the plasma evenly. By the way, in doing so, considerable skills are needed, and it is difficult to generalize various plasma control parameters associated therewith. The decomposition efficiency and utilization efficiency of used source gas for the film formation are not so high, and act as one factor raising the production cost.

Besides, Japanese Patent Application No. 61-288074 has disclosed a deposited film forming apparatus using an improved roll to roll method. This apparatus is characterized in that a flexible sheet like substrate installed within a reaction vessel is partially formed with a hood-like slack portion, into which active species produced in an activation space different from the reaction vessel and other source gases as necessary are introduced, causing chemical interaction with the thermal energy, and forming a deposited film on an inner face of the sheet-like substrate forming the hood-like slack portion. In this way, by depositing on the inner face of hood-like slack portion, a compact apparatus can be provided. Further, as preactivated active species are used, the film deposition rate can be more increased as compared with a conventional deposited film forming apparatus.

However, this apparatus utilizes a deposited film forming reaction with the chemical interaction under the existence of thermal energy, and to further improve the film deposition rate, it is necessary to increase the amount of introduction active species and the amount of supplying the thermal energy, but there is a limit in a method of supplying a large quantity of thermal energy evenly, or a method of producing a quantity of highly reactive active species and introducing them into a reaction space without loss.

On the other hand, it is a plasma process using the microwave that is recently noted. The microwave makes it possible to further enhance the energy density as compared with the conventional RF, owing to its short frequency band, and is appropriate for efficiently producing and connecting the plasma.

For example, in U.S. Pat. No. 4,517,223 specification and U.S. Pat. No. 4,504,518 specification, there is disclosed a method in which a thin film is deposited on a substrate of small area in the microwave glow discharge plasma under low pressure, in which because of the process under low pressure, it is possible to obtain a high quality deposited film by preventing the polymerization of active species causing the degradation of film characteristics, as well as suppressing the occurrence of powder such as polysilane in the plasma, and attain a great improvement of deposition rate, but there was no specific disclosure for the formation of uniform deposited film over large area.

On the other hand, in U.S. Pat. No. 4,729,341 specification, there is disclosed a low pressure microwave plasma-assisted CVD method and apparatus for depositing a photoconductive semiconductor thin film on a cylindrical substrate of large area with a high power process using a pair of emission-type waveguide applicators, but the substrate of large area is only limited to the cylindrical substrate, i.e., a light acceptor drum for the electrophotography, and not applicable to the substrate having large area and long length.

The plasma using the microwave is likely to cause the nonuniformity of energy because of short wavelength of the microwave, so that various problems for larger area must be solved.

For example, as effective means for attaining the uniformity of microwave energy, there is a slow wave circuit, but it has a specific problem of causing an abrupt decrease of microwave connection to the plasma with increasing distance of the microwave applicator toward the transverse direction. Thus, as means for resolving this problem, a method is attempted in which the energy density in the neighborhood of the substrate surface is made uniform while changing the distance between an processed object and the slow wave circuit. For example, in U.S. Pat. No. 3,814,983 specification and U.S. Pat. No. 4,512,717 specification, such a method has been disclosed. In the former, the necessity of inclining the slow wave circuit at a certain angle with respect to the substrate is described, but the conduction efficiency of the microwave to the plasma is not satisfied. And in the latter, there is disclosed that two slow wave circuits are provided unparallel within a plane parallel to the substrate. That is, they disclose that planes vertical to the center of the microwave applicator are desirably disposed to intersect with each other within the plane parallel to processed substrate and on the line perpendicular to a moving direction of the substrate, and to avoid the interference between two applicators, the applicators should be disposed to be shifted aside in the moving direction of the substrate by half the length of a crossbar of the waveguide.

Also, several proposals have been made to retain the uniformity of the plasma (i.e., the uniformity of energy). Those proposals can be found in the reports as described in Journal of Vacuum Science Technology B-4 (January to February in 1986) pp. 295–298 and B-4 (January to February in 1986) pp. 126–130. According to these reports, a microwave reactor called as a microwave plasma disk source (MPDS) is proposed. That is, they describe that the plasma is shaped as a disk or tablet, its diameter being a function of the microwave frequency. And those reports disclose the following contents. First, there is described the advantage that the plasma disk source can be changed depending on the microwave frequency. However, in the microwave plasma disk source designed to operate at 2.45 GHz, it is impossible to attain a larger area because the confinement diameter of plasma is at most about 10 cm, and the plasma volume is no more than about 118 $cm^3$. Also, the reports point out that with a system designed to operate at a low frequency of 915 MHz, the plasma diameter of about 40 cm and the plasma volume of 2000 cm³ can be given by reducing the frequency. Further, the reports point out that the discharge can be extended up to a diameter beyond 1 m by operating at a lower frequency, for example, 400 MHz. However, the apparatus which can attain this condition becomes quite expensive and specific.

Thus, it is possible to accomplish the larger area of plasma by reducing the microwave frequency, but the microwave power source having a high output in such a frequency range has not been generalized, and is difficult to obtain, and quite expensive even if obtained. And the microwave power source of high output with variable frequency is further difficult to obtain.

One of microwave feeding means with an antenna method which is relatively easy to deal with is a microwave plasma-assisted CVD apparatus as described in Japanese Patent Laid-Open Publication No. 57-53857 and Japanese Patent Application No. 61-283116 shown in FIGS. 35 and 36, for example. In either case, the circumference of the antenna is surrounded by a barrel body made of a microwave transparent material, which retains the air-tightness of a film formation chamber to prevent the film deposition on the antenna by introducing the microwave from outside the film formatin chamber, resulting in an increased life of the antenna, whereby a high density plasma can be generated over a wide range of pressure. However, in an apparatus as shown in FIG. 36, there are disposed a substrate 1703 laid on a substrate holder 1702 and microwave power supply means within a reaction vessel 1701. 1704 is a coaxial line as the microwave power supply means, in which the microwave power is introduced through a clearance 1705 provided by cutting away a part of an external conductor of the coaxial line 1704 via a microwave transparent barrel body 1706 into the reaction vessel 1701. However, in this apparatus, it is clearly difficult to form an A-Si film uniformly on the substrate of large area, and there is no specific disclosure. On the other hand, in an apparatus as shown in FIG. 16, within the reaction vessel 1601 are disposed a rod antenna 1602 which is microwave power supply means, a gas supply port 1603, a gas exhaust port connected to a vacuum pump 1604, and a substrate 1607 laid on a quartz barrel body 1606. The microwave power produced by a microwave oscillator is transmitted through a waveguide 1608, and introduced via the rod antenna 1602 and the microwave transparent member 1609 into a space surrounded by the quartz barrel body 1606, exciting the plasma to perform the plasma processing. However, due to the property intrinsic to the antenna that the microwave power will propagate on the rod antenna to be radiated to the space successively, the microwave power is attenuated in a longitudinal direction of the rod antenna, and it is difficult to produce the plasma uniform in the longitudinal direction.

Likewise, as means for exciting a high density plasma efficiently using the microwave, there has been proposed a method in Japanese Patent Application No. 55-141729 and No. 57-133636 in which an electromagnet is disposed around a cavity resonator so that the ECR (Electron Cyclotron Resonance) conditions may stand, and in the institutes, there are a number of reports that a variety of semiconductor thin films can be formed using this high density plasma, and this kind of microwave ECR plasma-assisted CVD apparatus has been put on the market.

In this method of using the ECR, however, it is technically difficult to form uniform deposited film on the substrate of large area owing to the nonuniformity of plasma caused by the wavelength of microwave and further the nonuniformity of magnetic field distribution, because a magneto is used to control the plasma. When the apparatus is tried to be made larger to attain the larger area, the used magnet naturally becomes larger, in which there are various problems to be solved for the practical use, such as the larger weight and space, measures against heat generation, and the necessity of a direct current stabilized power source against larger current.

Further, since the characteristics of the deposited film are not formed at an equivalent level as compared with that formed with the conventional RF plasma-assisted CVD method, and the deposited film formed in the space where the ECR conditions stand and the deposited film formed in the so-called divergence magnetic field space which is out of the ECR conditions are quite different in the characteristics and the deposition rate, it is not said to be a suitable method for fabricating semiconductor devices which particularly require the high quality and the uniformity.

In the U.S. Pat. Nos. 4,517,223 and 4,729,341 as previously described, there is disclosed the necessity of maintaining a very low pressure to obtain the high density plasma. That is, in order to expedite the deposition rate or raise the utilization efficiency of gas, the process under lower pressure is requisite. However, in order to maintain the relation between high deposition rate, high gas utilization efficiency, high power density and low pressure, neither the slow wave circuit as disclosed in the previously-mentioned patent nor the electron cyclotron resonance method is said to be sufficient.

Accordingly, it is necessary to provide a new microwave applicator as early as possible which has overcome various problems associated with the above-mentioned microwave means.

By the way, this method of thin film semiconductor is suitably used, in addition to the use of the solar cell as previously described, for the fabrication of thin film semiconductor devices which are required to have large area and long length such as thin film transistors (TFT) for driving the pixel of liquid crystal display, photoelectric transfer devices for contact-type image sensor and switching elements, and has been partially put to practical use as the key component for image input/output apparatus, and the thin film semiconductor is expected to further spread among the public by the provision of a new deposited film forming method which allows the high quality, the uniformity, the high deposition rate and the large area.

SUMMARY OF THE INVENTION

It is an object of the present invention to provide a new method and apparatus which overcomes the problems associated with the conventional thin film semiconductor device forming method and apparatus as above described, and which can form a functional deposited film uniformly over a large area at a high deposition rate.

It is another object of the present invention to provide a method and apparatus for forming on a continuously moving strip member a functional deposited film whose chemical Composition continuously varies in a longitudinal direction of the strip member.

It is a further object of the present invention to provide a method and apparatus which can greatly enhance the utilization efficiency of source gas for the formation of deposited film and realize the mass production of thin film semiconductor devices at lower cost.

It is a further object of the present invention to provide a microwave applicator which permits the excitation of nearly uniform microwave plasma over a large area and a large volume.

It is a further object of the present invention to provide a new method and apparatus for forming a photovoltaic device with high photoelectric transfer efficiency on a relatively wide, long substrate continuously and stably, at high efficiency.

It is a further object of the present invention to provide a method and apparatus for forming on a continuously moving strip member a semiconductor layer whose forbidden band width continuously varies in a longitudinal direction of the strip member.

It is a further object of the present invention to provide a method and apparatus for forming on a continuously moving strip member a semiconductor layer whose valence density continuously varies in a longitudinal direction of the strip member.

BRIEF DESCRIPTION OF THE DRAWINGS

FIGS. 5A and 5B are typical side cross-sectional views showing one example of the arrangement for a strip member conveying mechanism and a gas inlet tube in the present invention.

DETAILED DESCRIPTION OF THE PREFERRED EMBODIMENTS

Figure 1:
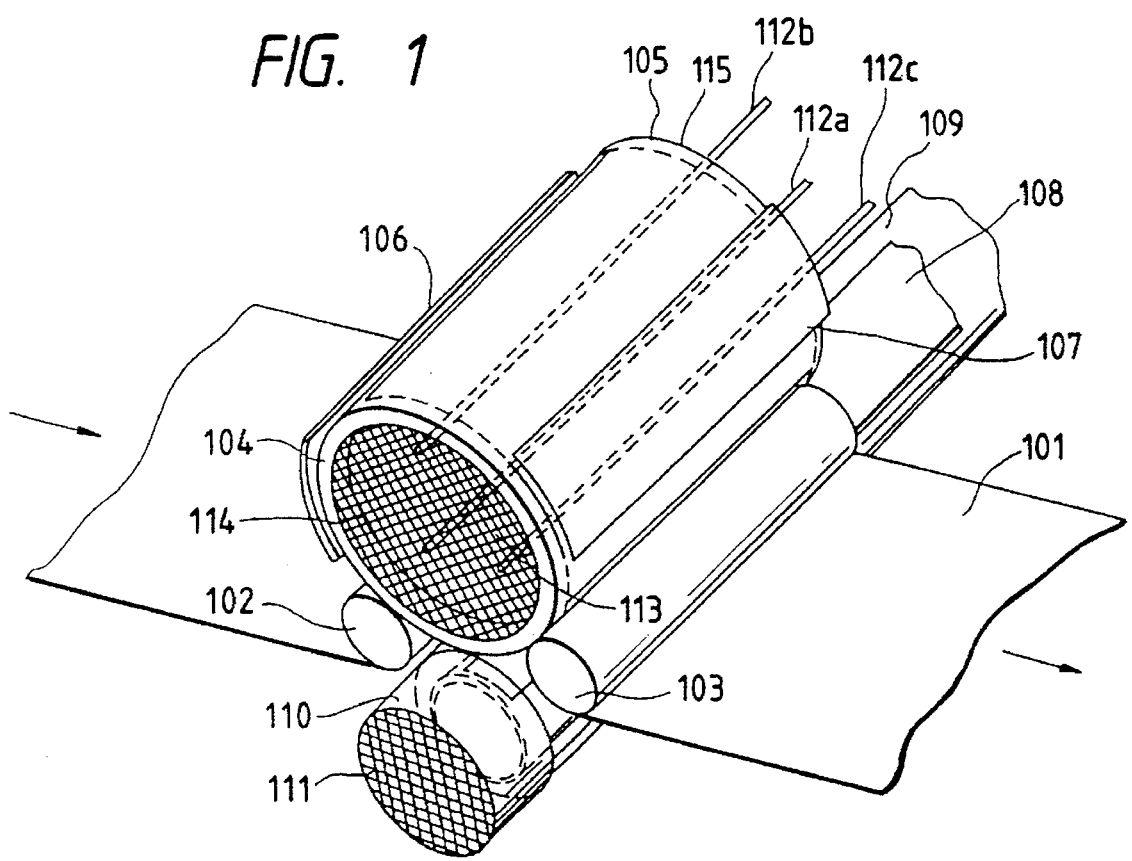
FIG. 1 is a typical schematic view showing one example of a microwave plasma-assisted CVD apparatus according to the present invention.

The preferred methods for continuously forming a functional deposited film of large area according to the present invention are as follows.

A method for continuously forming a deposited film according to the present invention is characterized by including, continuously moving a strip member in the longitudinal direction, while forming halfway a columnar film formation space with the moving strip member as a side wall, introducing individually at least two or more kinds of source gases for the formation of deposited film having different compositions via a plurality of respective gas supply means into the film formation space, introducing source gases for the formation of deposited film via the gas supply means into the film formation space, at the same time exciting a microwave plasma within the film formation space by radiating or transmitting the microwave energy with microwave applicator means which allows the microwave energy to be radiated or transmitted directionally in one direction perpendicular to a propagating direction of microwave, and forming the deposited film having its composition controlled on a surface of the continuously moving strip member making up the side wall exposed to the microwave plasma.

Further, a method for continuously forming a deposited film according to the present invention is characterized by including, continuously moving a strip member in the longitudinal direction, while forming halfway a columnar film formation space with the moving strip member as a side wall, introducing individually at least two or more kinds of source gases for the formation of deposited film having different compositions via a plurality of respective gas supply means into the film formation space, at the same time exciting a microwave plasma within the film formation space by radiating the microwave energy with microwave applicator means which allows the microwave energy to be radiated in the direction parallel to a propagating direction of microwave, and forming the deposited film having its composition controlled on a surface of the continuously moving strip member making up the side wall exposed to the microwave plasma.

Further, a method for continuously forming a deposited film according to the present invention is characterized by including, continuously moving a strip member in the longitudinal direction, while forming halfway a columnar film formation space capable of substantially holding a vacuum with the moving strip member as a side wall, introducing individually at least two or more kinds of source gases for the formation of deposited film having different compositions via a plurality of respective gas supply means into the film formation space, introducing the source gas for the film formation via the gas supply means into the film formation space, at the same time exciting a microwave plasma within the film formation space by radiating the microwave energy in all directions perpendicular to a propagating direction of microwave via a microwave antenna and introducing the microwave power into the film formation space, and forming the deposited film having its composition controlled on a surface of the continuously moving strip member making up the side wall exposed to the microwave plasma.

The preferred apparatuses for continuously forming a functional deposited film of large area according to the present invention are as follows.

An apparatus for continuously forming a functional deposited film of large area on a continuously moving strip member with a microwave plasma-assisted CVD method, according to the present invention, is characterized by comprising, a columnar film formation chamber having the strip member as a side wall, which is formed via bend forming means for bending the strip member halfway while continuously moving the strip member in the longitudinal direction, and capable of substantially holding a vacuum in its interior, microwave applicator means for radiating the microwave energy directionally in one direction perpendicular to a propagating direction of microwave to excite a microwave plasma within the film formation chamber, separating means for separating the microwave applicator means from the microwave plasma excited within the film formation chamber by the microwave energy, while transmitting the microwave energy radiated directionally in one direction perpendicular to the propagating direction of microwave from the microwave applicator means into the film formation chamber.

exhausting means for exhausting an interior of the film formation chamber, at least more than one gas supply means for introducing a source gas for the formation of deposited film into the film formation chamber, and temperature control means for heating and/or cooling the strip member, wherein the deposited film with its composition controlled is formed on a surface of the continuously moving strip member on the side exposed to the microwave plasma.

Further, an apparatus for continuously forming a functional deposited film on a continuously moving strip member with a microwave plasma-assisted CVD method, according to the present invention, is characterized by comprising, a columnar film formation chamber having the strip member as a side wall formed via bend forming means for bending the strip member halfway while continuously moving the strip member in the longitudinal direction, and capable of substantially holding a vacuum in its interior, microwave applicator means for radiating the microwave energy in the direction parallel to a propagating direction of microwave to excite a microwave plasma within the film formation chamber, exhausting means for exhausting an interior of the film formation chamber, at least more than one gas supply means for introducing a source gas for the formation of deposited film into the film formation chamber; and temperature control means for heating and/or cooling the strip member, wherein the deposited film with its composition controlled is formed on a surface of the continuously moving strip member on the side exposed to the microwave plasma.

Further, an apparatus for continuously forming a functional deposited film on a continuously moving strip member with a microwave plasma-assisted CVD method, according to the present invention, is characterized by comprising, a columnar film formation having the strip member as a side wall formed via bend forming means for bending the strip member halfway while continuously moving the strip member in the longitudinal direction, and capable of substantially holding a vacuum in its interior, microwave coaxial line for supplying the microwave power to excite the microwave plasma within the film formation chamber, central conductor separating means for separating a central conductor of the microwave coaxial line from the microwave plasma, while transmitting the microwave power supplied from the microwave coaxial line, and exhausting means for exhausting the film formation chamber, at least more than one gas supply means for introducing a source gas for the formation of deposited film into the film formation chamber, and temperature control means for heating and/or cooling the strip member, wherein the deposited film with its composition controlled is formed on a surface of the continuously moving strip member while forming the side wall of the film formation chamber on the side exposed to the microwave plasma.

According to a method of the present invention, it is possible to continuously form a functional deposited film of large area with its composition controlled at an excellent reproducibility in such a manner as to introduce individually two or more kinds of source gases for the formation of deposited film having different compositions via a plurality of respective gas supply means into the film formation space, while continuously moving a strip member constituting a side wall of a film formation space, radiate the microwave energy with microwave applicator means which allows the microwave energy to be radiated or transmitted directionally in one direction perpendicular to a propagating direction of microwave, and contain a microwave plasma within the film formation space.

Also, according to a method of the present invention, it is possible to continuously form a functional deposited film of large area with its composition controlled at an excellent reproducibility, in such a manner as to introduce individually two or more kinds of source gases for the formation of deposited film having different compositions via a plurality of respective gas supply means into the film formation space, while continuously moving a strip member constituting a side wall of a film formation space, radiate the microwave energy with microwave applicator means which allows the microwave energy to be radiated in a width direction of the strip member constituting the side wall of the film formation space and in a direction parallel to a propagating direction of microwave, and contain the microwave plasma within the film formation space.

Also, according to a method of the present invention, it is possible to continuously form a functional deposited film of large area with its composition controlled at an excellent reproducibility, in such a manner as to introduce individually two or more kinds of source gases for the formation of deposited film having different compositions via a plurality of respective gas supply means into the film formation space, while continuously moving a strip member constituting a side wall of a film formation space, penetrate microwave antenna means into the film formation space so as to be parallel to a width direction of the strip member constituting the side wall of the film formation space, radiate the microwave energy from the microwave antenna means in all directions perpendicular to a propagating direction of microwave, and contain the microwave plasma within the film formation space.

With a method and apparatus of the present invention, it is possible to form efficiently and continuously a functional deposited film having arbitrary band gap and doping profiles on a continuously moving strip member.

Also, with a method and apparatus of the present invention, it is possible to greatly enhance the utilization efficiency of the source gas for the formation of deposited film, as well as improving the stability and reproducibility of microwave plasma, by containing the microwave plasma within the film formation chamber. Further, it is also possible to continuously form the deposited film having arbitrary composition distribution and film thickness uniformly over large area by varying the shape and length of a bend, as well as the conveying speed in conveying the strip member continuously.

With a method and apparatus of the present invention, it is possible to continuously form a functional deposited film with its composition controlled uniformly on a surface of a relatively wide, long strip member. Accordingly, it can be suitable used as a mass production machine of solar cells having large area with high efficiency.

Also, as the deposited film can be formed continuously without stopping the discharge, the excellent surface characteristics can be obtained when fabricating laminate-type devices.

Because of the ability of forming the deposited film under low pressure, and suppressing the occurrence of polysilane powders and the polymerization of active species, it is possible to decrease defects and improve the film characteristics, and the stability in the film characteristics.

Accordingly, it is possible to improve the turnover rate and the yield and fabricate cheap and highly efficient solar cells in the mass production.

Further, the solar cell fabricated by the method and apparatus of the present invention has a high photoelectric transfer efficiency and the less degraded characteristics over long period.

In the following, the present invention will be described in detail.

I. First method and apparatus of the present invention

The present inventor made studies with efforts to solve the above-mentioned problems in a conventional thin film semiconductor device forming apparatus and accomplish the aforementioned objects of the present invention, resulting in the determination that a microwave plasma can be excited uniformly in a longitudinal direction of applicator means within a film formation chamber in such a manner that the microwave applicator means which allows the microwave energy to be radiated or transmitted directionally in one direction perpendicular to a propagating direction of microwave is covered with a microwave transparent member, and penetrated into the film formation chamber in a state where the microwave applicator means is not in contact with an inner peripheral wall thereof, source gases for the formation of deposited film are introduced into the film formation chamber which is then maintained at a predetermined pressure, and the microwave is supplied from a microwave power source to the microwave applicator means.

The present invention has been completed as a result of making a further examination based on the above-mentioned view, and includes a method and apparatus for continuously forming a functional deposited film of large area with a microwave plasma CVD method having the gist as will be described below.

The first method of the present invention is as follows. That is, a method for continuously forming a functional deposited film with a microwave plasma CVD method characterized by continuously moving a strip member in the longitudinal direction, while forming halfway a columnar film formation space with the moving strip member as a side wall, introducing individually at least two or more kinds of source gases for the formation of deposited film having different compositions via a plurality of respective gas supply means into the film formation space, introducing source gases for the formation of deposited film via the gas supply means into the film formation space, at the same time exciting a microwave plasma within the film formation space by radiating or transmitting the microwave energy with microwave applicator means which allows the microwave energy to be radiated or transmitted directionally in one direction perpendicular to a propagating direction of microwave, and forming the deposited film having its composition controlled on a surface of the continuously moving strip member constituting the side wall exposed to the microwave plasma.

In the first method of the present invention, the moving strip member constitutes a side wall of the film formation space halfway by using bend leading edge forming means and bend trailing edge forming means, and bending the strip member between the bend leading edge forming means and the bend trailing edge forming means with a clearance left in a longitudinal direction of the strip member.

And the microwave energy may be radiated or transmitted into the film formation space through the clearance left in the longitudinal direction of the strip member between the bend leading edge forming means and the bend trailing edge forming means, or the microwave energy may be radiated or transmitted into the film formation space by penetrating the microwave applicator means into the film formation space from either side of both end faces of the columnar film formation space formed with the strip member as the side wall.

The microwave energy radiated or transmitted from the microwave applicator is radiated or transmitted thorough a microwave transparent member provided between the film formation space and the applicator means into the film formation space.

The microwave applicator means is disposed closely in nearly parallel to a width direction of the strip member in a range not in contact with the microwave transparent member in order to radiate or transmit the microwave energy into the columnar film formation space.

From the microwave applicator means, the microwave energy is uniformly radiated or transmitted in substantially the same length as that of the strip member in its width direction.

The microwave applicator means is separated via the microwave transparent member from the microwave plasma excited within the film formation space.

In the first method of the present invention, the microwave energy radiated or transmitted into the columnar film formation space is not allowed to leak out of the film formation space.

In the first method of the present invention, the gas supply means is each disposed in parallel to the width direction of the strip member constituting the side wall, and source gases for the formation of deposited film are discharged in one direction toward the strip member located closely.

Further, the first apparatus of the present invention is an apparatus for continuously forming a functional deposited film on a continuously moving strip member with a microwave plasma-assisted CVD method, characterized by comprising, a columnar film formation chamber having the strip member as a side wall, which is formed via bend forming means for bending the strip member halfway while continuously moving the strip member in the longitudinal direction, and capable of substantially holding a vacuum in its interior, microwave applicator means for radiating the microwave energy directionally in one direction perpendicular to a propagating direction of microwave to excite a microwave plasma within the film formation chamber, separating means for separating the microwave applicator means from the microwave plasma excited within the film formation chamber by the microwave energy, while transmitting the microwave energy radiated directionally in one direction perpendicular to a propagating direction of microwave from the microwave applicator means into the film formation chamber, exhausting means for exhausting an interior of the film formation chamber, at least two or more gas supply means for introducing source gases for the formation of deposited film into the film formation chamber, and temperature control means for heating and/or cooling the strip member, wherein the deposited film with its composition controlled is formed on a surface of the continuously moving strip member on the side exposed to the microwave plasma.

In the first apparatus of the present invention, the bend forming means is constituted of at least more than one pair of bend leading edge forming means and bend trailing edge forming means, in which the bend leading edge forming means and the bend trailing edge forming means are disposed with a clearance left in the longitudinal direction of the strip member.

Note that the bend forming means is constituted of at least one pair of supporting/conveying roller and supporting/conveying rings, the supporting/conveying roller of that pair is disposed in parallel with the clearance left in the longitudinal direction of the strip member.

In the first apparatus of the present invention, the separating means may be disposed closely in the clearance left between the bend leading edge forming means and the bend trailing edge forming means, and outside of the film formation chamber, or may be penetrated almost in parallel to the width direction of the strip member into the film formation chamber from either side of both end faces of the columnar film formation chamber formed with the strip member as the side wall.

Also, the separating means may be substantially cylindrical or semicylindrical.

On the other hand, the microwave applicator means is spaced away from a peripheral wall of the separating means and within the inside of the separating means.

In the first apparatus of the present invention, the separating means is provided with cooling means, which includes an air flow passing along an inner peripheral surface of the separating means.

Also, the cooling means may be constituted to be coaxial with the separating means so as to have a conduit structure disposed within the inside of the separating means and through which a cooling medium can be passed to the separating means.

In the first apparatus of the present invention, the microwave applicator means is a microwave transmission waveguide, which is provided with substantially square-shaped holes to radiate the microwave energy directionally in one direction perpendicular to a propagating direction of microwave into the film formation chamber almost uniformly in the longitudinal direction thereof.

Note that at least one square-shaped hole is opened on one side of the waveguide to radiate the microwave therethrough.

When a plurality of the square-shaped holes are opened, these holes are spaced apart in the longitudinal direction of the waveguide.

Also, the square-shaped home may be simply of a rectangle having a large aspect ratio, its dimension being larger than one wavelength of the microwave, and substantially equal to an almost entire width or length of the square waveguide in the longitudinal direction.

And the microwave energy must be uniformly radiated for the length equal to or more than at least one wavelength of the microwave radiated in the longitudinal direction of the waveguide through the square-shaped hole or holes.

The square-shaped hole is provided with shutter means so as to radiate the microwave energy therethrough substantially over the entire length of the microwave applicator substantially at an even density.

In the first apparatus of the present invention, the microwave plasma is contained within the columnar film formation chamber which is formed by bending the strip member.

And gas discharge holes directed toward the neighboring strip member making up the side wall are disposed in the gas supply means.

Further, the first apparatus of the present invention is an apparatus for continuously forming a functional deposited film on a continuously moving strip member with a microwave plasma-assisted CVD method, characterized by comprising, a columnar film formation chamber having the strip member as a side wall, which is formed via bend forming means for bending the strip member halfway while continuously moving the strip member in the longitudinal direction, and capable of substantially holding a vacuum in its interior, microwave applicator means for transmitting the evanescent microwave energy directionally in one direction perpendicular to a propagating direction of microwave to excite a microwave plasma within the film formation chamber, separating means for separating the microwave applicator means from the microwave plasma excited within the film formation chamber by the evanescent microwave energy, while permeating the evanescent microwave energy transmitted directionally in one direction perpendicular to the propagating direction of microwave from the microwave applicator means into the film formation chamber, and exhausting means for exhausting an interior of the film formation chamber, at least two or more gas supply means for introducing source gases for the formation of deposited film into the film formation chamber, and temperature control means for heating and/or cooling the strip member, wherein the deposited film with its composition controlled is formed on a surface of the continuously moving strip member on the side exposed to the microwave plasma.

In the first apparatus of the present invention, the microwave applicator means is a slender slow wave circuit waveguide, which has a ladder structure so as to transmit the evanescent microwave energy substantially uniformly in its longitudinal direction into the film formation chamber.

The length of the ladder structure is substantially equal to the length of the strip member in the width direction.

And with the ladder structure, the evanescent microwave energy is transmitted uniformly over the length equal to or more than at least one wavelength of the microwave transmitted in its longitudinal direction.

In the first apparatus of the present invention, the gas supply means is each disposed in parallel to the width direction of the strip member making up the side wall.

And the gas supply means is provided with gas discharge holes directed toward the neighboring strip member making up the side wall.

In the following, the experiments carried out by the present inventors to complete the first method and apparatus of the present invention will be described in detail.

[Experiment]

The following experiments were made to investigate the excitation conditions of microwave plasma and the relative positional relation between a strip member and separating means, to form a functional deposited film uniformly on the strip member, using the first apparatus of the present invention.

Experimental examples 1A to 9A

In an apparatus having a constitution as shown in the apparatus example 1 as will be described later, the stability of plasma was evaluated with the experiment in which exhaust ports were provided on the side of conveying rings 104, 105, and connected to an exhaust pump, not shown, using a microwave applicator in various waveguide and hole dimensions as shown in Table 1, under the microwave plasma discharge conditions as shown in Table 2. The evaluation results are shown in Table 3. Note that this discharge experiment was performed in two instances where the strip member 101 was stationary, and where it was conveyed at a conveying speed of 1.2 m/min. As a result, there was no significant difference in the stability of discharge between them.

Experimental examples 10A to 18A

In an apparatus having a constitution as shown in the apparatus example 5 as will be described later, the stability of plasma was evaluated with the experiment, using a strip member and the microwave applicator arranged as shown in FIG. 5B, and a microwave applicator having various waveguides and hole dimensions as shown in Table 1, under the microwave plasma discharge conditions as shown in Table 4.

The evaluation results are shown in Table 5. Note that this discharge experiment was performed in two instances where the strip member 101 was stationary, and where it was conveyed at a conveying speed of 1.2 m/min. As a result, there was no significant difference in the stability of discharge between them.

Experimental example 19A to 28A

In an apparatus having a constitution as shown in the apparatus example 3 as will be described later, the stability of plasma was evaluated with the experiment, in which exhaust ports are provided on the side of conveying rings 104, 105, and connected to an exhaust pump, not shown, using various waveguides and hole and shutter dimensions as shown in Table 6, under the microwave plasma discharge conditions as shown in Table 2. The evaluation results are shown in Table 7. Note that this discharge experiment was performed in two instances where the strip member 101 was stationary, and where it was conveyed at a conveying speed of 1.2 m/min. As a result, there was no significant difference in the stability of discharge between them.

Experimental example 29A to 38A

In an apparatus having a constitution as shown in the apparatus example 7 as will be described later, the stability of plasma was evaluated with the experiment, using a microwave applicator having various waveguides and hole and shutter dimensions as shown in Table 6, under the microwave plasma discharge conditions as shown in Table 4. The evaluation results are shown in Table 8. Note that this discharge experiment was performed in two instances where the strip member 101 was stationary, and where it was conveyed at a conveying speed of 1.2 m/min. As a result, there was no significant difference in the stability of discharge between them.

Comparative experimental example 1A to 4A

In the experimental examples 2A, 7A, 21A and 25A, the pressure in the plasma discharge conditions as shown in Table 2 was only varied in many ways with other conditions unchanged, as shown in Table 9, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 9.

From the table, it will be seen that a stable, uniform microwave plasma can be formed in a relatively wide range of pressure.

Note that these results showed no significant variation irrespective of whether the strip member was stationary or conveyed at a conveying speed of 1.5 m/min.

Comparative experimental example 5A to 8A

In the experimental examples @a, 7A, 21A and 25A, the microwave power in the microwave plasma discharge conditions as shown in Table 2 was only varied in many ways with other conditions unchanged, as shown in Table 10, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 10.

From the table, it will be seen that a stable, uniform microwave plasma can be formed in a relatively wide range of microwave power.

Note that these results showed no significant variation irrespective of whether the strip member was stationary or conveyed at a conveying speed of 1.5 m/min.

Comparative experimental example 9A to 12A

In the experimental examples 2A, 7A, 21A and 25A, $L_1$, $L_2$ in the microwave plasma discharge conditions as shown in Table 2 were only varied in many ways with other conditions unchanged, as shown in Table 11, in which the plasma conditions were evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 11.

From the table, it will be seen that if at least one of $L_1$ and $L_2$ is larger than a quarter wavelength of microwave, the microwave plasma may flicker or the microwave may leak, but if both of them are equal to or less than a quarter wavelength, a stable, uniform microwave plasma can be formed.

Note that these results showed no significant variation irrespective of whether the strip member was stationary or conveyed at a conveying speed of 1.5 m/min.

Comparative experimental example 13A to 16A

In the experimental examples 2A, 7A, 21A and 25A, $L_3$ in the microwave plasma discharge conditions as shown in Table 2 is only varied in many ways with other conditions unchanged, as shown in Table 12, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 12.

From the table, it will be seen that if $L_3$ is less than a half wavelength of microwave, the discharge may be unstable, but if it is equal to or more than a half wavelength, a stable, uniform microwave plasma can be formed.

However, if $L_1$, $L_2$ are larger than a quarter wavelength, and $L_3$ is too large, the microwave may leak greatly, so that the discharge is unstable.

Note that these results showed no significant variation irrespective of whether the strip member was stationary or conveyed at a conveying speed of 1.5 m/min.

Comparative experimental example 17A to 20A

In the experimental examples 2A, 7A, 21A and 25A, the inner diameter in the microwave plasma discharge conditions as shown in Table 2 was only varied in many ways with other conditions unchanged, as shown in Table 13, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 13.

From the table, it will be seen that a stable, uniform microwave plasma can be formed at relatively large inner diameters.

Note that these results showed no significant variation irrespective of whether the strip member was stationary or conveyed at a conveying speed of 1.5 m/min.

Comparative experimental example 21A to 24A

In the experimental examples 11A, 18A, 30A and 37A, the pressure in the microwave plasma discharge conditions as shown in Table 4 was only varied in many ways with other conditions unchanged, as shown in Table 14, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 14.

From the table, it will be seen that a stable, uniform microwave plasma can be formed in a relatively wide pressure range.

Note that these results showed no significant variation irrespective of whether the strip member was stationary or conveyed at a conveying speed of 1.5 m/min.

Comparative experimental example 25A to 28A

In the experimental examples 11A, 18A, 30A and 37A, the microwave power in the microwave plasma discharge conditions as shown in Table 4 was only varied in many ways with other conditions unchanged, as shown in Table 14, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 15.

From the table, it will be seen that a stable, uniform microwave plasma can be formed in a relatively wide microwave power range.

Note that these results showed no significant variation irrespective of whether the strip member was stationary or conveyed at a conveying speed of 1.5 m/min.

Comparative experimental example 29A to 32A

In the experimental examples 11A, 18A, 30A and 37A, $L_4$ in the microwave plasma discharge conditions as shown in Table 4 was only varied in many ways with other conditions unchanged, as shown in Table 16, in which the plasma condition was evaluated from the viewpoint of the stability and uniformity. The evaluation is ranked as ⊚ if the stable condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 16.

From the table, it will be seen that if $L_4$ is in a range of less than a half wavelength of microwave, stable, uniform microwave plasma can be formed.

Note that these results showed no significant variation irrespective of whether the strip member was stationary or conveyed at a conveying speed of 1.5 m/min.

Comparative experimental example 33A to 36A

In the experimental examples 11A, 18A, 30A and 37A, the inner diameter of the bend shape in the microwave plasma discharge conditions as shown in Table 4 was only varied in many ways with other conditions unchanged, as shown in Table 17, in which the plasma condition was evaluated from the viewpoint of the stability and uniformity. The evaluation is ranked as ⊚ if the stablest condition is obtained, ○ if there is no problem in practice even though slightly lacking in the stability and uniformity, Δ if there is a problem in practice because of lacking in the stability and uniformity, and X if no discharge or the abnormal discharge is made to be impractical, and their evaluation results are shown in Table 17.

From the table, it will be seen that if the inner diameter is in a range up to about five times a diameter of separating means, a stable, uniform microwave plasma can be formed.

Note that these results showed no significant variation irrespective of whether the strip member was stationary or conveyed at a conveying speed of 1.5 m/min.

Comparative experimental examples 37A to 40A

In the experimental examples 1A and 37A, the same evaluation for the stability of plasma was made under the same discharge conditions, with the exception that the punching board for containing the microwave region was replaced with a thin plate made by SUS316L flame coated with alumina on the surface thereof, but there was no significant difference.

DESCRIPTION OF EXPERIMENTAL RESULTS

In the first method and apparatus of the present invention, the stability and uniformity of the microwave plasma are maintained with a combination of various parameter such as the type and shape of the microwave applicator, the pressure within the film formation chamber in forming the film, the microwave power, the degree of the containment of microwave plasma, and the volume and shape of discharge space, whereby the optimal condition is difficult to obtain with only a single parameter, but the following trends and conditions are seen from the experimental results.

It can been found that the pressure is preferably from 1–3 Torr to 200–400 Torr, and more preferably from 3–10 mTorr to 100–200 mTorr. Also, it has been found that the microwave power is preferably from 300–700 W to 3000–5000 W, and more preferably from 300–700 W to 1500–3000 W.

Further, it has been found that if the inner diameter of bend shape is preferably set to be about five times the length of an external peripheral wall of separating means exposed to the microwave plasma region, and more preferably about four times that length, a substantially stable, uniform microwave plasma can be maintained.

Also, it has been found that if the amount of leakage of microwave energy from the microwave plasma region increases, the stability of plasma may be lost, in which the clearance formed by either the bend ends of the strip member or separating means is preferably set to be a half wavelength of microwave or less, and more preferably a quarter wavelength or less.

In the following, the first method of the present invention will be described based on the facts found from the previously-described experiments.

In the first method of the present invention, the side wall of the columnar film formation space formed by bending the strip member halfway by the use of bend leading edge forming means and bend trailing edge forming means is formed for its most part by the moving strip member, so that a clearance is left in the longitudinal direction of the strip member between the bend leading edge forming means and the bend trailing edge forming means.

And in the first method of the present invention, to excite the microwave plasma uniformly within the columnar film formation space, it is desirable that microwave applicator means capable of radiating or transmitting the microwave energy uniformly in the width direction of the strip member may be penetrated thereinto substantially in parallel to the width direction of the strip member from one side of both end faces of the columnar film formation space, or disposed closely substantially in parallel to the clearance left in the longitudinal direction between the bend leading edge forming means and the bend trailing edge forming means. From the microwave applicator means, the microwave energy is radiated or transmitted directionally in one direction perpendicular to a propagating direction of microwave, but in any case, the microwave energy radiated or transmitted into the columnar film formation space is reflected and scattered against the strip member making up the side wall, and evenly filled within the film formation space, while at the same time being absorbed efficiently into source gases for the formation of deposited film introduced by the gas supply means, so that a uniform microwave plasma can be formed.

However, to excite the microwave plasma stably at excellent reproducibility care must be taken to efficiently radiate or transmit the microwave energy into the film formation space and to prevent the microwave energy leaking from the film formation space.

For example, in the former case, it is necessary to prevent the microwave energy leaking from one end face not having the applicator means penetrated, or from the clearance left in the longitudinal direction of the strip member between the bend leading edge forming means of the strip member and the bend trailing edge forming means, and it is desirable to seal the end face and the clearance with an electrically conductive member, or cover it with a wire guaze or punching board having a hole diameter of preferably a half wavelength of used microwave or less, and more preferably a quarter wavelength or less.

When the microwave applicator means is penetrated into the film formation space, it is desirable that the microwave applicator means is disposed at a position spaced almost equal distance away from the side wall, but if the bend shape of the side wall is asymmetrical, the disposed position is not particularly limited.

In the latter case, it is necessary that the microwave energy radiated or transmitted directionally from take microwave applicator means is directed toward the clearance left between the bend leading edge forming means and the bend trailing edge forming means for the strip member. And to efficiently radiate or transmit the microwave energy into the columnar film formation space, the minimum size of opening width in the longitudinal direction of the strip member in the clearance left between the bend leading edge forming means and the bend trailing edge forming means is preferably a quarter wavelength of microwave, and more preferably a half wavelength.

When there is too large spacing between the clearance and the microwave applicator means disposed, the amount of the microwave energy to be radiated or transmitted into the film formation space may decrease, and the containment of the radiated or transmitted microwave energy may be insufficient.

Although the direction of radiating or transmitting the microwave energy, the opening width, and the spacing between the clearance and the microwave applicator means have important meanings in supplying the microwave energy efficiently into the columnar film formation space, it is preferable to suitably adjust and arrange them to be most efficient as they interrelate with each other.

To prevent the microwave leaking from both end faces of the columnar film formation space, it is desirable to seal the end faces with a conductive member, or cover them with a wire gauze or punch board preferably having a hole diameter of a half wavelength of used microwave or less, and more preferably a quarter wavelength or less.

In the first method of the present invention, the shape of both end faces of the columnar film formation space formed by bending the moving strip member, using the bend leading edge forming means and the bend trailing edge forming means is desirably similar to a circular, elliptical, square or polygonal shape, and a substantially symmetrical, relatively smooth curved shape, so that the microwave energy radiated or transmitted into the film formation space is preferably filled almost uniformly within the film formation space. Of course, the shape of end face may be discontinuous in the clearance left in the longitudinal direction of the strip member between the bend leading edge forming means and the bend trailing edge forming means.

In the first method of the present invention, the bend leading edge forming means and the bend trailing edge forming means are disposed at least at two positions in the longitudinal direction of the moving strip member to bend the strip member and form the columnar film formation space having the bent strip member as the side wall. The bend shape is preferably maintained in a certain shape at all times to retain the stability and uniformity of the microwave plasma excited therein, and it is desirable that the strip member is supported by the bend leading edge forming means and the bend trailing edge forming means so as not to yield wrinkles, slack and lateral drift. In addition to the bend leading edge forming means and the bend trailing edge forming means, support means may be provided to retain the bend shape. Specifically, it is sufficient to provide support means for continuously holding a desired bend shape inside or outside the bent strip member. When the support means is provided inside the bent strip member, care must be taken to have a portion in contact with a face on which the deposited film is formed as small as possible. For example, the support means is preferably provided at both end portions of the strip member.

The strip member is one having the flexibility capable of continuously forming the bend shape, in which it is needed to form the smooth shape at the bend leading edge and the bend trailing edge and in the halfway bend portion.

A source gas for the formation of deposited film introduced into the film formation space by the gas supply means is efficiently exhausted out of the film formation space to maintain it substantially under a pressure at which the microwave plasma is uniformly excited, though the exhaust direction is not particularly limited. For exhaust hole, however, care must be taken so that the microwave may not leak therethrough and the source gas may be efficiently exhausted. Of course, when the source gas is exhausted through a plurality of exhaust holes, it is preferable that the diffusion and flow pattern of gas are made substantially uniformly within the film formation space, in which the number of exhaust holes may be limited.

In the first method of the present invention, when at least two or more kinds of source gases for the formation of deposited film having different compositions are introduced through a plurality of respective gas supply means into the film formation space, the source gas for the formation of deposited film discharged from the gas supply means is preferably discharged uniformly in the width direction of the strip member, and in one direction toward the strip member adjacent to gas supply means. That is, it is desirable that the gas discharge ports in the gas supply means are opened in mutually different directions, so that source gases for the formation of deposited film having different compositions may not mix with each other immediately after being discharged from the gas supply means.

And the gas supply means is disposed in parallel to the strip member making up the side wall.

The number of gas supply means used in the first method of the present invention is desirably at least equal to or more than the number of constituents in a functional deposited film to be formed, whereby it is possible to form the functional deposited film having its composition controlled by appropriately changing the compositions of source gases for the formation of deposited film discharged from respective gas supply means.

The gas supply means are desirably disposed within the columnar film formation space so that the discharged source gases for the formation of deposited film may be excited and decomposed without loss. Also, in order that the deposited film to be formed may have a desired component distribution, it is desirable that the arrangement of the gas supply means is appropriately adjusted. Further, to adjust and control the flow path of source gas for the formation of deposited film within the columnar film formation space, a straightening vane may be provided.

Among the functional deposit films with its composition controlled which can be formed with the method of the present invention, there are a so-called IV group alloy semiconductor thin film such as SiGe, SiC, GeC, SiSn, GeSn, SnC, a so-called III–V group compound semiconductor thin film such as GaAs, GaP, GaSb, InP, InAs, a so-called II–VI group compound semiconductor thin film such as ZnSe, ZnS, ZnTe, CdS, CdSe, CdTe, a so-called I–III–VI group compound semiconductor thin film such as $CuAlS_2$, $CuAlSe_2$, $CuAlTe_2$, $CuInS_2$, $CuInSe_2$, $SuInTe_2$, $CuGaS_2$, $CuGaSe_2$, $CuGaTe$, $AgInSe_2$, $AgInTe_2$, a so-called II–IV–V group compound semiconductor thin film such as $ZnSiP_2$, $ZnGeAs_2$, $CdSiAs_2$, $CdSnP_2$, a so-called called oxide semiconductor thin film such as $Cu_2O$, $TiO_2$, $In_2O_3$, $SnO_2$, $ZnO$, $CdO$, $Bi_2O_3$, $CdSnO_4$, and those containing the valence electron control element to control the semiconductor with the valence electron. In addition, there is a so-called IV group semiconductor thin film such as Si, Ge, C containing the valence electron control element. Of course, an amorphous semiconductor such as a-Si:H, a s-Si:H:F having a varying content of hydrogen and/or fluorine can used.

By controlling the composition in the semiconductor thin film as above described, the control for forbidden band, valence electron, refractive index and crystal can be performed. By depositing the functional deposited film with the composition controlled longitudinally or transversally on the strip member, thin film semiconductor devices of large area having the electrical, optical and mechanical excellent characteristics can be fabricated.

That is, the electrical characteristics can be improved by changing the forbidden band width and/or the valence electron density in the longitudinal direction of deposited semiconductor layer so as to increase the moving property of carriers or prevent the recombination of carriers at the interface of semiconductor. Also, the light transmittance into the semiconductor layer can be improved by virtue of an optical nonreflective surface made by continuously changing the refractive index. Further, the structural variation added by changing the hydrogen content allows for the relaxation of the stress, so that the deposited film having high adherence to the substrate may be formed.

Also, by forming semiconductor layers having different crystalline properties in the transverse direction, it is possible to continuously form a photoelectric transfer element made of amorphous semiconductor and a switching element made of crystalline semiconductor on the same substrate simultaneously.

In the present invention, the source gases for the formation of deposited film for use in forming the functional deposited film as previously described are introduced into the film formation space by adjusting the mixture ratio appropriately in accordance with the structure of a desired functional deposited film. In introducing them, a plurality of gas supply means are used, in which the compositions of source gases for the formation of deposited film introduced from respective gas supply means may or may not be the same, depending on the purpose- Also, the composition may be changed continuously with the time.

In the present invention, among the compounds containing the IV group element in the periodic table which is appropriately used to form the IV group semiconductor or IV group alloy semiconductor thin film, there are a compound containing Si atom, Ge atom, C atom, Sn atom or Pb atom, and more specifically, there are silane compound such as $SiH_4$, $Si_2H_6$, $Si_3H_8$, $Si_3H_6$, $Si_4H_8$, $Si_5H_{10}$, silane halide compound such as $SiF_4$, $(SiF_2)_5$, $(SiF_2)_6$, $(SiF_2)_4$, $Si_2H_6$, $Si_3H_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $Si_2Cl_6$, $Si_2Br_4$, $(SiBr_2)_5$, $Si_2Cl_6$, $Si_2Br_6$, $SiHC_3$, $SiHBr_3$, $SiHI_3$, $Si_2Cl_3F_3$, germane compound such as $GeH_4$, $Ge_2H_6$, germanium halide compound such as $GeF_4$, $(GeF_2)_5$, $(GeF_2)_6$, $(GeF_2)_4$, $Ge_2F_6$, $Ge_3F_8$, $GeHF_3$, $GeH_2F_2$, $Ge_2H_2F_4$, $Ge_2H_3F_3$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2Cl_3F_3$, hydrocarbon gas of methane series such as $CH_4$, $C_2H_6$, $C_3H_8$, hydrocarbon gas of ethylene series such as $C_2H_4$, $C_3H_6$, cyclic hydrocarbon gas such as $C_6H_6$, carbon halide compound such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHI_3$, $C_2Cl_3F_3$, tin compound such as $SnH_4$, $Sn(CH_3)_4$, and lead compound such as $Pb(CH_3)_4$, $Pb(C_2H_5)_6$. The compound may be used singly or in a mixture of two or mroe kinds of such compounds.

In the present invention, the control for a desired composition is permitted by using appropriately mixed compounds.

Among the preferred valence electron control agents used to control the IV group semiconductor or the IV group alloy semiconductor formed in the present invention with the valence electron, there are the III group element in the periodic table such as B, Al, Ga, In, Tl, as p-type impurities, and the V group element in the periodic table such as N, P, As, Sb, Bi, as n-type impurities, of which B, Ga, P, Sb are most suitable. The amount of impurities for doping is appropriately determined depending on the desired electrical and optical characteristics.

The source material for the introduction of impurities is required to be in the gas state at normal temperature and pressure, or easily converted into the gas state at least under the film formation conditions. Specific examples of the starting material for the introduction of such impurities include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$. The compound containing above-cited impurity elements can be used singly or in a combination of two or more kinds of such compounds.

In the present invention, specific examples of the compound containing the II group element in the periodic table used to form the II, IV group compound semiconductor include $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(_4H_9)_2$, $Hg(CH_3)_2$, $Hg(C_2H_5)_2$, and $Hg[C=(C_6H_5)]_2$. Also, specific examples of the compound containing the VI group element in the periodic table include NO, $N_2O$, $CO_2$, CO, $H_2S$, $SCl_2$, $S_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, and $Te(C_2H_5)_2$.

Of course, such source material can be used not only singly but also in a mixture of two or more source materials.

Among the effective valence electron control agents used to control the II–VI group compound semiconductor formed in the present invention with the valence electron, there are compounds containing the I, III, IV and V group elements in the periodic table.

Specifically, as the compound containing the I group element, there are $LiC_3H_7$, $Li(sec-C_4H_9)$, $Li_2S$, $Li_2S$, $Li_3N$.

Also, examples of the compound containing the III group element include $BX_3$, $B_2H_6$, $B_4H_{10}$, $B_5H_9$, $B_5H_{11}$, $B_6H_{10}$, $B(CH_3)_3$, $B(C_2H_5)_3$, $B_6H_{12}$, $AlX_3$, $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3Cl_3$, $Al(i-C_4H_9)_3$, $Al(i-C_3H_7)_3$, $Al(C_3H_7)_3$, $Al(OC_4H_9)_3$, $GaX_3$, $Ga(OCH_3)_3$, $Ga(OC_2H_5)_3$, $Ga(CH_3)_3$, $Ga_2H_6$, $GaH(C_2H_5)_2$, $Ga(OC_2H_5)(C_2H_5)$, $In(CH_3)_3$, and $In(C_4H_9)_3$, and examples of the compound containing the V group element include $NH_3$, $HN_3$, $N_2H_5N_3$, $N_2H_4$, $NH_4N_3$, $PX_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $(P(OC_3H_7)_3$, $P(OC_4H_9)_3$, $P(SCN)_3$, $P_2H_4$, $PH_3$, $AsH_3$, $AsX_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)_3$, $SbX_3$, $Sb(OC_2H_5)_3$, $Sb(OC_3H_7)_3$, $Sb(OC_4H_9)_3$, $Sb(CH_3)_3$, $Sb(CH_3)_3$, $Sb(C_3H_7)_3$, and $Sb(C_4H_9)_3$.

In the above notation, X indicates halogen (F, Cl, Br, I).

Of course, such source material may be used singly or in a combination of two or more kinds of source materials.

Further, the compounds containing the IV group elements are previously mentioned.

Among the compound containing the III group element in the periodic table used to form the III–V compound semiconductor in the present invention, there are $BX_3$ (X indicates a halogen atom), $B_2H_6$, $B_4H_{10}$, $B_5H_9$, $B_5H_{11}$, $B_6H_{10}$, $B_6H_{12}$, $AlX_3$ (X indicates a halogen atom), $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3Cl_3$, $Al(i-C_4H_9)_3$, $Al(i-C_3H_7)_3$, $Al(C_3H_7)_3$, $Al(OC_4H_9)_3$, $GaX_3$ (X indicates a halogen atom), $Ga(OCH_3)_3$, $Ga(OC_2H_5)_3$, $Ga(OC_3H_7)_3$, $Ga(OC_4H_9)_3$, $Ga(CH_3)_3$, $Ga_2H_6$, $GaH(C_2H_5)_2$, $Ga(OC_2H_5)(C_2H_5)_2$, $In(CH_3)_3$, $In(C_4H_7)_3$, $In(C_4H_9)_3$. Also, among the compound containing the V group element in the periodic table, there are $NH_3$, $HN_3$, $N_3H_5N_3$, $N_2H_4$, $NH_4N_3$, $PX_3$ (X indicates a halogen atom), $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, $P_2H_4$, $PH_3$, $AsX_3$ (X indicates a halogen atom), $AsH_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)$ $SbX_3$ (X indicates a halogen atom), $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$. [X indicates a halogen atom, or specifically, at least one selected among F, Cl, Br, I.]

Of course, the source material can be used singly or with combination of two or more kinds.

Among the effective valence electron control agents used to control the III–V group compound semiconductor formed in the present invention with the valence electron, there are compounds containing the II, IV and VI group elements in the periodic table.

Specific examples of the compound containing the II group element include $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(C_4H_9)_2$, $Hg(CH_3)_2$, $Hg(C_2H_5)_2$, $Hg(C_6H_5)_2$, and $Hg[C=(C_6H_5)]_2$. Also, specific examples of the compound containing the VI group element include NO, $N_2O$, $CO_2$, CO, $H_2S$, $SCl_2$, $Se_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, and $Te(C_2H_5)_2$.

Of course, such source material can be used not only singly but also in a mixture of two or more kinds of source materials.

Further, the compounds containing the IV group element are as previously cited.

The source material as previously cited in the present invention may be introduced in a mixture with a rate gas such as He, Ne, Ar, Kr, Xe or Rn, and a diluted gas such as $H_2$, HF or HCl.

Also, such rate or diluted gas may be introduced separately through the gas supply means.

In the first method of the present invention, to excite and maintain the microwave plasma uniformly and stably within the columnar film formation space, it is desirable to set appropriately the parameters such as the shape and volume of the film formation space, the kind and flow of source gas introduced into the film formation space, the pressure within the film formation space, the amount of microwave energy radiated or transmitted into the film formation space, and the matching of microwave, because they have respective optimal conditions but are organically interrelated with each other, and can not be defined unconditionally.

According to the first method of the present invention, the film formation space is formed, with the strip member as the side wall, while the strip member making up the side wall of the film formation space is continuously moved, whereby microwave applicator means radiating or transmitting the microwave energy uniformly in the width direction of the strip member making up the side wall of the film formation space allows the functional deposited film of large area to be formed continuously and uniformly.

The method of the present invention is objectively distinguished from the conventional deposited film forming method in that the film formation space is columnar, with its side wall being continuously moved and serving as a structural member and a carrier for the formation of deposited film.

Here, the function as the structural member is to isolate physically and chemically the atmosphere space for film formation or the film formation space from the atmosphere space not relating to the film formation, or more specifically, it is a function of forming an atmosphere different in the gas composition and its gas state, restricting the gas flow direction, and further forming an atmosphere different in the pressure difference.

That is, with the first method of the present invention, the functional deposited film is formed on the strip member making up the side wall in such a manner as to form the side wall of the columnar film formation space by bending the strip member, and contain the microwave plasma within the film formation space by supplying the source gases for the formation of deposited film and the microwave energy into the film formation space through a remaining wall face, i.e., any one of both end faces and a clearance left in a part of the side wall, and then exhausting it, whereby the strip member itself serves as the carrier for the formation of deposited film, as well as performing an important function as the structural member for isolating the film formation space from the external atmosphere space not relating to the film formation.

Accordingly, the external atmosphere of the film formation space made up with the strip member as the side wall lies in a quite different state from the inside of the film formation space in respect of the gas composition and its state, and the pressure.

On the other hand, with the conventional method of forming the deposited film, the carrier for the formation of deposited film is disposed within the film formation space for forming the deposited film, only serving as a member on which the precursor for the formation of deposited film created in the film formation space, for example, is deposited, but not as the structural member making up the film formation space as in the present invention.

In the RF plasma-assisted CVD method or sputtering method which is a conventional method, the substrate or carrier for the formation of deposited film may be also used as the electrode for exciting and maintaining the discharge, but the containment of plasma, and thus the isolation from the external atmosphere space not relating to the film formation are insufficient, whereby it is difficult to say that it functions as the structural member.

On the other hand, with the first method of the present invention, the strip member capable of functioning as the carrier for the formation of functional deposited film is used as the side wall of the film formation space, thereby exhibiting the function as the structural member, and allows for the continuous formation of functional deposited film on the strip member.

With the method of the present invention, the side wall of the columnar film formation space is formed on the strip member, and the microwave energy is radiated or transmitted uniformly in the width direction of the strip member into the columnar film formation space to contain the microwave within the columnar film formation space, so that the microwave energy is efficiently consumed within the columnar film formation space to excite a uniform microwave plasma, resulting in increased uniformity of deposited film. Further, if the strip member making up the side wall exposed to the microwave plasma is continuously moved at all times and out of the film formation space, it is possible to form the deposited film quite uniformly in its moving direction on the strip member.

Of course, even if the strip member is considerably wide, it can be processed as long as the radiation or transmission amount of the microwave energy from the microwave applicator means is held uniform in its longitudinal direction.

With the first method of the present invention, the film formation space is formed of the strip member, and the gas composition and its state outside the film formation space are conditioned to be different from that inside the film formation space, so that the deposited film is formed only within the film formation space. For example, the gas composition outside the film formation space may be a gaseous atmosphere not directly relating to the formation of deposited film, or an atmosphere containing source gases discharged from the film formation space. Of course, the microwave plasma is contained within the film formation space, but to improve the stability or reproducibility of the plasma or avoid the deposited film on unnecessary side, the microwave plasma must be prevented from leaking out of the film formation space. Specifically, it is effective to provide a pressure difference between the inside and outside of the film formation space, to form an atmosphere such as a so-called inert gas or $H_2$ gas having a small ionization cross-section, or more positively, to provide means for preventing the microwave leaking from within the film formation space. The means for preventing the leakage of the microwave is one in which the clearance portion connecting the inside and the outside of the film formation space is sealed with a conductive member, or covered with a wire gauze or punching board whose hole diameter is equal to or less than a half wavelength of the used microwave, more preferably a quarter wavelength or less, the maximum dimension of the clearance connecting the inside and the outside of film formation space being preferably a half wavelength of the microwave or less, or more preferably a quarter wavelength or less. If the external pressure of the film formation space is set to be much lower than the pressure within the film formation space, or conversely higher, the microwave plasma can be conditioned not to be excited outside the film formation space.

In this way, the method of the present invention is characterized in that the strip member comprises a function as the structural member making up the film formation space, and offers further more effects as distinguished from the conventional deposited film forming method.

With the first method of the present invention, in order to radiate or transmit the microwave energy directionally in one direction perpendicular to a propagating direction of the microwave almost uniformly at least across the width of used strip member from the microwave applicator means, either a leakage wave method or a slow wave circuit method is appropriately adopted. In either method, care must be taken so that the radiation or transmission amount of the microwave may be uniform in the propagating direction of microwave. Also, the microwave applicator means is separated from the microwave plasma excited within the film formation space by a microwave transparent member. In this case, the microwave energy radiated or transmitted from the microwave applicator means is held uniform in its longitudinal direction, without regard to changes in the external environment. For example, in an instance where the deposited film is formed on an external peripheral wall of the separating means to cause the absolute transmission amount of the microwave to be changed, the uniformity of microwave plasma at least in the longitudinal direction can be held, and further, the local ununiformity in transmitting the microwave can be avoided by adopting a structure capable of cooling the separating means uniformly and efficiently. Also, if the separating means can be only sufficiently cooled, it becomes a method capable of dealing with a considerably higher power process.

In the following, the constitution and features of the first microwave plasma-assisted CVD apparatus will be described in more detail in due order.

With the first apparatus of the present invention, since with the microwave plasma contained by the use of the moving strip member, the precursor contributing to the formation of deposited film produced within the microwave plasma region can be captured on the strip member at a high yield, and further, the deposited film can be continuously formed on the strip member, the utilization efficiency of source gas for the formation of deposited film can be greatly increased.

Furthermore, since with the microwave applicator means, the uniformity of microwave plasma excited in the longitudinal direction of the microwave applicator means is raised, the uniformity of deposited film formed across the width of the strip member is naturally excellent, and the uniformity of deposited film formed in the longitudinal direction of the strip member is also excellent by continuously conveying the strip member in a direction almost perpendicular to the longitudinal direction of the microwave applicator means.

With the apparatus of the present invention, the discharge can be maintained continuously, stably and uniformly, and thus the functional deposited film having stable characteristics can be deposited continuously on a long strip member so that a laminate device having excellent surface characteristics can be fabricated.

Also, with the microwave applicator means of the present invention, if its hole diameter or aperture ratio is changed in many ways, a highly uniform microwave plasma can be excited over its longitudinal direction.

With the apparatus of the present invention, the exterior of the film formation chamber may be in the atmosphere in allowing the strip member to function as the structural member, but if the characteristics of functional deposited film to be formed may be affected by the atmosphere flowing into the film formation chamber, appropriate atmosphere in-flow preventing means can be provided. Specifically, it is desirable that a mechanical sealing structure is made using an O-ring, gasket, helicoflex or magnetic fluid, or an isolation vessel for forming a diluted gas atmosphere less affecting or effective for the characteristics of deposited film to be formed, or an appropriate vacuum atmosphere, is disposed on the peripheral portion. In the mechanical sealing structure, special care must be taken so that the sealing state can be maintained while the strip member is moving continuously. When the deposited film is laminated continuously on the strip member by connecting the apparatus of the present invention with other plural deposited film forming means, each apparatus may be desirably connected using gas gate means. Also, when a plurality of apparatuses of the present invention are only connected, the isolation vessel may be provided singly or in each of the apparatuses as the film formation chamber of each apparatus is in an independent film formation atmosphere.

With the first apparatus of the present invention, the external pressure of the film formation chamber may be in a reduced or increased pressure state, but when the strip member is largely deformed by a pressure difference with respect to the interior of the film formation chamber, and appropriate auxiliary structural member may be disposed within the film formation chamber. The auxiliary structural member is desirably of the almost same shape as the side wall of the film formation chamber, and is desirably formed of a wire rod or thin plate made of a metal, ceramics or reinforced resin having an appropriate strength. As the strip member opposed to a face of the auxiliary structural member on the side not exposed to the microwave plasma is substantially concealed by a shadow of the auxiliary structural member, there is almost no deposited film formed thereon, and it is desirable to design the projected area of the auxiliary structural member onto the strip member to be as small as possible.

Also, if the auxiliary structural member is closed attached onto the strip member, and rotated or moved in synchronism with the conveyance of the strip member, mesh patterns applied on the auxiliary structural member can be transferred on the strip member.

The material of the strip member suitably used in the first method and apparatus of the present invention is preferably one of having less deformation or distortion and a desired strength at a temperature necessary to form the functional deposited film with the microwave plasma-assisted CVD method, and specific examples include a metallic thin plate or its complex such as stainless steel, aluminum and aluminum alloy, iron and iron alloy, copper or copper alloy, a heat resistive resinous sheet such as polyimide, polyamide, polyethyleneterephthalate or epoxy, and their complex with glass fiber, carbon fiber, boron fiber or metallic fiber, and the material in which a dissimilar metallic thin film and/or an insulating thin film such as $SiO_2$, $Si_3N_4$, $Al_2O_3$ or AlN is coated on a surface of such metallic thin plate or resin sheet, with the sputtering, evaporation, or plating method. The thickness of the strip member is desirably as thin as possible within a range of exhibiting a sufficient strength for the bend shape formed by the use of conveying means to be maintained, in consideration of the cost and the storage space. More specifically, it is preferably from 0.01 mm to 5 mm, more preferably from 0.02 mm to 2 mm, and most preferably from 0.05 mm to 1 mm, but a relatively thin metallic plate or the like allows a desired strength to be obtained. The width dimension of the strip member is not particularly limited, because the uniformity of microwave plasma can be retained in its longitudinal direction if the microwave applicator means is used, but it is preferably large enough to retain the bend shape, and specifically, preferably from 5 cm to 200 cm, and more preferably from 10 cm to 150 cm.

Furthermore, the length of the strip member is not particularly limited, but may be long enough to be wound as a roll, in which long strip members may be connected to be longer by the welding.

With the apparatus of the present invention, it is necessary that means for supporting and conveying the strip member while continuously bending it causes no slack, wrinkles or side drift in the strip member to be conveyed, so as to hold the bend shape constant. For example, the strip member is supported preferably at both ends by supporting/conveying rings having a desired bend shape, bent in accordance with its shape, further squeezed with at least a pair of supporting/conveying rollers serving as the bend leading edge forming means and the bend trailing edge forming means, which are provided in the longitudinal direction of the strip member to bend it to be almost columnar, and further conveyed in its longitudinal direction while maintaining the bend shape by giving a driving force to at least one of supporting/conveying ring and supporting/conveying roller. Note that the method of supporting and conveying the strip member with the supporting/conveying rings can be made only with a sliding friction, or the use of sprocket holes drilled through the strip member, or a so-called geared supporting/conveying ring which is provided with saw-tooth projections on the periphery thereof.

The shape of supporting/conveying ring is preferably circular to form the bend shape, but there is no particular problem even if it is elliptic, square or polygonal as long as it has a feature of continuously retaining its shape unchanged. The constant conveying speed is an important factor in conveying the strip member without causing any slack, wrinkles or side drift in the bend shape. Accordingly, the supporting/conveying mechanism is desirably provided with a detection mechanism for detecting the conveying speed of the strip member and an adjustment mechanism for adjusting the conveying speed fed back from the detection mechanism. Also, these mechanisms have significant effects on the control of film thickness in the fabrication of semiconductor devices.

Also, the supporting/conveying ring is disposed within the microwave plasma region although there is a difference of degree exposed to the plasma depending on the purpose. Accordingly, it is desirably made of a material withstanding the microwave plasma, that is, a material excellent in both the heat resistance and the corrosion resistance, while since the deposited film may stick to the surface, the stuck film being exfoliated or scattered in the deposition operation over long time to stick to the deposited film being formed, causing defects such as pin holes, resulting in the fabricated semiconductor device being degraded in the characteristics or decreased in the yield, it is desirably made of a material having a low sticking coefficient of the deposited film, or a material and a surface profile capable of retaining a strong sticking force up to a considerable film thickness even if it sticks thereto. Specific examples of such material include a processed material from stainless steel, nickel, titan, vanadium, tungsten, molybdenum, niobium and its alloy, a material in which a ceramics material such as alumina, quartz, magnesia, zirconia, silicon nitride, boron nitride, or aluminum nitride is coated on its surface with the flame spraying, evaporation, sputtering, ion plating or CVD method, or a material molded with a simple substance or compound of the ceramics materials. The surface profile can be appropriately selected by taking into consideration the stress on the deposited film applied in the mirror-like finishing or rough machining.

The deposited film sticking to the supporting/conveying ring is preferably removed before the exfoliation or scatter occurs, and is desirably removed with a chemical or physical method such as the dry etching in the vacuum, or wet etching after decomposition, or bead blast.

The supporting/conveying roller is designed to have a larger area in contact with the strip member, as compared with the supporting/conveying ring, and thus a larger heat exchanging efficiency. Accordingly, it is desirable to have a temperature control mechanism for adequately controlling the temperature of the strip member so as not to extremely increase or decrease in connection with the supporting/conveying roller. However, the setting temperatures of the supporting/conveying rollers which are provided at least one pair may be different. Further, it is effective for holding the conveying speed constant that a conveying tension detection mechanism of the strip member is stored within the supporting/conveying roller.

Further, it is desirable to provide the supporting/conveying roller with a crown mechanism for preventing the deflection, twist or side drift.

The bend shape formed in the present invention is located closely to the separating means, or formed like a column so as to contain the separating means.

To increase the uniformity of deposited film, the shape at both ends of the columnar film formation chamber having the strip member as the side wall is desirably almost circular, elliptical, square or polygonal, and substantially symmetrical relative to the central axis of the microwave applicator means. The length of the bend portion determines the volume of microwave plasma region, the film thickness of deposited film formed substantially in correlation with the time exposed to the microwave plasma region in conveying the strip member, and the utilization efficiency of source gas for the formation of deposited film in the ratio of the peripheral length of separating means to that exposed to the microwave plasma. Accordingly, the length of the bend portion is preferably set to be within five times a peripheral length of the separating means, and more preferably within four times. And in the microwave plasma area, the microwave power density (W/cm$^3$) for maintaining a stable microwave plasma can be determined by the correlation between the type, flow and pressure of the source gas to be used, the radiation and transmission ability of microwave for the microwave applicator, and the absolute volume of microwave plasma area, thereby making it difficult to define it unconditionally.

With the first apparatus of the present invention, even if the strip member is not bent to form the column but conveyed in a horizontal or slightly curved shape, opposed to the orifice means of the microwave applicator, there is no particular problem associated with the discharge condition of microwave plasma.

If the strip member is electrically conductive, e.g., as a metal, it can be directly made an electrode for picking up the current, when used as the substrate for the solar cell, and if the strip member is electrically insulating, e.g., synthetic resin, the electrode for picking up the current is desirably formed beforehand by the surface processing in which a metal simple substance or alloy, and a transparent conductive oxide (TCO) such as Al, Ag, Pt, Au, Ni, Ti, Mo, W, Fe, C, Cr, Cu, stainless, brass, nichrome, $SnO_2$, $In_2O_3$, ZnO or $SnO_2$-$In_2O_3$ (ITO) is applied on the surface where the deposited film is formed, with the plating, vapor deposition or sputtering method.

Of course, even if the strip member is electrically conductive such as metal, a dissimilar metal may be provided on the side of the substrate where the deposited film is formed, in order to improve the reflectance of the long wavelength light at the substrate surface, prevent the mutual diffusion of constituents between the substrate material and the deposited film, or provide the interference layer for avoiding the short-circuit. Also, when the strip member is relatively transparent and intended for the solar cell of a layer constitution in which the light is incident from the strip member side, it is desirable to deposit beforehand the transparent conductive oxide or the conductive thin film such as a metallic thin film.

The surface property of the strip member may be a smooth or minute irregular plane. In the minute irregular plane, its irregular shape is spherical, conical or pyramidal, with its maximum height (Rmax) being preferably from 500 Å to 5000 Å, so that the light reflected at the surface is irregular, increasing the optical path length of reflected light at the surface.

The separating means in the apparatus of the present invention is disposed near or penetrated into the film formation chamber, and has a structure for containing the microwave applicator means for radiating or transmitting the microwave energy inside thereof. Accordingly, it is designed to separate the vacuum atmosphere within the film formation chamber from the outside air in which the microwave applicator means is disposed, and withstand a pressure difference between the inside and the outside of the film formation chamber. Specifically, it is preferably cylindrical or semicylindrical, or may be shaped to have a smooth curved surface.

The thickness of the peripheral wall of the separating means is preferably from about 0.5 mm to 5 mm. The material has preferably an excellent airtightness, whereby the microwave energy radiated or transmitted from the microwave applicator means can be permeated into the film formation chamber with the minimum loss, and the atmosphere does not flow into the film formation chamber; specific examples include a glass or fine ceramics such as quartz, alumina, silicon nitride, beryllia, magnesia, zirconia, boron nitride, or silicon carbide.

When the separating means is cylindrical or semicylindrical, its diameter (inner diameter) is desirably set at a necessary minimum size so that the microwave applicator means is contained inside the separating means and the microwave applicator means is not contact with an inner peripheral wall of the separating means.

Also, the separating means is desirably provided with microwave containment means or dummy load at an end portion on the opposite side of where the microwave applicator means is inserted. In the former case, most portion protruding from the end portion of the strip member is preferably covered with a conductive member such as a metal or wire gauze, and earthed, and particularly when the inconvenience may possibly arise in matching the microwave at a high power level, the latter means is preferably provided.

Further, the separating means is preferably covered with a metal or wire gauze for the safety on a portion protruding from the side where the microwave applicator means is inserted, and is earthed to the waveguide and the isolation vessel.

Also, it is preferable that the separating means is cooled uniformly to prevent the thermal degradation (crack, rupture) from occurring with the heating from the microwave energy and/or plasma energy.

Specifically, the cooling means may be air flow passing along an internal peripheral face of the separating means, or a cooling fluid such as water, oil or freon passing through a conduit, which is extended to the separating means through an enclosure of a shape nearly similar to the separating means concentrically formed in the interior of the separating means.

On the other hand, the separating means of cylindrical shape of the present invention can be used together with a usual slow-wave circuit microwave applicator, in which the microwave energy transmitted from the slow-wave circuit microwave applicator is coupled via the evanescent wave into the film formation chamber. Therefore, a high density plasma can be excited by using the separating means of thin thickness and cooling the separating means down to a sufficient low temperature, without yielding the breakage such as crack in the separating means due to produced heat, even if the microwave energy at relatively high power is introduced into the film formation chamber.

Also, with the first apparatus of the present invention, the film is deposited on a part of the external peripheral face of the separating means at least in contact with the microwave plasma region, like on the strip member. Accordingly, depending on the kind and characteristics of the deposited film, the microwave energy radiated or transmitted from the microwave applicator means is absorbed into or reflected from the deposited film, whereby the radiation or transmission amount of the microwave energy into the film formation chamber formed by the strip member decreases, and if its variation is remarkably larger as compared with immediately after the start of discharge, the microwave plasma is difficult to maintain, and the deposition rate may decrease or the characteristics of the deposited film may vary. In such a case, if the film deposited in the separating means is removed by the dry etching, the wet etching or mechanical means, the initial state can be restored. In particular, as the method of removing the deposited film in the vacuum state maintained, the dry etching is preferably used. Also, it is possible to adopt a consecutive method in which the separating means is rotated in the vacuum maintained, a portion exposed to the microwave plasma is moved out of the microwave plasma region, and the deposited film is removed in a region different from the microwave plasma region, and then rotated back to the microwave plasma region. Furthermore, it is possible to adopt a method in which a sheet made of a material having the substantially same microwave transmittance as the separating means is continuously fed along the external peripheral face of the separating means, thereby to allow the deposited film to stick to the surface of the sheet, and is then discharged out of the microwave plasma region.

The microwave applicator means of the present invention has a structure capable of converting the source gases for the formation of deposited film introduced from the gas introducing means into the plasma and maintaining it by radiating the microwave energy supplied from a microwave power source into the interior of the film formation chamber. Specifically, a waveguide having an open end portion is preferably used. An example of the waveguide is a waveguide for the transmission of microwave such as a circular waveguide, a square waveguide, a rectangular waveguide and an elliptical waveguide. Here, owing to the open end, it is possible to prevent the stationary wave from occurring at the end portion of the waveguide. On the other hand, there is no trouble even if the waveguide has a closed end.

With the apparatus of the present invention, the size of a circular waveguide suitably used as the microwave applicator can be appropriately designed in accordance with the frequency band and the mode of the microwave to be used. In the design, preferably, care must be taken so that the transmission loss may be less within the circular waveguide, and the multiple mode may not occur, and specifically, in addition to the circular waveguide of EIAJ is standards, a waveguide having an inner diameter of 90 mm or 100 mm can be cited as the own company's standard for 2.45 GHz.

Note that for the transmission of the microwave from the microwave power source, a square waveguide which is easily available is preferably used, but it is necessary to suppress the transmission loss of the microwave energy to the minimum in a transducer to the circular waveguide useful as the microwave applicator, and specifically, a square or circular transducing waveguide of electromagnetic hone type is preferably used.

In the present invention, the kind of square or rectangular waveguide suitably used for the microwave applicator can be appropriately selected in accordance with the frequency band and the mode of used microwave, in which at least its cut-off frequency is preferably less than the used frequency, and specifically, in addition to standard products such as JIS, EIAC, IEC and JAN, a square waveguide having a cross section of 96 mm wide×27 mm high, can be cited as the own company's standard for 2.45 GHz.

With the first apparatus of the present invention, since the microwave energy supplied from the microwave power source is efficiently radiated or transmitted into the film formation chamber as long as the applicator means of the present invention is used, the problems associated with the so-called reflected wave can be easily avoid, in which it is possible to maintain a relatively stable discharge in the microwave circuit without using the microwave matching circuit such as a three stub tuner or E-H tuner, but when a strong reflected wave is caused due to abnormal discharge before or after the discharge, it is desirable to provide the matching circuit for the protection of the microwave power source.

The waveguide is provided with aperture means for radiating the microwave energy at least one on its one face, in which such aperture means is necessary to be opened with a size and a spacing to radiate the microwave energy uniformly, and each aperture may or may not be the same. A specific size will be disclosed in the experimental example as thereinafter described.

The shape of aperture means to be opened in the waveguide is desirably substantially square or rectangular, and when a plurality of such aperture means are provided from near an end portion of the waveguide in its longitudinal direction at desired intervals, a uniform microwave plasma is excited in the width direction of the strip member to be used by opening or closing some of them. At this time, the microwave energy to be radiated desirably has a wavelength equal to or more than at least one wavelength of the microwave radiated in the longitudinal direction of the waveguide, and preferably is radiated almost uniformly in the width direction of the strip member.

When only one aperture means is opened, it is desirable that the aperture means with a large aspect ratio of the square or rectangular is opened almost over the entire width and the length in the longitudinal direction of the waveguide in a size larger than one wavelength of the microwave. To enhance the uniformity of the microwave energy radiated in the longitudinal direction, shutter means is provided to adjust the degree of its aperture. The shape of the shutter means is a strip, a slender trapezoid, and a strip or slender trapezoid with one side face partialiy cut away like a semicircle, and desirably follows a surface shape of the waveguide, its material being preferably a metal or a resin treated for the electrical conductivity. And its end portion is secured to a connection portion provided near a corner of the aperture means on the side closer to the microwave power source, and the degree of opening is adjustable around that end portion as a flucrum, but may be fixed to improve the stability of the microwave plasma after a desired condition is attained.

When the aperture means with a large aspect ratio is used, the length of a longer side is desirably substantially equal to that of the strip member in the width direction.

Further, the shutter means is desirably earthed to the waveguide only at the connection portion, and the waveguide and the shutter means are preferably insulated with insulating means except for the connection portion. Note that when a contact shoe is additionally provided between the shutter means and the square waveguide, this becomes an arc contact.

The microwave applicator means using the above described aperture means has a microwave radiation structure of the so-called "leakage wave" type.

On the other hand, with the present invention, the microwave applicator means may be usable with a slow-wave circuit type. When the slow-wave circuit is used, most of the microwave energy is transmitted via the evanescent wave. Accordingly, the microwave energy has a drawback that the quantity of plasma bonding rapidly decreases with increasing distance of the microwave structure in the transverse direction, but the present invention can resolve this drawback by separating microwave applicator away from the plasma region.

The number of gas supply means disposed in the apparatus of the present invention is desirably equal to or more than the number of constituent elements in a functional deposited film. And each gas supply means is constituted of a pipe-like gas inlet conduit, with one or more rows of gas discharge ports being opened on its side face. The material constituting the gas inlet conduit is suitably selected so that it is not subjected to damage within the microwave plasma. Specific examples include a heat resisting metal such as stainless steel, nickel, titanium, niobium, tantalum, tungsten, vanadium or polybdenum, and a material in which such a heat resisting material is thermally sprayed on ceramics such as alumina, silicon nitride, or quartz, aceramics simple substance such as alumina, silicon nitride, or quartz, and a complex thereof.

With the apparatus of the present invention, the gas supply means is disposed in parallel to a width direction of the strip member making up the side wall of the film formation chamber, the gas discharge port being directed toward the strip member located in proximity thereof.

The arrangement of the gas supply means for use in the apparatus of the present invention will be described below with reference to the drawings, but is not specifically limited to them.

FIGS. 5A and 5B are typical side cross-sectional views showing the arrangement of a gas inlet conduit in a first apparatus of the present invention. Note that main constitutional members are only illustrated in this figure. A detailed description of each apparatus will be given later [apparatus example].

An example of FIG. 5A shows a typical arrangement of three gas inlet conduits 112a, 112b, 112c as gas supply means within a shaped film formation chamber 504, in which pipe-like gas inlet conduits 112a, 112b, 112c are disposed in parallel to the width direction of the strip member 101 at a substantially equal distance from a center o of the film formation chamber 504 and at angles $\theta_1, \theta_2, \theta_3$ with reference to a central axis HH' of the film formation chamber as shown. And gas discharge ports 503a, 503b, 503c are directed to adjacent strip member 101, respectively.

In this arrangement, the gas inlet conduit 112b is disposed on the central line HH' of the film formation chamber 116, but may be disposed at a left or right shifted position, if desired. The distances of the gas inlet conduits 112a, 112b, 112c from the center o may or may not be equal. Also, the angles $\theta_1, \theta_2, \theta_3$ may or may not be equal.

A source gas for the formation of deposited film, appropriately mixed as desired, is introduced into each of the gas inlet conduits 112a, 112b, 112c, under separate control.

The gas discharge ports 503a, 503b, 503c are opened at substantially equal intervals in a row on the side faces of respective gas inlet conduits, but the interval may be appropriately changed to improve the uniformity in the width direction of deposited film to be formed, in accordance with the increase or decrease of introduced gas.

Of course, the number of gas inlet conduits may be two, or more than three. A straightening vane may be provided within the film formation chamber in order to improve the separation of the source gas for the formation of deposited film to be introduced within the film formation chamber.

An example of FIG. 5B shows a typical arrangement of three gas inlet conduits 112a, 112b, 112c as gas supply means within a columnar film formation chamber 505. The gas inlet conduits 112a, 112b, 112c are disposed at a substantially equal distance from an external peripheral surface of separation means 109 and at angles $\theta_1, \theta_2, \theta_3$ with reference to central axis HH' of the film formation chamber as shown. The distances of the gas inlet conduits 112a, 112b, 112c from the external peripheral surface of the separation means 109 may be changed if desired. With such an arrangement, the flow path of the source gas for the formation of deposited film to be discharged from a respective gas inlet conduit is restricted, which improves the controllability for the composition of deposited film to be formed.

The angles $\theta_1, \theta_2, \theta_3$ can be appropriately determined depending on a desired composition of deposited film.

The number of gas inlet conduits may be two, or more than three. The gas discharge port is opened in the same way as for the gas inlet conduit used in FIG. 5A.

With the apparatus of the present invention, in order to control the plasma potential of microwave plasma excited within the film formation chamber, a bias voltage may be applied to the gas inlet conduit. And the bias voltage applied to a plurality of gas inlet conduits may not be equal. The bias voltage is desirably applied with the direct current, the pulsating current or the alternating current, singly or in a superposition thereof. In order that the bias voltage may be effectively applied, either of the gas inlet conduits and the strip member has desirably an electrically conductive surface. The control of the plasma potential with the application of the bias voltage allows for the stability and reproducibility of the plasma, the improvement of film characteristics, and the suppression of occurrence of defects.

Figure 6A:
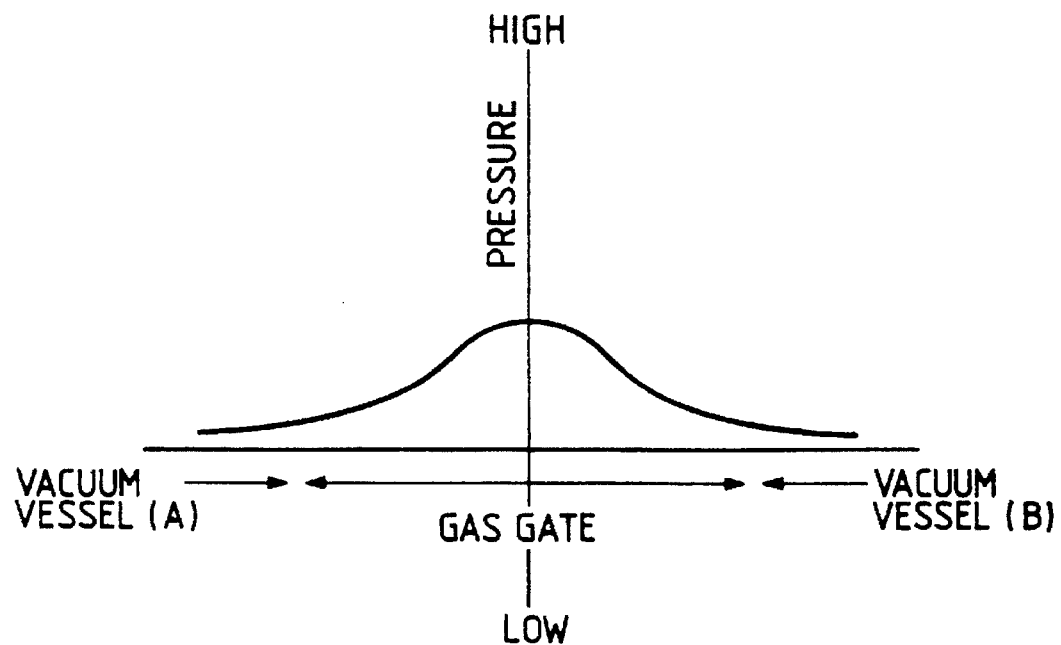
FIGS. 6A and 6B are typical views showing the pressure gradient of gas gate means in the present invention.
Figure 6B:
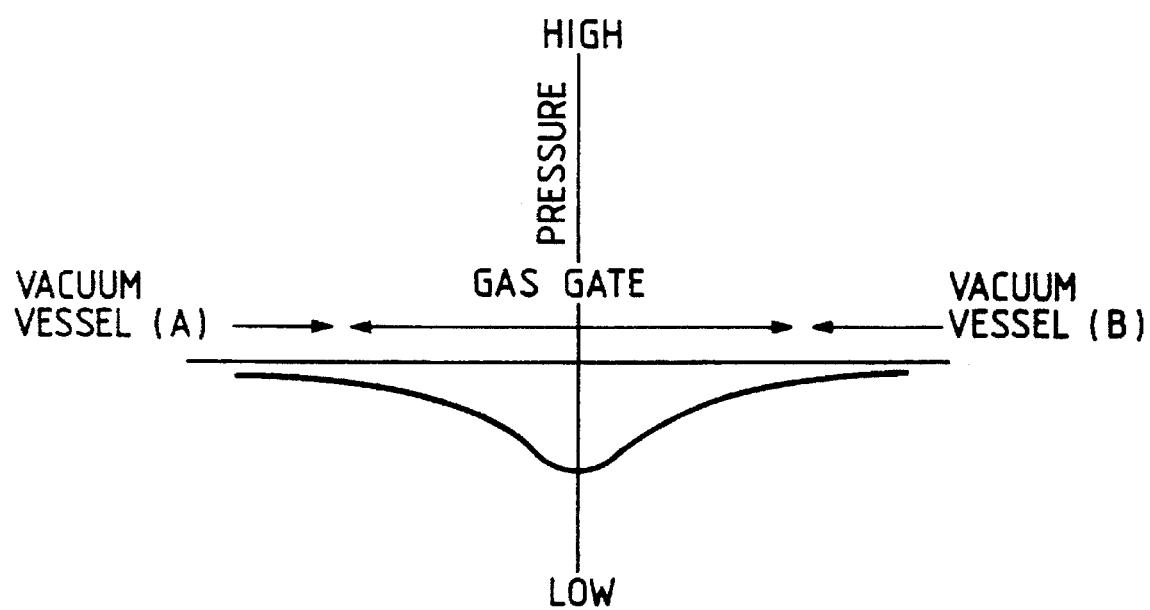

In the first apparatus of the present invention, in order that the film formation chamber and/or isolation vessel may have a vacuum atmosphere separate from a vacuum vessel having another film formation means, and the strip member may be continuously conveyed therethrough, gas gate means is suitably used. As the interior of the film formation chamber and/or isolation vessel in the apparatus of the present invention is desirably maintained at a low pressure necessary for the operation near a minimum value of a modified passion curve, the pressure within the other vacuum vessel connected to the film formation chamber and/or isolation vessel is at least equal to or greater than such low pressure in most cases. Accordingly, the ability of the gas gate means requires not to diffuse the source gases for the formation of deposited film which are mutually used. Accordingly, the basic concept can rely on the gas gate means as disclosed in U.S. Pat. No. 4,438,723, its ability further required to be improved. Specifically, it is necessary to withstand a pressure difference of up to about $10^6$ times, and the exhaust pump with a great displacement, such as an oil diffusion pump, a turbo-molecular pump or a booster pump, is suitably used. The cross-section of gas gate is of a slit or its similar shape, and along with the total length of gas gate and the displacement of exhaust pump for use, the dimensions can be calculated and set by using a general conductance calculation expression. Moreover, a gate gas is preferably used to enhance the separation ability, and examples include a rare gas such as Ar, He, Ne, Kr, Xe, Rn, and a dilution gas for the formation of deposited film such as $H_2$. The flow of gate gas can be appropriately determined depending on the conductance of entire gas gate and the ability of the exhaust pump to be used, but in general, the pressure gradient as shown in FIGS. 6A and 6B may be formed. As there is a point of the greatest pressure substantially in a central portion of the gas gate in FIG. 6A, the gate gas flows from the central portion of gas gate to the vacuum vessels on both sides, while in FIG. 6B, as there is a point of the smallest pressure substantially in a central portion of the gas gate, the gate gas is exhausted from the central portion of the gas gate together with source gases for the formation of deposited film flowing in from the vessels on both sides. Accordingly, in either case, the mutual gas diffusion between the vessels on both sides can be suppressed to the minimum. In practice, the amount of diffused gas is measured using a mass spectrometer, and the optimum condition is determined by making the component analysis of deposited film.

In the first apparatus of the present invention, examples of deposited film forming means which are disposed within the other vacuum vessel connected to the isolation vessel include means for realizing the method for use with the formation of functional deposited film such as RF plasma-assisted CVD method, sputtering method and reactive sputtering method, ion plating method, photoassisted CVD method, heating CVD method, MOCVD method, MBE method, and HR-CVD method. Of course, it is possible to connect means useful on the microwave plasma-assisted CVD method of the present invention and similar microwave plasma-assisted CVD method, in which means for fabricating a desired semiconductor device can be appropriately selected and connected by using the gas gate means.

The microwave frequency supplied from a microwave power source to be used with the apparatus of the present invention is preferably 2.45 GHz for the public use, but other frequency bands can be used if they are easily available. The oscillation method to obtain a stable discharge is the so-called continuous oscillation, with its ripple width being preferably within 30% in the service output area, and more preferably within 10%.

With the apparatus of the present invention, the continuous formation of deposited film without exposure of the film formation chamber and/or isolation vessel to the atmosphere is effective for stabilizing the characteristics of deposited film to be formed, because the contamination of impurities can be prevented. However, as the length of the strip member for use is limited, the connecting operation of the strip member by welding or the like is necessary. Specifically, it is necessary to provide such a process chamber in proximity of the containers containing the strip member (on the delivery side and the take-up side).

[First apparatus of the present invention]

Specific examples of the present invention will be described below with reference to the drawings for the description of the first apparatus of the present invention, but the present invention is not necessarily limited to such apparatus examples.

Apparatus example 1

FIG. 1 is a typical schematic view showing a microwave plasma-assisted CVD apparatus of the present invention.

101 is a strip member, which is conveyed in a direction of the arrow as shown while retaining a columnar curved shape by supporting/conveying rollers 102, 103 and supporting/conveying rings 104, 105, 106, 107 are temperature control mechanisms for heating or cooling the strip member 101.

108 is a microwave applicator which is separated from a microwave plasma region 113 by separation means 109. 110 is a microwave leakage preventing metallic barrel and 111 is a microwave leakage preventing wire gauze. 112a, 112b and 112c are gas inlet conduits, into which source gases for the formation of deposited film are individually introduced via a microcontroller, not shown. For the control of plasma potential, a bias voltage may be applied via conductive wires to the gas inlet conduits from a DC or AC power supply. In doing so, care must be taken so that the bias voltage may be only applied to the film formation space side by inserting an insulating coupling into a part of the gas inlet conduit. 114, 115 are microwave leakage preventing wire gauzes, whereby the microwave plasma region 113 is contained within the film formation chamber having a curved portion of the strip member 101 as the side wall. The interior of the microwave plasma region 113 is exhausted through the gap between separation means 109 and conveying rollers 102, 103 and/or the microwave leakage preventing wire gauzes 114, 115 by exhausting means not shown.

Figure 2:
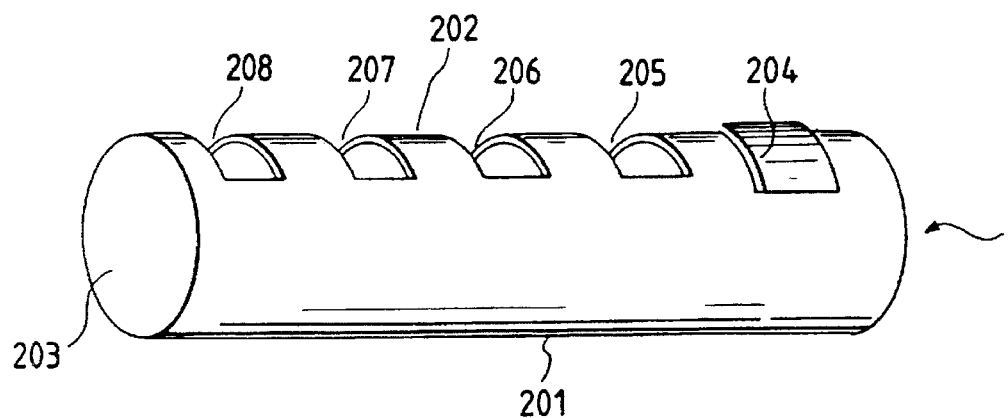
FIGS. 2 and 3A to 3D are typical schematic views showing one example of microwave applicator means usable for the apparatus of the present invention.

FIG. 2 is a specific schematic view of microwave applicator means 201 for use as the microwave applicator 108.

A circular waveguide 202 has an end portion 203, and comprises a plurality of apertures 204 to 208 (e.g., five) opened at intervals on one side face, in which the microwave will progress from the direction of the arrow as shown. Here, an aperture 205 is shown enclosed with a lid made of the same material as the waveguide 202, for example. By opening or closing several apertures, the uniformity of microwave energy radiated in the longitudinal direction of the waveguide 202 can be accomplished.

Apparatus example 2

Figure 4:
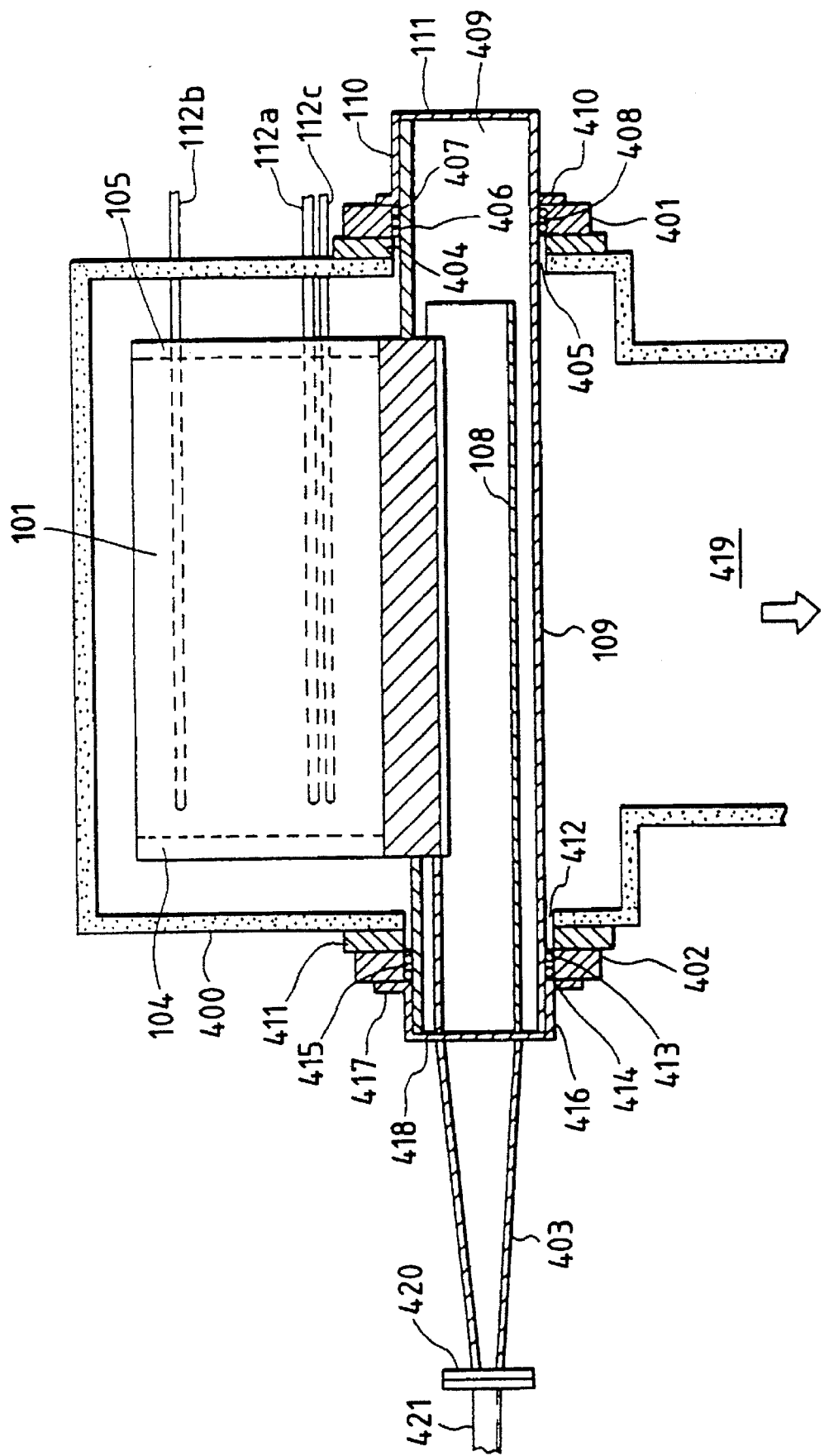
FIG. 4 is a typical schematic side cross-sectional view showing one example of the microwave plasma-assisted CVD apparatus according to the present invention.

This apparatus example describes one in which an apparatus as shown in the apparatus example 1 is disposed in an isolation vessel. FIG. 4 is a typical schematic view for that apparatus. 400 is an isolation vessel the interior of which can be evacuated through an exhaust hole by means of an exhaust pump, not shown. 401, 402 are securing flanges for securing the separation means 109 protruding through both walls of the isolation vessel 400. The securing flanges 401, 402 are preferably made of an appropriate corrosion resistant material such as stainless steel, like the isolation vessel 400, and preferably freely detachable from the isolation vessel 400. The securing flange 401 is affixed to a connecting flange 404. The connecting flange 404 is directly affixed onto a side wall of the isolation vessel 400, in which an opening portion 405 is opened substantially across the same width as an external peripheral surface of cylindrical separation means 109, so that the separation means 109 is inserted thereinto. To the securing flange 401 are affixed at least two O-rings 406, 407 to separate the vacuum atmosphere within the isolation vessel 400 from the external. Here, a cooling groove 408 is provided between the O-rings 406, 407, through which the refrigerant such as water is circulated to cool the O-rings 406, 407 uniformly. The material of the O-ring may be preferably one in which its function can be performed at a temperature greater than 100° C., e.g., Byton. The disposed position of the O-ring is preferably spaced sufficiently away from the microwave plasma region, so that the O-ring is not subjected to the damage at high temperature.

110 is a metallic barrel, having a wire gauze 111 attached to its open end portion 409, and holding the electrical contact with the securing flange 401 via an earth finger 410, so that the microwave energy is prevented from leaking outward. The wire gauze 111 has a role of passing a cooling air for the separation means 109 therethrough. Note that a dummy load for the absorption of microwave may be connected to the open end portion 409. This is effective particularly when the microwave leakage occurs at high power level.

The isolation vessel 400 has a securing flange 402 affixed for securing the separation means on a side wall opposed to the side wall having the previously described securing flange 401 affixed. 411 is a connecting flange, 412 is an opening portion, 413, 414 are O-rings, 415 is a cooling groove, 416 is a metallic barrel, and 417 is an earth finger. 418 is a connecting plate for the connection between the microwave applicator means 108, the microwave power source and a square-to-circular converting waveguide 403, preferably having a structure without leakage of the microwave energy, such as a choke flange. Moreover, the square-to-circular converting waveguide 403 is connected via a connecting flange 420 to a square waveguide 421.

FIG. 5A typically shows a side cross-sectional view of a conveying mechanism for the strip member 101 in this apparatus example.

The arrangement as shown is such that there are provided at least two neighboring points on a peripheral surface of the separation means 109, and a columnar film formation chamber 504 is formed to be curved almost cylindrically toward the open side of the aperture 208 on the circular waveguide 202. For the retain merit of such a cylindrical shape, supporting/conveying rollers 102, 103 and supporting/conveying rings 104 (105) are used. Here, the width of the supporting/conveying ring 104 (105) should be as small as possible relative to the width of used strip member to enhance the effective utilization factor of deposited film on the substrate. This is because the deposited film on the substrate may be possibly deposited on the supporting/conveying rings 104 (105).

Also, on both side faces of the supporting/conveying rings 104, 105, wire gauzes or thin plates 501, 501' (only shown for one side) for the containment of microwave plasma region are preferably attached, its mesh diameter being preferably ½ or less the wavelength of the microwave to be used, more preferably ¼ or less, and large enough to assure the transmission of source gas if it is exhausted from this face.

The substrate temperature control mechanisms 106, 107 function to hold the temperature constant while the strip member 101 passes through the microwave plasma region, and preferably heating and/or cooling means may be used. Also, the substrate temperature control mechanism may have a structure in direct contact with the strip member to increase the heat exchange efficiency. Generally, the temperature is likely to rise on a region exposed to the microwave plasma, in which the temperature rise depends on the kind and thickness of used strip member, and thus is required to appropriately control.

Further, the intervals L1 and L2 at neighboring points between the peripheral surface of the separation means 109 and the strip member 109 is preferably set to be at least less than ½ the wavelength of radiated microwave so as to prevent the leakage of the microwave energy and contain the microwave plasma region within the curved shape. However, the interval L3 between a curve leading edge and a curve trailing edge of the strip member 101 is desirably set to be larger than ¼ the wavelength of radiated microwave so that the microwave energy from the microwave applicator 201 may be effectively radiated within the curved area formed by the strip member 101.

The microwave energy from the aperture 208 is radiated directionally in a substantially vertical direction relative to a directed side of the aperture 208, its radiation being preferably directed at least substantially perpendicular to the interval L3.

Three gas inlet conduits 112a, 112b, 112c are disposed at an almost equal distance from a center o of the film formation chamber 504 and at angles $\theta_1$, $\theta_2$, $\theta_3$ with respect to a central axis HH' of the film formation chamber.

Apparatus example 3

Figure 3A:
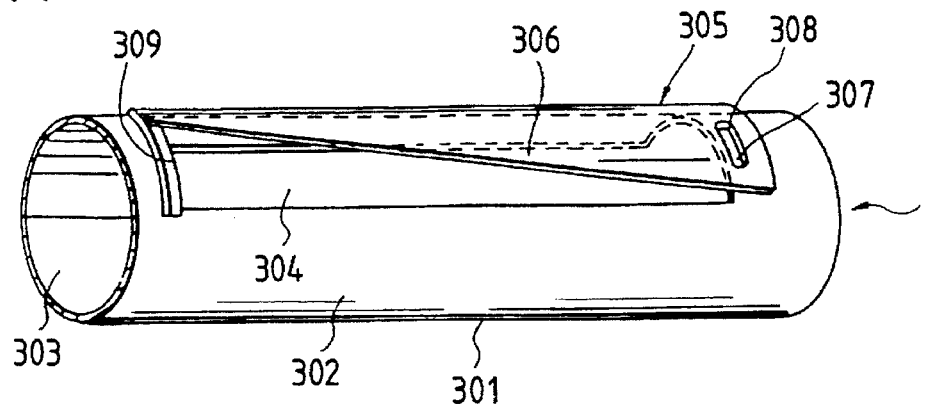
Figure 3B:
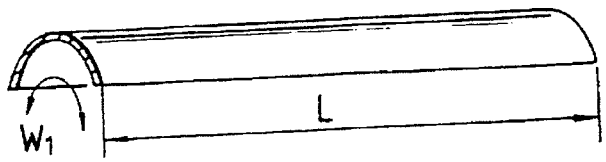

An instance where the microwave applicator means 301 as shown in FIG. 3A is used in the apparatus as shown in FIG. 1 will be described below.

The circular waveguide 302 has an opening end 303 and one slender square aperture 304 machines, in which the microwave will progress from a direction of the arrow shown in the figure. The aperture 304 is larger than one wavelength of used microwave, and opened substantially over an entire area of one side face for the circular waveguide 302. The opening end 303 is provided to prevent the standing wave from occurring, but has no trouble even if it is sealed. With this construction, the microwave energy can be radiated from the entire surface of the aperture 304, but the degree of concentration of the microwave energy is at maximum at an edge portion of the aperture on the side closer to the microwave power source. Accordingly, the degree of concentration can be adjusted using at least one shutter 306 attached to the circular waveguide 302 with the connecting portion 305. A preferred shape of the shutter 306 is a strip, a trapezoid, and a strip or trapezoid with one side cut away as a semicircle.

The connecting portion 305 is constituted of a groove 307 opened on the side of the shutter 306 closer to the microwave power source, and a securing pin 308. Around the aperture 304, an insulator 309 made of glass or TEFLON (Tetrafluorethylene fluorcarbon polymers) is disposed. This is aired to bring the shutter 306 into contact with the waveguide 302 only at the connecting portion 305. If a contact shoe is provided between a part of the shutter 306 and the waveguide 302, it becomes an arc contact.

Apparatus examples 4, 5

This apparatus example describes an instance where the strip member 101 and the separation means 109 are disposed, as in the side cross-sectional view shown in FIG. 5B in the apparatus examples 1 and 2.

The arrangement is such that the strip member 101 is bent concentrically along a peripheral surface of the separation means 109. On both side faces of the supporting/conveying rings 104, 105, wire gauzes 502, 502' (only shown for one side) for the containment of microwave plasma region are preferably attached, its mesh diameter being preferably ½ or less the wavelength of the microwave to be used, more preferably ¼ or less, and large enough to assure the transmission of source gas.

Further, the face interval L4 between a curve leading edge and a curve trailing edge of the strip member 101 is desirably set to be shorter than at least ½ the wavelength of radiated microwave so that the leakage of microwave energy may be prevented and the microwave plasma region is contained within the curved area.

Note that the relative arrangement between the separation means 109 and the strip member 101 is preferably concentric, but is not restricted in particular, because the radiated microwave energy is contained within curved shape of the strip member 101, as long as the separation means 109 is accommodated within the curved shape, and the direction of the aperture 208 is not particularly limited.

Also, the three gas inlet conduits 112a, 112b, 112c are disposed within an area encircled by the separation means 109 and the strip member 101 and at angles $\theta_1$, $\theta_2$, $\theta_3$ with respect to a central axis HH' of the film formation chamber.

Apparatus examples 6, 7

This constitution is the same as in the apparatus examples 4, 5 except that the microwave applicator 201 is replaced with the microwave applicator 301 used in the apparatus example 2.

Apparatus examples 8 to 11

This constitution is the same as in the apparatus examples 1, 2, 4, 5 except that the microwave applicator 201 is replaced with the microwave applicator of slow-wave circuit type, not shown.

Apparatus example 12

Figure 7:
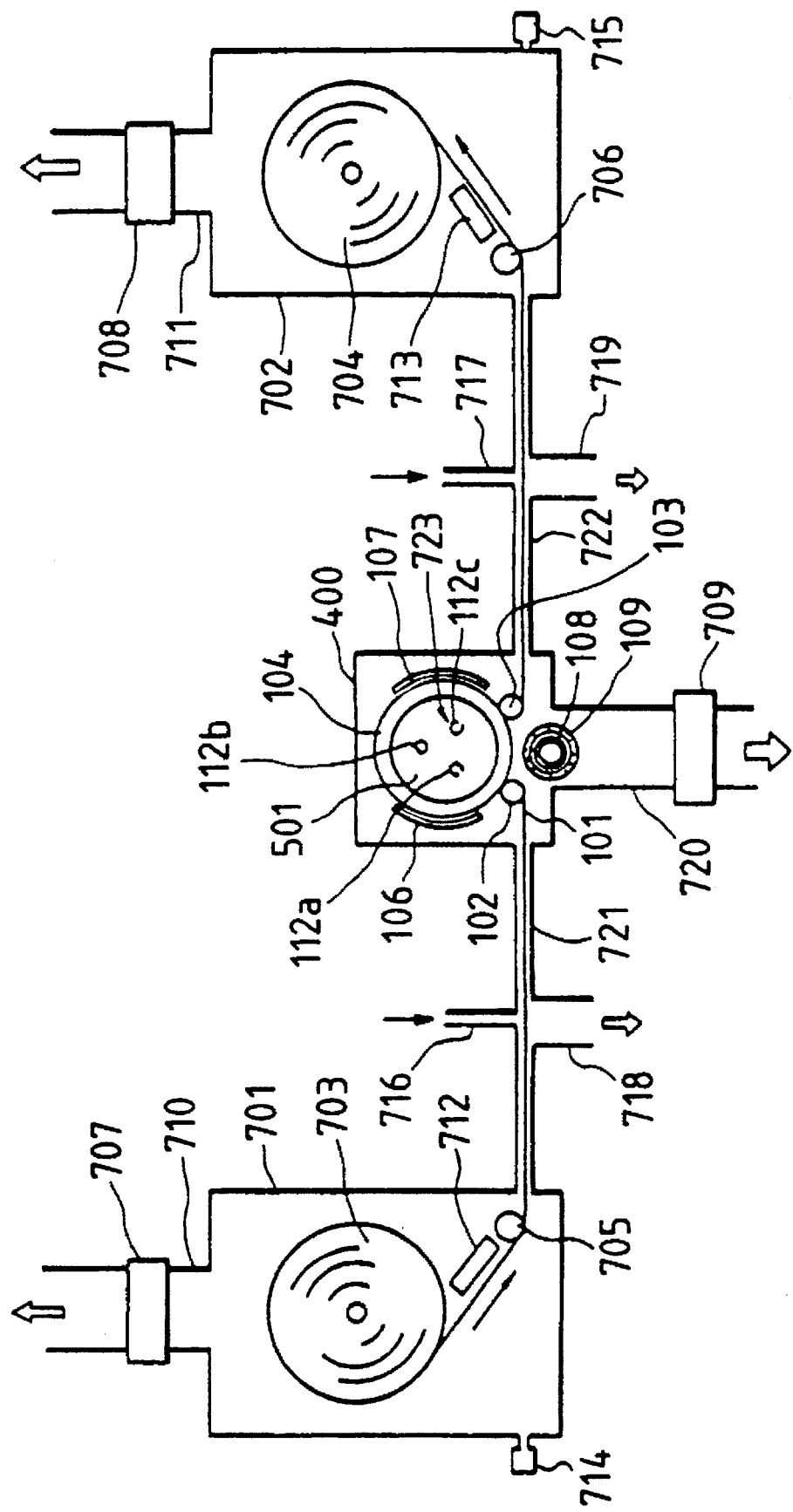
FIGS. 7 to 9 are overall schematic views showing one example of continuous microwave plasma-assisted CVD apparatus according to the present invention.

This apparatus example described an instance where vacuum vessels 701, 702 for the delivery and take-up of the strip member 101 are connected via gas gates 721, 722 to the microwave plasma-assisted CVD apparatus for the formation of deposited film, as shown in FIG. 7.

703 is a bobbin for the delivery of the strip member, and 704 is a bobbin for the take-up of the strip member. The strip member is conveyed in a direction of the arrow as shown. Of course, this conveying direction can be reversed. 706, 707 are conveying rollers which are also used for the tension adjustment and the positioning of the strip member. 712, 713 are temperature adjusting mechanisms for use in preheating or cooling the strip member. 707, 708, 709 are throttle valves for the adjustment of the displacement, and 710, 711, 720 are exhaust pipes, each connected to an exhaust pump, not shown. 704, 715 are manometers, 716, 717 are gate gas inlet conduits, and 718, 719 are gate gas exhaust pipes, in which the gate gas and/or source gas for the formation of deposited film is exhausted by the exhaust pump, not shown. 723 is a film formation chamber with the strip member 101 used as the side wall.

Apparatus example 13

Figure 8:
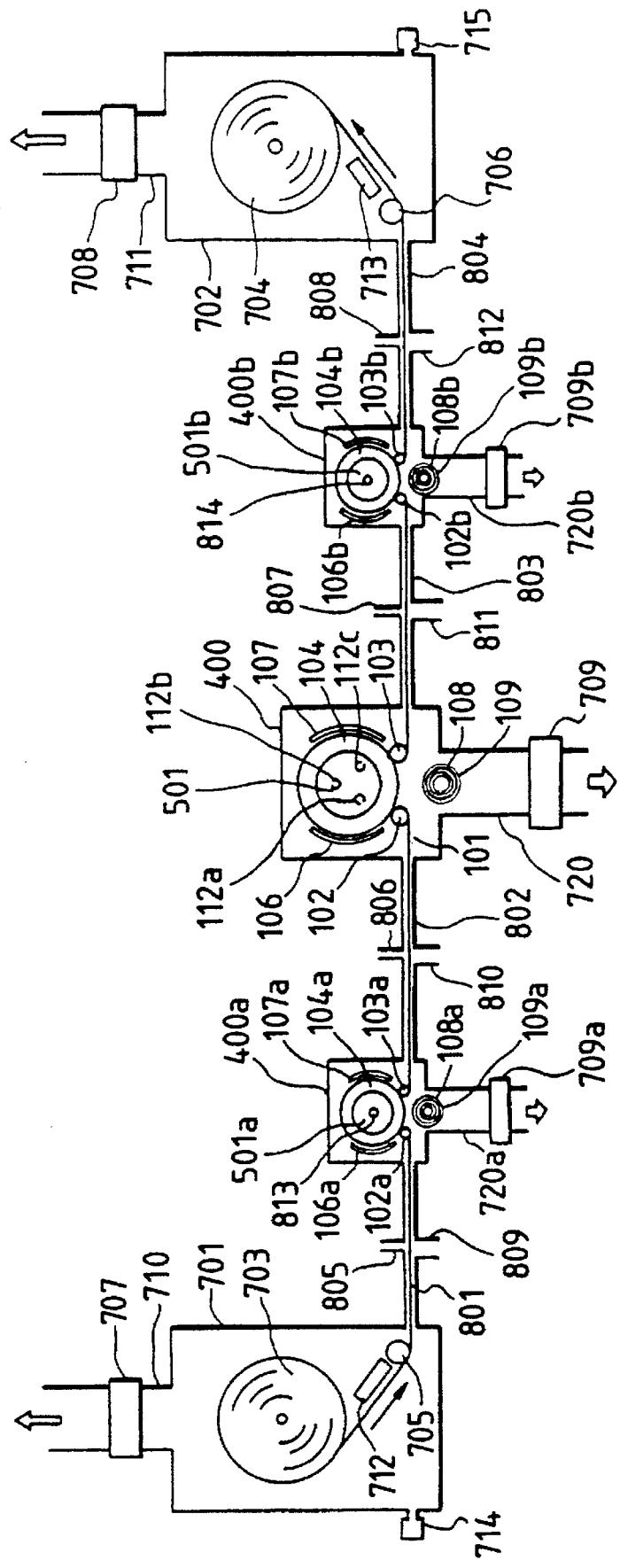

This apparatus example describes an instance where additional two isolation vessels 400a, 400b for the formation of the deposited film with the microwave plasma-assisted CVD method of the present invention are connected to the apparatus shown in the apparatus example 12 on both sides thereof, as shown in FIG. 8, for the fabrication of laminated devices. The two deposited film forming apparatuses thus connected each comprise one gas inlet conduit.

In the figure, the numerals having the affix a or b indicate the mechanisms having fundamentally the same effects as those used in the isolation vessels 400.

801, 802, 803, 804 are gas gates, 805, 806, 807, 808 are gas gate inlet conduits, 809, 810, 811, 812 are gas gate exhaust pipes, and 813, 814 are gas inlet conduits.

Apparatus examples 14, 15

This constitution is the same as in the apparatus examples 12, 13, except that the microwave applicator 201 is relaced with the microwave applicator 301 used in the apparatus example 3.

Apparatus examples 16, 17

This constitution is the same as in the apparatus examples 12, 13 except that the microwave applicator 201 is replaced with the microwave applicator of slow-wave circuit type, not shown.

Apparatus example 18

Figure 9:
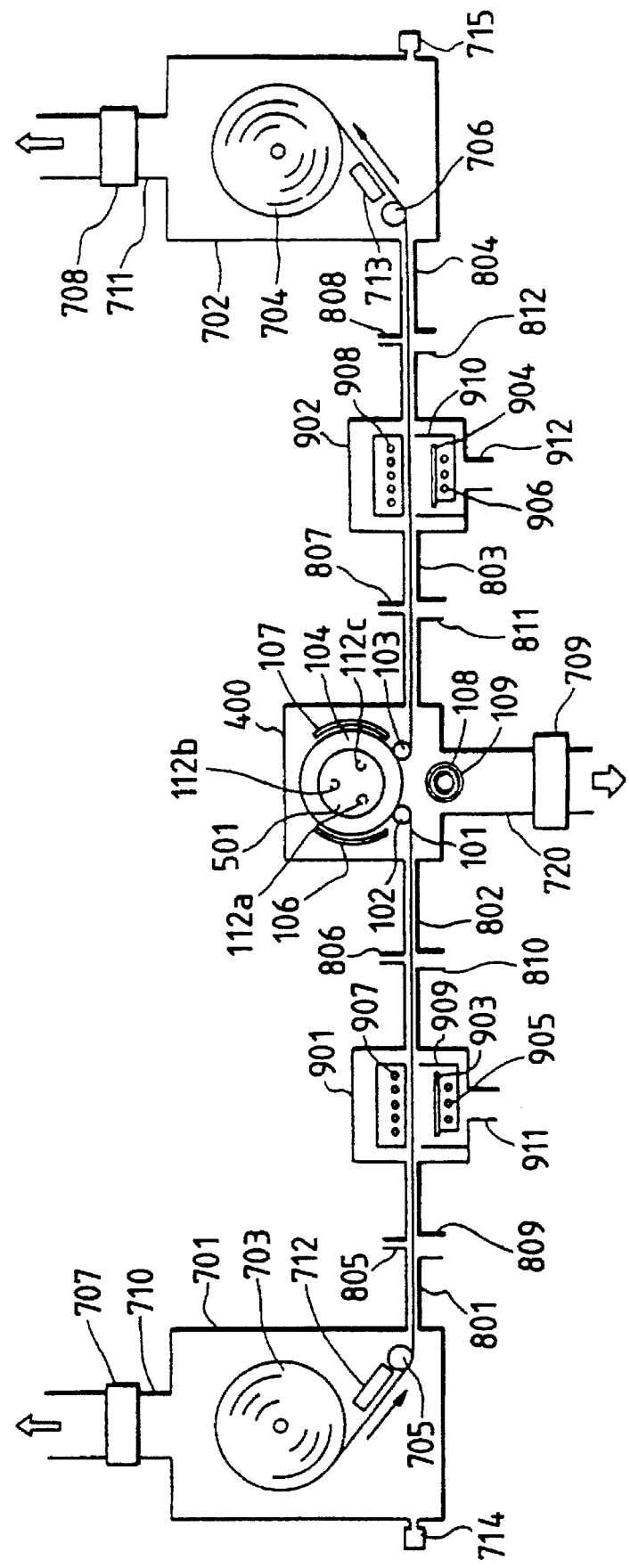

This apparatus example describes an instance where additional two apparatuses with the conventional microwave plasma-assisted CVD method are connected to the apparatus shown in the apparatus example 12 on both sides thereof, as shown in FIG. 9, for the fabrication of laminated devices.

Here, 901, 902 are vacuum vessels, 903, 904 are cathode electrodes for the RF application, 905, 906 are gas inlet conduit heaters, 907, 908 are tungsten halogen lamps for the heating of the substrate, 909, 910 are anode electrodes, and 911, 912 are exhaust pipes. ps Apparatus example 19

An apparatus having isolation vessels 400, 400-2, 400-b for the formation of deposited film combined with a variety of microwave applicators as above described in the apparatus example 13, for example.

Also, this apparatus example is one in which two or three apparatuses shown in the apparatus example 13 are connected in series, and aforementioned deposited film forming means with the RF plasma CVD method may be combined in the series.

Also, this apparatus example is one in which the arrangement of the strip member and the microwave applicator in the apparatus examples 12 and 13 is made the same as in the apparatus examples 4 and 5.

Also, this apparatus example is one in which a straightening vane is disposed within the film formation chamber in the apparatus examples 1, 2, 3, 12, 13.

One example of semiconductor device suitably fabricated with the method and apparatus of the present invention is a solar cell. A typical example of layer constitution is shown in FIGS. 24A to 24D.

Figure 24A:
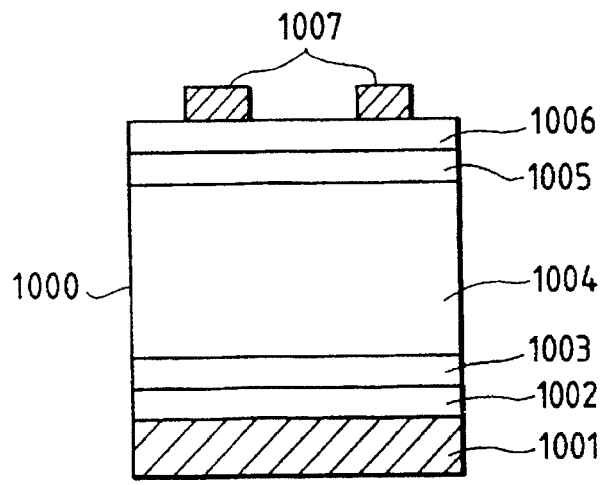
FIGS. 24A to 24D are typical cross-sectional views of pin-type photovoltaic device (single, tandem, triple) fabricated in the present invention.

An example as shown in FIG. 24A is a photovoltaic device 1000 having an under electrode 1002, an n-type semiconductor layer 1003, an i-type semiconductor layer 1004, a p-type semiconductor layer 1005, a transparent electrode 1006 and a collecting electrode 1007 deposited in this order on a carrier 1001. With this photovoltaic device, it is supposed that the light ray is incident from the side of the transparent electrode 1006.

Figure 24B:
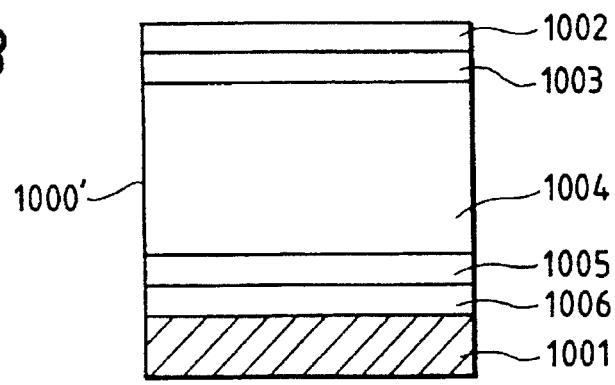

An example as shown in FIG. 24B is a photovoltaic device 1000' having a transparent electrode 1006, a p-type semiconductor layer 1005, an i-type semiconductor layer 1004, an n-type semiconductor layer 1003 and an under electrode 1002 deposited in this order on a translucent carrier 1001. With this photovoltaic device, it is supposed that the light ray is incident from the side of the translucent carrier 1001.

Figure 24C:
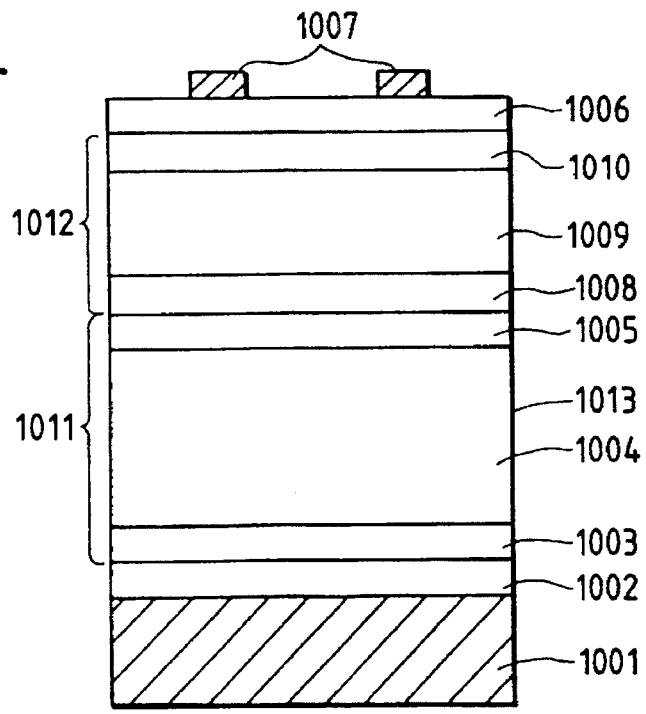

An example as shown in FIG. 24C is a so-called tandem-type photovoltaic device 1013 in which two pin junction-type photovoltaic devices 1011, 1012 using two kinds of semiconductor layers different in the band gap and/or the layer thickness as the i layer are laminated. This photovoltaic device 1013 has an under electrode 1002, an n-type semiconductor layer 1003, an i-type semiconductor layer 1004, a p-type semiconductor layer 1005, an n-type semiconductor layer 1008, an i-type semiconductor layer 1009, a p-type semiconductor layer 1010, a transparent electrode 1006 and a collecting electrode 1007 deposited in this order on a carrier 1001. With this photevoltaic device, it is supposed that the light ray is incident from the side of the transparent electrode 1006.

Figure 24D:
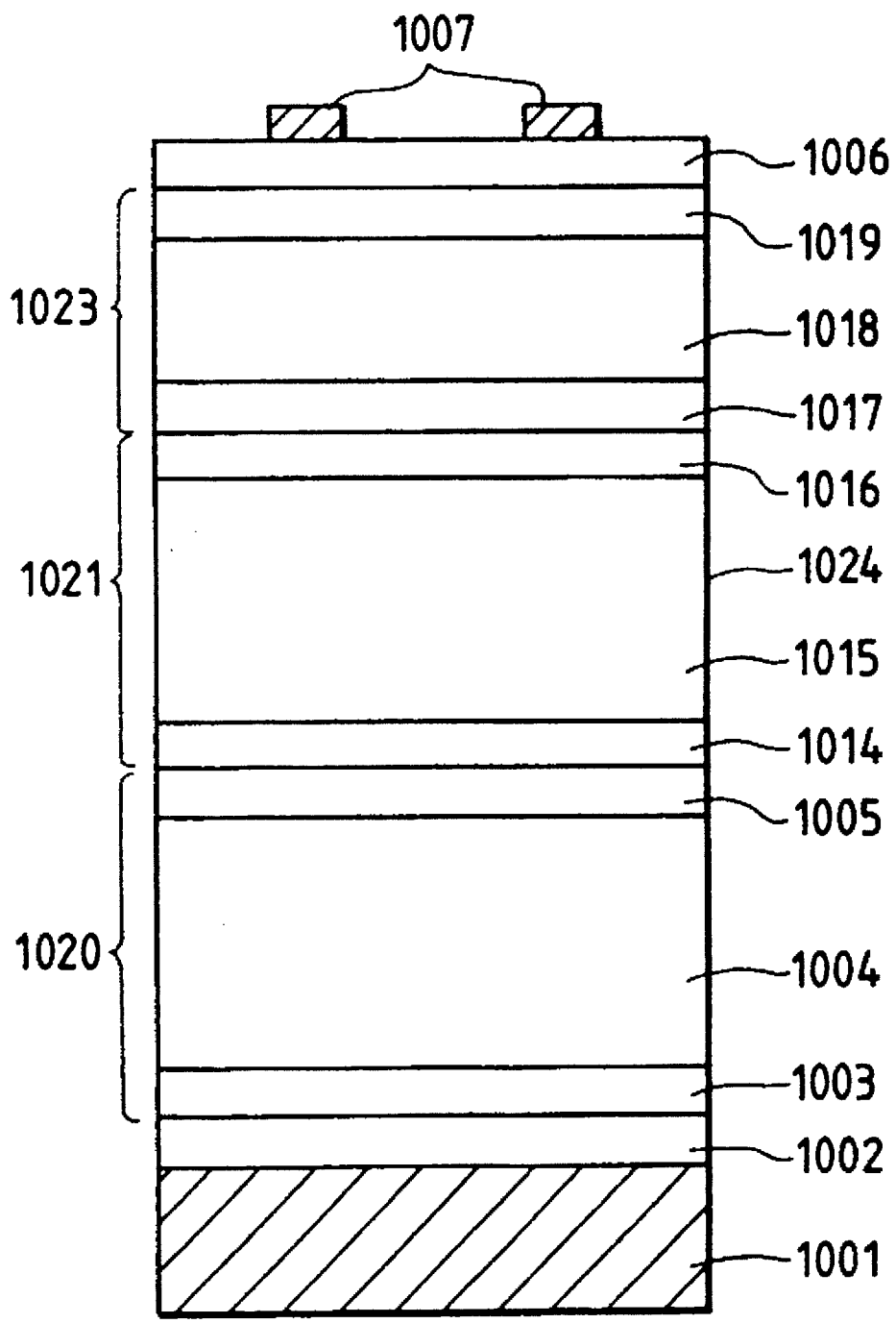

An example as shown in FIG. 24D is a so-called triple-type photovoltaic device 1024 in which three pin junction-type photovoltaic devices 1020, 1021, 1023 using three kinds of semiconductor layers different in the band gap and/or the layer thickness as the i layer are laminated. This photovoltaic device 1024 has an under electrode 1002, an n-type semiconductor layer 1003, an i-type semiconductor layer 1004, a p-type semiconductor layer 1005, an n-type semiconductor layer 1014, an i-type semiconductor layer 1015, a p-type semiconductor layer 1016, an n-type semiconductor layer 1017, an i-type semiconductor layer 1018, a p-type semiconductor layer 1019, a transparent electrode 1006 and a collecting electrode 1007 deposited in this order on a carrier 1001. With this photovoltaic device, it is supposed that the light ray is incident from the side of the transparent electrode 1006.

Note that in any of photovoltaic devices, the n-type semiconductor layer and the p-type semiconductor layer can be used by exchanging the laminating order of each layer as desired.

In the following, the constitution of the photovoltaic device will be described.

Carrier

A carrier 1001 used in the present invention is preferably made of a flexible material capable of forming the curved shape, which may have an electrically conductive or electrically insulating property. Moreover, it may or may not be translucent, but when the light ray is incident from the side of the carrier 1001, it is of course necessary to be translucent.

Specifically, the strip member for use with the present invention can be used, and the use of the substrate allows a lighter solar cell to be fabricated, and an more improved strength and a reduced transport space to be achieved.

Electrode

In the photovoltaic device obtained with the present invention, an appropriate electrode is selectively used, depending on the constitutional form of the device. Examples of those electrodes include an under electrode, an upper electrode (transparent electrode), and a collecting electrode, (Note that the upper electrode mentioned here is one provided on the incident side of the light, while the under electrode is opposed to the upper electrode with a semiconductor layer interposed.) These electrodes will be described below in detail.

(i) Under electrode

The under electrode 1002 used in the present invention is disposed at different locations depending on whether the material of the above mentioned carrier 1001 is translucent or not, because the light ray for the generation of photo-electromotive force is incident on different surfaces (for example, if the carrier 1001 is an untranslucent material such as a metal, the light ray for the generation of photoelectromotive force is incident from the side of the transparent electrode 1006 as shown in FIG. 1A).

Specifically, with a layer constitution as shown in FIGS. 24A, 24C and 24D, the under layer is provided between the carrier 1001 and the n-type semiconductor layer 1003. However, if the carrier 1001 is electrically conductive, the carrier can be also used as the under electrode. However, when the carrier 1001 is electrically conductive but has a low sheet resistance, the electrode 1002 may be provided as the electrode of low resistance for picking up the current, or for the purpose of increasing the resistivity on a carrier surface and making effective use of incident light.

In FIG. 24B, a translucent carrier 1001 is used, and the light ray is incident from the side of the carrier 1001, so that the under electrode 1002 is provided opposed to the carrier 1001 with a semiconductor layer interposed for the purpose of picking up the current and reflecting the light at the electrode.

Also, when the carrier 1001 has an electrically insulating property, the under electrode 1002 is provided between the carrier 1001 and the n-type semiconductor layer 1003 as the electrode for picking up the current.

Examples of the electrode material include a metal such as Ag, Au, Pt, Ni, Cr, Cu, Al, Ti, Zn, Mo, W, or its alloy, in which a thin film of such metal is formed with the vacuum evaporation, the electron beam deposition or the sputtering method. Care must be taken so that the formed metallic thin film may not act as a resistive component to the output of photovoltaic device, the sheet resistance being preferably 50Ω or less, and more preferably 10Ω or less.

Between the under layer 1002 and the n-type semiconductor layer 1003, a diffusion preventing layer, not shown, made of a conductive zinc oxide, for example, may be provided. The effects of the diffusion preventing layer are to prevent the metallic element constituting the electrode 1002 from diffusing into the n-type semiconductor layer, to prevent the short circuit from arising with the defect such as a pin hole on an area between the under electrode 1002 and the transparent electrode 1006 with the semiconductor layer interposed, owing to a slight amount of resistance, and to contain the incident light within the photovoltaic device by causing the multiple interference with the thin film.

(ii) Upper electrode (transparent electrode)

The transparent electrode 1006 used in the present invention has preferably a light transmittance of 85% or more in order to permit the light from the sun or white fluorescent lamp to be absorbed efficiently into the semiconductor layer, and further, the sheet resistance is desirably 100Ω or less so as not to electrically act as the resistive component to the output of photovoltaic device. Examples of the material having such characteristics include a metallic oxide such as $SnO_2$, $In_2O_3$, ZnO, CdO, $CD_2SnO_4$, ITO ($In_2O_3+SnO_2$) or a metallic thin film in which a metal such as Au, Al, Cu is formed as a very thin semitransparent film. The transparent electrode is laminated on the p-type semiconductor layer 1005 in FIGS. 24A, 24C and 24D, while it is laminated on the substrate 1001 in FIG. 24B. It is thus necessary to select a material having a good mutual adherence. The fabrication method is appropriately selected, as desired, among the resistance heating evaporation method, the electron beam deposition method, the sputtering method, or the spray method.

(iii) Collecting electrode

The collecting electrode 1007 used in the present invention is provided on the transparent electrode 1106 for the purpose of reducing the surface resistance of the transparent electrode 1006. Examples of the electrode material include a thin film made of a metal such as Ag, Cr, Ni, Al, Ag, Au, Ti, Pt, Cu, Mo, W, or its alloy. The thin film can be laminated for the purpose. The shape and the area are appropriately designed such that the amount of incident light upon the semiconductor layer may be sufficiently obtained.

For example, its shape is uniformly extended on a light receiving surface of photovoltaic device, and its area is preferably 15% or less of the light receiving area, and more preferably 10% or less.

The sheet resistance is preferably 50Ω or less, and more preferably 10Ω or less.

i-type semiconductor layer

Examples of the semiconductor material making up the i-type semiconductor layer include the so-called IV group and IV group alloy semiconductor materials such as A-Si:H, A-Si:F, A-Si:H:F, A-SiC:H, A-SiC:F, A-SiC:H:F, A-SiGe:H, A-SiGe:F, A-SiGe:H:F, poly-Si:h, poly-Si:F, poly-Si:H:F, and the so-called compound semiconductor materials of II–IV group and III–V group.

Especially when the so-called IV group alloy semiconductor such as a-SiGe:H, a-SiGe:F, a-SiGe:H:F, a-SiC:H, a-Si:F or a-SiC:H:F is used as the i-type semiconductor layer, it has been suggested that the release voltage (Voc) and the curve factor (FF: fill factor) are greatly improved by appropriately changing the forbidden band width (band gap: $Eg^{opt}$) from the light incidence side (20th IEEE PVSC, 1988, A NOVEL DESIGN FOR AMORPHOUS SILICON SOLARSELLS, S. Guha. J. Yang et al.)

FIGS. 25A to 25D show a specific example of the band gap profile. The arrow→in the figure indicates the light incident side.

Figure 25A:
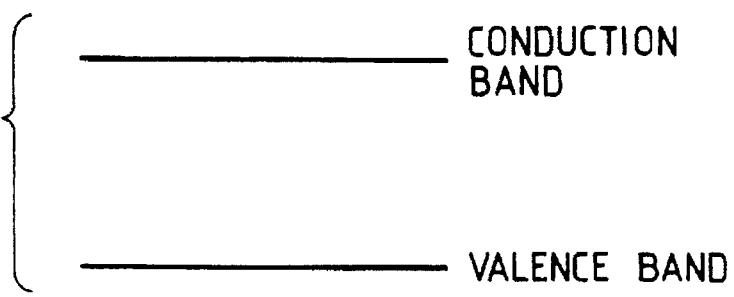
FIGS. 25A to 25D are views for explaining the band gap profile of a deposited film formed in the present invention.
Figure 25B:
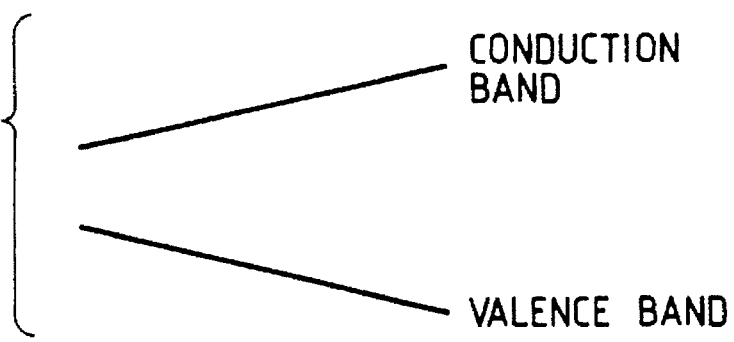
Figure 25C:
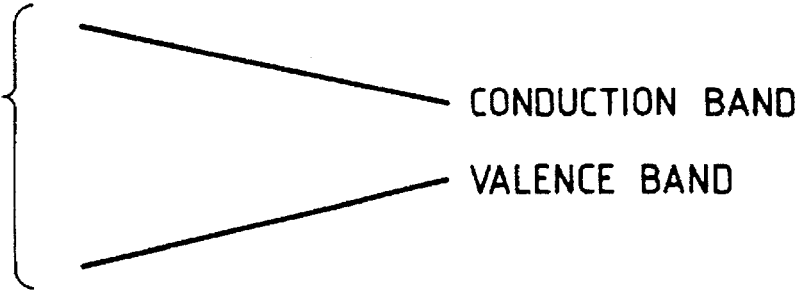

The band gap profile in FIG. 25A is one in which the band gap is constant from the light incident side. The band gap profile in FIG. 25B is of the type in which the band gap on the light incident side is narrower, and gradually widens, having the effects on the improvement of FF. The band gap profile in FIG. 25C is of the type in which the band gap on the light incident side is wider, and gradually narrows, having the effects on the improvement of Voc. The band gap profile in FIG. 25D is of the type in which the band gap on the light incident side is wider, relatively rapidly narrows, and then widens again, whereby in a combination of FIG. 25B and FIG. 25C, both effects can be obtained at the same time.

Figure 25D:
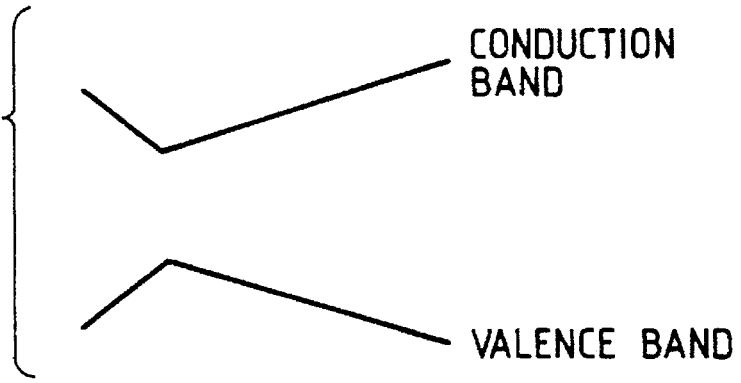

With the method and apparatus of the present invention, an i-type semiconductor layer having the band gap profile as shown in FIG. 25D can be fabricated using a-Si:H ($Eg^{opt}$= 1.72 eV) and s-SiGe:H ($Eg^{opt}$=1.45 eV), for example. An i-type semiconductor layer having the band gap profile as shown in FIG. 25C can be fabricated using a-SiC:H ($Eg^{opt}$= 2.05 eV) and a-Si:H ($Eg^{opt}$=1.72eV).

Also, with the method and apperatus of the present invention, a semiconductor layer having the doping profile as shown in FIG. 26A to 26D can be fabricated. The arrow→in the figure indicates the light incident side.

Figure 26A:
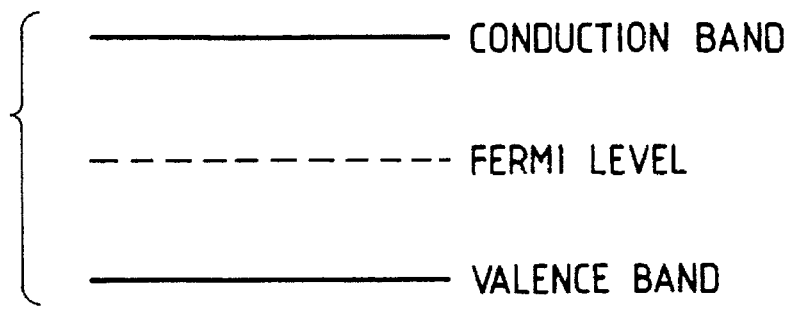
FIGS. 26A to 26D are typical views for explaining the doping profile of a deposited film formed in the present invention.
Figure 26B:
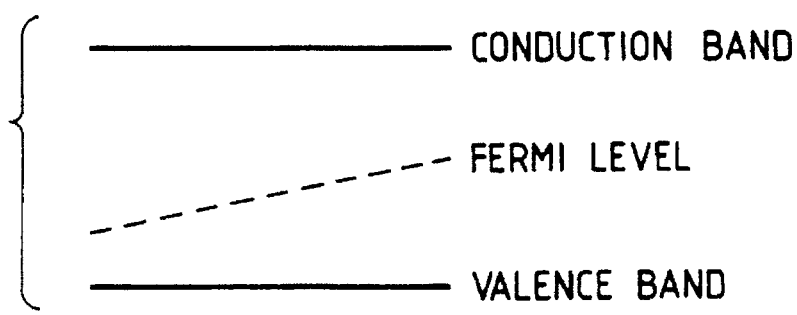
Figure 26C:
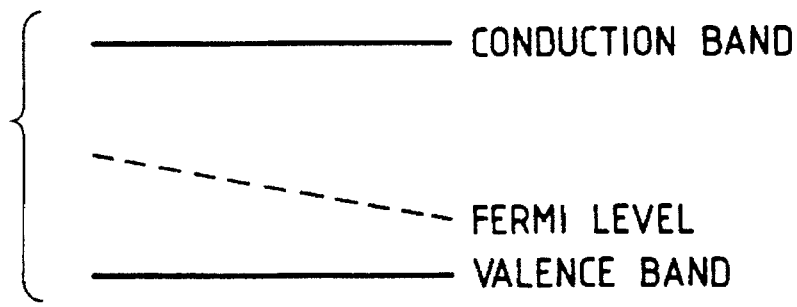
Figure 26D:
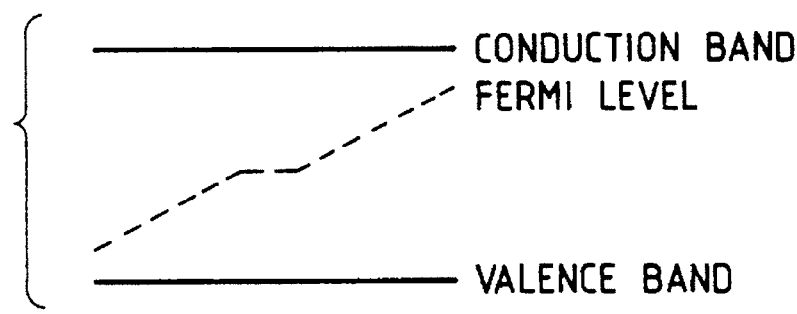

FIG. 26A is a profile of a nondoped i-type semiconductor layer. On the contrary, FIG. 26B is a profile of the type in which the fermi level on the light incident side is closer to the valence band, and gradually approaches to the conduction band, having the effects of preventing the recombination of carriers produced by the light and enhancing the moving property of carriers. FIG. 26C is a profile of the type in which the fermi level approaches gradually to the conduction band from the light incident side, whereby when an n-type semiconductor layer is provided on the light incident side, the same effects as in FIG. 26B can be obtained. FIG. 26D is a profile of the type in which the fermi level substantially continuously varies from the valence band on the light incident side to the conduction band.

They illustrate the instance where the band gap is constant from the light incidence side, as shown in FIG. 25A, but with the band gap profiles as shown in FIG. 25B to FIG. 25D, the fermi level can be controlled as well.

With an appropriate design of the band gap profile and the fermi level profile, photovoltaic devices having high photoelectric transfer efficiency can be fabricated. In particular, it is desirable that these profiles are applicable to the i-type semiconductor layer of tandem-type or triple-type photovoltaic device as shown in FIGS. 24C to 24D.

p-type semiconductor layer and n-type semiconductor layer

The semiconductor material making up the p-type or n-type semiconductor layer suitably used with the photovoltaic device fabricated according to the present invention can be obtained by doping a valence electron control agent into a semiconductor material making up the i-type semiconductor layer as previously described.

II. Second method and apparatus of the present invention

The present inventor made studies with efforts to solve the above-mentioned problems in a conventional thin film semiconductor device forming apparatus and accomplish the aforementioned objects of the present invention, and determined that the microwave plasma can be excited almost uniformly in a width direction of a strip member within a film formation chamber, in such a manner that the strip member is bent via supporting/conveying rollers for the formation of a bend leading edge, supporting/conveying rings for the formation of a bend, and supporting/conveying rollers for the formation of a bend trailing edge, with some gap between the supporting/conveying rollers, so as to form the columnar film formation chamber with the strip member as a side wall, wherein a pair of microwave applicator means for allowing the microwave energy to be radiated in a parallel direction to a propagating direction of the microwave are disposed opposed to each other on both end faces of the film formation chamber, and source gases for the formation of deposited film are introduced into the film formation chamber, and exhausted via the gap between a pair of supporting/conveying rollers so as to retain the pressure within the film formation chamber at a predetermined reduced pressure, and cause the microwave applicator means to radiate the microwave energy in an almost parallel direction to the side wall.

A second method and apparatus of the present invention has been completed as a result of making a further examination based on the above-mentioned view, and includes a method and apparatus for continuously forming a functional deposited film of large area with a microwave plasma-assisted CVD method with the gists as follows.

The second method and apparatus of the present invention is different in the form of microwave applicator means from the first method and apparatus, but other forms are applicable in the same way.

The second method of the present invention is as follows. That is, a method for continuously forming a functional deposited film of large area with a microwave plasma CVD method characterized by continuously moving a strip member in a longitudinal direction, while forming halfway a columnar film formation space with the moving strip member as a side wall, Introducing individually at least two or more kinds of source gases for the formation of deposited film having different compositions via a plurality of gas supply means into the film formation space.

at the same time exciting a microwave plasma within the film formation space by radiating the microwave energy with microwave applicator means which allows the microwave energy to be radiated in a parallel direction to a propagating direction of the microwave, and forming the deposited film having its composition controlled on a surface of the continuously moving strip member making up the side wall exposed to the microwave plasma.

The microwave energy is radiated within the film formation chamber via at least one or more microwave applicator means disposed on one or both sides of two end faces of the columnar film formation chamber formed with the strip member as the side wall.

The microwave applicator means is disposed in a perpendicular direction to the end face to radiate the microwave energy in a parallel direction to the side wall.

With the second method of the present invention, the microwave energy is radiated via a microwave transparent member provided at a top end portion of the microwave applicator means.

The microwave transparent member serves to retain the air tightness between the microwave applicator means and the film formation chamber.

Then the microwave applicator means are disposed opposed to each other at both end faces, the microwave energy radiated from one microwave applicator means is allowed not to be received by the other microwave applicator means.

With the method of the present invention, the microwave energy radiated within the columnar film formation chamber is not allowed to leak out of the film formation chamber.

With the method of the present invention, each of the gas supply means is disposed in parallel to the width direction of the strip member making up the side wall to discharge the source gases for the formation of deposited film in one direction toward neighboring strip member.

The source gases for the formation of deposited film to be introduced into the film formation chamber are exhausted through a gap left in a longitudinal direction of the strip member between the bend leading edge forming means and the bend trailing edge forming means.

With the method of the present invention, at least one face of the strip member is treated for the electrical conductivity.

Further, the apparatus of the present invention is an apparatus for continuously forming a functional deposited film on a continuously moving strip member with a microwave plasma-assisted CVD method, characterized by comprising.

a columnar film formation chamber with the strip member as a side wall formed via bend forming means for bending the strip member halfway while continuously moving the strip member in a longitudinal direction, and capable of substantially holding a vacuum in its interior, microwave applicator means for radiating the microwave energy in a parallel direction to a propagating direction of the microwave to excite a microwave plasma within the film formation chamber, exhaust means for exhausting an interior of the film formation chamber, at least two or more gas supply means for introducing source gases for the formation of deposited film into the film formation chamber, and temperature control means for heating and/or cooling the strip member, wherein the deposited film with its composition controlled is formed on a surface of the continuously moving strip member on the side exposed to the microwave plasma.

With the second apparatus of the present invention, at least one or more microwave applicator means is disposed on one or both sides of two end faces of the columnar film formation chamber formed by the strip member as the side wall.

The microwave applicator means is disposed in a perpendicular direction to the end face.

With the apparatus of the present invention, a microwave transparent member is provided at a top end portion of the microwave applicator means so as to make the airtight separation between the film formation chamber and the microwave applicator means, and allow the microwave energy radiated from the microwave applicator means to be transmitted into the film formation chamber.

With the apparatus of the present invention, at least one face of the strip member is treated for the electrical conductivity.

With the second apparatus of the present invention, the microwave energy is transmitted via a square or rectangular and/or elliptical waveguide, for example, to the microwave applicator means.

When the microwave applicator means are disposed opposed to each other on both end faces of the film formation chamber, they are disposed such that both faces containing long sides for the square or retangular and/or elliptical waveguides connected to the microwave applicator means, both faces containing long axes, or a face containing the long side and a face containing the long axis may not be in parallel to each other.

Also, they are disposed such that the angle made between a face containing the long side and/or a face containing the long axis for the square and/or elliptical waveguide and a face containing central axes of the pair of supporting/conveying rollers may not be at right angles.

The experiments performed by the present inventor to complete the second method and apparatus will be described below.

[Experiments]

The following experiments were made to investigate the excitation conditions of microwave plasma to form a functional deposited film uniformly on the strip member, using the second apparatus of the present invention.

Experimental example 1B

In this experimental example, the microwave plasma was excited using an apparatus as shown in the apparatus example 20 as will be described later, and according to a procedure as described in the fabrication example 12 as will be described later, the stability of microwave plasma and the leakage of the microwave out of the film formation chamber were examined with different mounting angles for a pair of waveguides 111, 112.

Figure 15:
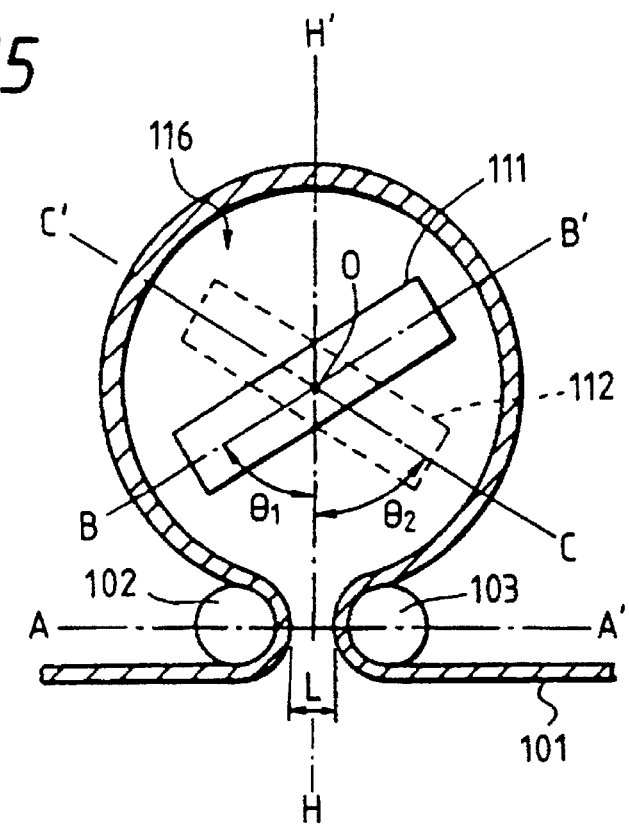
FIG. 15 is a typical cross-sectional view for explaining the setting angle of a square waveguide in the present invention.

FIG. 15 shows a typical cross-sectional schematic view for explaining the mounting angles of square waveguides 111, 112.

A retangular waveguide 111 as indicated by the solid line and a retangular waveguide 112 as indicated by the dot line are connected to microwave applicators (not shown) disposed opposed to both end faces of film formation chamber 116, in which the retangular waveguide 111 is disposed on the front side of the figure, and the retangular waveguide 112 is disposed on the rear side. The point o is a center of the bend shape, the line A–A' indicates a face containing central axes of supporting/conveying rollers 102 and 103, and a face perpendicular to that face A–A' is assumed to be H–H'. And the angle made between a face B–B' in parallel to a face containing a long side of the square waveguide 111 and H–H' is $\theta_1$, which is set as the mounting angle of the square waveguide 111. Also, the angle made between a face C–C' in parallel to a face containing a long side of the square waveguide 112 and H–H' is $\theta_2$, which is set as the mounting angle of the square waveguide 112. Here, when the mounting angles $\theta_1$, $\theta_2$ of the square waveguide 111, 112 each exceed 180°, the arrangement relation is the same as with the case of less than 180° because of the symmetrical arrangement of H–H' with respect to the case of less than 180°. Of course, even if $\theta_1$, $\theta_2$ are mutually exchanged, the arrangement relation is also the same because of the opposed relation.

In the present invention, the distance between bend edge faces of the strip member restricted by supporting/conveying rollers 102, 103 is defined as a gap L.

In the microwave plasma discharge conditions as shown in Table 30, the stability of microwave plasma was evaluated by the experiments in different combinations of $\theta_1$ and $\Theta_2$.

The degree of leakage of microwave was evaluated by providing a microwave sensor at a location spaced 5 cm away from the gap portion of the supporting/conveying rollers 102, 103.

The evaluated results were as shown in Table 2.

From these results, it has been found that the stability of microwave plasma and the degree of leakage of microwave out of the film formation chamber are greatly varied by changing the mounting angles of the square waveguides to the microwave applicator. Specifically, when $\theta_1$ and/or $\theta_2$ are 0°, the amount of leakage of microwave is greatest, the discharge condition being unstable, and at about 15°, the amount of leakage of microwave is reduced, but the discharge condition is also unstable. At 30° or more, the leakage of microwave is eliminated, and the discharge condition is stabilized. However, when the angle made by $\theta_1$ and $\theta_2$ is 0° or 180°, that is, both faces constaining long sides of the square waveguides are arranged in parallel to each other, the power source noise due to the abnormal oscillation is larger, resulting in unstable discharge. This discharge experiment was made when the strip member 101 was stationary, and when it was conveyed at a conveying speed of 1.2 m/min, but there was no specific difference between them as to the stability of discharge.

Further, among the microwave plasma discharge conditions, various conditions such as the kind and flow of source gas, the position of gas inlet conduit for use, the microwave power, the inner diameter of bend shape or the internal pressure of film formation chamber, are changed, in which there was no specific difference as to the amount of leakage of microwave caused by the arrangement of square waveguide and the stability of discharge.

Experimental example 2B

In this experimental example, the stability of microwave plasma and the influence of film thickness distribution were examined when the gap L between the supporting/conveying rollers 102, 103 as shown in FIG. 15 was changed, using an apparatus as shown in the apparatus example 20, like the experimental example 1B.

The gap L was changed variously in a range as shown in Table 32, and the discharge was made for about 10 minutes for each case. Other microwave plasma discharge conditions were the same as shown in Table 30, with the mounting angles $\theta_1$, $\theta_2$ of the square waveguides being both 45°. Note that the pressure variation of the film formation chamber was caused owing to increased conductance with a larger gap L, without adjustment of the exhaust pump ability. The temperature control mechanisms 106a to 106c were operated so that the surface temperature of the strip member 101 might be 250° C., with the conveying speed of the strip member being 35 cm/min.

Table 32 shows the results of the evaluation for the discharge conditions and the film thickness distribution.

Note that the discharge condition was visually evaluated, and the film thickness distribution was evaluated by measuring 10 points in the width direction of strip member for every 20 cm in the longitudinal direction, using a needle step film thickness meter.

From these results, it has been found that the pressure within the film formation chamber is varied by changing the gap L without any specific adjustment of the exhaust pump, so that the film thickness distribution of deposited film to be formed is significantly changed particularly in the width direction of the strip member. Also, it has been found that even if the mounting angles of the square waveguides are determined in the same arrangement as in the experimental example 1 in which no leakage of microwave occurred, the microwave leakage also occurs for too large gap L. And the leakage of microwave through the gap L occurs little when the gap L is preferably ½ or less the wavelength of microwave, and more preferably ¼ or less. Note that the film thickness distribution in the longitudinal direction of the strip member was substantially excellent as the strip member was conveyed. The deposition rate of sample No. 4 which had a faster deposition rate and a better film thickness distribution among fabricated samples was about 100 Å/sec. The utilization efficiency of source gas, which could be calculated from the amount of deposited film on the strip member relative to the total amount of used source gas, was 55%.

Further, among the microwave plasma discharge conditions, various conditions such as the microwave power or the inner diameter of bend shape were changed differently, but they did not help as means for resolving intrinsic problems caused by the size of the gap L though the film thickness distribution and the discharge stability were slightly changed.

Experimental example 3B

In this experimental example, the stability of microwave plasma and the film thickness distribution were examined when the inner diameter of formed bend shape was varied, using an apparatus as shown in the apparatus example 20, like the experimental example 1B. The microwave plasma discharge conditions were the same as shown in Table 30, except that the inner diameter of bend shape was differently changed in a range as shown in Table 33, with the mounting angles of the square waveguides being both 45°. The discharge time was 10 minutes for each case, and the surface temperature of the strip member was 250° C. as in the experimental example 2. The conveying speed of strip member was 35 cm/min.

Table 33 shows the results of the evaluation for the discharge condition and the film thickness distribution.

Note that the discharge condition was visually evaluated, and the film thickness distribution was evaluated by measuring 10 points in the width direction of strip member for every 20 cm in the longitudinal direction, using a needle step film thickness meter.

From these results, it has been found that the discharge condition is varied by changing the inner diameter of bend shape, so that the film thickness distribution of deposited film to be formed is significantly changed particularly in the width direction of the strip member. Note that the film thickness distribution in the longitudinal direction of the strip member was substantially excellent as the strip member was conveyed.

Further, among the microwave plasma discharge conditions, various conditions such as the microwave power or the pressure within the film formation chamber were changed, in which it could be found that the film thickness distribution and the discharge stability were affected by parameter variations.

Experimental example 4B

In this experimental example, the stability of microwave plasma was examined when the flow of source gas and the microwave power were changed differently, at a constant pressure within the film formation chamber, using an apparatus as shown in the apparatus example 20, like the experimental example 1B. The microwaver plasma discharge conditions were the same as shown in Table 30, except that the pressure within the film formation chamber and the flow of source gas were varied differently in a range as shown. in Table 5, with the mounting angles $\theta_1$, $\theta_2$ of the square waveguides being both 60°.

Note that the source gas was introduced evenly through gas inlet conduits 113a, 113b, 113c.

Table 34 shows the results of the evaluation for the discharge conditions. Here, ⊚ indicates the stable discharge, ○ indicates almost stable discharge with minute fluctuation, and △ indicates the stable discharge at usable level with slight fluctuation. In any case, substantial threshold values are indicated beyond which the discharge is unstable or not excited when the microwave power is decreased, the pressure within the film formation chamber is decreased, or the flow of $H_2$ as the source gas is increased. Accordingly, it has been found that the discharge is stabler when the microwave power is raised, the pressure within the film formation chamber is raised, or the flow of $SiH_4$ as the source gas is increased. This discharge experiment was made when the strip member 101 was stationary, and when it was conveyed at a conveying speed of 1.2 m/min, in which there was no specific difference between them on the discharge stability.

Experimental example 5B

In this experimental example, the stability of microwave plasma and the influence upon the film thickness distribution were examined when the width size of strip member was varied, using an apparatus as shown in the apparatus example 20, like the experimental example 1B. The width size of strip member was varied differently in a range as shown in Table 35, and the discharge was made for 10 minutes in each case. Other microwave plasma discharge conditions were the same as shown in Table 30, with the kind of square waveguide being replaced with EIAJ, WRI-32, and with the mounting angles $\theta_1$, $\theta_2$ of the square waveguides being both 60°. The surface temperature of the strip member was 250° C. as in the experimental example 2, and the conveying speed of strip member was 50 cm/min.

Note that the microwave applicator was disposed on only one side for samples No. 15 to 17 and a pair of microwave applicators were disposed opposed to each other for samples No. 18 to No. 21.

Table 33 shows the results of the evaluation for the discharge condition and the film thickness distribution. The evaluation method was the same as in the experimental example 2B.

From these results, it has been found that the stability of microwave plasma and the film thickness distribution are changed depending on the width size of the strip member. And when the stability of microwave plasma lacks or the film thickness distribution is spread, only with the supply of microwave power from one side, a pair of microwave applicators allow for their improvement.

Further, among the microwave plasma discharge conditions, various conditions such as the kind and flow of source gas, the position of gas inlet conduit to be used, the microwave power or the pressure within the film formation chamber were changed, in which it could be found that the discharge stability and the film thickness distribution were affected by the variations of respective parameters.

Outline of experimental results

With the method and apparatus of the present invention, since the stability and uniformity of microwave plasma are maintained by complex interrelations between various parameters such as the shape of microwave applicator, the kind and allocation of waveguide to be connected, the pressure within the film formation chamber in forming the film, the microwave power, the degree of containment for the microwave plasma, or the volume and shape of discharge space, it is difficult to determine the optimal conditions with a single parameter, but the following trend and condition range have been found from the results of this experiment.

It has been found that the pressure of film formation chamber is preferably from 1.5 mTorr to 100 mTorr, and more preferably from 3 mTorr to 50 mTorr; the microwave power is preferably from 250×2 W to 3000×2 W, and more preferably from 300×2 W to 1000×2 W; the inner diameter of bend shape is preferably from 7 cm to 45 cm, and more preferably from 8 cm to 35 cm. Also, it has been found that when a pair of microwave applicators opposed with respect to the width of strip member are used, the uniformity in the width direction can be obtained preferably at about 60 cm, and more preferably at about 50 cm.

Also, it has been found that the stability of microwave plasma may lack with a larger amount of leakage of microwave from the microwave plasma region, and the gap L between bend edge portions of the strip member is set to be preferably ½ or less the wavelength of microwave, and more preferably ¼ or less the wavelength.

In the following, the second method of the present invention will be further described based on the previously described facts.

[Experiments]

In the method of the present invention, most of side wall for the columnar film formation space to be formed by bending the strip member halfway on the passage of the moving strip member, using bend leading edge forming means and bend trailing edge forming means, are constituted of the moving strip member so that a gap may be left between the bend leading edge forming means and the bend trailing edge forming means in a longitudinal direction of the strip member.

In the second method of the present invention, in order to uniformity excite and contain the microwave plasma within the columnar film formation space, the microwave energy is caused to be radiated from one or both sides of two end faces of the film formation space formed in a parallel direction to the side wall formed by the strip member, and contained within the film formation space.

When the width of the strip member is relatively narrow, the uniformity of microwave plasma excited within the film formation chamber only by radiating the microwave energy from one side can be retained, but when the width of the strip member is more than one wavelength of the microwave, for example, it is preferable to radiate the microwave plasma from both sides to retain the uniformity of the microwave plasma.

Of course, the uniformity of microwave plasma excited within the film formation space requires the microwave energy to be fully transmitted within the film formation space, and the columnar film formation space has desirably a similar structure to that of the so-called waveguide. To this end, first, the strip member is preferably made of a conductive material, but may have at least one face treated for the electrical conductivity.

Also, in the second method of the present invention, both end faces for the columnar film formation space to be formed by bending the moving strip member, using the bend leading edge forming means and the bend trailing edge forming means, are preferably formed in such a manner that the microwave energy radiated within the film formation space is transmitted substantially uniformly within the film formation space, desirably in the relatively smooth bend shape substantially in symmetry and similar to a circular, elliptical, square or polygonal shape. Of course, the shape of the end face may be discontinuous in the gap left between the bend leading edge forming means and the bend trailing edge forming means in the longitudinal direction of the strip member.

Further, in the second method of the present invention, in order to efficiently transmit the microwave energy within the film formation space, and stably excite, maintain and control the microwave plasma, it is desirable that the transmission mode of microwave within the microwave applicator means is a single more. Specific examples of the single mode include $TE_{10}$ mode, $TE_{11}$ mode, $eH_1$ mode, $TM_{11}$ mode, and $TM_{01}$ mode, and preferably $TE_{10}$ mode, $TE_{11}$ mode and $eH_1$ mode are used. The transmission mode may be used singly or in a combination of plural modes. The microwave energy is transmitted via the waveguide transmittable on the above mentioned transmission modes into the microwave applicator means. Further, the microwave energy is radiated via a microwave transparent member having the air tightness provided at a top end portion of the microwave applicator means into the film formation chamber.

With the second method of the present invention, the source gases are exhausted through the gap left between the bend leading edge forming means and the bend trailing edge forming means in the film formation space, which is retained at a predetermined reduced pressure, the size of the gap being considered specially so that a sufficient exhaust conductance can be obtained and the microwave energy radiated within the film formation space may not leak out of the film formation space.

Specifically, the microwave applicator means is disposed such that an electric field direction of the microwave propagating within the microwave applicator means and a face containing a central axis of supporting/conveying roller as the bend leading edge forming means and a central axis of supporting/conveying roller as the bend trailing edge forming means may not be in parallel to each other.

When the microwave energy is radiated via a plurality of microwave applicator means into the film formation space, care must be taken for each microwave applicator means to be as previously described.

Further, the maximum size of opening width in a longitudinal direction of strip member for the gap left between the bend leading edge forming means and the bend trailing edge forming means is preferably ½ or less the wavelength of microwave, and more preferably ¼ or less the wavelength of microwave.

With the second method of the present invention, a plurality of the microwave applicator means are disposed opposed to each other, a special consideration must be taken so that if the microwave energy radiated from one microwave applicator means is received by the other microwave applicator means, the received microwave energy may not propagate to a microwave power source connected to the other microwave applicator means to thereby give an adverse effect such as the abnormality on the oscillation of microwave. Specifically, the microwave applicator is disposed such that both electric fields of microwave travelling in the microwave applicator means may not be in parallel to each other.

With the second method of the present invention, when the microwave energy is radiated from only one side of two end faces of the film formation space, it is necessary that the microwave energy may not leak from the other end face, whereby the end face is sealed with a conductive member, or covered with a wire gauze or punching board having a hole diameter of preferably ½ or less the wavelength of microwave, and more preferably ¼ or less the wavelength.

With the second method of the present invention, the microwave energy radiated within the film formation space has a tendency of significantly decreasing with increasing distance from the microwave transparent member provided in the microwave applicator, while it has a strong correlation with the pressure of the film formation space, and depends on the kind of source gas introduced into the film formation space. Accordingly, in order to excite the microwave plasma uniformly in the width direction when a relatively wide strip member is used, it is desirable that the microwave energy may be radiated from both end faces of the film formation space via at least one pair of microwave applicator means into the film formation space held at a sufficiently low pressure.

With the second method of the present invention, the microwave applicator means is desirably disposed vertically to the end face of the film formation space, so that the travelling direction of radiated microwave energy may be substantially in parallel to the side wall of the film formation space to be formed by the strip member. Also, the microwave applicator means is desirably disposed at a substantially equal distance away from the side wall, but when the bend of the side wall is shaped asymmetrically, the disposed position is not particularly limited. Of course, when a plurality of microwave applicator means are disposed opposed to each other, the central axes may or may not be on the same line.

With the second method of the present invention, the bend shape to be formed by the strip member is preferably always retained in a certain shape to hold the stability and uniformity of the microwave plasma excited therein, and the strip member is desirably supported by the bend leading edge forming means and the bend trailing edge forming means so as not to yield creases, slacks or side slips. In addition to the bend leading edge forming means and the bend trailing edge forming means, supporting means for supporting the bend shape may be provided. Specifically, supporting means for continuously holding a desired bend shape may be provided inside or outside the bent strip member. When the supporting means is provided inside the bent strip member, care must be taken to make contact with a face for the formation of deposited film as least as possible. For example, the supporting means is preferably provided on both end portions of the strip member.

It is desirable to form a smooth shape for the strip member at a bend leading edge, a bend trailing edge and a halfway bend portion, using the flexible strip member capable of continuously forming the bent shape.

With the second method of the present invention, when at least two or more kinds of source gases for the formation of deposited film having different compositions are separately introduced from a plurality of gas supply means into the film formation space, the source gases for the formation of deposited film are preferably discharged from the gas supply means uniformly in the width direction of the strip member, and in one direction toward the strip member in the neighborhood of the gas supply means. That is, gas discharge ports in the respective gas supply means may be desirably opened in different directions, so that the source gases for the formation of deposited film having different compositions may not mix with each other immediately after they are discharged from the gas supply means.

The gas supply means is disposed in parallel to the strip member making up the side wall.

The number of gas supply means for use with the second method of the present invention is desirably at least equal to or more than the number of constituent elements in a functional deposited film to be formed, in which the functional deposited film with controlled composition can be formed by appropriately changing the compositions of source gases for the formation of deposited film to be discharged from respective gas supply means.

It is desirable that the respective gas supply means are disposed within the columnar film formation space so that the source gases for the formation of deposited film to be discharge therefrom may be assuredly excited and decomposed. In order that the formed deposited film may have a desired component distribution, it is desirable that the allocation of the gas supply means may be suitably adjusted. Further, to adjust and control the flow path of the source gas for the formation of deposited film within the columnar film formation space, a straightening vane may be provided with the columnar film formation space.

The functional deposited film with controlled composition to be formed in the second method of the present invention may be the same as in the first method of present invention described before, and the same gases are used for the formation of deposited film.

With the composition control of the above mentioned semiconductor thin film, the forbidden band, valence electron, refractive index, and crystallization are controlled. By forming the functional deposited film having its composition controlled longitudinally and transversely on the strip member, thin film semiconductor devices having electrically, optically and mechanically superior characteristics can be fabricated.

That is, the travelling property of carriers is enhanced by changing the width of forbidden band and/or the density of valence electrons in a longitudinal direction of deposited semiconductor layer, or the electrical characteristics are improved by preventing the recombination of carriers on the semiconductor interface. The light transmittance into the semiconductor layer can be improved by providing a non-reflective surface with continuous changes of the refractive index. Further, the stress relaxation can be made with the structural changes caused by the change in the hydrogen content, so that the deposited film having a high adherence with the substrate can be fabricated. Also, by forming the semiconductor layer having different crystallization in its transverse direction, photoelectric transfer devices formed of amorphous semiconductor and switching devices formed of crystalline semiconductor can be continuously formed on the same substrate.

In the present invention, the source gases for the formation of deposited film to be used for forming the functional deposited film as previously described are introduced into the film formation space by appropriately adjusting their mixture ratio depending on the organization of a desired functional deposited film. When introducing them, a plurality of gas supply means are used, in which the compositions of source gases for the formation of deposited film to be introduced from respective gas supply means may be different or identical depending on the purpose. Also, the composition may be changed continuously with the time.

With the second method of the present invention, in order to excite and maintain uniformly and stably the microwave plasma within the columnar film formation space, the parameters such as the shape and capacity of the film formation space, the kind and flow of source gas introduced into the film formation space, the pressure within the film formation space, the quantity of microwave energy radiated into the film formation space, and the alignment of microwave are mutually connected organically although they have respective optimal conditions, and can not be uniquely defined, whereby the preferred conditions should be set properly.

That is, with the second method of the present invention, it is possible to continuously form a functional deposited film of large area in good uniformity by adjusting and optimizing the exciting and maintaining conditions of the microwave plasma in such a manner that the film formation space is formed with the strip member as side wall, and the microwave applicator means is disposed such that the strip member making up the side wall of the film formation chamber is continuously moved, while the microwave energy is radiated almost uniformly in the width direction of the strip member making up the side wall of the film formation space.

In the following, the constitution and features of the second microwave plasma-assisted CVD apparatus of the present invention will be further described in detail in due order.

With the apparatus of the present invention, it is possible to catch the precursor contributing to the formation of deposited film and excited within the microwave plasma region on the substrate at high yield, and further continuously form the deposited film on the strip member, because the microwave plasma region is contained by the moving strip member, so that the utilization efficiency of source gas for the formation of deposited film can be greatly raised.

Further, since the uniform microwave plasma is excited within the film formation space using the microwave applicator means of the present invention, the deposited film is formed in good uniformity not only in the width direction of the strip member, but also in the longitudinal direction of the strip member while the strip member is continuously conveyed in a substantially perpendicular direction to the longitudinal direction of the microwave applicator means.

With the apparatus of the present invention, the continuous and stable discharge can be made in good uniformity, so that it is possible to deposit continuously a functional deposit film having stable characteristics on a long strip member, and fabricate laminated devices superior in the surface characteristics.

The second apparatus of the present invention can take the same form as the first apparatus of the present invention, except for the microwave applicator.

The number of gas supply means disposed in the second apparatus of the present invention is desirably at least equal to or more than the number of constituent elements in the functional deposited film to be formed. And the respective gas supply means are constituted of pipe-like gas inlet conduits, on its side face being opened one or more rows of gas discharge ports. The material constituting the gas inlet conduit is suitably used so that it may not be subjected to damage within the microwave plasma. Specifically, examples of such material include a heat resisting metal such as stainless steel, nickel, titanium, niobium, tantalum, tungsten, vanadium, or molybdenum, and a material in which such heat resisting metal is thermally sprayed on ceramics such as alumina, silicon nitride or quartz, a ceramics simple substance such as alumina, silicon nitride, or quartz, and a complex thereof.

In the second apparatus of the present invention, the gas supply means is disposed in parallel to the width direction of the strip member making up the side wall of the film formation chamber, the gas discharge port being directed toward neighboring strip member.

The arrangement of the gas supply means for use in the second apparatus of the present invention will be described below with reference to the drawings, but is not specifically limited.

Figure 16:
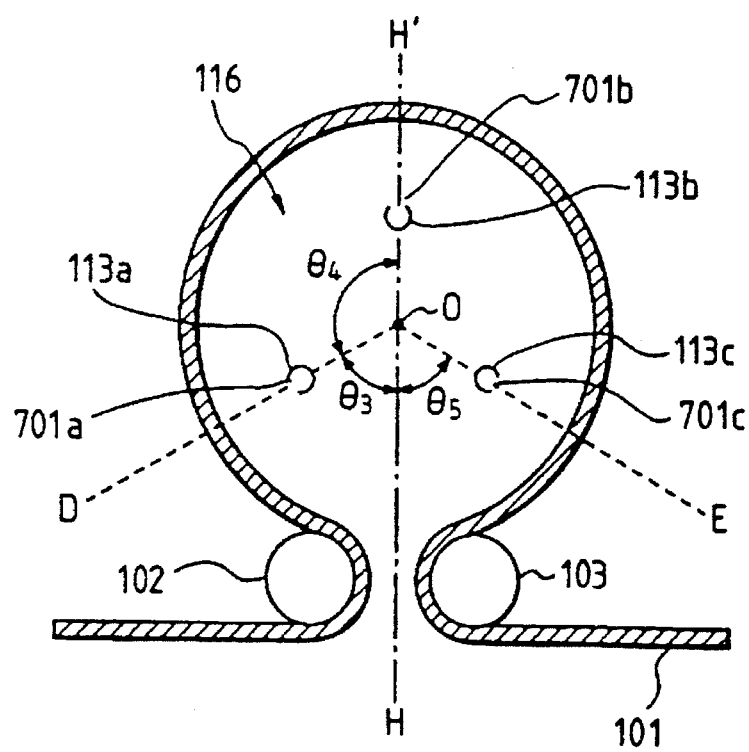
FIG. 16 is a typical side cross-sectional view showing one example of the arrangement for a gas inlet tube in the apparatus of the present invention.
Figure 17:
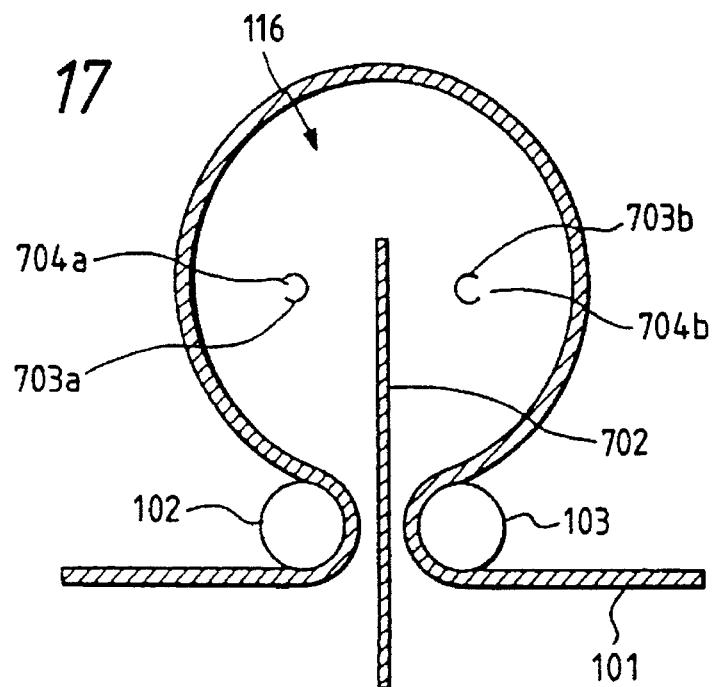
FIG. 17 is a typical side cross-sectional view showing another example of the arrangement for the gas inlet tube in the apparatus of the present invention.

FIGS. 16 and 17 are typical side cross-sectional views showing the arrangement of a gas inlet conduit in the apparatus of the present invention. Note that main constitutional members are only illustrated in this figure.

An example of FIG. 16 shows a typical arrangement of three gas inlet conduits 113a, 113b, 113c as gas supply means disposed within the columnar film formation chamber 116, in which pipe-like gas inlet conduits 113a, 113b, 113c are disposed in parallel to the width direction of the strip member 101 at a substantially equal distance from a center o of the film formation chamber 116 and angles $\theta_3$, $\theta_4$, $\theta_5$ with reference to a central axis HH' of the film formation chamber as shown. And gas discharge ports 701a, 701b, 701c are directed to adjacent strip member 101, respectively.

In this arrangement, the gas inlet conduit 113b is disposed on the central line HH' of the film formation chamber 116, but may be disposed at a left or right shifted position, if desired. The distances of the gas inlet conduits 113a, 113b, 113c from the center o may or may not be equal. Also, the angles $\theta_3$, $\theta_4$, $\theta_5$ may or may not be equal.

A source gas for the formation of deposited film, appropriately mixed as desired, is introduced into each of the gas inlet conduits 113a, 113b, 113c under separate control.

The gas discharge ports 701a, 701b, 701c are opened at substantially equal intervals in a row on the side faces of respective gas inlet conduits, but the interval may be appropriately changed to improve the uniformity in the width direction of deposited film to be formed, in accordance with the increase or decrease of introduced gas.

Of course, the number of gas inlet conduits may be two, or more than three.

An example of FIG. 17 shows a typical arrangement of two gas inlet conduits 703a, 703b as gas supply means within the column-shaped film formation chamber 116 and a gas straightening vane 702. The gas inlet conduits 703a, 703b are disposed substantially in symmetry with respect to the gas straightening vane 702. The distances of gas inlet conduits 703a, 703b from the gas straightening vane may be changed as desired. The disposition of the gas straightening vane 702 can improve the separation of source gases for the formation of deposited film to be discharged from respective gas inlet conduits, and the controllability for the composition of deposited film to be formed.

The size, shape and disposed position of the gas straightening vane are appropriately determined depending on the composition of a desired deposited film.

The number of gas inlet conduits may be two or more.

The gas discharge port can be opened as in the gas inlet conduit used in FIG. 16.

With the second apparatus of the present invention, in order to control the plasma potential of microwave plasma excited within the film formation chamber, a bias voltage may be applied to the gas inlet conduit. The bias voltage applied to a plurality of gas inlet conduits may or may not be equal. It is desirable that the bias voltage is applied with the DC, pulsating or AC voltage singly or in a superposition thereof.

In order that the bias voltage may be effectively applied, both the gas inlet conduit and the strip member have desirably electrically conductive surfaces.

The control of the plasma potential with the application of the bias voltage allows for the stability and reproducibility of the plasma, the improvement of film characteristics, and the suppression of occurrence of defects.

With the second apparatus of the present invention, the source gases for the formation of deposited film introduced through the gas inlet conduits into the columnar film formation chamber are partially or totally decomposed to produce the precursor for the formation of deposited film, and then form the deposited film, while undecomposed source gases or gases having changed compositions due to the decomposition must be exhausted rapidly out of the columnar film formation chamber. However, if the area of exhaust port is larger than necessary, the microwave energy may leak through the exhaust port, causing the unstable plasma, or giving the adverse effect on other electronic or human bodies. Accordingly, in the present invention, the exhaust port may be a gap between the bend leading edge and the bend trailing edge of the strip member, its gap being preferably ½ or less the wavelength of microwave to be used for the prevention of leakage of the microwave, and more preferably ¼ or less the wavelength.

With the second apparatus of the present invention, the source gases are exhausted through the gap left between the bend leading edge forming means and the bend trailing edge forming means in the film formation chamber, which is retained at a predetermined reduced pressure, in which the size of the gap must be designed so that a sufficient exhaust conductance can be obtained while the microwave energy radiated within the film formation chamber may not leak out of the film formation chamber.

Specifically, the microwave applicator means is disposed such that an electric field direction of the microwave propagating in the microwave applicator means and a face containing a central axis of supporting/conveying roller as the bend leading edge forming means and a central axis of supporting/conveying roller as the bend trailing edge forming means may not be in parallel to each other. That is, the waveguide is disposed such that a face containing a long side or a long axis of the waveguide connected to the microwave applicator means and a face containing central axes of the pair of supporting/conveying rollers may not in parallel.

When the microwave energy is radiated via a plurality of microwave applicator means into the film formation chamber, each microwave applicator means is necessary to dispose as previously described.

Further, the maximum size of opening width for the gap left in the longitudinal direction of strip member between the bend leading edge forming means and the bend trailing edge forming means is preferably ½ or less the wavelength of microwave, and more preferably ¼ or less the wavelength of microwave, in order to prevent the microwave energy from leaking through the gap.

With the second apparatus of the present invention, a plurality of the microwave applicator means are disposed opposed to each other, a special consideration must be taken so that if the microwave energy radiated from one microwave applicator means is received by the other microwave applicator means, the received microwave energy may not propagate to a microwave power source connected to the other microwave applicator means to thereby give an adverse effect such as the failure of the microwave power source or the abnormality on the oscillation of microwave.

Specifically, the microwave applicators are disposed such that both electric fields of the microwave travelling in the microwave applicator means may not be in parallel to each other. That is, the waveguides are disposed such that both faces containing long sides or long axes of the waveguides connected to the microwave applicator means may not in parallel to each other.

[Apparatus example]

Specific examples of the second apparatus of the present invention will be cited below with reference to the drawings, but the present invention is not necessarily limited to such apparatus examples.

Apparatus example 20

Figure 10:
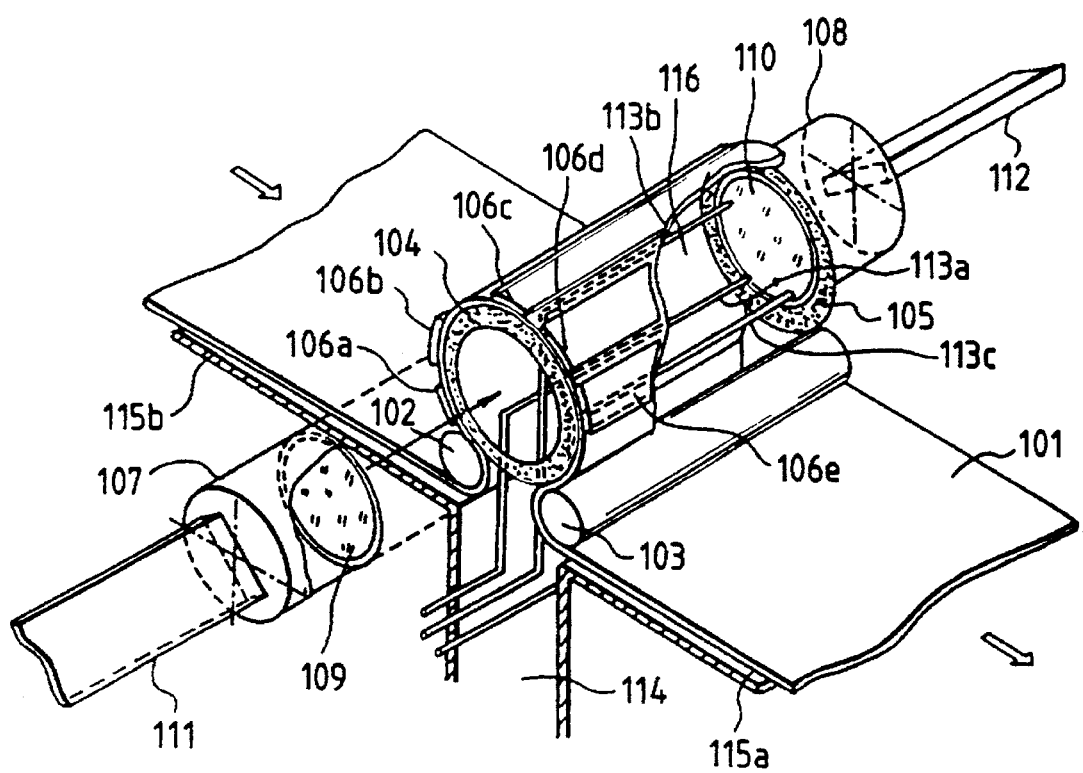
FIG. 10 is a typical schematic view showing one example of microwave plasma-assisted CVD apparatus according to the present invention.

FIG. 10 is a typical schematic perspective view showing a second microwave plasma-assisted CVD apparatus of the present invention.

101 is a strip member which is conveyed in a direction of the arrow (→) as shown, in which the film formation chamber 116 is continuously formed while retaining a columnar curved shape by supporting/conveying rollers 102, 103 and supporting/conveying rings 104, 105. 106a to 116e are temperature control mechanisms for heating or cooling the strip member 101 which can be separately operated.

In the apparatus example, a pair of microwave applicators 107, 108 are opposed to each other, each comprising microwave transparent member 109, 110 on its top end portion, in which square waveguides 111, 112 are disposed such that a face containing its long side may not vertical to a face containing central axes of supporting/conveying rollers, and both faces containing the long sides may not in parallel to each other. Note that the microwave applicator means 107 is separated from supporting/conveying ring 104 for the explanation in FIG. 1, but it is disposed in the direction of the arrow as shown when forming the deposited film.

113a, 113b and 113c are gas inlet conduits, into which a sources gases for the formation of deposited film are individually introduced via a microcontroller, not shown. For the application of a bias voltage for the control of plasma potential, the voltage may be applied via conductive wires to the gas inlet conduits from a DC or AC power supply. doing so, care must be taken so that the bias voltage may be only applied to the film formation space side by inserting an insulating coupling into a part of the gas inlet conduit. 114 is an exhaust pipe connected to an exhaust pump, not shown. 115a, 115b are isolation passages, which are provided for connecting the apparatus of the present invention to the vessel including other film forming means.

The supporting/conveying rollers 102, 103 contain a conveying speed detecting mechanism, and a tension detecting/adjusting mechanism (not shown) in order to hold the conveying speed of the strip member 101 constant and its bend shape constant.

The microwave power source, not shown, is connected to the waveguides 111, 112.

Figure 11:
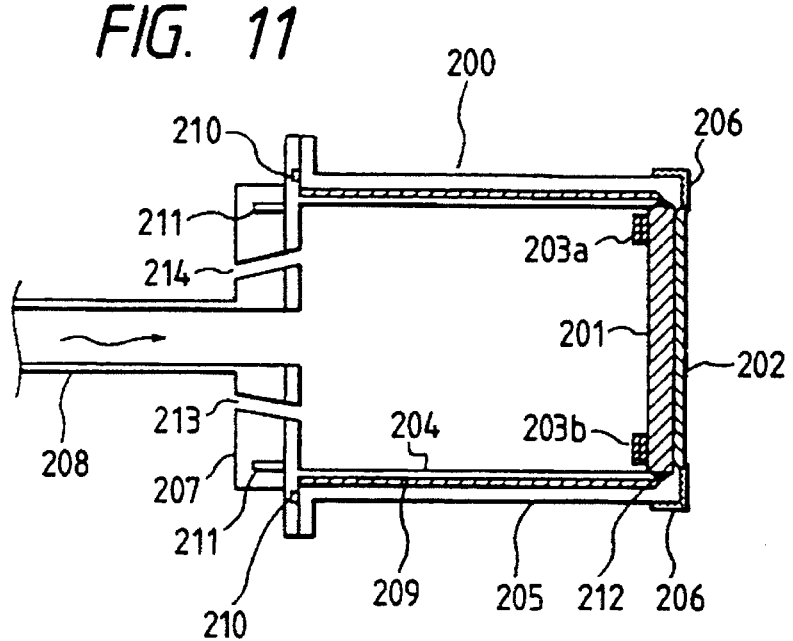
FIG. 11 is a schematic view showing one example of microwave applicator means usable for the apparatus of the present invention.

FIG. 11 is a typical cross-sectional view for depicting specifically microwave applicator means 107, 108.

200 is a microwave applicator, the microwave being transmitted from the microwave power source, not shown, via the square waveguide 208 as indicated by the arrow in the figure.

201, 202 are microwave transparent members, which are secured to an internal cylinder 204 and an external cylinder 205 by means of a metal seal 212 and a securing ring 206, respectively, so as to provide a vacuum sealing. The cooling medium 209 flows between the internal cylinder 204 and the external cylinder 205, with one end being sealed by an O-ring 210 to cool the entire microwave applicator 200 evenly. The cooling medium 200 is preferably water, freon, oil or cooling air. To the microwave transparent member 201 are secured circular disks 203a, 203b for the alignment of microwave. To the external cylinder 205 is connected a choke flange 207 formed with a groove 211. 213, 214 are cooling air inlet ports and/or outlet ports for cooling the interior of the applicator.

In this apparatus example, the internal cylinder 204 has a cylindrical inner shape, and its inner diameter and the length in the travelling direction of microwave designed to function as the waveguide. That is, its inner diameter is less than one wavelength of microwave at the cut-off frequency, and as great as possible in a range where plural modes are not permitted, and the length is preferably designed so that the standing wave may not occur internally. Of course, the inner shape of the internal cylinder 204 may be prismatic.

Apparatus example 21

This apparatus example describes an instance in which the apparatus shown in the apparatus example 20 is disposed in an isolation vessel.

The shape of the isolation vessel is not particularly limited if it can contain each component jig as shown in the apparatus example 20, but is preferably cubical, rectangular parallelopiped, and cylindrical. In the space left between the film formation chamber 116 and the isolation vessel is provided an auxiliary gas inlet conduit, through which a rare gas or $H_2$ gas for the adjustment of the pressure for preventing the discharge in the space is introduced. That space may be exhausted via the exhaust pump for the film formation chamber 116 concurrently, or may be connected to a separate exhaust pump.

Apparatus example 22

This apparatus example describes an apparatus having the same constitution as in the apparatus example 20, except that the shape of microwave applicator is prismatic. The cross-sectional dimensions of such a prismatic microwave applicator may or may not be the same as those of the waveguide to be used. Also, it is desirably as great as possible in a range where plural modes are not permitted at the used frequency of microwave.

Apparatus example 23

This apparatus example describes an apparatus having the same constitution as in the apparatus example 21, except that the prismatic microwave applicator in the apparatus example 22 is used.

Apparatus examples 24, 25

This apparatus example describes an apparatus having the same constitution as in the apparatus examples 20 and 21, except that the elliptical microwave applicator is used in place of the cylindrical mirowave applicator means.

Apparatus example 26

Figure 12:
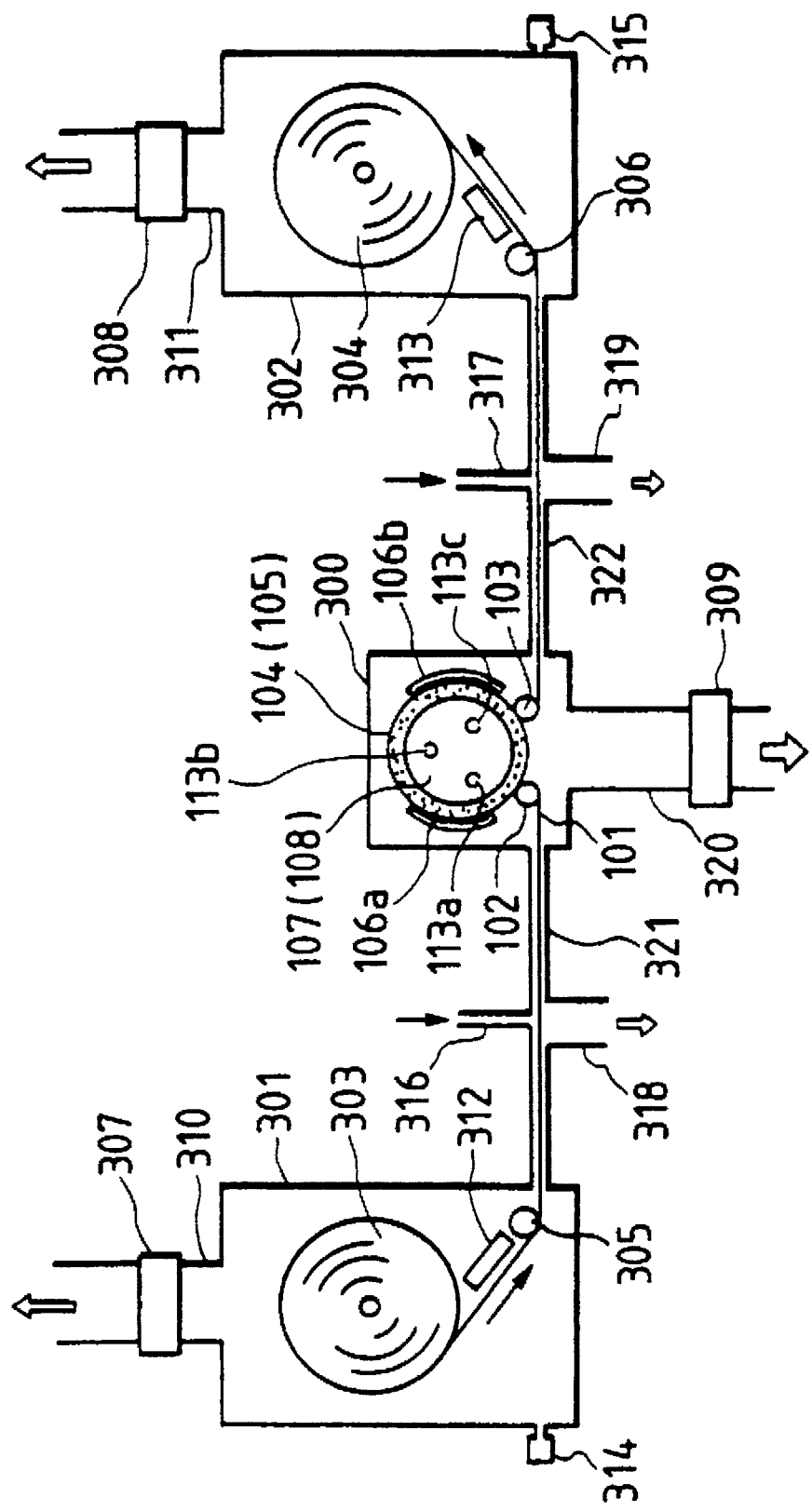
FIG. 12 is an overall schematic view showing one example of continuous microwave plasma-assisted CVD apparatus according to the present invention.

This apparatus example describes an instance where vacuum vessels 301, 302 for the delivery and take-up of the strip member 101 are connected via gas gates 321, 322 to the microwave plasma-assisted CVD apparatus for the formation of deposit film in the apparatus example 21, as shown in FIG. 12.

Note that this apparatus example comprises gas supply means constituted as shown in FIG. 16, but of course may comprise gas supply means constituted as shown in FIG. 17 or otherwise.

300 is an isolation vessel, 303 is a bobbin for the delivery of strip member, and 304 is a bobbin for the take-up of strip member. The strip member is conveyed in a direction of the arrow as shown. Of course, this conveying direction can be reversed. Within the vacuum vessels 301, 302, take-up and delivery means for a conformation paper useful for the surface protection of strip member may be provided. The material of the conformation paper is preferably a heat resisting resin of polyimide, TEFLON, and glass wool. 306, 307 are conveying rollers which are also used for the tension adjustment and the positioning of the strip member. 312, 313 are temperature adjusting mechanisms for use in preheating or cooling the strip member. 307, 308 and 309 are throttle valves for the adjustment of the displacement, and 310, 311 and 320 are exhaust pipes, each connected to an exhaust pump, not shown. 314, 315 are manometers, 316, 317 are gate gas inlet conduits, and 318, 319 are gate gas exhaust pipes, in which the gate gas and/or source gases for the formation of deposited film are exhausted through the exhaust pump, not shown.

Apparatus example 27

Figure 13:
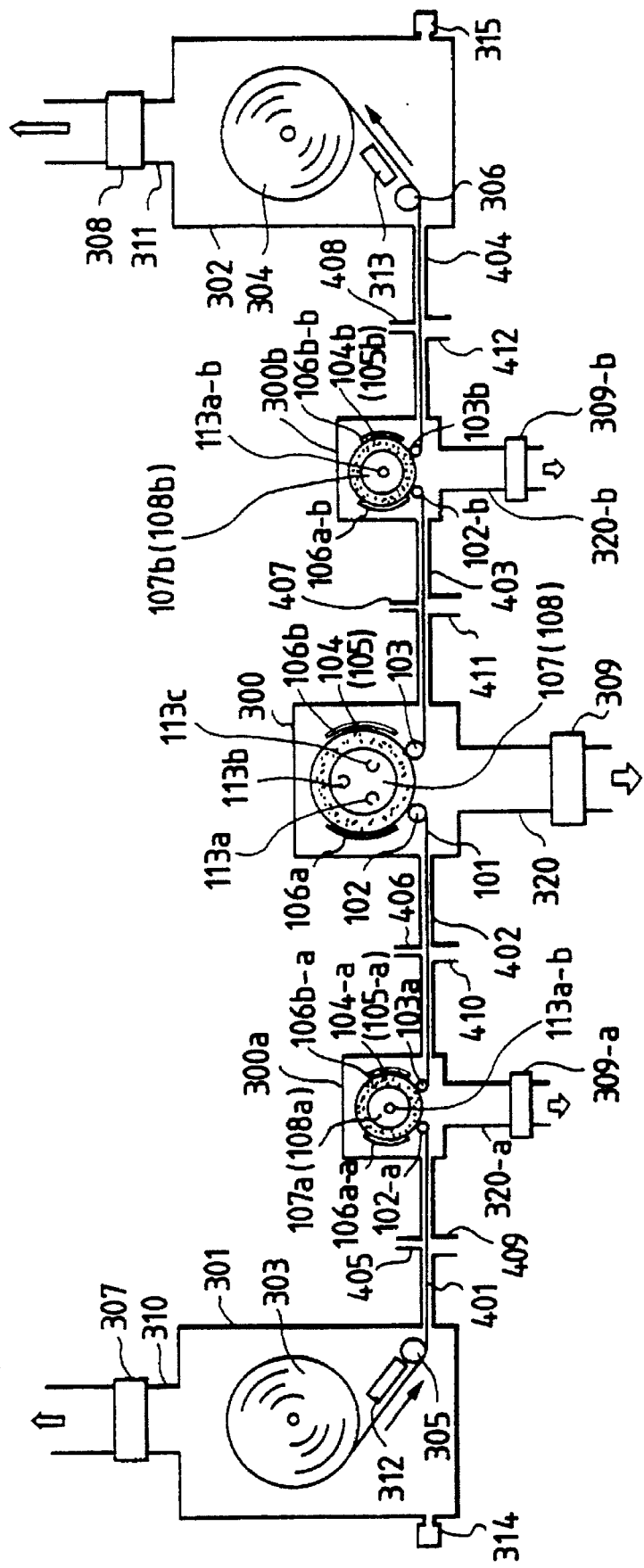
FIG. 13 is an overall schematic view showing one example of continuous microwave plasma-assisted CVD apparatus according to the present invention.

This apparatus example describes an instance where isolation vessels 300a, 300b containing additional two deposited film forming apparatuses with the microwave plasma-assisted CVD method are connected to the apparatus shown in the apparatus example 26 on both sides thereof, as shown in FIG. 13, for the fabrication of laminated devices. The two deposited film forming apparatuses thus connected each comprise one gas inlet conduit.

Note that the deposited film forming apparatus contained in the isolation vessel 300 in this apparatus example comprises gas supply means constituted as shown in FIG. 6, but of course may comprise gas supply means constituted as shown in FIG. 17 or otherwise.

In the figure, the numerals having the affix a or b indicate the mechanisms having fundamentally the same effects as those in the isolation vessels 300.

401, 402, 403, 404 are gas gates, 405, 406, 407, 408 are gas gate inlet conduits, and 409, 410, 411, 412 are gas gate exhaust pipes.

Apparatus examples 28, 29

This constitution is the same as in the apparatus examples 26, 27, except that the microwave applicator 201 is replaced with the prismatic microwave applicator used in the apparatus examples 22, 23.

Apparatus examples 30, 31

This constitution is the same as in the apparatus examples 26, 27 except that the microwave applicator is replaced with the elliptical microwave applicator used in the apparatus examples 24, 25.

Apparatus example 32

Figure 14:
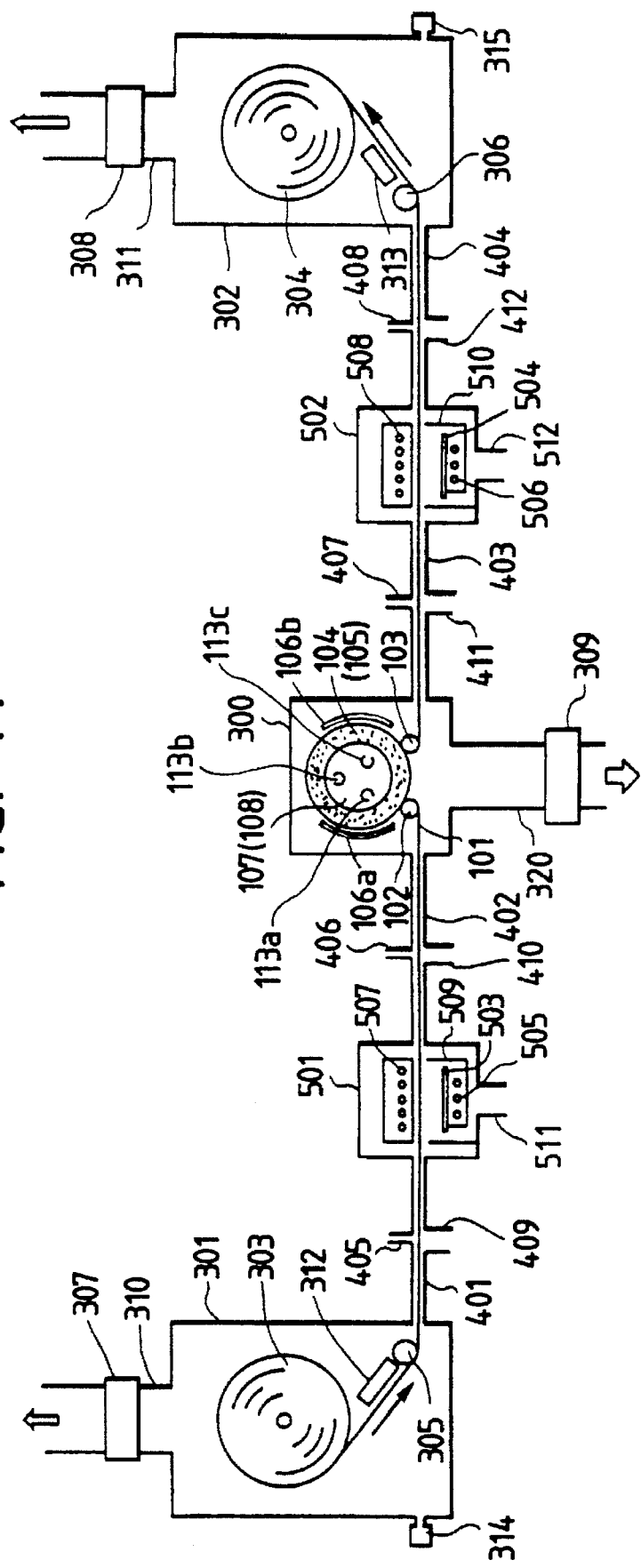
FIG. 14 is an overall schematic view showing one example of continuous microwave plasma-assisted CVD apparatus according to the present invention.

This apparatus example describes an instance where additional two RF plasma-assisted CVD apparatuses with the conventional method are connected to the apparatus shown in the apparatus example 26 on both sides thereof, as shown in FIG. 14, for the fabrication of laminated devices.

Note that this apparatus example comprises gas supply means constituted as shown in FIG. 16, but of course may comprise gas supply means constituted as shown in FIG. 17 or otherwise.

Here, 501, 502 are vacuum vessels, 503, 504 are cathode electrodes for the RH application, 505, 506 are gas inlet conduit heaters, 507, 508 are tungsten halogen lamps for the heating of the substrate, 509, 510 are anode electrodes, and 511, 512 are exhaust pipes.

Apparatus examples 33, 34

This apparatus example describes an apparatus where the microwave applicator is disposed on only one-side end face of the film formation chamber as a case of using a relatively narrow strip member in the apparatus examples 20, 21. However, in this case, a wire gauze, a punching board and a metallic thin plate for the prevention of leakage of microwave are provided on the other end face.

Apparatus example 35

An apparatus having isolation vessels 300, 300a, 300b for the formation of deposited film combined with a variety of microwave applicators as above described in the apparatus example 27, for example.

Also, this apparatus example is one in which two or three apparatuses shown in the apparatus example 27 are connected in series, and in which aforementioned deposited film forming means with the RF plasma-assisted CVD method may be combined in the series.

Also, this apparatus example is one in which two or more pairs of microwave applicators are disposed on both end faces of the film formation chamber in the apparatus example 20 or 21 to form a larger microwave plasma region, so that a relatively thick functional deposited film can be formed without changing the conveying speed of the strip member.

An example of semiconductor device suitably fabricated with the second method and apparatus of the present invention is a solar cell. A typical example of the layer constitution is shown in FIGS. 24A to 24D, and can be described in the same way as in the first method and apparatus of the present invention.

III. Third method and apparatus of the present invention

The present inventor made studies with efforts to solve the above-mentioned problems in a conventional semiconductor deposited film forming apparatus and accomplish the aforementioned objects of the present invention, and obtained such a view that the microwave plasma can be excited uniformly in a longitudinal direction of a microwave antenna within a film formation chamber, with its plasma potential controlled, in such a manner that the side wall of film formation chamber are constituted of continuously moving strip member, microwave antenna means is covered with a microwave transparent member and projected into the film formation chamber, a source gas for the film formation is introduced into the film formation chamber, which is retained at an appropriate pressure to cause the gas diffusion easily, the microwave is supplied to the microwave antenna means from a microwave power source, and a bias voltage is applied to bias applying means disposed separately from the strip member.

A third method and apparatus of the present invention has been completed as a result of making a further examination based on the above-mentioned view, and includes a method and apparatus for continuously forming a functional deposited film of large area with a microwave plasma-assisted CVD method with the gist as follows.

The third method of the present invention is as follows. That is, a method for continuously forming a functional deposited film of large area with a microwave plasma CVD method characterized by continuously moving a strip member in a longitudinal direction, while forming halfway a columnar film formation space which can be retained substantially in the vacuum with the moving strip member as side wall, introducing individually more than at least one kind of source gas for the formation of deposited film having different compositions via a plurality of gas supply means into the film formation space, at the same time exciting a microwave plasma within the film formation space by causing the microwave energy to be radiated in all directions perpendicular to a propagating direction of the microwave via microwave antenna and the microwave power to be input into the film formation space, and forming the deposited film having its composition controlled on a surface of the strip member moving continuously by constituting the side wall exposed to the microwave plasma.

Further, a third apparatus of the present invention is as follows. That is, an apparatus for continuously forming a functional deposited film of large area on a continuously moving strip member with a microwave plasma-assisted CVD method, comprising a columnar film formation chamber formed with the strip member as side wall and capable of substantially holding the interior in the vacuum, via bend forming means for bending the strip member halfway while continuously moving the strip member in a longitudinal direction, a microwave coaxial line for supplying the microwave power to excite the microwave plasma within the film formation chamber, central conductor separating means for separating a central conductor of the microwave coaxial line from the microwave plasma, while transmitting the microwave power supplied from the coaxial line, exhaust means for exhausting the film formation chamber, at least more than one gas supply means for introducing a source gas for the film formation into the film formation chamber, and temperature control means for heating and/or cooling the strip member, characterized in that the deposited film with its composition controlled is formed on a surface of the strip member which forms the side wall of the film formation chamber while moving continuously on the side exposed to the microwave plasma.

The third method and apparatus of the present invention are different in the form of introducing the microwave from the first and second method and apparatus, but identical in the other forms.

[Experiments]

The following experiments were made to investigate the excitation condition of microwave plasma to form a high quality functional deposited film uniformly on the strip member, using the third apparatus of the present invention.

Note that the source gas was introduced through three gas inlet conduits in the experiment.

Experimental example 1C

In this experimental example, the stability of plasma, the film thickness distribution, and the film quality distribution were investigated when the inner diameter of columnar film formation chamber was changed.

Specifically, five kinds of samples were fabricated according to the film formation conditions as shown in Table 48 by changing the inner diameter of film formation chamber, using an apparatus in the apparatus example 36 as will be described later.

Table 49 shows the evaluation results for the plasma state when the inner diameter is changed variously.

In the case where the inner diameter of film formation chamber was 180 mm$\phi$ and 120 mm$\phi$, as shown in Table 49, the plasma was excited in the same conditions as shown in Table 48, except that the microwave power was 2500 W. As a result, it was indicated that the discharge was stabilized when the inner diameter of film formation chamber was 120 mm$\phi$, while the discharge was excited but too unstable for the practical use when it was 180 mm$\phi$.

Next, the characteristics evaluation were made with a following evaluation method for samples 2-1 to 2-4.

The film thickness of formed deposited film was calculated from the peak position of multiple interference fringes in a spectral reflectance curve measured using MCPD-200 type spectroreflectometer made by Union Technologies, Co. Ltd. The measurement positions for the film thickness in respective samples were at every 50 mm along the width direction (x) and the longitudinal direction (y) of the substrate. Then, the Cr thin film was deposited about 70 Å on this A-Si:H film to form an ohmic electrode. The dark conductivity ($\sigma_d$) was obtained from a flowing current value while the voltage was applied between the ohmic electrode and an SUS430BA (0.2 mm thick) thin plate used as the strip member in the darkness, and the photo conductivity ($\sigma_p$) was obtained from a flowing current value by applying a He—Ne laser beam from the Cr electrode side while the voltage was applied likewise, whereby the evaluation for respective characteristics distributions was made. Note that the irradiation intensity of He—Ne laser beam into the A-Si:H film was $4\times10^{15}$ photons/cm$^2$·sec in consideration of the absorption into the Cr electrode.

Figure 33A:
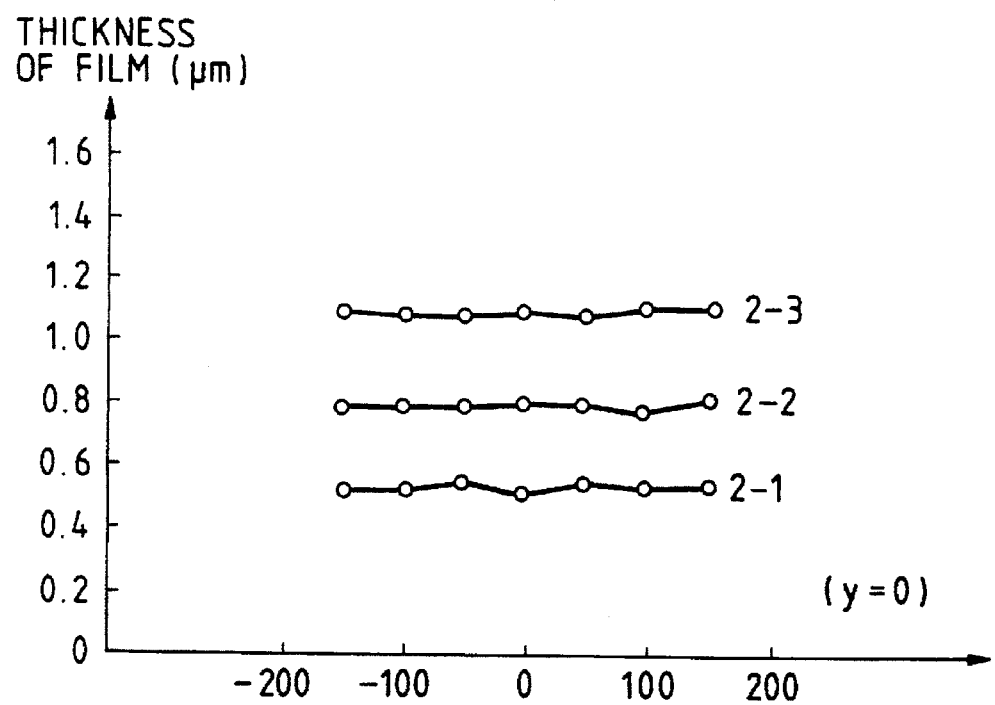
FIGS. 33A to 34B are graphs showing the evaluation example of film forming results.
Figure 33B:
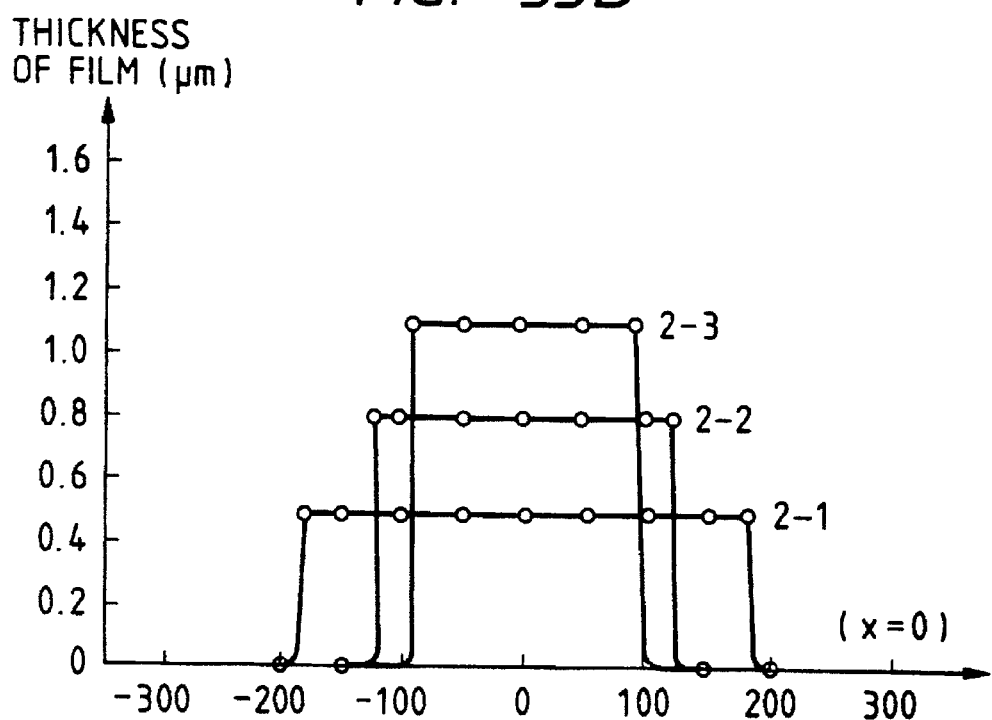
Figure 34A:
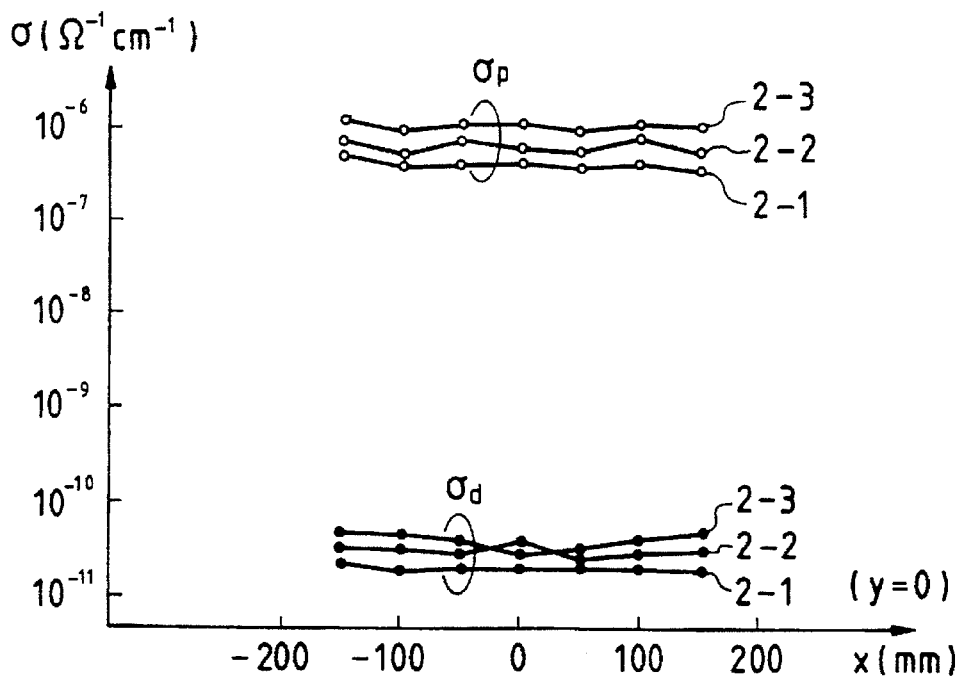
Figure 34B:
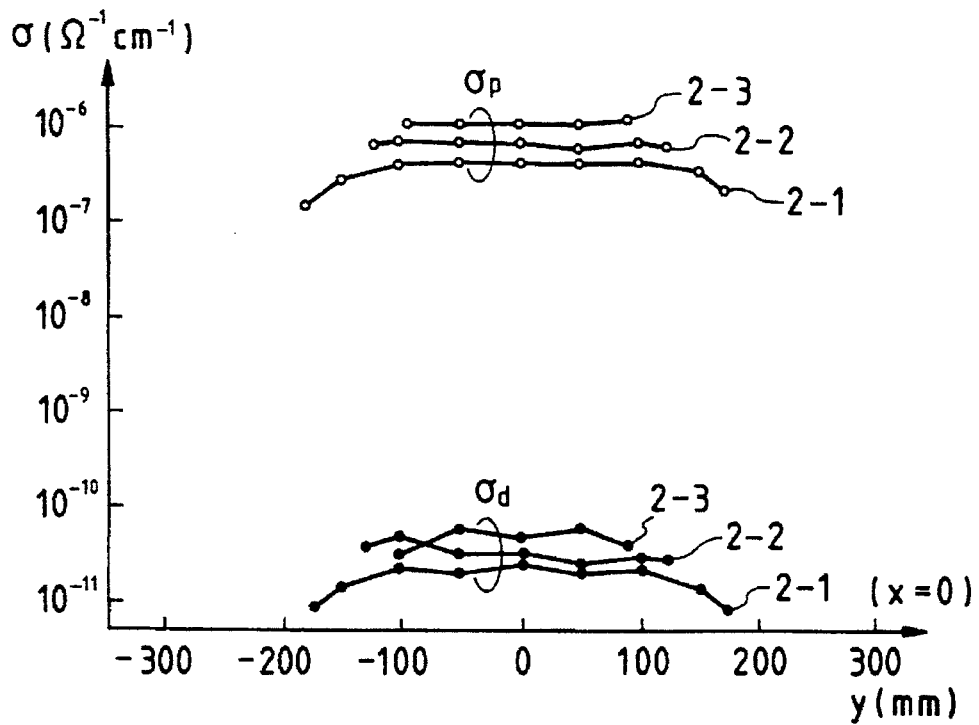
Figure 35:
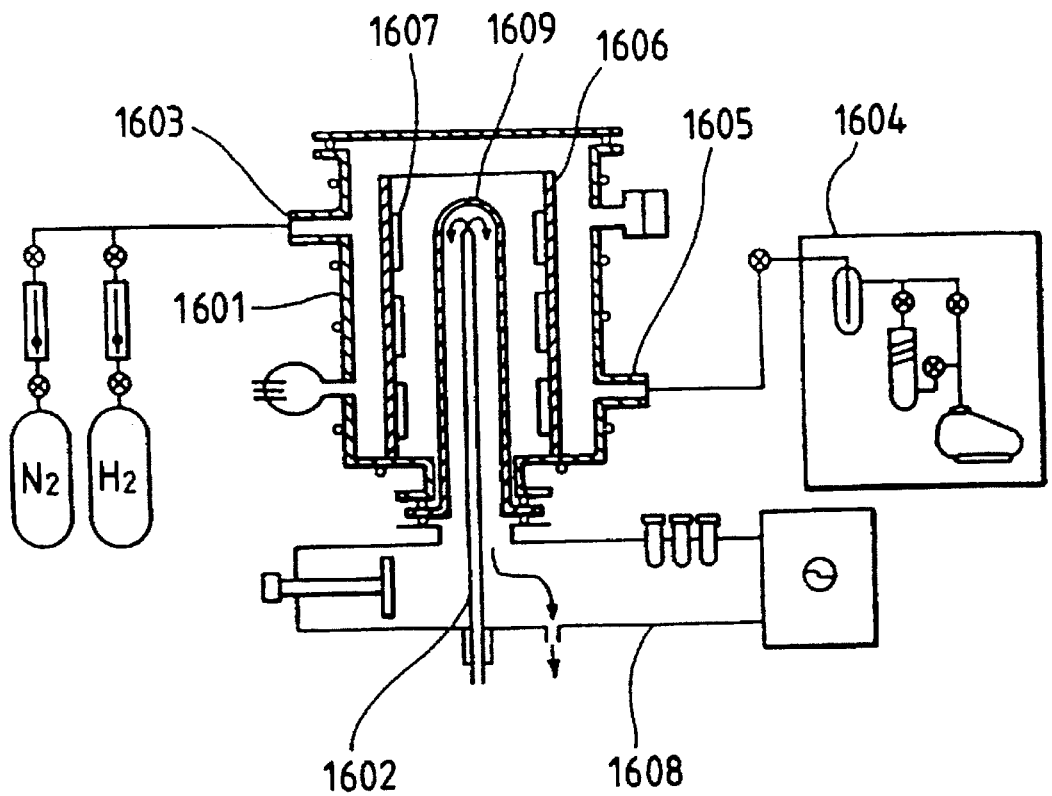
FIGS. 35 and 36 are typical views of an microwave plasma-assisted CVD apparatus with a conventional antenna method.
Figure 36:
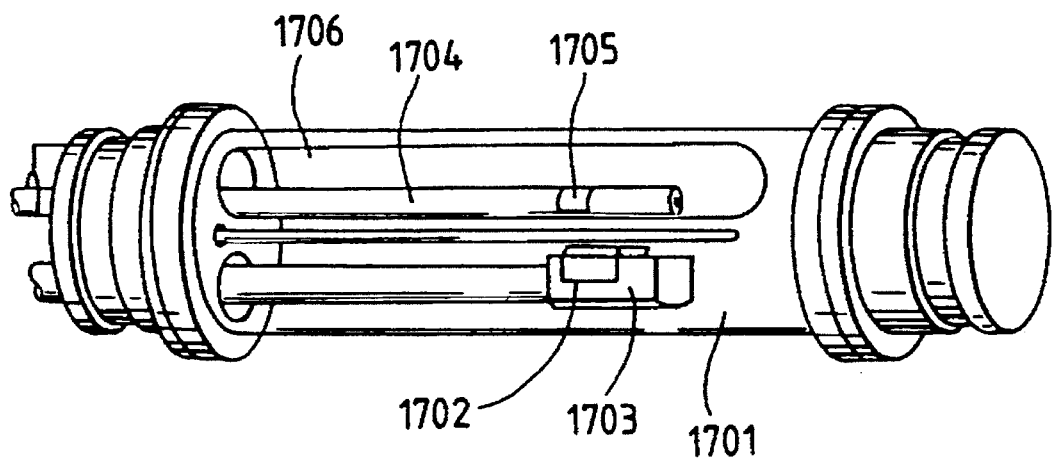

FIG. 33A shows the film thickness distribution in the x direction for samples 2-1 to 2-3, FIG. 33B shows the film thickness distribution in the y direction, FIG. 34A shows the distribution of $\sigma_d$, $\rho_p$ in the x direction, and FIG. 34B shows the distribution of $\sigma_d$, $\sigma_p$ in the y direction, based on the measurement results. Where x=0 is a center of strip member in the width direction, and y=0 is a center of strip member in the longitudinal direction when the strip member is expanded.

From the measurement results, it was found that in the width direction of the strip member, the film thickness and the film quality are nearly uniform, but the deposited film thickness decreases with increasing internal pressure of film formation chamber, while in the longitudinal direction of the strip member, the film thickness is retained uniform, but the degradation of the characteristics could be clearly seen for sample 2-1. That is, the formed A-Si:H film has a tendency that its characteristics may degrade with larger inner diameter of the film formation chamber.

Note that for sample 2-4, the plasma density is significantly higher as compared with other samples, because the strip member is very close to the same axis, so that the substrate temperature is 350° C. or more, with the exfoliation of the film after the film formation, resulting in uncountable evaluation.

Experimental example 2

Figure 18:
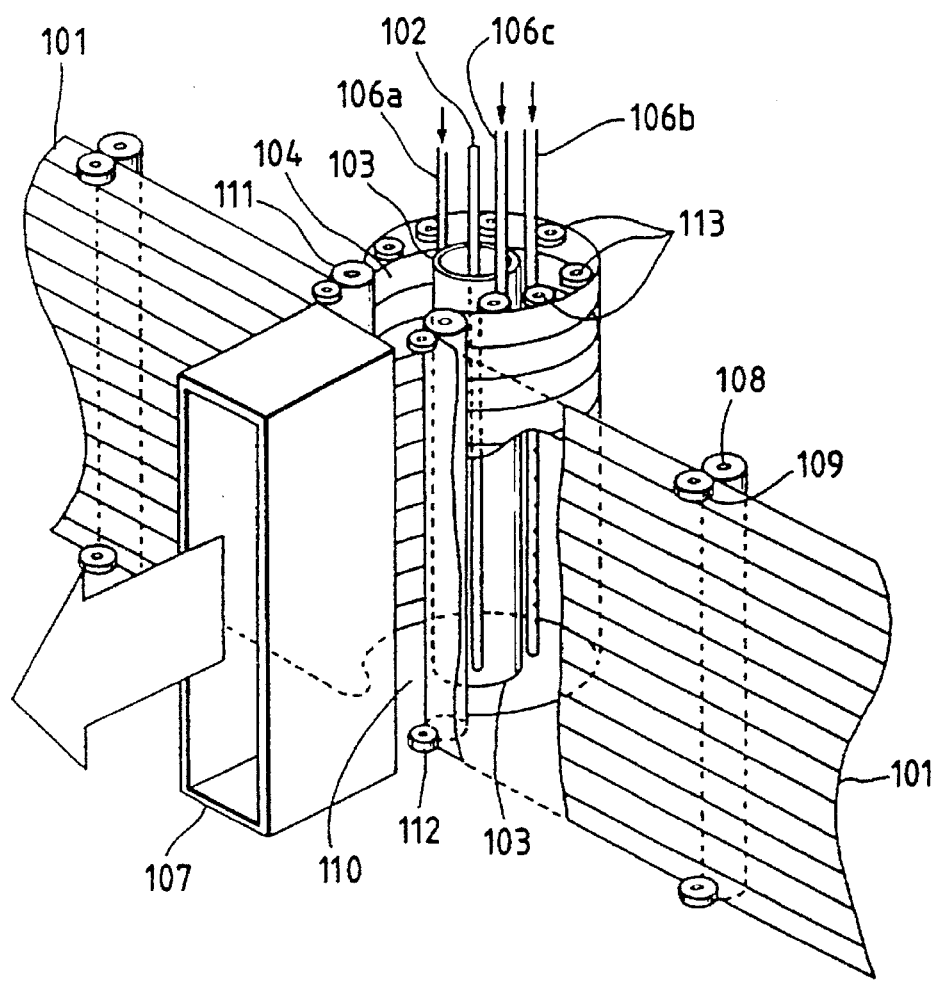
FIG. 18 is a typical view for explaining one example of a film forming chamber and its peripheral mechanism in the apparatus of the present invention.

In this experimental example, the deposited film was formed in the conditions as shown in Table 50, using the third apparatus of the present invention (see the apparatus example 36 as will be described later) as shown in FIG. 18 and a conventional RF glow discharge resolving apparatus (not shown), the variation of compressive stress in the deposited film was examined by measuring the skewness of substrate before and after the formation of deposited film. The Young's modulus of stainless steel for the strip member was $2.04\times10^4$ [kg/mm$^2$], and the coefficient of linear expansion was $11.9\times10^{-6}$[°C.$^{-1}$].

As a result, no exfoliation of the deposited film was seen in either apparatus. The measurement of the compressive stress built up in the deposited film in practice was 32 kg/mm$^2$ for the conventional apparatus, and 9 kg/mm$^2$ for the apparatus of the present invention as shown in FIG. 18, which indicated that the stress relaxation of about 1/3.5 was accomplished.

Experimental example 3C

In this experimental example, for the method of providing a pressure difference inside or outside the film formation space, an experiment of depositing the A-Si:H film was made in the same fabrication conditions of Table 50 except that the width of slit opening was differently changed, using an apparatus as shown in FIG. 18.

The results and evaluation of the experiment were shown in Table 51.

Note that the effective conductance $C_{ef}$[1/sec] in the table was obtained from the flow converted from [sccm] into [Torr·1/sec] and divided by a differential pressure $\Delta P$ [Torr] between the inside and the outside of film formation chamber.

From the results of Table 51, it has been found that the pressure difference between the inside and the outside of film formation chamber is preferably more than 9 mTorr in order to prevent the leakage of plasma.

Experimental example 4C

Figure 23A:
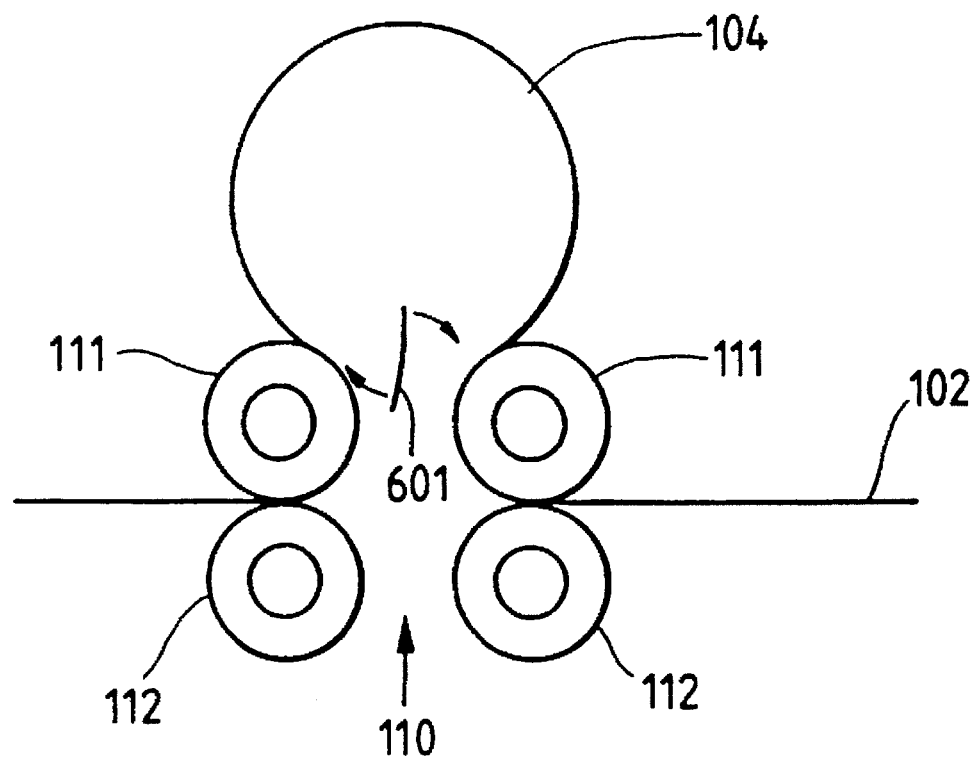
FIGS. 23A and 23B are typical views for explaining the operation of an exhaust port in the film forming chamber.
Figure 23B:
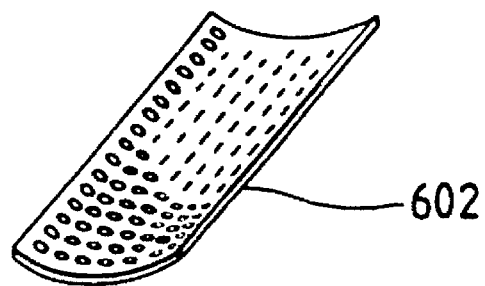

In this experimental example, for the method of suppressing the abnormal discharge by holding the pressure outside the film formation space low, a discharge experiment was made in the same fabrication conditions as shown in Table 50 except that the pressure outside the film formation chamber was differently changed, using an apparatus as shown in FIG. 18, and allowing the effective exhaust speed to be changed by interposing a throttle valve as shown in FIG. 23 in a vacuum exhaust port and connecting an oil diffusion pump. The results are shown in Table 52.

From these results, it is indicated that if the pressure of isolation vessel outside the film formation space increases substantially up to a pressure inside the film formation space, the abnormal discharge or discharge concentration occurs, so that less adherent film may deposit. Accordingly, it has been found that the pressure outside the film formation space is preferably 6 mTorr or less in order to prevent the leakage of plasma.

Outline of experimental results

With the third method and apparatus of the present invention, since the stability and uniformity of microwave plasma are maintained with complex interrelations between various parameters such as the shape of microwave applicator, the kind and allocation of waveguide to be connected, the pressure within the film formation chamber in forming the film, the microwave power, the degree of containment for the microwave plasma, or the volume and shape of discharge space, it is difficult to determine the optimal conditions with a single parameter, but the following trend and condition range have been found from the results of this experiment.

With the method of the present invention, the inner diameter of the film formation space is preferably 60 mm$\phi$ to 120 mm$\phi$. The deposited film is formed on a concave bent surface of the strip member heated up to a desired film formation temperature and bent like the column, then expanded in a plane and cooled, so as to relax the stress built up in the deposited film.

Also, if the pressure difference between the inside and the outside of the film formation space is made 9 mTorr or more by changing the opening width of slit, the leakage of plasma through the film formation space can be prevented. Further, with the external pressure of the film formation space being 6 mTorr or less, it has been found that the deposited film is prevented from degrading in the film quality due to the abnormal discharge.

In the following, the method and apparatus of the present invention will be described in detail on the basis of the facts found from the previous [Experiments].

The method of the present invention can be objectively distinguished from the conventional deposited film forming method in that the film formation space is columnar, its side wall serve as the structural member while being continuously moving, and also serve as the carrier for the formation of deposited film.

Here, the function as the structural member is a function of isolating physically and chemically the atmosphere space for the film formation or the film formation space from the atmosphere space irrelevant to the film formation, and specifically, it is a function of, for example, forming the atmosphere having different gas composition and state, limiting the gas flowing direction, and further forming the atmosphere having different pressure difference.

That is, the side wall of the columnar film formation space is formed by bending the strip member, the source gas for the formation of deposited film and the microwave power is supplied into the film formation space from either one of opposed two end faces, the source gas is exhausted through the gap left on a part of the side wall, the plasma is contained within the film formation space, and the functional deposited film is formed on the strip member making up the side wall, whereby the strip member itself fulfills an important function as the structural member for isolating the film formation space from the external atmosphere space not involved in the film formation, as well as serving as the carrier for the formation of deposited film.

Accordingly, the atmosphere outside the film formation space constituted with the strip member as the side walls is totally different from the inside of the film formation space in the gas composition and state, the pressure, etc.

On the other hand, with the conventional deposited film forming method, the carrier for the formation of deposited film is disposed within the film formation space for forming the deposited film, and only serves as the member for allowing the precursor for the formation of deposited film produced in the film formation space to be deposited, but does not serve as the structural member constituting the film formation space as in the method of the present invention.

Also, with the conventional RF plasma-assisted CVD method or sputtering method, the carrier for formation of deposited film may be also used as the electrode to generate and maintain the discharge but is insufficient to contain the plasma, with insufficient isolation from the external atmosphere space not involved in the film formation, and thus it is difficult to mention that it functions as the structural member.

In brief, with the method of the present invention, the strip member capable of serving as the carrier for the formation of functional deposited film is used for the side wall of the film formation space to exhibit the function as the structural member, and allow for the continuous formation of functional deposited film on the strip member.

From the examination results of the experiments made by the present inventors, an apparatus currently available on the market as the plasma-assisted CVD apparatus has a quite low yield, such as at most about 15%, by which the source gas for the film formation deposited on the substrate within the film formation chamber can be used in practice, whether the RF or the microwave is used.

From the examinations on the assumption that this point largely depends on the shape or structure of film formation space, the present inventors have found that if the deposited film is formed on an inner surface of a peripheral wall of the film formation space is constituted of the substrate, the yield can be greatly improved. That is, the strip member is used as the substrate, and is continuously moved while the side wall of the film formation chamber is formed by the strip member. And a gap is provided on a part of the side wall to exhaust out of the film formation chamber. The shape of the film formation chamber is preferably columnar, and more preferably cylindrical. To improve the yield as the deposited film, it is preferable to make larger the ratio of the area of side wall constituted by the strip member to the total area of wall surface forming the film formation space. That is, the specific shape of the columnar film formation space to be formed of the strip member is desirably one in which the ratio of the length of the side wall (the width of strip member) to the inner diameter of opposing both end faces is as large as possible. By doing this, a desired functional deposited film can be formed on the inner face of the side wall at high yield.

With the method of the present invention, in order to avoid the exfoliation of deposited film from the substrate under the influence of a temperature difference from at the film formation or the humidity when the deposited film formed on the substrate is taken out in the atmosphere, a method is preferably used in which the strip member is bent almost columnar and subject to a mechanical compressive stress beforehand, the deposited film is formed on a concave bent surface of the strip member which is bent columnar, at a desired film formation temperature, and the strip member is expanded in a plane or a convex plane on the side where the deposited film is deposited, and cooled slowly while converting the mechanical compressive stress applied beforehand into the mechanical tensile stress, whereby the thermal compressive stress caused by a difference between expansion coefficients of the strip member and the deposited film is relaxed by the mechanical tensile stress.

The material of the strip member having a linear expansion coefficient greater than that of the deposited film can be used to allow for the above mentioned stress relaxation method.

To avoid the exfoliation of the deposited film, some measures have been conventionally taken from the standpoint of strengthening the adherence force between the substrate and the deposited film, but it is difficult to mention that they are sufficient because the substrate is required to have a strength greater than a certain value, and if the substrate is made of a relatively soft material such as polyimide or PET (polyethyleneterephthalate), creases may arise.

In particular, the described method of the present invention is effective in solar cells fabricated by laminating a plurality of deposit films, because the compressive stress may be augmented with the lamination of deposit films.

With the method of the present invention, to excite and maintain the plasma efficiently, the outer diameter of microwave transparent member is preadjusted and preselected so that the inner diameter of equivalent external conductor for the coaxial line including the plasma within the film formation space may be equal to the inner diameter of external conductor for the coaxial line outside the film formation space, with the impedance for the microwave in accordance with a complex dielectric constant of plasma.

Here, the term "equivalent" is used because the inner diameter of external conductor containing the plasma may vary under the conditions such as the kind and flow of source gas, the pressure of film formation chamber, and the microwave power as a result of the practical discharge experiment, which affects not only the real part of dielectric constant for the plasma but also the imaginary part or the absorptance, causing the phase inversion, so that the value of the outer diameter can not be theoretically predicted. Accordingly, the inner diameter of external conductor formed of the plasma can be confirmed with the experiment.

Conventionally, in microwave apparatuses having the mismatching of impedance or strong reflective surfaces, a method is used in which the other reflected wave having the same intensity as that of the reflected wave produced at the reflective surface and the inverted phase from the reflected wave is generated by a tuner, and these two reflected waves are caused to interfere with each other so as to match the impedance, but when the matching is made with the interference of reflected waves, there are some occasions where large standing waves may occur between the reflective surface and the tuner, thereby causing a large loss of Joule heat.

Accordingly, to eliminate this loss of Joule heat, it is necessary that the distance between the reflective surface and the tuner is as least as possible, and preferably zero. That is, with the microwave antenna means of the present invention, it is difficult to match the impedance at the interface of the film formation chamber in the state before the start of discharge, because the dielectric constants inside and outside the film formation chamber are both 1 and the inner diameter of external conductor for the coaxial line is larger in the inside, while in the state after the start of discharge, the plasma having a dielectric constant of 1 is filled within the film formation chamber, with the equivalent inner diameter being smaller, whereby if the outer diameter of microwave transparent member is appropriately selected, the inner diameters of external conductor for the coaxial line inside and outside the film formation chamber coincide to realize a matchable situation. In this way, the matching of the impedance is possible in the state after the discharge.

With the method of the present invention, the film formation space is formed of the strip member, and the conditions are set such that the gas composition and its state outside the film formation space are different from those inside the film formation space. For example, the gas composition outside the film formation chamber may be that of the atmosphere not directly involved in the formation of deposited film, or the atmosphere containing the source gas exhausted from the film formation space. Of course, the plasma is contained within the film formation space, but in order to improve the stability and reproducibility of the plasma and prevent the film deposition on unnecessary portions, it is effective to prevent the plasma and the microwave from leaking out of the film formation chamber and suppress the abnormal discharge.

Since the microwave power is input in the TEM mode in the apparatus of FIG. 18, the leakage of the microwave can be automatically suppressed due to its mode, when the width of the opening portion is narrow, but when the width of the opening portion is about ½ the wavelength of microwave, it is necessary to provide microwave leakage preventing means. That is, a conductive punching board having a hole diameter of about 1/20 the wavelength of microwave as shown in FIG. 6 may be disposed in the gap portion formed in a longitudinal direction of the strip member.

With the method of the present invention, as alternative means ef having the same effects as those of retaining the outside of the film formation chamber at a pressure of 6 mTorr or less, the abnormal discharge may be suppressed by passing a gas (He or $H_2$) having a small electrolytic dissociation section into the outside of the film formation space. Of course, the gas having the small electrolytic dissociation section may be passed therethrough while retaining the outside of the film formation space at a pressure of 6 mTorr or less.

That is, with the method of the present invention, the yield of the source gas for the formation of deposited film is improved and the film formation speed can be greatly enhanced in such a manner that the plasma is contained with the film formation space and the abnormal discharge outside the film formation space is suppressed, so that the production of solar cells can be industrialized.

With the third method of the present invention, to form the deposited film uniform in the film thickness and the film quality, the microwave antenna means is penetrated into the film formation space so as to be in parallel to the strip member constituting the side wall of the film formation space, and the microwave power is input into the film formation space via the microwave antenna means which radiates the microwave in all directions perpendicular to a propagating direction of the microwave, such as the coaxial line or resister coil, so as to excite the plasma. Also, to sustain the discharge of constant plasma density over long time, the microwave antenna means is covered with the microwave transparent member and totally isolated from the plasma.

With the method of the present invention, the microwave antenna means is disposed in parallel to the strip member, in which it is preferable that the distance between the strip member and the microwave antenna means is relatively short and is also held constant in a longitudinal direction of the antenna. By doing this, the antenna means of which the microwave power is input almost uniformly in a width direction of the strip member constituting the side wall is disposed so that the density distribution of the plasma can be made uniform.

In particular, when the central conductor is a coaxial line isolated from the plasma in the microwave transparent member as previously described, there is a threshold at which the microwave power absorbed into the plasma will be saturated depending on the kind and flow of gas introduced into the film formation space and converted into the plasma with the microwave power, if the microwave power input via the coaxial line into the film formation space is increased. Accordingly, because the greater the microwave power input into the film formation space, the larger the saturated area of the absorbed power, the same power as the threshold at which the absorbed power has been saturated will be input into the film formation space from each portion of the antenna in the longitudinal direction, resulting in the uniformity of plasma density, or the uniformity in the film thickness and film quality over large area.

However, if such a large microwave power is input into the film formation space, the electrical characteristics of formed deposited film may degrade, the heat may be generated within the microwave transparent member, or the microwave transparent member may be damaged with the temperature rise caused by the exposure to the plasma, so that the microwave power to be input into the film formation space is restricted. In such a case, as the microwave power input into the film formation space is restricted, the saturation of absorbed power as above described, and thus the uniformity of the plasma density, will not occur. That is, because the microwave power input from the microwave antenna means disposed in the interior of the film formation space into the film formation space decreases gradually along the propagating direction of the microwave, the plasma density will have spatially ununiform distribution.

In order to avoid this and form the deposited film uniform in the film thickness and the film quality over large area, a frusto-conical or conical microwave transparent member having the inner diameter gradually increasing so as to compensate for gradually decreasing microwave power input into the film formation space along the propagating direction of microwave is disposed along the propagating direction of the microwave, so that the distance between the strip member and the microwave antenna means may be narrower along the propatating direction of microwave.

As above described, the method of the present invention permits the formation of deposited film uniform in the film thickness and film quality over large area, irrespective of the input microwave power.

With the method of the present invention, an inner wall face of the film formation space has desirably an electric conductivity necessary for the bias current having a desired current density to flow. To this end, the strip member is preferably made of a conductive material, but requires that at least the face directed to the film formation space is treated for the electric conductivity.

With the method of the present invention, when at least two or more kinds of source gases for the formation of deposited film having different compositions are separately introduced from a pluralilty of gas supply means into the film formation space, the source gases for the formation of deposited film from the gas supply means are preferably discharged uniformly in a width direction of the strip member and in one direction toward the strip member in the vicinity of the gas supply means. That is, gas discharge ports opened in respective gas supply means are desirably directed to different directions from each other so that respective source gases for the formation of deposited film having different compositions may not be mixed immediately after being discharged from the gas supply means.

And each gas supply means is disposed in parallel to the strip member constituting the side wall.

The number of gas supply means for use with the method of the present invention is desirably at least equal to or more than the number of constituent elements in a functional deposited film to be formed, in which the functional deposited film with controlled composition can be formed by appropriately changing the compositions of source gases for the formation of deposited film to be discharged from respective gas supply means.

It is desirable that the respective gas supply means are disposed within the columnar film formation space so that the source gases for the formation of deposited film to be discharged therefrom may be assuredly excited and decomposed. In order that the formed deposited film may have a desired composition distribution, it is desirable that the allocation of the gas supply means may be appropriately adjusted. Further, to adjust and control the flow path of the source gas for the formation of deposited film within the columnar film formation space, a straightening vane may be provided with the columnar film formation space.

The functional deposited film with controlled composition to be formed in the third method of the present invention may be the same as in the first and second methods of present invention described before, with the same gases for the formation of deposited film.

With the method of the present invention, in order to excite and maintain uniformly and stably the plasma with the columnar film formation space, the parameters such as the shape and capacity of the film formation space, the kind and flow of source gas introduced into the film formation space, the pressure within the film formation space, the quantity of microwave power input into the film formation space, and the alignment of microwave are mutually connected organically although there are respective optimal conditions, and can not be uniquely defined, in which preferred conditions should be set properly.

In the following, the third apparatus of the present invention will be further described in detail. The third apparatus of the present invention can take the same form as the first and second apparatus of the present invention as previously described, except for the form of introducing the microwave.

With the third apparatus of the present invention, in order that the strip member may function as the structural member, the outside of the film formation chamber may be the atmosphere, but if the atmosphere flowing into the film formation chamber affects the characteristics of functional deposited film to be formed, atmosphere flow preventing means may be appropriately provided. Specifically, a mechanical sealing structure such as O-ring, gasket, helicoflex or magnetic fluid is provided, or it is desirable to dispose an isolation vessel for forming the effective diluted gas atmosphere having little influence on the characteristics of formed deposited film, or the proper vacuum atmosphere, on the periphery. In the mechanical sealing structure, special consideration must be taken so that the sealing state can be maintained by the strip member which is continuously moving. When the deposited film is laminated continuously on the strip member in a concatenation of the apparatus of the present invention and a plurality of other deposited film forming apparatuses, each apparatus should be concatenated using gas gate means and so on. Also, when a plurality of apparatuses of the present invention are concatenated, the isolation vessel may be singly provided or provided on each apparatus, because the film formation chamber of each apparatus is in a separate film formation atmosphere.

With the method of the present invention, the external pressure of the film formation chamber may be reduced or increased, but if the strip member is largely varied due to a pressure difference from the film formation chamber, adequate auxiliary structural means may be disposed.

The auxiliary structural member is desirably a wire rod or thin plate in which the substantially same shape as the side wall of the film formation chamber is constituted of a metal, ceramics or reinforced resin having adequate strength. A contact portion of the strip member making contact with and supporting a face of the auxiliary structural member on the side unexposed to the microwave plasma is substantially concealed by the auxiliary structural member, in which the deposited film is little formed thereon. Accordingly, the projected area of the auxiliary structural member onto the strip member is desirably designed to be as small as possible.

By placing the auxiliary structural member into close contact with the strip member, and rotating or moving it in synchronism with the conveying speed of the strip member, mesh patterns applied on the auxiliary structural member can be formed on the strip member.

The material of the strip member for use with the apparatus of the present invention is one of having the flexibility capable of continuously bending the strip member, and in which it is desirable to form a smooth shape at a bend leading edge, a bend trailing edge and a halfway bend portion. Also, it is preferable to have the strength not to cause the deflection or torsion, when the strip member is continuously conveyed.

Specifically, examples include a metallic thin plate and its complex such as stainless steal or aluminum and its alloy, iron and its alloy, copper and its alloy, and the coated on the surface with a metallic thin film of different material with the sputtering method, the deposition method or the plating method; further, a heat resisting resinous sheet such as polyimide, polyamide, polyethylene terephthalate or epoxy, and their complex with glass fiber, carbon fiber, boron fiber or metallic fiber having its surface treated with metal simplex, metal alloy, or transparent conductive oxide (TCO) for the conductivity with the plating, the deposition, the sputtering or the application method; a strip member thus constituted having its conductive surface partially formed with an insulating thin film such as $SiO_2$, $Si_3N_4$, $Al_2O_3$, AlN or heat resisting resin.

The thickness of the strip member is desirably as thin as possible in consideration of the cost and storage space, as long as it can exhibit the strength at which the bend shape formed in conveying with the conveying means is maintained.

Figure 20:
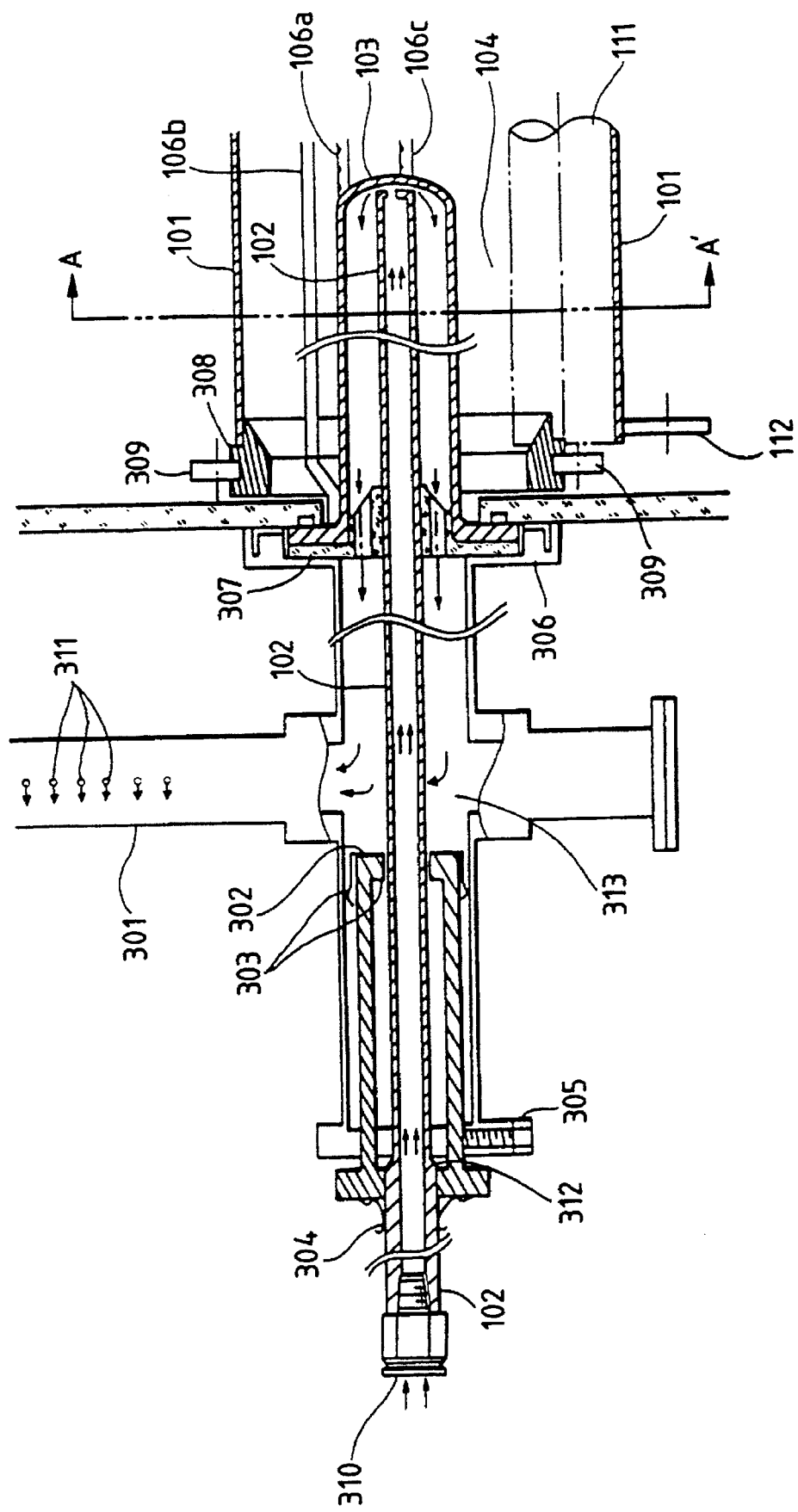
FIG. 20 is a typical view for explaining a microwave coaxial line.

However, with the apparatus of the present invention, bend edge face support rings 308 are slightly in contact with the periphery of the strip member, one at left and right, opposed to each other, as shown in FIG. 20, in a structure for conveying the strip member, it is necessary to raise the strength of strip member so that there may not occur any slackness of the strip member between a pair of opposed bend edge face support rings.

Also, for the relaxation of the stress for the deposited film as previously described, the strip member should be thicker. Accordingly, the thickness of the strip member can be appropriately determined in the light of these respects, but depends to a degree on the kind of the material for the strip member and the curvature of the bend. For example, its thickness is about 0.03 to 0.3 mm when the strip member is stainless, about 0.05 to 0.5 mm when it is aluminum or copper, and about 0.1 to 3 mm when it is synthetic resin.

When the strip member is used as a substrate for the solar cell, it can be used as the electrode for directly picking up the current if it has an electric conductivity such as the metal, or if it has an electric insulating property such as synthetic resin, it is desirable to form the electrode for picking up the current by treating beforehand a surface for metal simple substance or its alloy such as Al, AG, Pt, Au, Ni, Ti, Mo, W, Fe, V, Cr, Cu, $In_2O_3$, ZnO, $SnO_2$ or —$In_2O_3$(ITO) and a transparent conductive oxide (TCO), on the deposited film formation side, with the plating, the deposition or the sputtering method. To facilitate the process of device separation, the insulating film may be partially provided.

Of course, if the strip member is electrically conductive such as metal, a layer of dissimilar metal may be provided on the deposited film formation side of the substrate in order to improve the reflectivity for the long wavelength on the substrate surface, prevent mutual diffusion of constituents between the substrate material and the deposited film, or use it as an interference layer for preventing the short-circuit. Also, if the strip member is relatively transparent, it is desirable that a conductive thin film such as transparent conductive oxide or metallic thin film is deposited beforehand, when the solar cell is made having a constitution in which the light is incident from the strip member side.

Also, the surface property of the strip member may have the so-called smoothness or minute irregularities. In the minute irregular surface, its irregular shape may be spherical, conical, or prismatic, with its maximum height (Rmax) being preferably from 500 Å to 5000 Å, whereby the reflected light at the surface is irregular, increasing the optical path of the reflected light at the surface.

With the apparatus of the present invention, to control the film thickness of a film deposited within the film formation chamber, it is preferable to insert a substrate cover overlapping the side wall.

The central conductor for use with the apparatus of the present invention is preferably made of a metallic material having a small ohmic loss. Specifically, it is made of silver, copper or aluminum, or made of any other material having its surface plated with such metal. With this apparatus, a silver-plated stainless tube was used.

Also, the central conductor projected into the film formation chamber acts to prevent the input efficiency of microwave power from decreasing, because the deposited film is formed on the central conductor with its peripheral portion isolated from the plasma with the microwave transparent member, then serving as the absorbing member of the microwave.

In the film formation chamber, the wall surface opposed to a face into which the central conductor is projected is made of a microwave reflective material, while the face into which the central conductor is projected is made of a material for transmitting the microwave and retaining the air tightness between the inside and the outside of the film formation chamber, and a microwave reflective material, so that a resonator structure can be provided by the appropriate selection of the strip member width by virtue of the side wall of the film formation chamber constituted of a conductive strip member.

As well known, the electromagnetic wave is strongly reflected at an interface where the impedance of the line abruptly changes and a shorted face. Here, both opposed end faces of the film formation chamber reflect the microwave strongly, as they correspond to the interface and the shorted face, whereby the resonator structure with a high Q value can be constituted by inputting the electromagnetic wave into a cavity where two strong reflective faces are appropriately disposed.

With the apparatus of the present invention, the resonator structure may be constituted with both opposed end faces of the film formation chamber being movable, or a reentrant cylindrical resonator structure is formed with an adjusting mechanism for the central conductor inserting length, which is superior in the operativity, or the resonator may have an equivalently variable length or the adjustable impedance by inserting a microwave transparent member having a high dielectric constant into a desired position of the film formation chamber.

The preadjustment which is performed prior to the discharge to have the resonator structure as above described can facilitate the start of the discharge with the power accumulating effect of resonator structure, while the matching of the impedance with the adjusting mechanism for the central conductor insertion length can sustain the constant discharge condition steadily over a long time in a wide pressure range for the film formation.

The microwave transparent material for use with the apparatus of the present invention may be a dielectric tube as indicated by 103 in FIG. 18, for example.

The material of the dielectric tube may be one having a small dielectric loss tan δ (tan delta) in the used microwave band, but it is more preferable that at the same time it has a high thermal conductivity and a strong thermal shock resistance, because the film adhering to the dielectric tube will change in quality to restrain the reflection and absorption of the microwave power from increasing and prevent the heat loss of the dielectric tube. Preferred examples of the material optimal for these conditions are beryllia, alumina ceramics, boron nitride and quartz, and in particular alumina ceramics is most preferable.

In order to excite the microwave glow discharge and make the discharge stabely and steadily, the dielectric tube is required to have the function of transmitting the microwave and retaining the air tightness. The shape of the dielectric tube for fulfilling this function may be optimally either of the following two examples: an open end cylindrical tube in which bored flange is welded one at each end of open cylindrical tube, or a closed end cylindrical tube in which bored flange is welded at one open end side of cylindrical tube having the other end closed. And this flange portion is placed into close contact with one wall of opposed end faces of the film formation chamber via an O-ring so as to retain the air tightness. From the viewpoint of maintenance and inspection, the latter closed end cylindrical tube is more preferable.

The microwave transparent member having a high dielectric constant as previously described is made of a material such as alumina ceramics, beryllia or boron nitride, and the present inventors have confirmed in the examination that there is the effect of changing the resonator length equivalently by disposing it in the inside or end portion of the reentrant cylindrical resonator structure constituted with the adjusting mechanism for central conductor insertion length. As a result of further examination by the present inventors, it has been found that the optimal dimensions for the microwave transparent member having high dielectric constant has the correlation with the insertion length of the central conductor. Accordingly, the shape of the microwave transparent member having high dielectric constant can be determined so that the resonant frequency may be 2.45 GHz, with the insertion length of the central conductor fixed, and using HP8757A scaler network analyzer (made by Hewlett Packard).

In connection with means for supporting and conveying the strip member used in the apparatus of the present invention, if the torsion, deflection or meander is produced in the strip member (substrate) being conveyed, which forms the side wall of the film formation chamber, the discharge is unstable so that it is difficult to fabricate the film of same quality reproducibly and in mass production. Also, the dirt or contamination, attaching to the surface of the means for supporting and conveying the strip member, was in problem because it might often cause imperfections in the formed deposited film. That is, it has been found that with the means for supporting and conveying the strip member, there are two important points of preventing the deformation of the film formation chamber and extremely preventing the means for supporting and conveying the strip member from making contact with the strip member face where the deposited film is formed (abbreviated as "film formation face").

That is, for the first point of preventing the deformation of film formation chamber, a well-known crown mechanism is incorporated into the means for supporting and conveying the strip member to prevent the distortion and meander, and a well-known tension adjusting mechanism is allowed to prevent the deflection.

Also, for the second point of extremely preventing the means for supporting and conveying the strip member from making contact with the film formation face, the strip member is supported on the film formation face side only by the periphery of the strip member, while it is supported and conveyed over the entire width of strip member on a back face of the film formation face.

In other words, bend forming means for the strip member is disposed with bend edge face supporting rings for making contact with and supporting only the periphery of strip member that is placed inside the film formation chamber, and rollers for making contact with and supporting the strip member over its substantially entire width that is placed outside the film formation chamber. To support and convey the inside of the strip member with the bend edge face supporting ring, the strip member may be supported by a number of bend supporting inner rings 113 as shown in FIG. 18, or by a pair of bend supporting inner rings 308 having the almost same size as that of both opposed end faces of the columnar film formation chamber as shown in FIG. 20.

In order to form the columnar film formation chamber with the bent strip member as the side wall and the gap provided in the longitudinal direction of the strip member as previously described, the strip member being continuously conveyed is caused to gently change the conveying direction by means of a bend leading edge forming roller consisting of a pair of opening portion supporting inner roller and opening portion supporting outer roller, bent by the bend edge face supporting ring to make the side wall of the film formation chamber, and is caused to gently change the conveying direction by means of a bend trailing edge forming roller consisting of another pair of opening portion supporting inner roller and opening portion supporting outer roller.

If the diameter of the opening portion supporting outer roller is too large, many uneven plasma density portions may undesirably occur because the distance from the central conductor to the strip member is different depending on the direction. On the other hand, if the diameter of the opening portion supporting outer roller is too small, the strip member may be distorted with the bending stress, or the film may be exfoliated. Therefore, it is desirable to use the roller having a diameter of 60 mmϕ to 100 mϕ for a metallic strip member having a thickness of 0.15 mm, and the roller having a diameter of about 25 mmφ for a thickness of 0.05 mm. Further, for the rapid evacuation, the apparatus may be constituted with variable spacing between the bend leading edge forming roller and the bend trailing edge forming roller. The method of supporting and conveying the strip member with the bend edge face supporting ring may simply rely on the sliding friction, or may be made in such a manner that the strip member is worked for sprocket holes and at the same time the bend edge face supporting ring is a sprocket.

Figure 19:
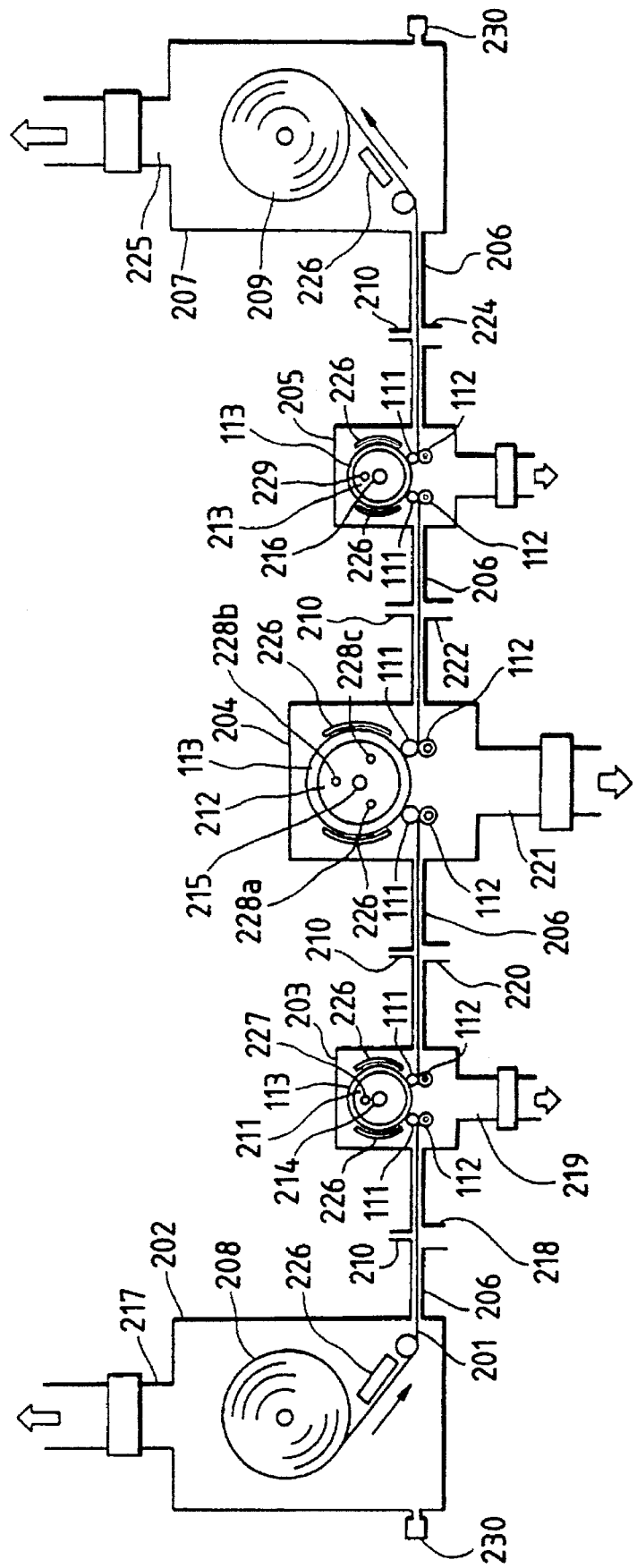
FIG. 19 is a typical view of microwave plasma-assisted CVD apparatus suitable for fabricating a pin-type photovoltaic device.

With the apparatus of the present invention, the surface temperature of the strip member is an important parameter governing the film quality of the deposited film, but the strip member can be heated from a back face of the film formed face with the lamp radiation heating as shown in FIG. 19 which is a control method for the surface temperature of the strip member. However, when the conveying speed of the strip member is slow, that is, the residence time of the strip member in the film formation chamber is long, and when the input power of the microwave is large, the strip member will significantly rise in temperature, so that there are some occasions where the temperature control is not permitted only with the lamp radiation heating. In such a case, in addition to the bend supporting inner ring as indicated at 308 in FIG. 20, the bend supporting outer roller (not shown) is provided to press it against the back face of the film formed face for the strip member over its entire width, whereby the heating and cooling can be made by incorporating a heat exchange medium inside the bend supporting outer roller for the temperature control.

The number of gas supply means disposed in the apparatus of the present invention is desirably at least equal to or more than the number of constituent elements in the functional deposited film to be formed. And the respective gas supply means are constituted of pipe-like gas inlet conduits, with its side face having one or more rows of gas discharge ports opened. The material constituting the gas inlet conduit is suitably used if it is not subjected to damage within the microwave plasma. Specifically, examples of such material include a heat resisting metal such as stainless steel, nickel, titanium, niobium, tantalum, tungsten, vanadium, or molybdenum, and those thermally sprayed on ceramics such as a alumina, silicon nitride, or quarts, a ceramics simplex such as alumina, silicon nitride, or quarta, and a complex thereof.

In the apparatus of the present invention, the gas supply means is disposed in parallel to a width direction of the strip member making up a side wall of the film formation chamber, the gas discharge port being directed toward neighboring strip member.

The arrangement of the gas supply means for use in the third apparatus of the present invention will be described below with reference to the drawings, but is not specifically limited to them.

Figure 21:
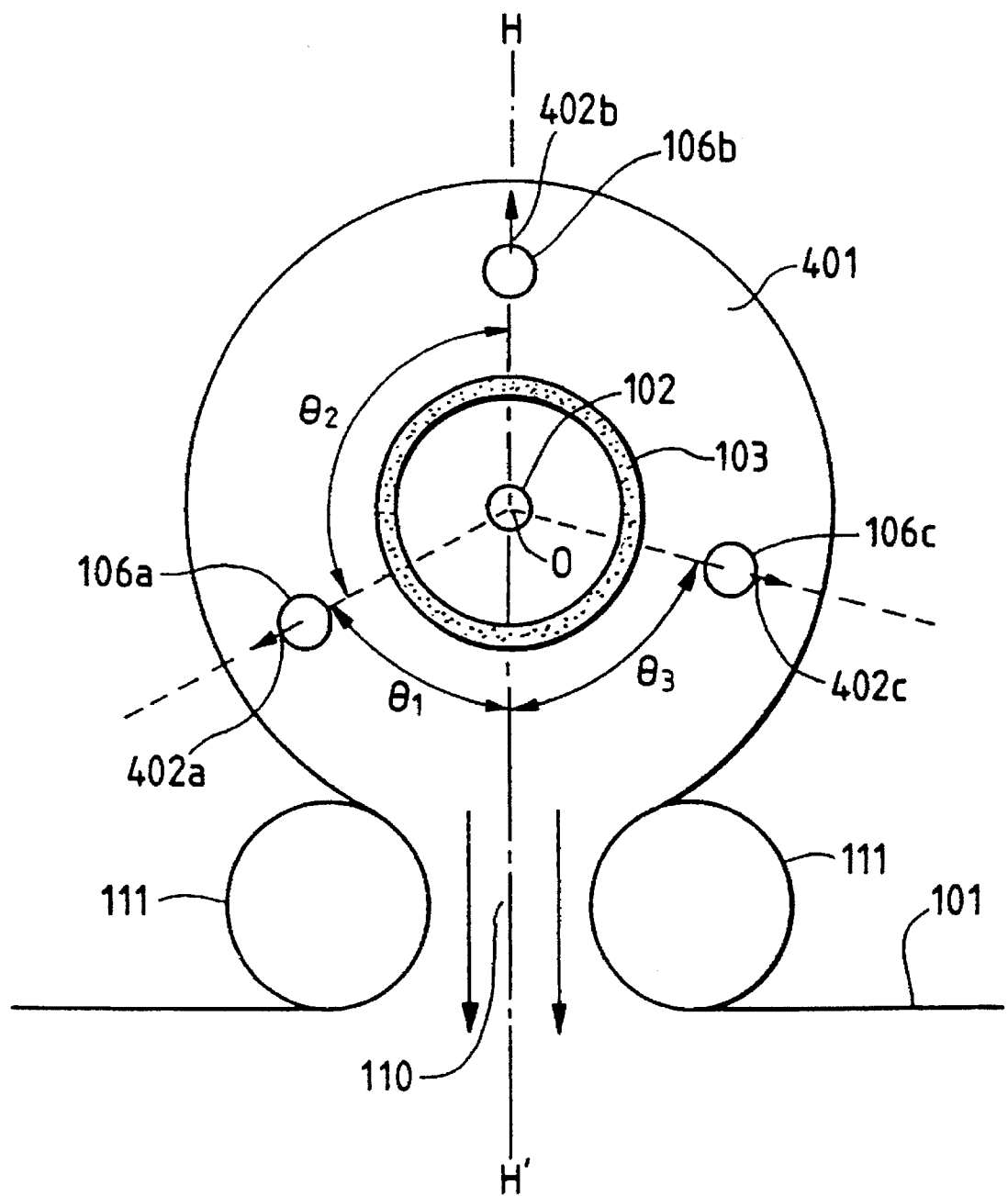
FIG. 21 is a cross-sectional view taken along the line A–A' in FIG. 20.

FIG. 21 is a typical side cross-sectional view showing the arrangement of a gas inlet conduit in the third apparatus of the present invention. Note that main constitutional members are only illustrated in this figure.

An example of FIG. 21 shows a typical arrangement of three gas inlet conduits 106a, 106b, 106c as gas supply means within a columnar film formation chamber 401, in which pipe-like gas inlet conduits 106a, 106b, 106c are disposed in parallel to the width direction of the strip member 101 at a substantially equal distance from a center o of the film formation chamber 401 and at angles $\theta_1, \theta_2, \theta_3$ with reference to a central axis HH' of the film formation chamber as shown. And gas discharge ports 402a, 402b, 402c are directed to adjacent strip member 101, respectively.

In this arrangement, the gas inlet conduit 106b is disposed on the central line HH' of the film formation chamber 401, but may be disposed at a left or right shifted position, if desired. The distances of the gas inlet conduits 106a, 106b, 106c from the center o may or may not be equal. Also, the angles $\theta_1, \theta_2, \theta_3$ may or may not be equal.

A source gas for the formation of deposited film, appropriately mixed as desired, is introduced into each of the gas inlet conduits 106a, 106b, 106c under the separate control.

The gas discharge ports 402a, 402b, 402c are opened at substantially equal intervals in a row on the side faces of respective gas inlet conduits, but the interval may be appropriately changed to improve the uniformity in the width direction of deposited film to be formed, in accordance with an increased or decreased amount of introduced gas.

Of course, the number of gas inlet conduits may be two, or more than three.

In the apparatus of the present invention, in order to control the plasma potential of microwave plasma excited within the film formation chamber, a bias voltage may be applied to the gas inlet conduit. And the bias voltage applied to a plurality of gas inlet conduits may or may not be equal. It is desirable that the bias voltage is applied with DC, pulsating or AC voltage singly or in a superposition thereof.

In order that the bias voltage may be effectively applied, both the gas inlet conduit and the strip member have desirably their surfaces electrically conductive.

The control of the plasma potential with the application of the bias voltage allows for the stability and reproducibility of the plasma, the improvement of film characteristics, and the suppression of occurrence of defects.

[Apparatus examples]

In the following, specific examples of the third apparatus of the present invention will be described with reference to the drawings, but the present invention is not limited to those apparatus examples.

Apparatus example 1

FIG. 18 is a perspective view illustrating a typical example of a film formation chamber constituted with a moving strip member as the side wall and its peripheral mechanism.

In FIG. 18, 101 is a strip member, 102 is a central conductor of coaxial line for inputting the microwave, 103 is a dielectric tube which is a microwave transparent member, 104 is a film formation chamber, 105 is a small aperture, and 106a, 106b, 106c are gas inlet conduits, into each of which a source gas for the formation of deposited film is separately introduced via a microcontroller, not shown.

When a bias voltage for the control of plasma potential is applied, the voltage may be applied from DC or Ac power source via a conductive wire into the gas inlet conduits. In doing so, care must be taken so that the bias voltage may be applied only to the film formation space side by inserting an insulating coupling into a part of the gas inlet conduit. 107 is a vacuum exhaust port, 108 is a strip member supporting outer roller, 109 is a strip member supporting inner roller, 111 is an opening portion supporting outer roller 112 is an opening portion supporting inner roller, and 113 is a bend supporting inner ring.

Note that two arrows in FIG. 18 indicate the flow direction of source gases.

In FIG. 18, the film formation chamber 104 made up of the strip member 101 is columnar, the central conductor 102 of coaxial line is disposed on a rotational axis of the film formation chamber, and the dielectric tube 103 of microwave transparent member is disposed coaxially with the central conductor 102 within the film formation chamber 104. The film formation chamber 104 can be formed like a column in such a manner that the strip member is caused to change the conveying direction by means of opening portion supporting outer rollers 111 and opening portion supporting inner rollers 112 which carry the strip member therebetween, supported and conveyed via plurality of bend supporting inner rings 113 opposed to the periphery of the strip member which is bent outward convex so as to make up a columnar side wall, and again caused to change the conveying direction by means of opening portion supporting outer rollers 111 and opening portion supporting inner rollers 112 which carry the strip member therebetween. Also, to prevent the distortion and slackness in conveying the strip member 101, the strip member 101 is supported and conveyed while being carried between strip member supporting outer rollers 108 and strip member supporting inner rollers 109, other than a bent portion of the strip member 101.

In FIG. 18, a slit-like opening portion 110 made up of the strip member 101 has its shape retained by supporting the strip member 101 by means of the opening portion supporting outer roller 111 and the opening portion supporting inner roller 112. The opening portion supporting inner roller 112 is only in contact with the periphery of the strip member 101, which is driven from the outside of the film formation chamber by a driving mechanism (not shown) provided separately. The provision of a tension adjusting mechanism in the driving mechanism allows the conveyance without slackness.

In FIG. 18, three gas inlet conduits 106a, 106b, 106c are disposed inside the film formation chamber 104, its arrangement being such that they are disposed in a columnar film formation space formed of the dielectric tube 103 and the bent strip member 101, and a number of small orifices 105 provided on the gas inlet conduits 106a, 106b, 106c are opened in the direction toward the strip member 101, as shown in FIG. 21.

The strip member 101 is grounded, preferably substantially over the entire surface of a side wall portion of the columnar film formation chamber uniformly, and via opening portion supporting outer rollers 111, opening portion supporting inner rollers 112, bend supporting inner rings 113, and an electric brush (not shown) in contact with the side wall of the strip member 101.

The mechanism of introducing the microwave power into the film formation chamber 104 shown in FIG. 18 will be described with reference to FIG. 20.

In FIG. 20, the coaxial line will be described as one example of the microwave antenna means, but may be antenna means such as resiterno coil.

In FIG. 20, 301 is a square waveguide, 302 is a coaxial plunger (movable terminal), 303, 304 are electromagnetic shield members, 305 is a coaxial plunger holddown member, 306 is a circular chock flange, 307 is a microwave transparent member having a high dielectric constant, 308 is a bend supporting inner ring, 309 is a roller or bearing, 310 is a central conductor cooling gas inlet port, 311 is small orifices, 312 is a stopper, and 313 is a waveguide coaxial transducer.

The central conductor 102 has a hollow structure, as shown in FIG. 20, with its one end projected into the inside of the film formation chamber 104, via the waveguide coaxial transducer 313 out of the coaxial line and the other end being the central conductor cooling gas inlet port 310. The central conductor 102 are held in good electrical contact by means of electromagnetic shield members 303, 304 made of spring material, and a central conductor holddown member, not shown. The central conductor holddown member may have the same structure as the coaxial plunger holddown member 305, for example, with its attaching position being rotated 90° about the axis of the central conductor. In FIG. 20, this holddown member is substituted with a simple bolt. Shifting a neighboring portion of the central conductor 102 in contact with the electromagnetic shield member 304 allows the insertion length of the central conductor 102 into the film formation chamber 104 to be adjusted from outside the coaxial line.

In FIG. 20, the coaxial plunger 302 is constructed to operate it outside the coaxial line, as can be clearly seen from the figure. To this coaxial plunger 302 is connected the electromagnetic shield member 303 of spring material for making better electrical contact with the fastening or spot welding. A bore through which the central conductor 102 penetrates is provided in a center of the coaxial plunger 302, and another electromagnetic shield member 303 made of spring material is provided at the contact portion so that the coaxial plunger 302 can slide smoothly along the central conductor 102.

Further, it is convenient in practice that the central conductor 102 is provided midway with a step portion, for example, stopper 312, so that the microwave transparent dielectric tube 103 may not be placed into contact with the terminal of the central conductor 102 to damage the dielectric tube 103. The similar stopper is provided at the other end portion of the coaxial plunger 302 so that the termination face of the coaxial plunger 302 may not protrude up to the waveguide coaxial transducer 313. If this portion protrudes, the abnormal discharge may easily occur on the electrical shield member 303 which makes better the contact between the coaxial plunge 302 and the external conductor, or burn out in certain cases, causing the trouble in practical use.

In FIG. 20, the waveguide coaxial transducer 313 is formed by penetrating the coaxial line having the central conductor 102 into the interior of the square waveguide 301.

In FIG. 20, the square waveguide 301 is connected to a microwave oscillator of 2.45 GHz, not shown, made by Evick & Co.

In FIG. 20, the microwave transparent member 307 having a high dielectric constant is of a substantially frusto-conical shape, with a plurality of orifices for exhausting the cooling gas provided on the conical surface. Accordingly, the central conductor cooling gas flows from the central conductor cooling gas inlet port 310 through the center of hollow central conductor 102, through a terminal opening of the central conductor 102, along an inner face of the microwave transparent dielectric tube 103, through exhaust ports provided on the conical surface of the microwave transparent member 307 having high dielectric constant out of a plurality of small orifices 311 provided on the side wall of the square waveguide 301.

In FIG. 20, the strip member 101 forms a columnar space with only its periphery supported and conveyed by a pair of bend supporting inner rings 308. The bend supporting inner ring 308 is rotatably supported by the roller (or bearing) 309 disposed on its peripheral portion, both of them being grounded. The bend supporting inner ring may be a plurality of small rings as shown in FIG. 18 disposed on the periphery of the strip member 101.

In FIG. 20, the central conductor 102 is isolated from the plasma excited within the film formation chamber 104 by the dielectric tube 103. The dielectric tube 103 is a hemispheric tube closed at one end, with a vacuum flange at the other end, and has a cylinder structure capable of vacuum sealing with the vacuum flange.

In FIG. 20, a circular chock flange 306 is closely fastened with the vacuum flange of the dielectric tube 103, thereby preventing the leakage of microwave even if the circular chock flange 306 and a metallic surface of the dielectric tube 103 for the vacuum sealing is not in good electrical contact.

The apparatus of the present invention comprises a load lock mechanism as the auxiliary mechanism, in addition to the main mechanism as the microwave plasma-assisted CVD apparatus as above described.

Figure 22:
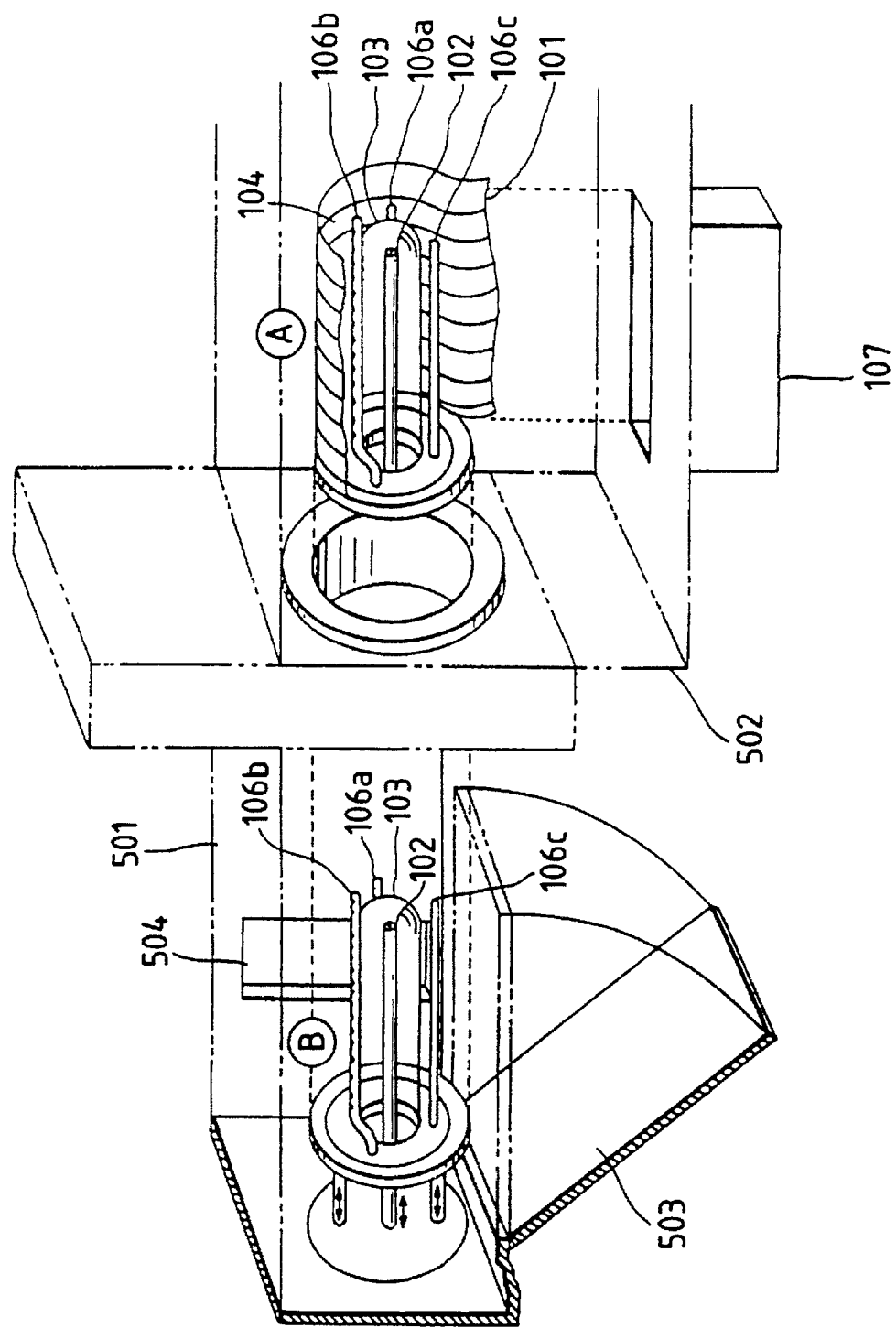
FIG. 22 is a typical view for explaining an exchanging mechanism for a dielectric tube and a source gas inlet tube.

That is, the provision of the load lock mechanism of FIG. 22 allowed the reduction of imperfections occurring on the deposited film, and the improvement of the maintenance ability. The load lock mechanism will be described in detail.

In FIG. 22, 501 is a load lock chamber for the exchange, is a gate valve, 503 is an exchange door, and 504 is a vacuum exhaust port, in which A indicates a predetermined position of the dielectric tube and the source gas inlet conduit, and B indicates a position where they are pulled out from the predetermined position for the exchange of them.

In FIG. 22, the central conductor 102, a dielectric window 103 and three gas inlet conduits 106a, 106b, 106c can be exchanged as a unit, in which a holddown member not shown has been prepared at each position of A and B, so that they can be secured at either position of A and B. Also, an arm for moving the unit form the position A to the position B, not shown, is provided within the load lock chamber 501 for the exchange. A vacuum pump not shown is connected to an evacuation port 504 to evacuate the load lock chamber 501 for the exchange. Further, the central conductor 102 and the gas inlet conduits 106a, 106b, 106c are constructed to be detachable therefrom in the vicinity of a gate valve 502. The load lock mechanism as shown in FIG. 22 is disposed adjoining the film formation chamber 104 shown in FIG. 18 via the gate valve 502.

To operate the microwave plasma-assisted CVD apparatus of the present invention as above described, two settings are made, in which the initial discharge is caused to easily occur, and the outer diameter of the dielectric tube 103 is preadjusted and preselected so that the coaxial line on a portion not penetrated into the film formation chamber 104 and the coaxial line on a portion penetrated into the film formation camber 104 may be matched in the impedance in accordance with the discharge state for practicing the formation of a desired deposited film. Of course, this apparatus may be operated without troubles even if these settings are not made, but in order to exhibit the features of this apparatus at maximum, the described settings are important.

First, to easily excite the initial discharge which is the first setting, various methods have been well known in which the pressure of the film formation chamber is raised, the input microwave power is increased, or the spark discharge is produced with a tesla coil. With the apparatus of the present invention, it has been found that a constant discharge can be sustained steadily in a wider pressure range for the film formation over a long time, as compared with the conventional method of causing the initial discharge to easily occur, because the film formation chamber 104 constitutes the reentrant cylindrical resonator as previously described. Here, to constitute the reentrant cylindrical resonator, the insertion length of the central conductor 102 into the film formation chamber 104 is preadjusted, while confirming the resonating state, using a HP8757A scaler network analyzer (made by Hewlett Packard), so that the dielectric tube 103, attached at a predetermined position, may become the reentrant cylindrical resonator.

Next, the adjustment and selection for the outer diameter of the dielectric tube 103, which is the second setting, can be made so that the coaxial line on a portion not penetrated into the film formation chamber 104 and the coaxial line on a portion penetrated into the film formation chamber 104 may be matched in the impedance. That is, an equivalent coaxial line in accordance with the plasma density has been formed within the film formation chamber 104 where the discharge is excited. The plasma density or the complex dielectric constant for the plasma may vary with the gas mixture ratio, the gas pressure or the size of dielectric tube for the microwave to be introduced. As these four variables are interrelated, it is difficult to expect theoretically the optimal diameter of the dielectric diameter 103 at which the coaxial line penetrated into the film formation chamber and the coaxial line not penetrated into the film formation chamber are placed in the matched state. Accordingly, the matched state can be confirmed experimentally by selecting the outer diameter of the dielectric diameter 103 and adjusting the insertion length of the central conductor 102 into the film formation chamber 104.

A specific example in the conditions as shown in Table 55 in the fabrication example 23 will be described later is as follows. That is, in the film formation chamber having an inner diameter of 40 mm$\phi$, it is preferable to have the coaxial line with the central conductor of 6 mm$\phi$ in diameter and the outer conductor of 20 mm$\phi$ in diameter, the outer diameter of dielectric tube being about 1.8 mm$\phi$, and the insertion length of the control conductor being 452 mm. Also, in the film formation chamber having an inner diameter of 105 mm$\phi$, it is preferable to have the coaxial line with the central conductor of 15 mm$\phi$ in diameter and the outer conductor of 30mm$\phi$ in diameter, the outer diameter of dielectric tube being about 23 mm$\phi$, and the insertion length of the central conductor being 455 mm.

The operation of the third microwave plasma-assisted CVD apparatus of the present invention as above described is as follows.

Apparatus example 36

The film formation chamber of FIG. 18 is evacuated via a slit-like opening portion 110 and an evacuation port 107 by a vacuum pump, not shown. After the internal pressure of the film formation chamber reaches $1 \times 10^{-6}$ the source gases for the formation of deposited film, each flow of which is separately controlled by a master controller not shown, are introduced via three gas inlet conduits 106a, 106b, 106c into the film formation chamber 104, respectively. In this state, after the internal pressure of the film formation chamber reaches a predetermined pressure, the microwave power generated by a microwave oscillator of 2.45 GHz (e.g., made by Evick & Co.), not shown, is input via the square waveguide 301, the waveguide coaxial transducer 313, the central conductor and the microwave transparent dielectric tube 103 as shown in FIG. 3 into the film formation chamber. To make effective use of the microwave power, it is preferable to make the impedance matching of the microwave as well known. In the apparatus of the present invention, an insertion length adjusting mechanism of the central conductor 102 and the coaxial plunger 302, as shown in FIG. 20, are incorporated as an impedance matching mechanism of the microwave. Since the former central conductor insertion length adjusting mechanism of such microwave impedance matching mechanism has a wider matching range, it is preferable to first adjust the reflected power with the insertion length adjusting mechanism so that the reflected power may be as least as possible, using a reflected power meter for monitoring the reflected power within the coaxial line or waveguide, and subsequently match the impedance by making the fine adjustment with the coaxial plunger 302. As a result, the plasma is excited within the film formation chamber 104. With the action of the plasma thus generated, a desired high quality functional deposited film with its composition controlled is formed on the strip member 101.

Next, the operation procedure of the load lock mechanism which is auxiliary mechanism as shown in FIG. 22 will be described below. First, the central conductor 102 and the gas inlet conduits 106a, 106b, 106c are taken away in the vicinity of the gate valve 502, the microwave transparent dielectric tube 103 and the gas inlet conduits 106a, 106b, 106c are pulled out from the position A to the position B as shown, and then the gate valve 502 is closed. Next, the load lock chamber 501 is returned to the atmospheric pressure using an inert gas such as $N_2$ or Ar, an exchange door is opened, and the dielectric tube 103 and the gas inlet conduits 106a, 106b, 106c are exchanged. Afterwards, the exchange door 503 is closed again for the exhaust through an exhaust port 504 via an exhaust pump not shown, the gate valve 502 is opened when the load lock chamber 501 and the film formation chamber are placed at equal pressure, the dielectric tube 103 and the gas inlet conduits 106a, 106b, 106c are returned to the position A, and the central condutor 102 and the gas inlet conduits 106a, 106b, 106c are connected again in the vicinity of the gate valve 502. And the formation of deposited film can be restarted.

The load lock mechanism has an important role to raise the availability of the apparatus as above described, but if a conductance adjusting mechanism is provided at a position of the exhaust port 107 of FIG. 18, the availability of the apparatus can be further improved, quickening the redemption of the apparatus.

The conductance adjusting mechanism, using a rotatable conductance adjusting plate 601 or a microwave reflecting plate 602 having a mesh structure, as shown in FIG. 23, is rotated and totally opened at the initial evacuation, and fixed at a rotated position to give a desired conductance after reaching a predetermined pressure, so as to flow the source gas.

Another, conductance adjusting mechanism is such that the positions of opposed rollers 111 and 112 as shown in FIG. 23 are shifted left or right to effectively change the area of slit-like opening portion 110, and to control the conductance.

Apparatus example 37

This apparatus example is a microwave plasma-assisted CVD apparatus suitable for fabricating pin-type photovoltaic devices by depositing n-type semiconductor layer, i-type semiconductor layer and p-type semiconductor layer continuously and sequentially on a continuously moving strip member in a concatenation of three film formation chambers as shown in FIG. 18. FIG. 19 shows a typical cross-sectional schematic view.

In FIG. 19, 201 is a strip member, 202 is a strip member carrying in chamber, 203 to 205 are isolation vessels, 206 is a gas isolation passage, 207 is a strip member carrying out chamber, 208 is a strip member supply roller, 209 is a strip member receiving (take-up) roller, 210 is a scavenging gas inlet port, 211 to 213 a film formation chambers, 214 to 216 are microwave coaxial line introducing portions, 217 to 225 exhaust ports, 226 is a temperature control mechanism for the strip member, 227, 228a, 228b, 228c, 229 are gas inlet conduits, and 230 is a manometer.

In FIG. 19, isolation vessels 203 to 205 may have the load lock mechanism as described in the apparatus example 1 disposed adjacent thereto via the gate valve not shown. Also, the strip member carrying in chamber 202 and the strip member carrying out chamber 207 may have the same load lock mechanism installed adjacent thereto.

In FIG. 19, a heating chamber is installed adjacent to the strip member carrying in chamber, or a cooling chamber is installed in front of the strip member carrying out chamber 207, in which the cooling or heating chamber is appropriately incorporated in accordance with the flow of the heat from the plasma within the film formation chamber.

In the apparatus as shown in FIG. 19, the film thickness of formed deposited film can be adjusted by varying the inner diameters of film formation chambers 211 to 213, even if the conveying speed of the strip member 201 is constant.

In FIG. 19, the gas isolation passage 206 is between all adjacent isolation vessels so that the exhaust gas may be introduced through exhaust gas inlet conduits 210.

The gas isolation passage 217 is required to have the feature that the source gas for the formation of deposited film mutually used between adjacent isolation vessels is not diffused. The basic concept can rely on means as disclosed in U.S. Pat. No. 4,438,723, but its ability must be further improved in the present invention. The reason is that the deposited film is desirably formed under a pressure of about $10^{-2}$ to $10^{-3}$ Torr in at least one film formation chamber of the present invention, and the film formation pressure of the present invention is lower than that as disclosed in U.S. Pat. No. 4,438,723, whereby the source gas is easily diffused. Specifically, it is necessary to withstand the pressure difference up to about $10^6$ times, and examples of the exhaust pump to be suitably used are an oil diffusion pump, a turbe-molecular pump, a mechanical booster pump, or a combination thereof.

The gas isolation passage 217 allows for the change of isolation ability by changing the total length of gas isolation passage 217, with its cross-sectional shape being substantially of the same size as the cross-section of the strip member, to reduce the conductance and enhance the isolation feature. Further, to enhance the isolation ability, the scavenging gas is preferably used at the same time, and for example, the rare gas easily exhausted with turbo molecules such as At, Ne, Kr, Xe, or the gas easily exhausted with the oil diffusion such as $H_2$ gas may be suitably used. The optimal flow of scavenging gas introduced into the gas isolation passage can be roughly determined by the shape of the gas isolatin passage or a mutual diffusion coefficient between the scavenging gas and the source gas for the formation of deposited film, but in practice, it is desirable to determine the optimal condition by measuring the amount of mutually diffused gas.

Before the activation of this apparatus, the strip member 201 which has been preprocessed such as the formation of under electrode is set to the supply roller 208, and wound around the take-up roller 209 through a predetermined path of isolation vessels 203 to 205. Then, a cover of each film formation chamber is closed, and evacuated up to about $1\times10^{-6}$ Torr, so that the preparation is complete. The vacuum pump to be used is a combination of a rotary pump, a mechanical booster pump, and an oil diffusion pump.

The operation of this apparatus is as follows. The strip member 201 is fed out from the strip member carrying in chamber 202 at a constant conveying speed, and heated up to a predetermined temperature in a heating mechanism 226, and then three deposit films are laminated via isolation vessels 203, 204, 205, cooled down to a predetermined temperataure in a cooling mechanism 226, and finally wound around the take-up roller 209. After it is fully cooled, a roll of strip member having deposit films laminated is taken out from the strip member carrying out chamber 207.

The take-up mechanism in the apparatus of the present invention has desirably the features of iv) protecting the deposited film in the take-up v) providing a roller shape not peeling off the film.

Specifically, when the strip member 201 is taken up around the take-up roller 209, it is desirable to take up the strip member with a non-woven sheet (so-called laminated sheet) of polyimide interposed along with the strip member 201.

The material of the laminated sheet has desirably a heat resisting property up to about 150° C. and the flexibility, and the outer diameter of the roller is preferably 100 mmφ or more, and more preferably about 300 mmφ.

In the apparatus of the present invention, if a mechanism is also provided in which the exchange of strip member is allowed with the vacuum state within the film formation chamber retained, the interior of film formation chamber is not exposed to the atmosphere, and the adsorption of moisture to the inner wall of film formation chamber can be eliminated, so that high quality semiconductor devices can be stably formed.

In the third apparatus of the present invention, the cleaning of the film formation chamber can be practiced with the dry etching while the vacuum state is retained, as required.

One example of semiconductor device appropriately fabricated with the third method and apparatus of the present invention is a solar cell. A typical example of the layer configuration is as shown in FIGS. 24A and 24D, and the explanation is the same as previously described.

[Fabrication examples]

In the following, specific fabrication examples will be described using a microwave plasma-assisted CVD apparatus of the present invention, but the present invention is not limited to such fabrication examples.

Fabrication example 1

The continuous deposition of amorphous silicone germanium was made, using a continuous microwave plasma-assisted CVD apparatus (FIG. 7) as shown in the fabrication example 12. Note that the microwave applicator used No. 13 type.

First, a bobbin 703 having a strip member (60 cm wide× 100 cm long×0.2 mm thick) made by SUS430BA, sufficiently defatted and cleaned, was set tca vacuum vessel 701 having a substrate supply mechanism, the strip member 101 was passed through the gas gate 721 and conveying mechanism in the isolation vessel 400, further through the gas gate 722, to the vacuum vessel 702 having substrate take-up mechanism to adjust the tension to the degree having no slackness. The conditions such as the bent shape of strip member or the allocation of gas inlet conduit are shown in Table 18. The gas supply means was of the type having three gas inlet conduits as shown in FIG. 5A.

Thus, each vacuum vessel 701, 702 and the isolation vessel 400 are roughly evacuated by a rotary pump 400 not shown, then evacuated up to about $10^{-3}$ Torr by starting a mechanical booster pump not shown, and then further evacuated up to less than $5\times10^{-6}$ Torr by an oil diffusion pump (HS-32 made by Varian) not shown, while the surface temperature of the substrate is retained at 280° C. using temperature control mechanisms 160, 107.

When the degasification had been sufficiently made, source gases for the formation of deposited film were introduced from respective gas inlet conduits under the conditions as shown in Table 19, and the pressure within the film formation chamber 723 was retained at 12 mTorr by adjusting the opening of a throttle valve attached to the oil diffusion pump. At this time, the pressure within the isolation vessel 400 was 4 mTorr. When the pressure was stabilized, the microwave having an effective power of 1.2 kW was radiated from a microwave power source not shown. Immediately, the source gases introduced were converted into the plasma to form a microwave plasma region, in which the microwave plasma region did not get out of wire gauzes 501, 501' (a wire diameter of 1 mm, an interval of 5 mm) attached to the side faces of conveying rings 104, 105 toward the vacuum vessel side, and the leakage of the microwave was also not detected.

Thus, the supporting/conveying rollers 102, 103 and the supporting/conveying rings 104, 105 (driving mechanisms not shown) were started, and controlled so that the conveying speed of the strip member 102 might be at 1.2 m/min.

Note that $H_2$ gas was flowed as the gate gas by 50 sccm through the gate gas inlet conduits 716, 717 into the gas gates 721, 722, exhausted through the exhaust ports 718, 718 by the oil diffusion pump not shown, and controlled so that the internal pressure of gas gate might be at 1 mTorr.

The deposited film was formed continuously for 30 minutes after the start of conveyance. Due to the use of a long strip member, after the termination of one fabrication example, subsequent other formation of deposited film was carried out, and after the termination of all deposit films, the strip member was cooled and taken out, in which the film thickness distribution of deposited film on the strip member formed in this fabrication example was measured in the width and length directions, so that it was within 5%, and the deposition rate was 44 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 13 was obtained, which indicated that a band gap profile as shown in FIG. 11B had been substantially formed. The determination for the total amount of hydrogen in the film using an in-metal hydrogen analyzer (EMGA-1100, made by Horiba Ltd.) indicated 18±2 atomic %.

Fabrication example 2

Following the deposited film forming process performed in the fabrication example 1, the introduction of used source gases was stopped, the isolation vessel 400 was evacuated up to an internal pressure of $5\times10^{-6}$ Torr or less, then the source gases for the formationof deposited film were introduced from respective gas inlet conduits under the conditions as shown in Table 20, and the deposited film was continuously formed in the same conditions except that the internal pressure was retained at 10 mTorr and the microwave power was 1.1 kW.

After the termination of this fabrication example and other fabrication examples, the substrate was cooled and taken out, in which the film thickness distribution of deposited film formed in this fabrication example was measured in the width and length directions, so that it was within 5%, and the deposition rate was 51 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 14 was obtained, which indicated that a band gap profile as shown in FIG. 11D and been substantially formed. The determination for the total amount of hydrogen in the film using an in-metal hydrogen analyzer (EMGA-1100, made by Horiba Ltd.) indicated 17±2 atomic %.

Fabrication example 3

Following the deposited film forming process performed in the fabrication example 1, the introduction of used source gases was stopped, the isolation vessel 400 was evacuated up to an internal pressure of $5\times10^{-6}$ Torr or less, then the source gases for the formation of deposited film were introduced from respective gas inlet conduits under the conditions as shown in Table 21, and the deposited film was continuously formed in the same conditions except that the internal pressure was retained at 19 mTorr and the microwave power was 1.8 kW.

After the termination of this fabrication example and other fabrication examples, the substrate was cooled and taken out, in which the film thickness distribution of deposited film formed in this fabrication example was measured in the width and length directions, so that it was within 5%, and the deposition rate was 55 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 15 was obtained, which indicated that a band gap profile as shown in FIG. 11C had been substantially formed. The determination for the total amount of hydrogen in the film using an in-metal hydrogen analyzer (EMGA-1100, made by Horiba Ltd.) indicated 14±2 atomic %.

Fabrication example 4

As the deposited film forming process performed in the fabrication example 1, the isolation vessel 400 evacuated up to an internal pressure of $5 \times 10^{-6}$ Torr or less, then the source gases for the formation of deposited film were introduced from respective gas inlet conduits under the conditions as shown in Table 22, and the deposited film was formed in the same conditions except that the internal pressure was retained at 6 mTorr and the microwave power was 1.9 kW.

Note that the microwave applicator was of the No. 18 type in this fabrication example.

After the termination of this fabrication example and other fabrication examples, the substrate was cooled and taken out, in which the film thickness distribution of deposited film formed in this fabrication example was measured in the width and length directions, so that it was within 5%, and deposition rate was 112 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 16 was obtained, which indicated that a doping profile as shown in FIG. 12B had been substantially formed. The determination for the total amount of hydrogen in the film using an in-metal hydrogen analyzer (EMGA-1100, made by Horiba Ltd.) indicated 17±2 atomic %.

Fabrication example 5

In a continuous microwave plasma-assisted CVD apparatus (FIG. 7) as shown in the apparatus example 12, in which the strip member and the microwave applicator are arranged as in the apparatus example 5, the continuous deposition of amorphous silicone germanium was carried out.

As the deposited film forming process performed in the fabrication example 1, the isolation vessel 400 was evacuated up to an internal pressure of $5 \times 10^{-6}$ Torr or less, then the source gases for the formation of deposited film were introduced from respective gas inlet conduits under the conditions as shown in Table 19, and the deposited film was formed in the same conditions except that the internal pressure was retained at 11 mTorr and the microwave power was 1.2 kW.

After the termination of this fabrication example and other fabrication examples, the substrate was cooled and taken out, in which the film thickness distribution of deposited film formed in this fabrication example was measured in the width and length directions, so that it was within 5%, and the deposition rate was 42 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 13 was obtained, which indicated that a band gap profile as shown in FIG. 11B had been substantially formed. The determination for the total amount of hydrogen in the film using an in-metal hydrogen analyzer (EMGA-1100, made by Horiba Ltd.) indicated 19±2 atomic %.

Fabrication example 6

In this fabrication example, a pin-type photovoltaic device having the layer configuration as shown in a typical cross-sectional view of FIG. 10A was fabricated using the apparatus of FIG. 8.

The photoboltaic device is a photovoltaic device 1000 which has under electrode 1002, n-type semiconductor layer 1003, i-type semiconductor layer 1004 having a band gap profile as shown in FIG. 11D, p-type semiconductor layer 1005, transparent electrode 1006 and collecting electrode 1007 deposited in this order on the substrate 1001. With this photovoltaic device, it is assumed that the light is incident from the transparent electrode 1006 side.

First, the same strip member made by SUS430BA as in the fabrication example 1 was set to a continuous sputtering apparatus, and a 1000 Å thick Ag thin film, with Ag (99.99%) electrode as the target, and consecutively a 1.2 µm thick ZnO thin film, with ZnO (99.99%) electrode as the target, were deposited with the sputtering, to form the under electrode 1002.

Subsequently, the strip member formed with the under electrode 1002 was set to the continuous deposited film forming apparatus, as shown in FIG. 8, in the same manner as in the fabrication example 1. The conditions of the substrate such as the bent shape within the isolation vessel 400 are shown in Table 23. In the conditions as shown in Table 24, the source gases for the formation of deposited film were introduced through respective gas inlet conduits.

In the isolation vessels 400-a, 400-b, an n-type a-Si:H:F film and a p$^+$-type µc-Si:H:F film were formed in the deposited film forming conditions as shown in Table 25.

First, the microwave plasma was excited with each film formation chamber, the strip member was conveyed from left to right side in the figure at a conveying speed of 48 cm/min, when the discharge was stabilized, so as to continuously laminate n-type, i-type and p-type semiconductor layers.

The semiconductor layer was laminated over the entire length of the strip member 101, and taken out after cooling, and further, a solar cell module of 35 cm×70 cm was continuously fabricated in the continuous modularization apparatus.

With the solar cell module fabricated, the characteristics evaluation was made under the light irradiation of a AM1.5 (100 mW·cm$^2$), so that the photoelectric transfer efficiency was 7.5% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9.5%.

An electric power supply system of 5 kW could be fabricated with the connection of these modules.

Fabrication example 7

In this fabrication example, an a-SiC:H:F film having a band gap profile as shown in FIG. 11C was used in a pin-type photovoltaic device fabricated in the fabrication example 6, instead of an a-SiGe:H:F film as the i-type semiconductor layer.

The a-SiC:H:F film was formed by introducing the source gases for the formation of deposited film through respective gas inlet conduits under the conditions as shown in Table 26, with the surface temperature of strip member retained at 270° C., the internal pressure retained at 16 mTorr, and the microwave power being 1.8 kW. The formation and modularization of other semiconductor layers were made in the same operation and method as in the fabrication example 6, except that the conveying speed was 42 cm/min, so as to fabricate a solar cell module.

With the solar cell module fabricated, the characteristics evaluation was made under the light irradiation of AM1.5 (100 mW/cm$^2$), so that the photoelectric transfer efficiency was 6.8% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9.5%.

An electric power systems of 5 kW could be fabricated with the connection of these modules.

Fabrication example 8

In this fabrication example, an a-SiC:H:F film having a fermi level profile as shown in FIG. 12B was used in a pin-type photovoltaic device fabricated in the fabrication example 6, instead of an a-SiGe:H:F film as the i-type semiconductor layer.

The a-SiC:H:F film was formed by introducing the source gases for the formation of deposited film through respective gas inlet conduits under the conditions as shown in Table 27, with the surface temperature of strip member retained at 270° C., the internal pressure retained at 7 mTorr, and the microwave power being 1.3 kW. The formation and modularization of other semiconductor layers were made in the same operation and method as in the fabrication example 6, except that the conveying speed was 44 cm/min, so as to fabricate a solar cell module.

With the solar cell module fabricated, the characteristics evaluation was made under the light irradiation of AM1.5 (100 mW/cm$^2$), so that the photoelectric transfer efficiency was 8.5% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9.5%.

An electric power supply system of 5 kW could be fabricated with the connection of these modules.

Fabrication example 9

In this fabrication example, a photovoltaic device having the layer configuration as shown in FIG. 10C was fabricated. In the fabrication, an apparatus (not shown) was used in which isolation vessels 400-a', 400', 400-b' with the same constitution as the isolation vessels 400-a, 400, 400-b in the apparatus shown in FIG. 8, were further connected to the gas gate in this order.

The strip member of the same material, processed in the same way, as in the fabrication example 1, was used, the under cell and the upper cell were made with the same layer configuration as in the fabrication examples 6 and 8, respectively, in which the fabrication conditions for each semiconductor layer were the same as in each fabrication example, except that the surface temperature of strip member was 270° C., 270° C., 260° C., 260° C., 250° C. and 250° C. from the strip member side.

With the solar cell module fabricated, the characteristics evaluation was made under the light irradiation of AM1.5 (100 mW/cm$^2$), so that the photoelectric transfer efficiency was 10.6% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9%.

An electric power supply system of 5 kW could be fabricated with the connection of these modules.

Fabrication example 10

In this fabrication example, a photovoltaic device having the layer configuration as shown in FIG. 10C was fabricated. In the fabrication, an apparatus (not shown) was used in which isolation vessels 400-a', 400', 400-b' with the same constitution as the isolation vessels 400-a, 400, 400-b in the apparatus shown in FIG. 4, were further connected to the gas gate in this order.

The strip member of the same material, processed in the same way, as in the fabrication example 1, was used, the under cell and the upper cell were made with the same layer configuration as in the fabrication example 8 and 7, respectively, in which the fabrication conditions for each semiconductor layer were the same as in each fabrication example, except that the surface temperature of strip member was 260° C., 260° C., 250° C., 250° C., 240° C. and 230° C. from the strip member side. The modularization process was made in the same operation and member side. The modularization process was made in the same operation and method as in the fabrication example 6 to fabricate a solar cell module.

With the solar cell module fabricated, the characteristics evaluation was made under the light irradiation of AM1.5 (100 mW/cm$^2$), so that the photoelectric transfer efficiency was 10.5% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9%.

An electric power supply system of 5 kW could be fabricated with the connection of these modules.

Fabrication example 11

In this fabrication example, a photovoltaic device having the layer configuration as shown in FIG. 10D was fabricated. In the fabrication, an apparatus (not shown) was used in which isolation vessels 400-a', 400', 400-b', 400-a", 400", 400-b" with the same constitution as the isolation vessels 400-a, 400, 400-b in the apparatus shown in FIG. 8, were further connected to the gas gate in this order.

The strip member of the same material, processed in the same way, as in the fabrication example 1, was used, the under cell, the intermediate cell, and the upper cell were made with the same layer configuration as in the fabrication example 6, 8 and 7, respectively, in which the deposited film fabrication conditions for each semiconductor layer were shown in Tables 28 and 29. The modularization process was made in the same operation and method as in the fabrication example 6 to fabricate a solar cell module.

With the solar cell module fabricated, the characteristics evaluation was made under the light irradiation of AM1.5 (100 mW/cm$^2$), so that the photoelectric transfer efficiency was 10.8% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 8.5%.

An electric power supply system of 5 kW could be fabricated with the connection of these modules.

Fabrication example 12

The continuous deposition of amorphous silicone germanium was made, using a continuous microwave plasma-assisted CVD apparatus (FIG. 12) as shown in the fabrication example 26.

First, a bobbin 303 having a strip member (45 cm wide× 200 cm long×0.25 mm thick) made by SUS430BA, sufficiently defatted and cleaned, was set to a vacuum vessel 301 having a substrate supply mechanism, the strip member 101 was passed through the gas gate 321 and conveying mechanism in the isolation vessel 300, further through the gas gate 322, to the vacuum vessel 302 having substrate take-up mechanism to adjust the tension to the degree having no slackness.

Thus, even vacuum vessel 301, 302 and the isolation vessel 300 are roughly evacuated by a rotary pump not shown, then evacuated up to about $10^{-3}$ Torr by starting a mechanical booster pump not shown, and then further evacuated up to less than $5×10^{-6}$ Torr by an oil diffusion pump (HS-32 made by Varian) not shown, while the surface temperataure of the substrate is retained at 280° C. using temperature control mechanisms 106a, 106b.

The conditions such as the shape of microwave applicator, the bent shape of strip member, or the allocation of gas inlet conduit are shown in Table 36. The gas supply means was of the type having three gas inlet conduits as shown in FIG. 16A.

When the degasification had been sufficiently made, source gases for the formation of deposited film were introduced from respective gas inlet conduits under the conditions as shown in Table 37, and the pressure within the isolation vessel 300 was retained at 8 mTorr by adjusting the opening of a throttle valve attached to the oil diffusion pump. When the pressure was stabilized, the microwave having an effective power of 0.05 kW×2 kW was radiated with the applicators 107, 108 from a microwave power source of 2.45 GHz specification not shown into the film formation chamber. Immediately, the source gases introduced were converted into the plasma to form a plasma region, in which the plasma region did not leak through the intervals between supporting/conveying rollers 102, 103 to the isolation vessel side. The leakage of the microwave was also not detected.

Thus, the supporting/conveying rollers 102, 103 and the supporting/conveying rings 104, 105 (driving mechanisms nots shown) were started, and controlled so that the conveying speed of the substrate 101 might be at 30 cm/min.

Note that H$_2$ gas was flowed as the gate gas by 50 sccm through the gate gas inlet conduits 316, 317 into the gas gates 321, 322, exhausted through the exhaust ports 318, 318 by the oil diffusion pump not shown, and controlled so that the internal pressure of gas gate might be at 1 mTorr.

The deposited film was formed continuously for 30 minutes after the start of conveyance. Due to the use of a long strip member, after the termination of one fabrication example, subsequent other formation of deposited film was carried out, and after the termination of all deposit films, the strip member was cooled and taken out, in which the film thickness distribution of deposited film on the substrate formed in this fabrication example was measured in the width and length directions, so that it was within 5%, and the deposition rate was 54 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 21 was obtained, which indicated that a band gap profile as shown in FIG. 25B had been substantially formed. The determination for the total amount of hydrogen in the film using an in-metal hydrogen analyzer (EMGA-1100, made by Horiba Ltd.) indicated 16±2 atomic %.

Fabrication example 13

Following the deposited film forming process performed in the fabrication example 12, the introduction of used source gases was stopped, the isolation vessel 400 was evacuated up to an internal pressure of $5×10^{-6}$ Torr or less, then the source gases for the formation of deposited film were introduced from respective gas inlet conduits under the conditions as shown in Table 9, and the deposited film was continuously formed in the same conditions except that the internal pressure was retained at 9 mTorr, the microwave power was 0.55 kW×2, and the conveying speed was 3 cm/min.

After the termination of this fabrication example and other fabrication examples, the substrate was cooled and taken out, in which the film thickness distribution of deposited film formed in this fabrication example was measured in the width and length direction, so that it was within 5%, and the deposition rate was 62 Å/sec on the average.

Arbitrary six parts of the substrate having the deposited film formed were cut out using SIMS (ims-3F made by CAMECA) and the component analysis was made in the depth direction of deposited film, so that a depth profile as shown in FIG. 22 was obtained, which indicated that a band gap profile as shown in FIG. 25D had been substantially formed. The determination for the total amount of hydrogen in the film using an in-metal hydrogen analyzer (EMGA-1100, made by Horiba Ltd.) indicated 17±2 atomic %.

Fabrication example 14

Following the deposited film forming process performed in the fabrication example 12, the introduction of used source gases was stopped, the isolation vessel 300 was evacuated up to an internal pressure of $5×10^{-6}$ Torr or less, then the source gases for the formation of deposited film were introduced from respective gas inlet conduits under the conditions as shown in Table 10, and the deposited film was continuously formed in the same conditions except that the internal pressure was retained at 18 mTorr, the microwave power was 1.0 kW×2, and the conveying speed was 20 cm/min.

After the termination of this fabrication example and other fabrication examples, the substrate was cooled and taken out, in which the film thickness distribution of deposited film formed in this fabrication example was measured in the width and length directions, so that it was within 5%, and the deposition rate was 51 Å/sec on the average.

Artitrary six parts of the substrate having the deposited film formed were cut out using SIMS (ims-3f made by CAMECA) and the component analysis was made in the depth direction of deposited film, so that a depth profile as shown in FIG. 23 was obtained, which indicated that a band gap profile as shown in FIG. 25C had been substantially formed. The determination for the total amount of hydrogen in the film using an in-metal hydrogen analyzer (EMGA-1100, made by Horiba Ltd.) indicated 15±2 atomic %.

Fabrication example 15

As the deposited film forming process performed in the fabrication example 12, the isolation vessel 300 was evacuated up to an internal pressure of $5×10^{-6}$ Torr or less, then the source gases for the formation of deposited film were introduced from respective gas inlet conduits under the conditions as shown in Table 40, and the deposited film was formed in the same conditions except that the internal pressure was retained at 8 mTorr, the microwave power was 0.85 kW×2, and the conveying speed was 60 cm/min.

Note that the gas supply means had a constitution as shown in FIG. 17 in this fabrication example. The gas inlet conduits 703a and 703b were disposed 2 cm leftward anal rightward from the center of film formation chamber, and a gas straightening vane made of stainless was disposed from a center of the gap provided on the lower side of the film formation chamber to a position 1 cm upward from a center of the film formation chamber.

After the termination of this fabrication example and other fabrication examples, the substrate was cooled and taken out, in which the film thickness distribution of deposited film formed in this fabrication example was measured in the width and length directions, so that it was within 5%, and the deposition rate was 122 Å/sec on the average.

Arbitrary six parts of the substrate having the deposited film formed were cut out using SIMS (ims-3f made by CAMECA) and the component analysis was made in the depth direction of deposited film, so that a depth profile as shown in FIG. 24 was obtained, which indicated that a doping profile as shown in FIG. 26B had been substantially formed. The determination for the total amount of hydrogen in the film using an in-metal hydrogen analyzer (EMGA-1100, made by Horiba Ltd.) indicated 19±2 atomic %.

Fabrication example 16

In this fabrication example, a pin-type photovoltaic device having the layer configuration as shown in a typical cross-sectional view of FIG. 24A was fabricated using the apparatus of FIG. 13.

The photovoltaic device is a photovoltaic device 1000 which has under electrode 1002, n-type semiconductor layer 1003, i-type semiconductor layer 1004 having a band gap profile as shown in FIG. 25D, p-type semiconductor layer 1005, transparent electrode 1006 and collecting electrode 1007 deposited in this order on the substrate 1001. With this photovoltaic device, it is assumed that the light is incident from the transparent electrode 1006 side, and the band gap profile of the i-type semiconductor layer 1004 was as shown in FIG. 25D.

First, the same strip member made by SUS430BA as in the fabrication example 20 was set to a continuous sputtering apparatus, and a 1000 Å thick Ag thin film, with Ag (99.99%) electrode as the target, and consecutively a 1.2 μm thick ZnO thin film, with ZnO (99.99%) electrode as the target, were deposited with the sputtering, to form the under electrode 1002.

Subsequently, the strip member formed with the under electrode 1002 was set to the continuous deposited film forming apparatus, as shown in FIG. 13, in the same manner as in the fabrication example 20. The conditions such as the bent shape of substrate within the isolation vessel 300 are shown in Table 41. In the conditions as shown in Table 40, the source gases for the formation of deposited film were introduced through respective gas inlet conduits.

In the isolation vessels 300-a, 300-b, and n-type a-Si:H:F film and a p⁺-type μc-Si:H:F film were formed in the deposited film forming conditions as shown in Table 43.

First, the microwave plasma was excited within each film formation chamber, the strip member was conveyed from left to right side in the figure at a conveying speed of 55 cm/min, when the discharge was stabilized, so as to continuously laminate n-type, i-type and p-type semiconductor layers.

The semiconductor layer was laminated over the entire length of the strip member 101, and taken out after cooling, and further, a solar cell module of 35 cm×70 cm was continuously fabricated in the continuous modularization apparatus.

With the solar cell module fabricated, the characteristics evaluation was made under the light irradiation of AM1.5 (100 mW/cm²), so that the photoelectric transfer efficiency was 7.6% or more, and the dispersion of characteristics between modules was within 5%.

Also, the rate of change for the photoelectric transfer efficiency relative to the initial value after the 500-hour continuous light irradiation of AM1.5 (100 mW/cm²) was measured to be within 9.5%.

An electric power supply system of 5 kW could be fabricated with the connection of these modules.

Fabrication example 17

In this fabrication example, an a-SiC:H:F film having a band gap profile as shown in FIG. 25C was used in a pin-type photovoltaic device fabricated in the fabrication example 16, instead of an a-SiGe:H:F film as the i-type semiconductor layer.

The a-SiC:H:F film was formed by introducing the source gases for the formation of deposited film through respective gas inlet conduits under the conditions as shown in Table 44, with the surface temperature of strip member retained at 270° C., the internal pressure retained at 18 mTorr, and the microwave power being 1.2 kW×2. The formation and modularization of other semiconductor layers were made in the same operation and method as in the fabrication example 5, except that the conveying speed was 50 cm/min, so as to fabricate a solar cell module.

With the solar cell module fabricated, the characteristics evaluation was under the light irradiation of AM1.5 (100 mW/cm²), so that the photoelectric transfer efficiency was 6.9% or more, and the dispersion of characteristics between modules was within 5%.

Also, the rate of change for the photoelectric transfer efficiency relative to the initial value after the 500-hour continuous light irradiation of AM1.5 (100 mW/cm²) was measured to be within 9.5%.

An electric power supply system of 5 kW could be fabricated with the connection of these modules.

Fabrication example 18

In this fabrication example, an a-SiC:H:F film having a fermi level profile as shown in FIG. 26B was used in a pin-type photovoltaic device fabricated in the fabrication example 16, instead of an a-SiGe:H:F film as the i-type semiconductor layer.

The a-SiC:H:F film was formed by introducing the source gases for the formation of deposited film through respective gas inlet conduits under the conditions as shown in Table 45, with the surface temperature of strip member retained at 270° C., the internal pressure retained at 8 mTorr, and the microwave power being 0.65 kW×2. The formation and modularization of other semiconductor layers were made in the same operation and method as in the fabrication example 5, except that the conveying speed was 50 cm/min, so as to fabricate a solar cell module.

With the solar cell module fabricated, the characteristics evaluation was made under the light irradiation of AM1.5 (100 mW/cm²), so that the photoelectric transfer efficiency was 8.6% or more, and the dispersion of characteristics between modules was within 5%.

Also, the rate of change for the photoelectric transfer efficiency relative to the initial value after the 500-hour continuous light irradiation of AM1.5 (100 cmW/cm²) was measured to be within 9.5%.

An electric power supply system of 5 kW could be fabricated with the connection of these modules.

Fabrication example 19

In this fabrication example, a photovoltaic device having the layer configuration as shown in FIG. 24C was fabricated. In the fabrication, an apparatus (not shown) was used in which isolation vessels 300-a', 300', 300-b' with the same constitution as the isolation vessels 300-a, 300, 300-b in the apparatus shown in FIG. 13, were further connected to the gas gate in this order.

The strip member of the same material, processed in the same way, as in the fabrication example 12, was used, the under cell and the upper cell were made with the same layer configuration as in the fabrication example 16 and 18, respectively, in which the fabrication conditions for each semiconductor layer were the same as in each fabrication example, except that the surface temperataure of strip member was 270° C., 270° C., 260° C., 260° C., 250° C. and 240° C. from the strip member side. The modularization process was performed in the same operation and method as in the fabrication example 5 so as to fabricate a solar cell module.

With the solar cell module fabricated, the characteristics evaluation was made under the light irradiation of AM1.5 (100 mW/cm$^2$), so that the photoelectric transfer efficiency was 10.5% or more, and the dispersion of characteristics between modules was within 5%.

Also, the rate of change for the photoelectric transfer efficiency relataive to the initial value after the 500-hour continuous light irradiation of AM1.5 (100 mW/cm$^2$) was measured to the within 9%.

An electric power supply system of 5 kW could be fabricated with the connection of these modules.

Fabrication example 20

In this fabrication example, a photovoltaic device having the layer configuration as shown in FIG. 24C was fabricated. In the fabrication, an apparatus (not shown) was used in which isolation vessels 300-a', 300', 300-b' with the same constitution as the isolation vessels 300-a, 300, 300-b in the apparatus shown in FIG. 13, were further connected to the gas gate in this order.

The strip member of the same material, processed in the same way, as in the fabrication example 12, was used, the under cell and the upper cell were made with the same layer configuration as in the fabrication example 18 and 17, respectively, in which the fabrication conditions for each semiconductor layer were the same as in each fabrication example, except that the surface temperature of strip member was 260° C., 250° C., 250° C., 240° C., 240° C. and 230° C. from the strip member side. The modularization process was made in the same operation and method as in the fabrication example 16 to fabricate a solar cell module.

With the solar cell module fabricated, the characteristics evaluation was made under the light irradiation of AM1.5 (100 mW/cm$^2$), so that the photoelectric transfer efficiency was 10.4% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9%.

An electric power supply system of 5 kW could be fabricated with the connection of the these modules.

Fabrication example 21

In this fabrication example, a photovoltaic device having the layer configuration as shown in FIG. 24D was fabricated. In the fabrication, an apparatus (not shown) was used in which isolation vessels 300-a', 300', 300-b', 300-a", 300", 300-b" with the same constitution as the isolation vessels 300-a, 300, 300-b in the apparatus shown in FIG. 13, were further connected to the gas gate in this order.

The strip member of the same material, processed in the same way, as in the fabrication example 12, was used, the under cell, the intermediate cell, and the upper cell were made with the same layer configuration as in the fabrication example 16, 18 and 17, respectively, in which the deposited film fabrication conditions for each semiconductor layer were shown in Tables 46 and 47. The modularization process was made in the same operation and method as in the fabrication example 16 to fabricate a solar cell module.

With the solar cell module fabricated, the characteristics evaluation was made under the light irradiation of AM1.5 (100 mW/cm$^2$), so that the photoelectric transfer efficiency was 10.7% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 8.5%.

An electric power supply system of 5 kW could be fabricated with the connection of these modules.

Fabrication example 22

The continuous deposition of amorphous silicone germanium was made, using a continuous microwave plasma-assisted CVD apparatus (FIG. 19) as shown in the fabrication example 37.

First, a strip member supply roller 208 having wound a strip member (46 cm wide×100 cm long×0.2 cm thick) made by SUS430BA, sufficiently defatted and cleaned, was set to a strip member carrying in chamber 202 having a strip member supply mechanism, the strip member 201 was passed through the gas isolation passage 206 and via opening portion supporting outer roller 111, opening portion supporting inner roller 112, and bend supporting inner ring 113 in each of isolation vessels 203 to 205, through strip member discharge chamber 207 where strip member withdrawal roller 209 is disposed to adjusted to adjust the tension to the degree having no slackness. The conditions such as the bent shape of strip member or the allocation of gas inlet conduits are shown in Table 53.

Thus, the strip member carrying in chamber 201, the strip member carrying out chamber 207, and the isolation chambers 203 to 205 are roughly evacuated by a rotary pump not shown, then evacuated up to about $10^{-3}$ Torr by starting a mechanical booster pump not shown, and then further evacuated up to less than $5 \times 10^{-6}$ Torr by an oil diffusion pump (HS-32 made by Varian) not shown, which the surface temperature of the substrate is retained at 270° C. by operating a temperature control mechanism 226 disposed within the isolation vessel 204.

When the degasification had been sufficiently made, source gases for the formation of deposited film were introduced from respective gas inlet conduits under the conditions as shown in Table 54, and the pressure within the film formation chamber 212 was retained at 22 mTorr by adjusting the opening of a throttle valve attached to the oil diffusion pump. At this time, the pressure within the isolation vessel 204 was 8 mTorr. When the pressure was stabilized, the microwave having an effective power of 0.8 kW was radiated from a microwave power source not shown via the central conductor 102. Immediately, the source gases introduced were converted into the plasma to form a plasma region within the film formation chamber 212.

Thus, the opening portion supporting outer roller 111, the opening portion supporting inner roller 112, and the bend supporting inner ring 113 (driving mechanisms not shown) were started, and controlled so that the conveying speed of the strip member might be at 40 cm/min.

Note that H$_2$ gas was flowed as the exhaust gas by 50 sccm through the exhaust gas inlet conduit 210 into the gas isolation passage 206. The deposited film was formed continuously for 30 minutes after the start of conveyance. Due to the use of a long strip member, after the termination of one film formation example, subsequent other formation of deposited film was carried out, and after the termination of all deposit films, the strip member was cooled and taken out, in which the film pressure distribution of deposited film on the strip member formed in this film formation example was measured in the width and length directions, so that it was within 5%, and the deposition rate was 35 Å/sec on the average.

Figure 27:
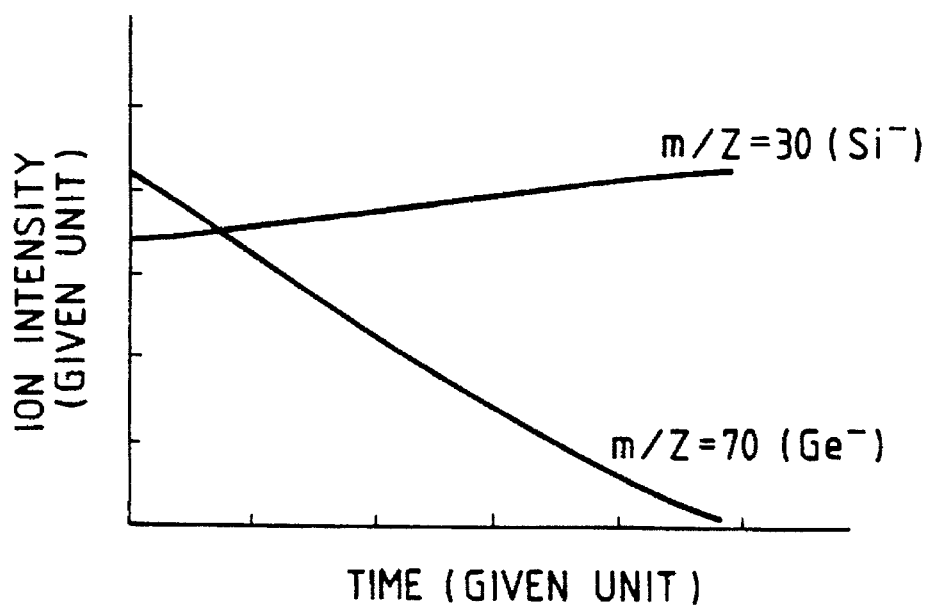
FIGS. 27 to 30 are are views showing the depth profile of component device of deposited film formed in a fabrication example of the present invention.

Arbitrary six parts of the substrate having the deposited film formed were cut out using SIMS (ims-3f made by CAMECA) and the component analysis was made in the depth direction of deposited film, so that a depth profile as shown in FIG. 27 was obtained, which indicated that a band gap profile as shown in FIG. 25B had been substantially formed. The determination for the total amount of hydrogen in the film using an in-metal hydrogen analyzer (EMGA-1100, made by Horiba Ltd.) indicated 18±2 atomic %.

Fabrication example 23

Following the deposited film forming process performed in the fabrication example 22, the introduction of used source gases was stopped, the isolation vessel 204 was evacuated up to an internal pressure of $5 \times 10^{-6}$ Torr or less, then the source gases for the formation of deposited film were introduced from respective gas inlet conduits under the conditions as shown in Table 55, and the deposited film was continuously formed in the same conditions except that the internal pressure was retained at 23 mTorr, and the microwave power was 0.9 kW.

After the termination of this fabrication example and other fabrication examples, the substrate was cooled and taken out, in which the film thickness distribution of deposited film formed in this fabrication example was measured in the width and length directions, so that it was within 5%, and the deposition rate was 48 Å/sec on the average.

Figure 28:
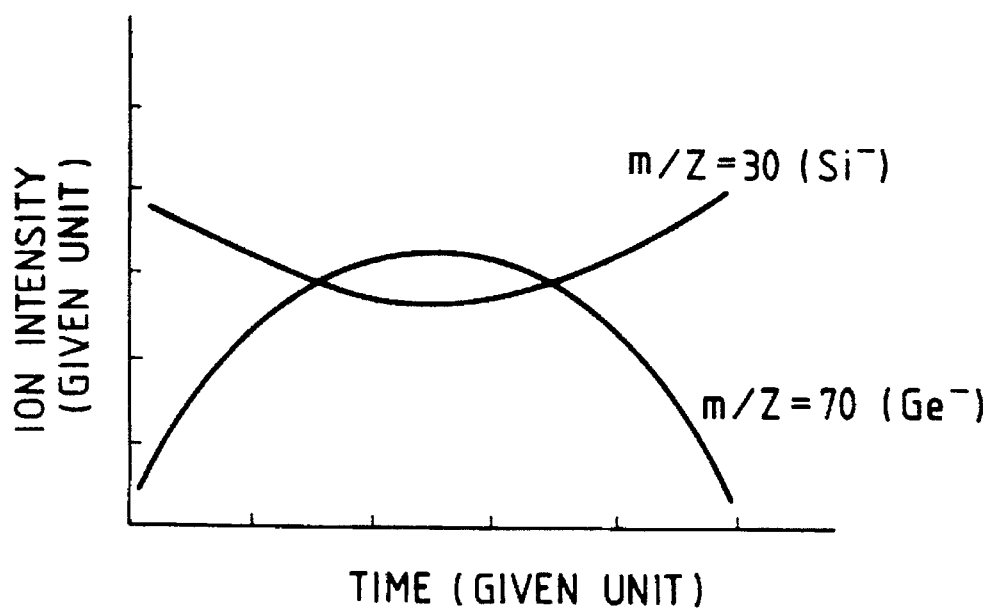

Arbitrary six parts of the substrate having the deposited film formed were cut out using SIMS (ims-3f made by CAMECA) and the component analysis was made in the depth direction of deposited film, so that a depth profile as shown in FIG. 28 was obtained, which indicated that a band gap profile as shown in FIG. 25D had been substantially formed. The determination for the total amount of hydrogen in the film using an in-metal hydrogen analyzer (EMGA-1100, made by Horiba Ltd.) indicated 17±2 atomic %.

Fabrication example 24

Following the deposited film forming process performed in the fabrication example 22, the introduction of used source gases was stopped, the isolation vessel 204 was evacuated up to an internal pressure of $5 \times 10^{-6}$ Torr or less, then the source gases for the formation of deposited film were introduced from respective gas inlet conduits under the conditions as shown in Table 56, and the deposited film was continuously formed in the same conditions except that the internal pressure was retained at 26 mTorr, the microwave power was 1.5 kW, and the conveying speed was 35 cm/min.

After the termination of this fabrication example and other fabrication examples, the substrate was cooled and taken out, in which the film thickness distribution of deposited film formed in this fabrication example was measured in the width and length directions, so that it was within 5%, and the deposition rate was 52 Å/sec on the average.

Figure 29:
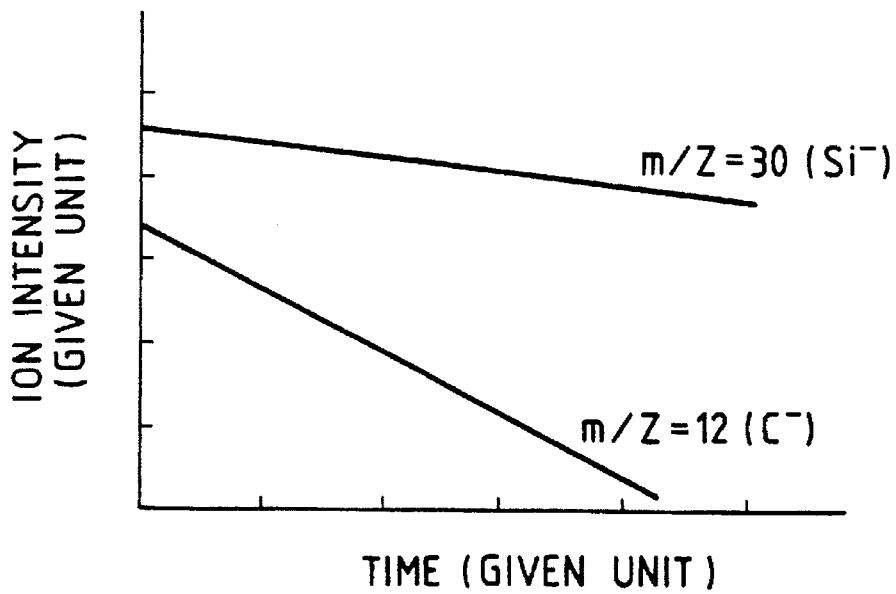

Arbitrary six parts of the substrate having the deposited film formed were cut out using SIMS (ims-3f made by CAMECA) and the component analysis was made in the depth direction of deposited film, so that a depth profile as shown in FIG. 29 was obtained, which indicated that a band gap profile as shown in FIG. 25C had been substantially formed. The determination for the total amount of hydrogen in the film using an in-metal hydrogen analyzer (EMGA-1100, made by Horiba Ltd.) indicated 14±2 atomic %.

Fabrication example 25

As the deposited film forming process performed in the fabrication example 22, the isolation vessel 204 was evacuated up to an internal pressure of $5 \times 10^{-6}$ Torr or less, then the source gases for the formation of deposited film were introduced from respective gas inlet conduits under the conditions as shown in Table 57, and the deposited film was formed in the same conditions except that the internal pressure was retained at 24 mTorr and the microwave power was 1.2 kW.

After the termination of this fabrication example and other fabrication examples, the substrate was cooled and taken out, in which the film thickness distribution of deposited film formed in this fabrication example was measured in the width and length directions, so that it was within 5%, and the deposition rate was 110 Å/sec on the average.

Figure 30:
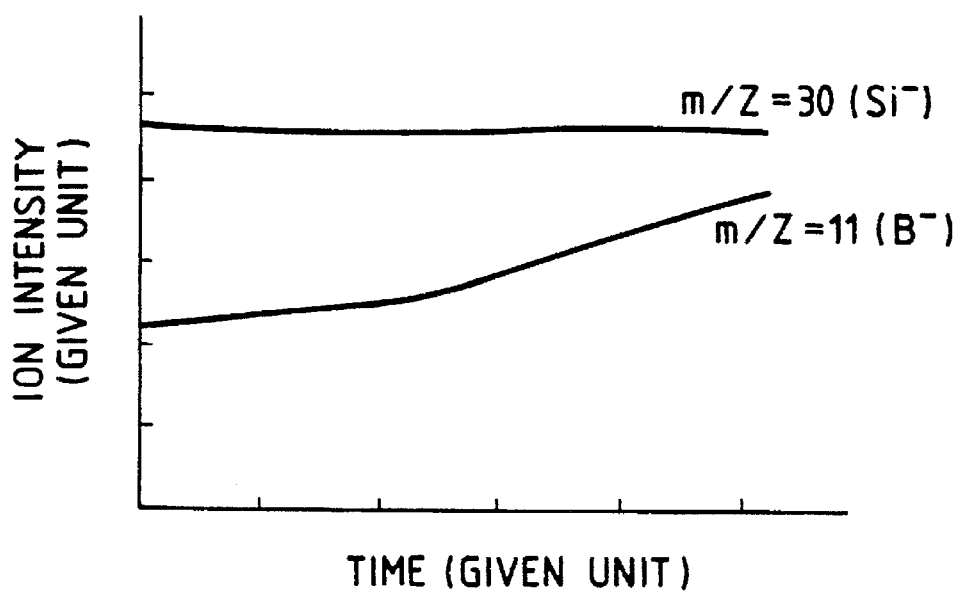
Figure 31:
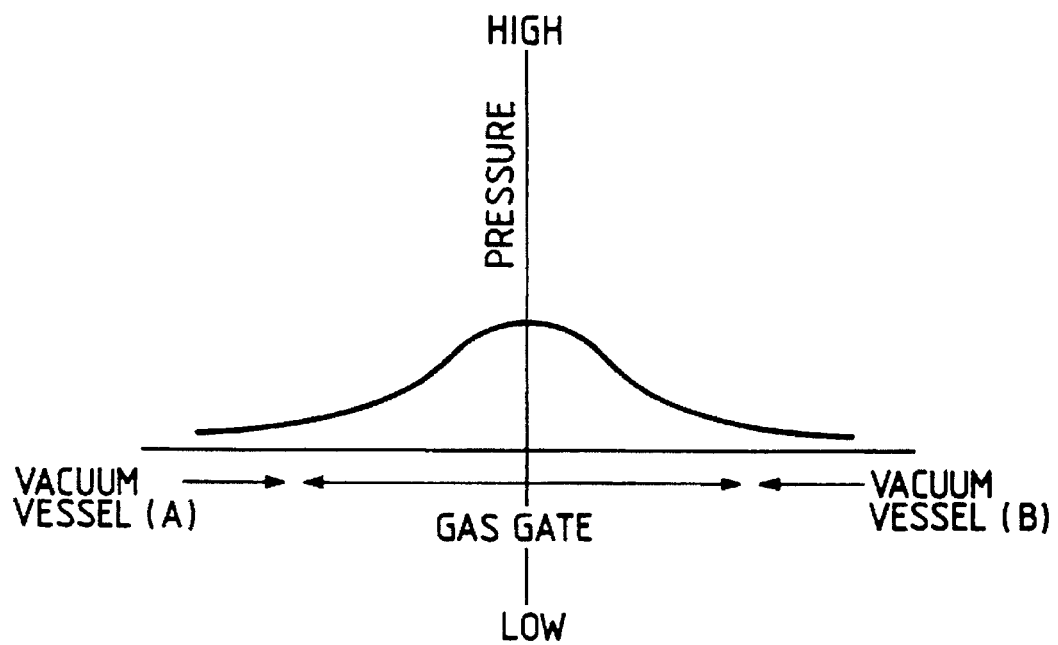
FIG. 31 is a typical view showing the pressure gradient of gas gate means in the present invention.
Figure 32:
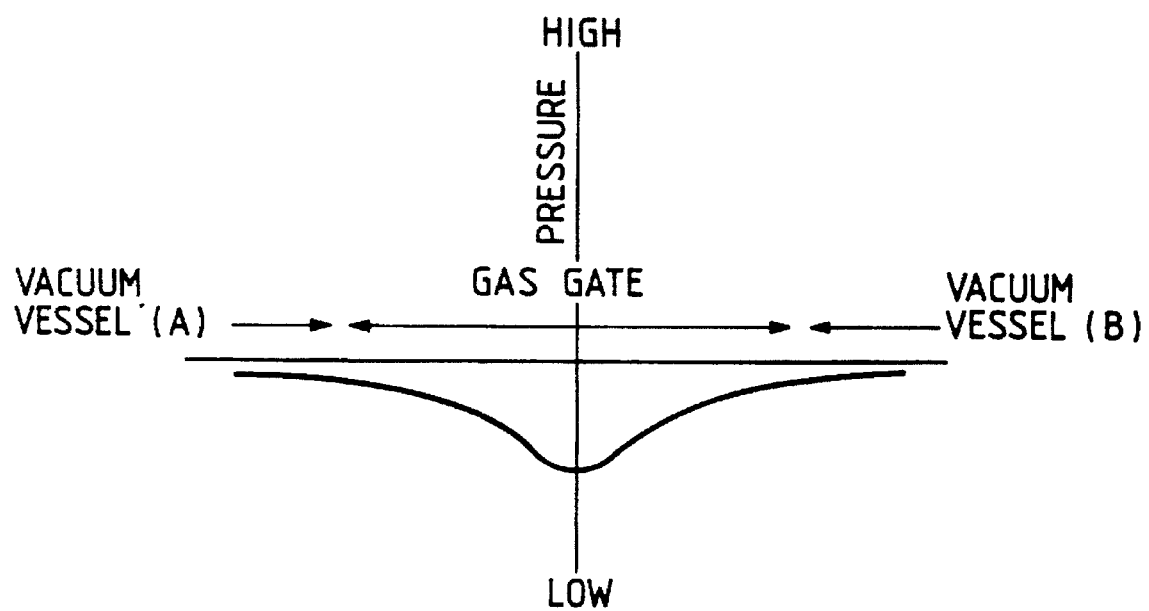
FIG. 32 is a typical view showing the pressure gradient of gas gate means in the present invention.

Arbitrary six parts of the substrate having the deposited film formed were cut out using SIMS (ims-3f made by CAMECA) and the component analysis was made in the depth direction of deposited film, so that a depth profile as shown in FIG. 30 was obtained, which indicated that a doping profile as shown in FIG. 26B had been substantially formed. The determination for the total amount of hydrogen in the film using an in-metal hydrogen analyzer (EMGA-1100, made by Horiba Ltd.) indicated 18±2 atomic %.

Fabrication example 26

In this fabrication example, a pin-type photovoltaic device having the layer configuration as shown in a typical cross-sectional view of FIG. 24A was fabricated using the apparatus of FIG. 19.

The photovoltaic device is a photovoltaic device 1000 which has under electrode 1002, n-type semiconductor layer 1003, i-type semiconductor layer having a band gap profile as shown in FIG. 25D, p-type semiconductor layer 1005, transparent electrode 1006 and collecting electrode 1007 deposited in this order on the substrate 1001. With this photovoltaic device, it is assumed that the light is incident from the transparent electrode 1006 side.

First, the same strip member made by SUS430BA as in the fabrication example 22 was set to a continuous sputtering apparatus, and a 1000 Å thick Ag thin film, with Ag (99.99%) electrode as the target, and consecutively a 1.2 μm thick ZnO thin film, with ZnO (99.99%) electrode as the target, were deposited with the sputtering, to form the under electrode 1002.

Subsequently, the strip member formed with the under electrode 1002 was set to the continuous deposited film forming apparatus, as shown in FIG. 19, in the same manner as in the fabrication example 22. The conditions such as the bent shape of substrate within the isolation vessel 204 are shown in Table 58. Under the conditions as shown in Table 59, the source gases for the formation of deposited film were introduced through respective gas inlet conduits.

In the isolation vessels 203, 205, an n-type a-Si:H:F film and a p⁺-type μc-Si:H:F film were formed in the deposited film forming conditions as shown in Table 60.

First, the microwave plasma was excited within each film formation chamber, the strip member 201 was conveyed from left to right side in the figure at a conveying speed of 41 cm/min, when the discharge was stabilized, so as to continuously laminate n-type, i-type and p-type semiconductor layers.

The semiconductor layer was laminated over the entire length of the strip member 201, and taken out after cooling, and further, a solar cell module of 35 cm×70 cm was continuously fabricated in the continuous modularization apparatus.

With the solar cell module fabricated, the characteristics evaluation was made under the light irradiation of AM1.5 (100 mW/cm²), so that the photoelectric transfer efficiency was 7.5% or more and the dispersion of characteristics between modules was within 5%.

Also, the rate of change for the photoelectric transfer efficiency relative to the initial value after the 500-hour continuous light irradiation of AM1.5 (100 mW/cm²) was measured to be within 9.5%.

An electric power supply system of 5 kW could be fabricated with the connection of these modules.

Fabrication example 27

In this fabrication example, an a-SiC:H:F film having a band gap profile as shown in FIG. 25C was used in a pin-type photovoltaic device fabricated in the fabrication example 26, instead of an a-SiGe:H:F film as the i-type semiconductor layer.

The a-SiC:H:F film was formed by introducing the source gases for the formation of deposited film through respective gas inlet conduits under the conditions as shown in Table 61, with the surface temperature of strip member retained at 250° C., the internal pressure retained at 36 mTorr, and the microwave power being 1.6 kW. The formation and modularization of other semiconductor layers were made in the same operation and method as in the fabrication example 26, except that the conveying speed was 45 cm/min, so as to fabricate a solar cell module.

With the solar cell module fabricated, the characteristics evaluation was made under the light irradiation of AM1.5 (100 mW/cm$^2$), so that the photoelectric transfer efficiency was 6.8% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9.5%.

An electric power supply system of 5 kW could be fabricated with the connection of these modules.

Fabrication example 28

In this fabrication example, an a-Si:H:F film having a fermi level profile as shown in FIG. 26B was used in a pin-type photovoltaic device fabricated in the fabrication example 26, instead of an a-SiGe:H:F film as the i-type semiconductor layer.

The a-Si:H:F film was formed by introducing the source gases for the formation of deposited film through respective gas inlet conduits under the conditions as shown in Table 62, with the surface temperature of strip member retained at 270° C., the internal pressure retained at 45 mTorr, and the microwave power being 2.5 kW. The formation and modularization of other semiconductor layers were made in the same operation and method as in the fabrication example 26, except that the conveying speed was 50 cm/min, so as to fabricate a solar cell module.

With the solar cell module fabricated, the characteristics evaluation was made under the light irradiation of AM1.5 (100 mW/cm$^2$), so that the photoelectric transfer efficiency was 8.5% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9.5%.

An electric power supply system of 5 kW could be fabricated with the connection of these modules.

Fabrication example 29

In this fabrication example, a photovoltaic device having the layer configuration as shown in FIG. 24C was fabricated. In the fabrication, an apparatus (not shown) was used in which isolation vessels 203', 204', 205' with the same constitution as the isolation vessels 203, 204, 205 in the apparatus shown in FIG. 19, were further connected to the gas gate in this order.

The strip member of the same material, processed in the same way, as in the fabrication example 22, was used, the under cell and the upper cell were made with the same layer configuration as in the fabrication example 26 and 28, respectively, in which the fabrication conditions for each semiconductor layer were the same as in each fabrication example, except that the surface temperature of strip member was 270° C., 260° C., 260° C., 250° C., 250° C. and 240° C. from the strip member side. The modularization process was performed in the same operation and method as in the fabrication example 26 so as to fabricate a solar cell module.

With the solar cell module fabricated, the characteristics evaluation was made under the light irradiation of AM1.5 (100 mW/cm$^2$), so that the photoelectric transfer efficiency was 10.4% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9%.

An electric power supply system of 5 kW could be fabricated with the connection of these modules.

Fabrication example 30

In this fabrication example, a photovoltaic device having the layer configuration as shown in FIG. 24C was fabricated. In the fabrication, an apparatus (not shown) was used in which isolation vessels 203', 204', 205' with the same constitution as the isolation vessels 203, 204, 205 in the apparatus shown in FIG. 2, where further connected to the gas gate in this order.

The strip member of the same material, processed in the same way, as in the fabrication example 22, was used, the under cell and the upper cell were made with the same layer configuration as in the fabrication example 28 and 27, respectively, in which the fabrication conditions for each semiconductor layer were the same as in each fabrication example, except that the surface temperature of strip member was 270° C., 270° C., 260° C., 250° C., 240° C. and 240° C. from the strip member side. The modularization process was made in the same operation and method as in the fabrication example 26 to fabricate a solar cell module.

With the solar cell module fabricated, the characteristics evaluation was made under the light irradiation of AM1.5 (100 mW/cm$^2$), so that the photoelectric transfer efficiency was 10.3% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 9%.

An electric power supply system of 5 kW could be fabricated with the connection of these modules.

Fabrication example 31

In this fabrication example, a photovoltaic device having the layer configuration as shown in FIG. 24D was fabricated. In the fabrication, an apparatus (not shown) was used in which isolation vessels 203', 204', 205', 203", 204", 205" with the same constitution as the isolation vessels 203, 204, 205 in the apparatus shown in FIG. 21, were further connected to the gas gate in this order.

The strip member of the same material, processed in the same way, as in the fabrication example 22, was used, the under cell, the intermediate cell, and the upper cell were made with the same layer configuration as in the fabrication example 26, 28 and 27, respectively, in which the deposited film fabrication conditions for each semiconductor layer were shown in Tables 63 and 64. The modularization process was made in the same operation and method as in the fabrication example 26 to fabricate a solar cell module.

With the solar cell module fabricated, the characteristics evaluation was made under the light irradiation of AM1.5 (100 mW/cm$^2$), so that the photoelectric transfer efficiency was 10.6% or more, and the dispersion of characteristics between modules was within 5%.

Also, the rate of change for the photoelectric transfer efficiency relative to the initial value after the 500-hour continuous light irradiation of AM1.5 (100 mW/cm$^2$) was measured to be within 8.5%.

An electric power supply system of 5 kW could be fabricated with the connection of these modules.

TABLE 1

| Applicator No. | Waveguide standards | Aperture size (mm) (length × width) | Number of apertures | Internal between apertures | Termination | Open/close state of aperture |
|---|---|---|---|---|---|---|
| 1 | EIAJ, WC1-25 | 60 × 45 | 5 | 50 | closed | Full open |
| 2 | Own company standards inner diameter φ90 mm | 50 × 40 | 6 | 40 | closed | Four open from termination side |
| 3 | Own company standards inner diameter φ100 mm | 35 × 55 | 7 | 40 | closed | Five open from termination side |
| 4 | IEC, R-32 | 60 × 50 | 5 | 50 | closed | Full open |
| 5 | " | " | " | " | " | Four open from termination side |
| 6 | " | 50 × 40 | 6 | 40 | " | Full open |
| 7 | " | " | " | " | " | Four open from termination side |
| 8 | IEC, R-26 | 30 × 70 | 8 | " | Open | Closed for every other aperture from termination side |
| 9 | Own company standards (mm) inner diameter 96 × 27 | 40 × 80 | 6 | 50 | closed | Five open from termination side |

TABLE 2

| | |
|---|---|
| Kind and flow of source gas *) | SiH$_4$: 360 sccm<br>H$_2$: 45 sccm |
| Microwave frequency and power | 2.45 GHz<br>2.0 kW |
| L1, L2 | 2 cm, 2 cm |
| L3 | 12.5 cm |
| Inner diameter and width of curved shape | φ20 cm, 50 cm |
| Inner pressure of film formation chamber | 8 mTorr |
| Material and size of separating means | Quartz tube (thickness 3 mm) φ12 cm × 80 cm (inner diameter) |
| Kind of strip member | SUS 430BA |
| Punching board for containment of microwave plasma region | Hole diameter 8 mm, Opening ratio 45% made by SUS 316L Al$_2$O$_3$ flamed coated on the surface |

*) Evenly introduced from gas inlet conduits 112a, 112b, 112c

TABLE 3

| Experimental example | Applicator No. | Discharge condition |
|---|---|---|
| 1 | 1 | Stable, but slightly deviated to microwave power source side |
| 2 | 2 | Stable substantially over entire surface |
| 3 | 3 | Stable substantially over entire surface |
| 4 | 4 | Stable, but slightly deviated to microwave power source side |
| 5 | 5 | Stable substantially over entire surface |
| 6 | 6 | Stable, but slightly deviated to microwave power source side |
| 7 | 7 | Stable substantially over entire surface |
| 8 | 8 | Stable substantially over entire surface |
| 9 | 9 | Stable substantially over entire surface |

TABLE 4

| | |
|---|---|
| Kind and flow of source gas *) | SiH$_4$: 360 sccm<br>H$_2$: 45 sccm |
| Microwave frequency and power | 2.45 GHz<br>1.5 kW |
| L4 | 3 cm |
| Inner diameter and width of curved shape | φ40 cm, 50 cm |
| Inner pressure of film formation chamber | 9 mTorr |
| Material and size of separating means | Quartz tube (thickness 3 mm) φ12 cm × 80 cm (inner diameter) |
| Kind of strip member | SUS 430BA |
| Punching board for containment of microwave plasma region | Hole diameter 8 mm Opening ratio 45% made by SUS 316L Al$_2$O$_3$ flamed coated on the surface |

*) Evenly introduced from gas inlet conduits 112a, 112b, 112c

TABLE 5

| Experimental Example | Application No. | Discharge condition |
|---|---|---|
| 10 | 1 | Stable, but slightly deviated upward to microwave power source side |
| 11 | 2 | Stable substantially over entire surface |
| 12 | 3 | Stable substantially over entire |

TABLE 5-continued

| Experimental Example | Application No. | Discharge condition |
|---|---|---|
| | | surface |
| 13 | 4 | Stable, but slightly deviated upward to microwave power source side |
| 14 | 5 | Stable substantially over entire surface |
| 15 | 6 | Stable, but slightly deviated upward to microwave power source side |
| 16 | 7 | Stable substantially over entire surface |
| 17 | 8 | Stable substantially over entire surface |
| 18 | 9 | Stable substantially over entire surface |

TABLE 7-continued

| Experimental example | Applicator No. | Discharge condition |
|---|---|---|
| 27 | 18 | Stable substantially over entire surface |
| 28 | 19 | Stable over entire surface |

TABLE 6

| Applicator No. | Waveguide standards | Aperture size (mm) (L × W) | Shutter size (mm) [L × $W_1$, $W_2$] *3) | Termination | Opening ratio (%) |
|---|---|---|---|---|---|
| 10 | EIAJ, WC1-25 | 480 × 70 | 530 × 45, 65 *1) | Open | 40 |
| 11 | " | " | 530 × 45, 65 *2) R = 42 | Open | 45 |
| 12 | Own company standards inner diameter φ90 mm | 480 × 75 | 530 × 50, 70 *1) | Closed | 40 |
| 13 | Own company standards inner diameter φ100 mm | 470 × 80 | 530 × 55, 75 *2) R = 45 | Open | 45 |
| 14 | IEC, R-32 | 470 × 72 | 520 × 55 | Open | 45 |
| 15 | " | " | 520 × 45, 55 | Closed | 50 |
| 16 | " | " | 530 × 45, 55 *4) R = 40 | Open | 55 |
| 17 | IEC, R-26 | 450 × 86 | 480 × 50, 60 | Open | 45 |
| 18 | Own company standards inner diameter (mm) 96 × 27 | 420 × 95 | 460 × 55, 65 | Closed | 50 |
| 19 | Own company standards inner diameter (mm) 96 × 27 | " | 460 × 55, 65, R = 45 *4) | Open | 55 |

Figure 3C:
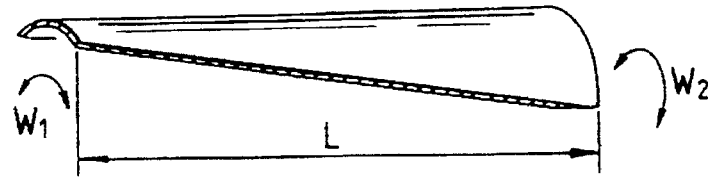
Figure 3D:
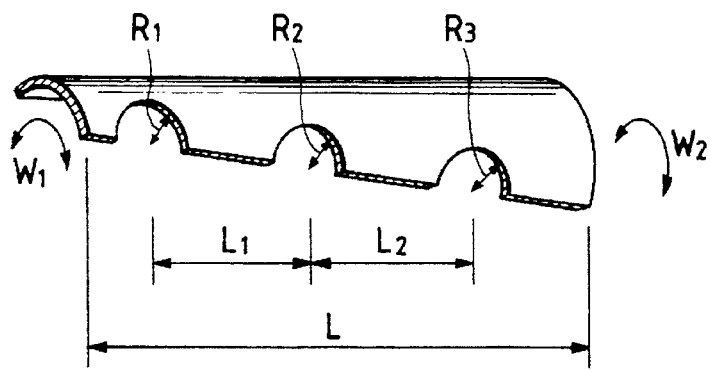

*1) FIG. 3C
*2) FIG. 3D
*3) L × $W_1$: strip shape
 L × $W_1$, $W_2$: trapezoidal shape
*4) L × $W_1$, $W_2$ having three semicircles of radius R cut away

TABLE 7

| Experimental example | Applicator No. | Discharge condition |
|---|---|---|
| 19 | 10 | Stable substantially over entire surface microwave power source side |
| 20 | 11 | Stable over entire surface |
| 21 | 12 | Stable substantially over entire surface |
| 22 | 13 | Stable over entire surface |
| 23 | 14 | Stable, but slightly deviated to microwave power source side |
| 24 | 15 | Stable substantially over entire surface |
| 25 | 16 | Stable over entire surface |
| 26 | 17 | Stable substantially over entire surface |

TABLE 8

| Experimental example | Applicator No. | Discharge condition |
|---|---|---|
| 29 | 10 | Stable substantially over entire surface |
| 30 | 11 | Stable over entire surface |
| 31 | 12 | Stable substantially over entire surface |
| 32 | 13 | Stable over entire surface |
| 33 | 14 | Stable, but slightly deviated to microwave power source side |
| 34 | 15 | Stable substantially over entire surface |
| 35 | 16 | Stable over entire surface |
| 36 | 17 | Stable substantially over entire surface |

TABLE 8-continued

| Experimental example | Applicator No. | Discharge condition |
|---|---|---|
| 37 | 18 | Stable substantially over entire surface |
| 38 | 19 | Stable over entire surface |

TABLE 9

| Comparative example | Pressure (mTorr) | | | | | | | | |
|---|---|---|---|---|---|---|---|---|---|
| | 0.5 | 1 | 3 | 10 | 30 | 50 | 100 | 200 | 500 |
| 1 | x | Δ*) | o | ⊚ | ⊚ | ⊚ | o | o | Δ**) |
| 2 | x | Δ*) | o | ⊚ | ⊚ | ⊚ | ⊚ | o | Δ**) |
| 3 | x | Δ*) | o | ⊚ | ⊚ | ⊚ | o | o | Δ**) |
| 4 | x | Δ*) | o | ⊚ | ⊚ | ⊚ | ⊚ | o | Δ**) |

*)Flickering of discharge
**)Abnormal concentration of discharge

TABLE 10

| Comparative example | Microwave power (W) | | | | | | |
|---|---|---|---|---|---|---|---|
| | 200 | 300 | 700 | 1000 | 1500 | 3000 | 5000 |
| 5 | x | Δ*) | o | ⊚ | ⊚ | o | Δ**) |
| 6 | x | Δ*) | ⊚ | ⊚ | ⊚ | ⊚ | Δ**) |
| 7 | x | Δ*) | o | ⊚ | ⊚ | o | Δ**) |
| 8 | x | Δ*) | ⊚ | ⊚ | ⊚ | o | Δ**) |

*)Flickering of discharge
**)Abnormal concentration of discharge

TABLE 11

| Comparative example | $L_1, L_2$ (cm) | | | | | | | |
|---|---|---|---|---|---|---|---|---|
| | 0.5, 0.5 | 1, 1 | 1, 2.5 | 2, 3 | 3, 3 | 3, 5 | 5, 5 | 8, 8 |
| 9 | o | o | ⊚ | ⊚ | ⊚ | o | Δ**) | x |
| 10 | o | o | ⊚ | ⊚ | ⊚ | o | Δ**) | x |
| 11 | o | o | ⊚ | ⊚ | ⊚ | o | Δ**) | x |
| 12 | o | o | ⊚ | ⊚ | ⊚ | Δ*) | Δ**) | x |

*)Flickering of discharge, microwave slightly leaking
**)Flickering of discharge, microwave greatly leaking

TABLE 12

| Comparative example | $L_3$ | | | | |
|---|---|---|---|---|---|
| | 3 | 5 | 8 | 10 | 14 |
| 13 | x*) | Δ**) | o | ⊚ | ⊚ |
| 14 | x*) | Δ**) | o | ⊚ | ⊚ |
| 15 | x*) | Δ**) | o | ⊚ | ⊚ |
| 16 | Δ**) | Δ**) | o | ⊚ | ⊚ |

*)No discharge
**)Flickering of discharge

TABLE 13

| Comparative example | Inner diameter of curved shape (cm) | | | | | | |
|---|---|---|---|---|---|---|---|
| | 12 | 16 | 20 | 25 | 30 | 35 | 45 |
| 17 | ⊚ | ⊚ | ⊚ | ⊚ | o | Δ*) | Δ*) |
| 18 | ⊚ | ⊚ | ⊚ | ⊚ | ⊚ | o | Δ*) |
| 19 | ⊚ | ⊚ | ⊚ | ⊚ | o | Δ*) | Δ*) |
| 20 | ⊚ | ⊚ | ⊚ | ⊚ | o | o | Δ*) |

*)Flickering discharge

TABLE 14

| Comparative example | Pressure (mTorr) | | | | | | | | |
|---|---|---|---|---|---|---|---|---|---|
| | 0.5 | 1 | 3 | 10 | 30 | 50 | 100 | 200 | 500 |
| 21 | x | Δ*) | o | ⊚ | ⊚ | ⊚ | ⊚ | o | Δ**) |
| 22 | x | Δ*) | ⊚ | ⊚ | ⊚ | ⊚ | ⊚ | o | Δ**) |
| 23 | x | Δ*) | o | ⊚ | ⊚ | ⊚ | ⊚ | o | Δ**) |
| 24 | x | Δ*) | o | ⊚ | ⊚ | ⊚ | ⊚ | o | Δ**) |

*)Flickering of discharge
**)Abnormal concentration of discharge

TABLE 15

| Comparative example | Microwave power (W) | | | | | | |
|---|---|---|---|---|---|---|---|
| | 200 | 300 | 700 | 1000 | 1500 | 3000 | 5000 |
| 25 | x | Δ*) | ⊚ | ⊚ | ⊚ | o | Δ**) |
| 26 | x | Δ*) | ⊚ | ⊚ | ⊚ | ⊚ | Δ**) |
| 27 | x | Δ*) | ⊚ | ⊚ | ⊚ | o | Δ**) |
| 28 | x | Δ*) | ⊚ | ⊚ | ⊚ | o | Δ**) |

*)Flickering of discharge
**)Abnormal concentration of discharge

TABLE 16

| Comparative example | $L_4$ (cm) | | | | | | | |
|---|---|---|---|---|---|---|---|---|
| | 1 | 1.5 | 2 | 3 | 5 | 8 | 10 | 14 |
| 29 | o | ⊚ | ⊚ | ⊚ | ⊚ | o | Δ**) | x |
| 30 | o | ⊚ | ⊚ | ⊚ | ⊚ | o | Δ**) | x |
| 31 | o | ⊚ | ⊚ | ⊚ | o | Δ*) | Δ**) | x |
| 32 | o | ⊚ | ⊚ | ⊚ | ⊚ | o | Δ**) | x |

*)Flickering of discharge, microwave leaking
**)Microwave greatly leaking

TABLE 17

| Comparative example | Inner diameter of curved shape (cm) | | | | | | |
|---|---|---|---|---|---|---|---|
| | 16 | 20 | 30 | 45 | 50 | 60 | 70 |
| 33 | o | ⊚ | ⊚ | ⊚ | o | Δ | Δ*) |
| 34 | o | ⊚ | ⊚ | ⊚ | ⊚ | o | Δ*) |
| 35 | o | ⊚ | ⊚ | ⊚ | o | Δ | Δ*) |
| 36 | o | ⊚ | ⊚ | ⊚ | o | o | Δ*) |

*)Flickering of discharge

TABLE 18

| | |
|---|---|
| Inner diameter of curved shape (cm) | φ22 |
| $L_1, L_2$ | 2 cm, 2 cm |
| $L_3$ | 12.5 cm |

TABLE 18-continued

| | |
|---|---|
| Material and size of separating means | Quartz tube (thickness 3 mm) φ12 cm × 100 cm (inner diameter) |
| Punching board for containment of microwave plasma region | Hole diameter 10 mm, Opening ratio 40% made by SUS 316L Alumina flame coating |
| Disposition of gas inlet conduit | At a position 6 cm away from center of film formation chamber $\theta_3 = \theta_5 = 60°$, $\theta_4 = 120°$ |

TABLE 19

| Gas inlet conduit | Kind of gas | Flow rate (sccm) |
|---|---|---|
| 112a | $SiH_4$ | 90 |
| | $SiF_4$ | 2 |
| 112b | $SiH_4$ | 50 |
| | $GeH_4$ | 55 |
| 112c | $SiH_4$ | 30 |
| | $GeH_4$ | 20 |

TABLE 20

| Gas inlet conduit | Kind of gas | Flow rate (sccm) |
|---|---|---|
| 112a | $SiH_4$ | 95 |
| | $SiF_4$ | 2 |
| 112b | $SiH_4$ | 30 |
| | $GeH_4$ | 65 |
| 112c | $SiH_4$ | 90 |
| | $GeH_4$ | 10 |

TABLE 21

| Gas inlet conduit | Kind of gas | Flow rate (sccm) |
|---|---|---|
| 112a | $SiH_4$ | 95 |
| | $SiF_4$ | 2 |
| 112b | $SiH_4$ | 95 |
| | $CH_4$ | 12 |
| 112c | $SiH_4$ | 100 |
| | $CH_4$ | 18 |

TABLE 22

| Gas inlet conduit | Kind of gas | Flow rate (sccm) |
|---|---|---|
| 112a | $SiH_4$ | 200 |
| | $SiF_4$ | 5 |
| 112b | $SiH_4$ | 200 |
| | $BF_3$ (Diluted by 100 ppm by $H_2$) | 20 |
| 112c | $SiH_4$ | 200 |
| | $BF_3$ (Diluted by 500 ppm by $H_2$) | 5 |

TABLE 23

| | |
|---|---|
| Isolation vessel Parameters | 400 |
| Disposition of gas inlet conduit | At a position 6 cm away from center of film formation chamber $\theta_1 = 90°$, $\theta_2 = 120°$, $\theta_3 = 60°$ |
| Pressure within film formation chamber (mTorr) | 10 |
| Microwave power (kW) | 1.2 |
| Inner diameter of curved shape (cm) | φ20 |
| $L_1$, $L_2$ (cm) | 1.5, 1.5 |
| $L_3$ (cm) | 12.5 |
| Applicator No. | 13 |
| Matrial and size of separating means | Quartz tube (thickness 3 mm) φ12 cm × 100 cm (inner diameter) |
| Punching board for containment of microwave plasma region | Hole diameter 5 mm, Opening ratio 45%, made by SUS 316L, Alumina flame coating |

TABLE 24

| Gas inlet conduit | Kind of gas | Flow rate (sccm) |
|---|---|---|
| 112a | $SiH_4$ | 75 |
| | $H_2$ | 20 |
| 112b | $SiH_4$ | 30 |
| | $GeH_4$ | 60 |
| | $SiF_4$ | 2 |
| 112c | $SiH_4$ | 70 |
| | $GeH_4$ | 15 |

TABLE 25

| Isolation vessel Parameters | 400-a | | 400-b | |
|---|---|---|---|---|
| Source gas for deposited film formation (sccm) | $SiH_4$ | 52 | $SiH_4$ | 18 |
| | $H_2$ | 100 | $H_2$ | 200 |
| | $PH_3/H_2$ (1% $H_2$ diluted) | 7 | $B_2H_6/H_2$ (3000 ppm $H_2$ diluted) | 8 |
| | $SiF_4$ | 5 | $SiF_4$ | 5 |
| Pressure (mTorr) | 12 | | 16 | |
| Microwave power (kW) | 0.85 | | 1.2 | |
| Inner diameter of curved shape (cm) | φ12 *) | | φ12 *) | |
| $L_1$, $L_2$ (cm) | 1.0, 1.0 | | 1.0, 1.0 | |
| $L_3$ (cm) | 10 | | 10 | |
| Applicator No. | 11 | | 11 | |
| Material and size of separating means | Quartz tube (thickness 3 mm) φ10 cm × 100 cm (inner diameter) | | Quartz tube (thickness 3mm) φ10 cm × 100 cm (inner diameter) | |
| Punching board for containment of microwave plasma region | Hole diameter 5 mm Opening ratio 45% SUS 316L Alumina flame coating | | Hole diameter 5 mm Opening ratio 45% SUS 316L Alumina flame coating | |

*) A substrate cover for the fine adjustment of film thickness inserted into curved shape

TABLE 26

| Gas inlet conduit | Kind of gas | Flow rate (sccm) |
|---|---|---|
| 112a | $SiH_4$ | 60 |
| | $H_2$ | 20 |
| 112b | $SiH_4$ | 70 |
| | $CH_4$ | 8 |
| | $SiF_4$ | 2 |

TABLE 26-continued

| Gas inlet conduit | Kind of gas | Flow rate (sccm) |
|---|---|---|
| 112c | $SiH_4$ | 80 |
|  | $CH_4$ | 12 |

*) At a position 6 cm away from a center of film formation chamber, $\theta_3 = \theta_5 = 60°$, $\theta_4 = 120°$

TABLE 27

| Gas inlet conduit *) | Kind of gas | Flow rate (sccm) |
|---|---|---|
| 112a | $SiH_4$ | 85 |
|  | $H_2$ | 30 |
| 112b | $SiH_4$ | 85 |
|  | $H_2$ (Diluted to 100 ppm by $BF_3$) | 5 |

TABLE 27-continued

| Gas inlet conduit *) | Kind of gas | Flow rate (sccm) |
|---|---|---|
| 112c | $SiH_4$ | 85 |
|  | $H_2$ (Diluted to 500 ppm by $BF_3$) | 4 |

TABLE 28

| Semi-conductor layer Parameters | Under element | | | Intermediate element | | |
|---|---|---|---|---|---|---|
|  | 400-a | 400 | 400-b | 400-a' | 400' | 400-b' |
| Source gas for deposited film formation (sccm) | $SiH_4$ 58<br>$H_2$ 120<br>$PH_3/H_2$ 7<br>(1% $H_2$ diluted)<br>$SiF_4$ 4 | **) | $SiH_4$ 20<br>$H_2$ 250<br>$BF_3/H_2$ 10<br>(3000 ppm $H_2$ diluted)<br>$SiF_4$ 4 | $SiH_4$ 48<br>$H_2$ 100<br>$PH_3/H_2$ 7<br>(1% $H_2$ diluted)<br>$SiF_4$ 4 | **) | $SiH_4$ 16<br>$H_2$ 220<br>$BF_3/H_2$ 10<br>(3000 ppm $H_2$ diluted)<br>$SiF_4$ 4 |
| Pressure within film formation chamber (mTorr) | 14 | 12 | 16 | 14 | 6 | 16 |
| Microwave power (kW) | 0.85 | 1.1 | 1.2 | 0.8 | 0.95 | 1.1 |
| Inner diameter of curved shape (cm) | φ12 *) | φ18 | φ12 *) | φ12 *) | φ18 | φ12 *) |
| $L_1, L_2$ (cm) | 1.0, 1.0 | 1.5, 1.5 | 1.0, 1.0 | 1.0, 1.0 | 1.5, 1.5 | 1.0, 1.0 |
| $L_3$ (cm) | 10 | 12 | 10 | 10 | 12 | 10 |
| Applicator No. | 3 | 11 | 3 | 19 | 11 | 19 |
| Material and size of separating means | Quartz tube (thickness 3 mm) φ10 cm × 100 cm (inner diameter) | Quartz tube (thickness 3 mm) φ12 cm × 100 cm (inner diameter) | Same as 400-a | Same as 400-a | Same as 400-a | Same as 400-a |
| Punching board for containment of microwave plasma region | Hole diameter 5 mm, Opening ratio 45% SUS316L, Alumina flame coating | | | Hole diameter 5 mm, Opening ratio 45% SUS316L, Alumina flame coating | | |
| Conveying speed | 42 cm/min | | | 42 cm/min | | |

| Semi-conductor layer Parameters | Upper element | | |
|---|---|---|---|
|  | 400-a" | 400" | 400-b" |
| Source gas for deposited film formation (sccm) | $SiH_4$ 48<br>$H_2$ 100<br>$PH_3/H_2$ 7<br>(1% $H_2$ diluted)<br>$SiF_4$ 4 | **) | $SiH_4$ 16<br>$H_2$ 250<br>$BF_3/H_2$ 10<br>(3000 ppm $H_2$ diluted)<br>$SiF_4$ |
| Pressure within film formation chamber (mTorr) | 12 | 18 | 18 |
| Microwave power (kW) | 0.8 | 1.8 | 1.1 |
| Inner diameter of curved shape (cm) | φ12 *) | φ18 | φ12 *) |

TABLE 28-continued

|  |  |  |  |  |
|---|---|---|---|---|
|  | $L_1, L_2$ (cm) | 1.0, 1.0 | 1.5, 1.5 | 1.0, 1.0 |
|  | $L_3$ (cm) | 10 | 12 | 10 |
|  | Applicator No. | 7 | 16 | 7 |
|  | Material and size of separating means | Same as 400-a | Same as 400-a | Same as 400-a |
|  | Punching board for containment of microwave plasma region | | Hole diameter 5 mm, Opening ratio 45% SUS316L, Alumina flame coating | |
|  | Conveying speed | | 42 cm/min | |

*) A substrate cover for the fine adjustment of film thickness inserted into curved shape.
**) See Table 29.

TABLE 29

| Semi-conductor layer Gas inlet conduit *) | Under cell | | Intermediate cell | | Upper cell | |
|---|---|---|---|---|---|---|
|  | Kind of gas | Flow rate (sccm) | Kind of gas | Flow rate (sccm) | Kind of gas | Flow rate (sccm) |
| 112a | $SiH_4$ | 45 | $SiH_4$ | 65 | $SiH_4$ | 45 |
|  | $H_2$ | 25 | $H_2$ | 55 | $H_2$ | 20 |
| 112b | $SiH_4$ | 50 | $SiH_4$ | 75 | $SiH_4$ | 55 |
|  | $GeH_4$ | 55 | $H_2$ | 4 | $CH_4$ | 4 |
|  | $SiF_4$ | 2 | ($BF_3$ 50 ppm diluted) |  | $SiF_4$ | 1 |
| 112c | $SiH_4$ | 40 | $SiH_4$ | 85 | $SiH_4$ | 60 |
|  | $GeH_4$ | 6 | $H_2$ | 12 | $CH_4$ | 8 |
|  |  |  | ($BF_3$ 100 ppm diluted |  |  |  |

TABLE 30

| Kind and flow of source gas and used gas inlet conduit | $SiH_4$: 120 sccm | 113a |
|---|---|---|
|  | $SiH_4$: 80 sccm $GeH_4$: 120 sccm | 113b |
|  | $SiH_4$: 120 sccm $H_2$: 80 sccm | 113c |
| Microwave frequency and power | 2.45 GHz 850 W × 2 | |
| Gap | 3.2 cm | |
| Inner diameter and width of curved shape | φ20 cm, 45 cm | |
| Inner pressure of film formation chamber | 8 mTorr | |
| Kind and thickness of strip member | SUS 430BA, 0.25 mm | |
| Size of microwave applicator (inner diameter × length) | φ98 mm × 150 mm | |
| Microwave transmission waveguide | EIAJ, WRI-26 | |

TABLE 31

| $\theta_1(°)$ | $\theta_2(°)$ | $\theta_1 + \theta_2(°)$ | Evaluation results |
|---|---|---|---|
| 0 | 0 | 0 | Microwave leakage large Discharge unstable Power noise great (abnormal oscillation) |
| 0 | 45 | 45 | Microwave leakage large Discharge unstable |
| 0 | 90 | 90 | Microwave leakage large Discharge unstable |
| 15 | 15 | 30 | Microwave leakage medium Discharge unstable |
| 15 | 45 | 60 | Microwave leakage small Discharge unstable |
| 15 | 75 | 90 | Microwave leakage small Discharge unstable |
| 15 | 135 | 150 | Microwave leakage small Discharge unstable |
| 15 | 165 | 180 | Microwave leakage medium Discharge unstable Power noise great (abnormal oscillation) |
| 30 | 30 | 60 | No microwave leakage Discharge stable |
| 30 | 60 | 90 | No microwave leakage Discharge stable |
| 30 | 105 | 135 | No microwave leakage Discharge stable |
| 30 | 150 | 180 | No microwave leakage Discharge unstable Power noise great (abnormal oscillation) |
| 45 | 45 | 90 | No microwave leakage Discharge stable |
| 45 | 90 | 135 | No microwave leakage Discharge stable |
| 45 | 105 | 150 | No microwave leakage Discharge stable |
| 45 | 135 | 180 | No microwave leakage Discharge unstable Power noise great (abnormal oscillation) |
| 60 | 60 | 120 | No microwave leakage Discharge stable |
| 60 | 75 | 135 | No microwave leakage Discharge stable |
| 60 | 90 | 150 | No microwave leakage Discharge stable |
| 60 | 120 | 180 | No microwave leakage |

TABLE 31-continued

| $\theta_1(°)$ | $\theta_2(°)$ | $\theta_1 + \theta_2(°)$ | Evaluation results |
|---|---|---|---|
| | | | Discharge unstable |
| | | | Power noise great (abnormal oscillation) |
| 75 | 75 | 150 | No microwave leakage |
| | | | Discharge stable |
| 75 | 90 | 165 | No microwave leakage |
| | | | Discharge slightly unstable |
| 75 | 105 | 180 | No microwave leakage |
| | | | Discharge stable |
| | | | Power noise great (abnormal oscillation) |
| 90 | 90 | 180 | No microwave leakage |
| | | | Discharge stable |
| | | | Power noise great (abnormal oscillation) |

TABLE 32

| Sample No. | Gap L (cm) | Pressure of film formation chamber (mTorr) | Discharge state | Film thickness distribution (width direction) (%) | Film thickness distribution (length direction) (%) |
|---|---|---|---|---|---|
| 1 | 0.4 | 65 | Discharge concentrated near microwave applicator | 1000* | 100* |
| 2 | 0.8 | 28 | Discharge deviated near microwave applicator | 25 | 12 |
| 3 | 1.5 | 12 | Stable discharge | 8 | 7 |
| 4 | 3.5 | 6 | Stable discharge | 5 | 5 |
| 5 | 5.0 | 4 | Stable discharge | 7 | 5 |
| 6 | 7.2 | 2 | Unstable discharge (microwave leakage medium) | 30 | 7 |
| 7 | 10.0 | 1.2 | Discharge not excited (microwave leakage large) | — | — |

*Film is hardly formed in a central portion in a width direction strip member.

TABLE 33

| Sample No. | Inner diameter of curved shape (cm) | Discharge state | Film thickness distribution (width direction) (%) | Film thickness distribution (length direction) (%) |
|---|---|---|---|---|
| 8 | 5.5 | Discharge not excited | — | — |
| 9 | 7 | Unstable discharge | 20 | 12 |
| 10 | 10 | Stable discharge | 10 | 7 |
| 11 | 20 | Stable discharge | 5 | 5 |
| 12 | 25 | Stable discharge | 5 | 5 |
| 13 | 35 | Slightly unstable discharge | 12 | 7 |
| 14 | 45 | Unstable discharge | 25 | 12 |

TABLE 34

| Pressure film formation chamber (mTorr) | Flow of source gas (sccm) | Microwave power (kW) | Discharge state |
|---|---|---|---|
| 1.5 | SiH$_4$: 100 | 3.0 × 2 | o |
| 1.5 | SiH$_4$: 100  H$_2$: 100 | " | Δ |
| 3 | SiH$_4$: 100  H$_2$: 50 | 2.5 × 2 | o |
| 3 | SiH$_4$: 100  H$_2$: 100 | " | Δ |
| 5 | SiH$_4$: 100  H$_2$: 200 | 1.2 × 2 | o |
| 5 | SiH$_4$: 300  H$_2$: 100 | 0.8 × 2 | ⊙ |
| 5 | SiH$_4$: 300  H$_2$: 400 | 0.7 × 2 | o |
| 5 | SiH$_4$: 400 | 0.4 × 2 | ⊙ |
| 10 | SiH$_4$: 10  H$_2$: 300 | 1.0 × 2 | o |
| 10 | SiH$_4$: 300  H$_2$: 600 | " | ⊙ |
| 10 | SiH$_4$: 400 | 0.3 × 2 | ⊙ |
| 10 | SiH$_4$: 10  H$_2$: 800 | 1.0 × 2 | Δ |
| 30 | SiH$_4$: 10 | 0.25 × 2 | ⊙ |
| 30 | SiH$_4$: 10  H$_2$: 300 | 0.7 × 2 | o |
| 30 | SiH$_4$: 300  H$_2$: 300 | 0.6 × 2 | ⊙ |

TABLE 34-continued

| Pressure film formation chamber (mTorr) | Flow of source gas (sccm) | Microwave power (kW) | Discharge state |
|---|---|---|---|
| 30 | SiH$_4$: 300<br>H$_2$: 900 | 0.8 × 2 | ○ |

TABLE 35

| Sample No. | Width size of strip member (cm) | Discharge state | Film thickness distribution (width direction) (%) | Film thickness distribution (length direction) (%) |
|---|---|---|---|---|
| 15 | 5 | Stable discharge | 3 | 5 |
| 16 | 10 | " | 5 | 7 |
| 17 | 25 | Slightly unstable discharge | 8 | 7 |
| 18 | 35 | Stable discharge | 5 | 5 |
| 19 | 45 | " | 5 | 5 |
| 20 | 60 | Slightly unstable discharge | 10 | 7 |
| 21 | 70 | Unstable discharge | 15 | 10 |

TABLE 36

| | |
|---|---|
| Inner diameter of curved shape | φ 20 cm |
| Gap L | 3.2 cm |
| Size of microwave applicator (inner diameter × length) | φ 98 mm × 135 mm |
| Microwave transmission waveguide | EIAJ, WRI-32 |
| Disposition of gas inlet conduit | At a position 3 cm away from center of film formation chamber<br>$\theta_3 = \theta_5 = 60°$,<br>$\theta_4 = 120°$ |

TABLE 37

| Gas inlet conduit | Kind of gas | Flow rate (sccm) |
|---|---|---|
| 113a | SiH$_4$ | 70 |
| 113b | SiH$_4$ | 45 |
| | GeH$_4$ | 25 |
| 113c | SiH$_4$ | 25 |
| | GeH$_4$ | 35 |

TABLE 38

| Gas inlet conduit | Kind of gas | Flow rate (sccm) |
|---|---|---|
| 113a | SiH$_4$ | 80 |
| 113b | SiH$_4$ | 25 |
| | GeH$_4$ | 55 |
| 113c | SiH$_4$ | 75 |
| | GeH$_4$ | 5 |

TABLE 39

| Gas inlet conduit | Kind of gas | Flow ragte (sccm) |
|---|---|---|
| 113a | SiH$_4$ | 60 |
| 113b | SiH$_4$ | 60 |
| | CH$_4$ | 7 |
| 113c | SiH$_4$ | 65 |
| | CH$_4$ | 10 |

TABLE 40

| Gas inlet conduit | Kind of gas | Flow rate (sccm) |
|---|---|---|
| 703a | SiH$_4$ (Diluted to 100 ppm by BF$_3$) | 230 |
| 703b | SiH$_4$ (Diluted to 500 ppm by BF$_3$) | 220 |

TABLE 41

| | |
|---|---|
| Isolation vessel Parameters | 300 |
| Disposition of gas inlet conduit | At a position 3 cm away from center of film chamber<br>$\theta_3 = 90°$, $\theta_4 = 120°$,<br>$\theta_5 = 60°$ |
| Pressure (mTorr) | 9.5 |
| Microwave power (kW) | 0.55 × 2 |
| Inner diameter of curved shape (cm) | φ 20 |
| Gap L (cm) | 3.2 |
| Size of microwave applicator (inner diameter × length) | φ 98 mm × 135 mm |
| Microwave transmission waveguide | EIAJ, WRI-26 |
| Surface temperature of strip member (°C.) | 280 |

TABLE 42

| Gas inlet conduit | Kind of gas | Flow rate (sccm) |
|---|---|---|
| 113a | SiH$_4$ | 40 |
| | H$_2$ | 20 |
| 113b | SiH$_4$ | 45 |
| | GeH$_4$ | 50 |
| | SiF$_4$ | 2 |
| 113c | SiH$_4$ | 35 |
| | GeH$_4$ | 5 |

TABLE 43

| Parameters | Isolation vessel | |
|---|---|---|
| | 300-a | 300-b |
| Source gas for deposited film formation (sccm) | SiH$_4$ 32<br>H$_2$ 100<br>PH$_3$/H$_2$ 5<br>(1% H$_2$ diluted)<br>SiF$_4$ 3 | SiH$_4$ 26<br>H$_2$ 250<br>B$_2$H$_6$/H$_2$ 20<br>(3000 ppm H$_2$ diluted)<br>SiF$_4$ 3 |
| Pressure (mTorr) | 9 | 8 |
| Microwave power (kW) | 0.65 × 2 | 0.75 × 2 |
| Inner diameter of curved shape (cm) | φ 10*) | φ 9*) |
| Cap L (cm) | 1.0 | 1.0 |
| Size of microwave applicator (inner diameter × length) | φ 95 mm × 125 mm | φ 85 mm × 120 mm |
| Microwave transmission waveguide | EIAJ, RWI-26 | EIAJ, WRI-26 |
| Surface temperature of strip member | 290 | 270 |

*)A substrate cover for the fine adjustment of film thcikness inserted into curved shape.

TABLE 44

| Gas inlet conduit*) | Kind of gas | Flow rate (sccm) |
|---|---|---|
| 113a | SiH$_4$<br>H$_2$ | 50<br>20 |
| 113b | SiH$_4$<br>CH$_4$<br>SiF$_4$ | 60<br>3<br>1 |
| 113c | SiH$_4$<br>CH$_4$ | 70<br>10 |

*)At a position 3 cm away from a center of film formation chamber, θ$_3$ = θ$_5$ = 60°, θ$_4$ = 120°

TABLE 45

| Gas inlet conduit*) | Kind of gas | Flow rate (sccm) |
|---|---|---|
| 703a | SiH$_4$<br>H$_2$ | 100<br>50 |
| 703b | SiH$_4$<br>H$_2$<br>(diluted to 100 ppm by BF$_3$) | 120<br>15 |

*)Disposed in the same way as in the fabrication example 4.

TABLE 46

| Semiconductor layer | Under cell | | |
|---|---|---|---|
| Parameters | 300-a | 300 | 300-b |
| Source gas for deposited film formation (sccm) | SiH$_4$ 30<br>H$_2$ 100<br>PH$_3$/H$_2$ 5<br>(1% H$_2$ diluted)<br>SiF$_4$ 3 | **) | SiH$_4$ 25<br>H$_2$ 250<br>BF$_3$/H$_2$ 20<br>(3000 ppm H$_2$ diluted)<br>SiF$_4$ 3 |
| Pressure (mTorr) | 9 | 11 | 8 |
| Microwave power (kW) | 0.65 × 2 | 0.65 × 2 | 0.75 × 2 |
| Inner diameter of curved shape (cm) | φ *) | φ22 | φ9*) |
| Gap L (cm) | 1.0 | 3.5 | 1.2 |
| Size of microwave applicator (inner diameter × length) | φ95 mm × 125 mm | φ98 mm × 135 mm | φ85 mm × 120 mm |
| Microwave transmission waveguide | EIAJ, WRI-26 | EIAJ, ERI-32 | EIAJ, WRI-26 |
| Surface temperature of strip member (°C.) | 280 | 280 | 270 |
| Conveying speed | 54 cm/min | | |

| Semiconductor layer | Intermediate cell | | |
|---|---|---|---|
| Parameters | 300-a' | 300' | 300-b' |
| Source gas for deposited film formation (sccm) | SiH$_4$ 28<br>H$_2$ 95<br>PH$_3$/H$_2$ 5<br>(1% H$_2$ diluted)<br>SiF$_4$ 3 | **) | SiH$_4$ 22<br>H$_2$ 220<br>BF$_3$/H$_2$ 18<br>(3000 ppm H$_2$ diluted)<br>SiF$_4$ 2 |
| Pressure (mTorr) | 8 | 7 | 8 |
| Microwave power (kW) | 0.65 × 2 | 0.70 × 2 | 0.75 × 2 |
| Inner diameter of curved shape (cm) | 10*) | φ20 | φ9*) |
| Gap L (cm) | 1.0 | 3.5 | 1.0 |
| Size of microwave applicator (inner diameter × length) | Same as 300-a | Same as 300 | Same as 300-b |
| Microwave transmission waveguide | EIAJ, WRI-26 | EIAJ, ERI-32 | EIAJ, WRI-26 |
| Surface temperature of strip member (°C.) | 270 | 260 | 260 |
| Conveying speed | 54 cm/min | | |

TABLE 46-continued

| Semiconductor layer | Upper cell | | |
|---|---|---|---|
| Parameters | 300-a" | 300" | 300-b" |
| Source gas for deposited film formation (sccm) | SiH$_4$ 26<br>H$_2$ 90<br>PH$_3$/H$_2$ 4<br>(1% H$_2$ diluted)<br>SiF$_4$ 3 | **) | SiH$_4$ 20<br>H$_2$ 200<br>BF$_3$/H$_2$ 16<br>(3000 ppm H$_2$ diluted)<br>SiF$_4$ 2 |
| Pressure (mTorr) | 8 | 22 | 7 |
| Microwave power (kW) | 0.65 × 2 | 1.3 × 2 | 0.70 × 2 |
| Inner diameter of curved shape (cm) | φ10*) | φ18 | φ9*) |
| Gap L (cm) | 1.0 | 3.2 | 1.2 |
| Size of microwave applicator (inner diameter × length) | Same as 300-a | Same as 300 | Same as 300-b |
| Microwave transmission waveguide | EIAJ, WRI-26 | EIAJ, WRI-26 | EIAJ, WRI-26 |
| Surface temperature of strip member (°C.) | 250 | 250 | 240 |
| Conveying speed | | 54 cm/min | |

*) A substrate cover for the fine adjustment of film thickness inserted into curved shape.
**) See Table 18.

TABLE 47

| Semiconductor layer | Under cell | | Intermediate cell | | Upper cell | |
|---|---|---|---|---|---|---|
| Gas inlet conduit*) | Kind of gas | Flow rate (sccm) | Kind of gas | Flow rate (sccm) | Kind of gas | Flow rate (sccm) |
| 113a | SiH$_4$<br>H$_2$ | 44<br>25 | SiH$_4$<br>H$_2$ | 70<br>55 | SiH$_4$<br>H$_2$ | 48<br>20 |
| 113b | SiH$_4$<br>GeH$_4$<br>SiF$_4$ | 48<br>54<br>2 | SiH$_4$<br>H$_2$<br>(Diluted to 50 ppm by BF$_3$) | 80<br>4 | SiH$_4$<br>CH$_4$<br>SiF$_4$ | 58<br>2.5<br>1 |
| 113c | SiH$_4$<br>GeH$_4$ | 38<br>5.5 | SiH$_4$<br>H$_2$<br>(Diluted to 100 ppm by BF$_3$) | 90<br>12 | SiH$_4$<br>CH$_4$ | 65<br>8 |

TABLE 48

| Film formation conditions | | Set values |
|---|---|---|
| Microwave power | | 1400W |
| Pressure of film formation chamber | | 24 mTorr |
| Substrate temperature | | 250° C. |
| Gas flow rate | SiH$_4$ | 125 sccm |
| | H$_2$ | 90 sccm |

TABLE 48-continued

| Film formation conditions | Set values |
|---|---|
| Size of slot opening | 8 mm × 400 mm |
| Central conductor | 12 mmφ (silver plated) |

TABLE 49

| Sample No. | Inner diameter of film formation chamber | Evaluation |
|---|---|---|
| — | 180 mmφ | Discharge not excited |
| 2-1 | 120 mmφ | Unstable discharge |
| 2-2 | 80 mmφ | No problem |
| 2-3 | 60 mmφ | " |
| 2-4 | 40 mmφ | Antenna red heated and exfoliation on a part of film |

TABLE 50

| Strip member material | Stainless (bright annealing) |
|---|---|
| Size of strip member | 400 mm wide, 0.2 mm thick |
| Film formation chamber | 80 mmφ × 400 mm |
| Microwave power | 1400W |
| Gas flow rate | SiH$_4$: 120 sccm<br>H$_2$: 100 sccm |
| Substrate temperature | 250° C. (room temperature 25° C.) |
| Film formation time | 100 seconds |
| Coaxial line | 60 mmφ and 12 mmφ Silver plated |

TABLE 51

| Sample No. | Slot opening width [mm] | Internal pressure of film formation chamber [Torr] | Differential pressure $\Delta P$ [Torr] | Effective conductance Cel [l/sec] | Evaluation |
|---|---|---|---|---|---|
| 1-1 | 0.9 | $300 \times 10^{-3}$ | $299 \times 10^{-3}$ | 14 | Large film thickness distribution |
| 1-2 | 1.6 | $150 \times 10^{-3}$ | $149 \times 10^{-3}$ | 29 | Large film thickness distribution |
| 1-3 | 3 | $75 \times 10^{-3}$ | $74 \times 10^{-3}$ | 58 | No problem |
| 1-4 | 8 | $25 \times 10^{-3}$ | $24 \times 10^{-3}$ | 179 | " |
| 1-5 | 17 | $10 \times 10^{-3}$ | $9 \times 10^{-3}$ | 478 | Unstable discharge Plasma leakage |
| — | 24 | $8 \times 10^{-3}$ | $7 \times 10^{-3}$ | 615 | Discharge not excited |

TABLE 52

| Sample No. | Isolation vessel pressure outside film formation chamber | Effective exhaust speed | Evaluation |
|---|---|---|---|
| 3-1 | 20 mTorr | 861 (l/sec) | Abnormal discharge on periphery of substrate (continuous) |
| 3-2 | 10 mTorr | 287 (l/sec) | Intermittent abnormal discharge |
| 3-3 | 6 mTorr | 227 (l/sec) | No problem |
| 3-4 | 4 mTorr | 205 (l/sec) | " |

TABLE 53

| | |
|---|---|
| Inner diameter of curved shape (cm) | $\phi 80$ |
| Slot opening size (m) | $8 \times 400$ |
| Diameter and inserted length of central conductor (mm) | $\phi 15, 455$ |
| Material and size of dielectric | Quartz (thickness 3 mm) $\phi 24 \times 470$ |
| Desposition of gas inlet conduit | At a position 26 mm away from center of film formation chamber $\theta_1 = \theta_3 = 60°, \theta_2 = 120°$ |

TABLE 54

| Gas inlet conduit | Kind of gas | Flow rate (sccm) |
|---|---|---|
| 228a | $SiH_4$ | 15 |
| 228b | $SiH_4$ | 9 |
| | $GeH_4$ | 5 |
| 228c | $SiH_4$ | 5 |
| | $GeH_4$ | 7 |

TABLE 55

| Gas inlet conduit | Kind of gas | Flow rate (sccm) |
|---|---|---|
| 228a | $SiH_4$ | 20 |
| 228b | $SiH_4$ | 6 |
| | $GeH_4$ | 13 |
| 228c | $SiH_4$ | 18 |
| | $GeH_4$ | 1.5 |

TABLE 56

| Gas inlet conduit | Kind of gas | Flow rate (sccm) |
|---|---|---|
| 228a | $SiH_4$ | 20 |
| 228b | $SiH_4$ | 20 |
| | $CH_4$ | 2.5 |
| 228c | $SiH_4$ | 22 |
| | $CH_4$ | 3.5 |

TABLE 57

| Gas inlet conduit | Kind of gas | Flow rate (sccm) |
|---|---|---|
| 228a | $SiH_4$ | 50 |
| | $H_2$ | 20 |
| 228b | $SiH_4$ | 50 |
| | $H_2$ (Diluted 100 ppm by $BF_3$) | 20 |
| 228c | $SiH_4$ | 40 |
| | $H_2$ (Diluted 500 ppm by $BF_3$) | 12 |

TABLE 58

| Parameters | Isolation vessel 204 |
|---|---|
| Disposition of gas inlet conduit | At a position 3 cm away from center of film formation chamber $\theta_1 = 90°, \theta_2 = 120°, \theta_3 = 60°$ |
| Pressure (mTorr) | 36 |
| Microwave power (kW) | 1.8 |
| Inner diameter of curved shape (cm) | $\phi 10.5$ |
| Gap L (cm) | 0.8 |
| Surface temperature of strip member (°C.) | 270 |

TABLE 59

| Gas inlet conduit | Kind of gas | Flow rate (sccm) |
|---|---|---|
| 228a | $SiH_4$ | 50 |
| | $H_2$ | 30 |
| 228b | $SiH_4$ | 55 |

TABLE 59-continued

| Gas inlet conduit | Kind of gas | Flow rate (sccm) |
|---|---|---|
|  | GeH$_4$ | 60 |
|  | SiF$_4$ | 2 |
| 228c | SiH$_4$ | 45 |
|  | GeH$_4$ | 15 |

TABLE 60

| Parameters | Isolation vessel | | | |
|---|---|---|---|---|
|  | 203 | | 205 | |
| Source gas for deposited film formation (sccm) | SiH$_4$<br>H$_2$<br>PH$_3$/H$_2$<br>(1% H$_2$ diluted)<br>SiF$_4$ | 13<br>15<br>3.5<br><br>2.5 | SiH$_4$<br>H$_2$<br>B$_2$H$_6$/H$_2$<br>(3000 ppm H$_2$ diluted)<br>SiF$_4$ | 6<br>8<br>25<br><br>2 |
| Pressure (mTorr) | 17 | | 15 | |
| Microwave power (kW) | 0.4 | | 0.6 | |
| Inner diameter of curved shape (cm) | 4*) | | 4.5*) | |
| Gap L (cm) | 0.45 | | 0.3 | |
| Surface temperature of strip member (°C.) | 270 | | 250 | |

*)A substrate cover for the fine adjustment of film thickness inserted into curved shape.

TABLE 61

| Gas inlet conduit*) | Kind of gas | Flow rate (sccm) |
|---|---|---|
| 228a | SiH$_4$ | 30 |
|  | H$_2$ | 60 |
| 228b | SiH$_4$ | 40 |
|  | CH$_4$ | 2 |
|  | SiF$_4$ | 1 |
| 228c | SiH$_4$ | 50 |
|  | CH$_4$ | 7 |

*)At a position 3 cm away from a center of film formation chamber, θ$_1$ = θ$_3$ = 60°, θ$_2$ = 120°

TABLE 62

| Gas inlet conduit*) | Kind of gas | Flow rate (sccm) |
|---|---|---|
| 228a | SiH$_4$ | 80 |
|  | H$_2$ | 40 |
| 228b | SiH$_4$ | 80 |
|  | H$_2$<br>(diluted to 100 ppm by BF$_3$) | 35 |
| 228c | SiH$_4$ | 70 |
|  | H$_2$<br>(diluted to 500 ppm by BF$_3$) | 20 |

*)Disposed in the same way as in fabrication example 4.

TABLE 63

| Semi-conductor layer | Under cell | | |
|---|---|---|---|
| Parameters | 203 | 204 | 205 |
| Source gas for deposited film formation (sccm) | SiH$_4$ 15<br>H$_2$ 15<br>PH$_3$/H$_2$ 1.4<br>(1%H$_2$ diluted)<br>SiF$_4$ 0.2 | **) | SiH$_4$ 7<br>H$_2$ 10<br>BF$_3$/H$_2$ 1<br>(3000 ppm H$_2$ diluted)<br>SiF$_4$ |
| Pressure (mTorr) | 12 | 36 | 14 |
| Microwave power (kW) | 0.35 | 1.65 | 0.7 |
| Inner diameter of curved shape (cm) | φ6*) | φ12 | φ7.5*) |
| Gap L (cm) | 0.5 | 0.9 | 0.55 |
| Surface temperature of strip member (°C.) | 270 | 270 | 260 |
| Conveying speed | 52 cm/min | | |

| Semi-conductor layer | Intermediate cell | | |
|---|---|---|---|
| Parameters | 203' | 204' | 205' |
| Source gas for deposited film formation (sccm) | SiH$_4$ 14<br>H$_2$ 14<br>PH$_3$/H$_2$ 1.5<br>(1%H$_2$ diluted)<br>SiF$_4$ 0.2 | **) | SiH$_4$ 6<br>H$_2$ 9<br>BF$_3$/H$_2$ 1<br>(3000 ppm H$_2$ diluted)<br>SiF$_4$ 0.2 |
| Pressure (mTorr) | 15 | 45 | 15 |
| Microwave power (kW) | 0.35 | 2.4 | 0.9 |
| Inner diameter of curved shape (cm) | φ6*) | φ10.5 | φ5.5*) |
| Gap L (cm) | 0.5 | 0.8 | 0.45 |
| Surface temperature of strip member (°C.) | 260 | 250 | 250 |
| Conveying speed | 52 cm/min | | |

| Semi-conductor layer | Upper cell | | |
|---|---|---|---|
| Parameters | 203" | 204" | 205" |
| Source gas for deposited film formation (sccm) | SiH$_4$ 13<br>H$_2$ 13<br>PH$_3$/H$_2$ 1.5<br>(1%H$_2$ diluted)<br>SiF$_4$ 0.2 | **) | SiH$_4$ 5<br>H$_2$ 10<br>BF$_3$/H$_2$ 1<br>(3000 ppm H$_2$ diluted)<br>SiF$_4$ 0.2 |
| Pressure (mTorr) | 13 | 32 | 18 |
| Microwave power (kW) | 0.35 | 1.7 | 1.1 |
| Inner diameter of curved shape (cm) | φ6*) | φ10 | φ4.5*) |
| Gap L (cm) | 0.5 | 0.8 | 0.4 |
| Surface temperature of strip member (°C.) | 240 | 240 | 230 |
| Conveying speed | 52 cm/min | | |

*)A substrate cover for the fine adjustment of film thickness inserted-into curved shape.
**)See table 17.

TABLE 64

| Semiconductor layer | Under cell | | Intermediate cell | | Upper cell | |
|---|---|---|---|---|---|---|
| Gas inlet conduit | Kind of Gas | Flow rate (sccm) | Kind of Gas | Flow rate (sccm) | Kind of Gas | Flow rate (sccm) |
| 228a | $SiH_4$ | 50 | $SiH_4$ | 70 | $SiH_4$ | 40 |
|  | $H_2$ | 20 | $H_2$ | 50 | $H_2$ | 15 |
| 228b | $SiH_4$ | 50 | $SiH_4$ | 80 | $SiH_4$ | 45 |
|  | $GeH_4$ | 52 | $H_2$ | 5 | $CH_4$ | 2 |
|  | $SiF_4$ | 2 | (Diluted to 50 ppm by $BF_3$) |  | $SiF_4$ | 1 |
| 228c | $SiH_4$ | 40 | $SiH_4$ | 80 | $SiH_4$ | 45 |
|  | $GeH_4$ | 6 | $H_2$ (Diluted to 100 ppm by $BF_3$) | 10 | $CH_4$ | 6.5 |

I claim:

1. A method for forming a functional deposited film by continuously moving a strip member in a longitudinal direction, by a microwave plasma CVD process and forming a film formation space at one side of said strip member, said method comprising the steps of:

independently introducing each of at least two kinds of deposited film formation raw material gases, having different compositions through separate gas supply means into said film formation space;

introducing a microwave into said film formation space through an opening portion having a regulated opening area so as to introduce the microwave substantially uniformly into said film formation space at a side of said film formation space opposed to said strip member so that the microwave energy is irradiated in a direction parallel to a travelling direction of the microwave and generating a plasma in said film formation space.

2. The method of continuously forming a functional deposited film of large area according to claim 1, wherein said moving strip member is continuously moving while forming midway a columnar film formation space with said moving strip member as a side wall, wherein said moving strip is bent midway, using bend leading edge forming means and bend trailing edge forming means, with a gap left in the longitudinal direction of said strip member between said bend leading edge forming means and said bend trailing edge forming means, so as to form the side wall of said film formation space.

3. The method of continuously forming a functional deposited film of large area according to claim 1, wherein said microwave energy is radiated into said film formation space via at least one of said microwave applicator means disposed on one side or both sides of two end faces of said film formation space wherein said strip member is continuously moving in a longitudinal direction while being bent midway to form a columnar film formation space with said moving strip member as a side wall.

4. The method of continuously forming a functional deposited film of large area according to claim 3, wherein said microwave energy is radiated in a parallel direction to said side wall, with said microwave applicator means disposed in a perpendicular direction to said end face.

5. The method of continuously forming a functional deposited film of large area according to claim 1, wherein said microwave energy is radiated via a microwave transparent member provided on a top end portion of said microwave applicator means.

6. The method of continuously forming a functional deposited film of large area according to claim 5, wherein said microwave transparent member is air tight between said microwave applicator means and said film formation space.

7. The method of continuously forming a functional deposited film of large area according to claim 3, wherein when said microwave applicator means are disposed opposed to each other on said both end faces, the microwave energy radiated from one microwave applicator means is not allowed to be received by the other microwave applicator means.

8. The method of continuously forming a functional deposited film of large area according to claim 1, wherein the microwave energy radiated into said film formation space is not allowed to leak out of said film formation space.

9. The method of continuously forming a functional deposited film of large area according to claim 1, wherein each of said gas supply means is arranged in a direction substantially perpendicular to a moving direction of said strip member and said film forming raw material gas is emitted towards said strip member.

10. The method of continuously forming a functional deposited film of large area according to claim 2, wherein said source gases for the formation of deposited film introduced into said film formation space are exhausted through a gap left in the longitudinal direction of said strip member between said bend leading edge forming means and said bend trailing edge forming means.

11. The method of continuously forming a functional deposited film of large area according to claim 1, wherein at least one face of said strip member is made to be electro-conductive.

* * * * *

UNITED STATES PATENT AND TRADEMARK OFFICE
CERTIFICATE OF CORRECTION

PATENT NO. : 5,629,054

DATED : May 13, 1997

INVENTOR(S): MASAHIRO KANAI

Page 1 of 5

It is certified that error appears in the above-identified patent and that said Letters Patent is hereby corrected as shown below:

<u>ON THE COVER PAGE, IN THE TITLE OF THE INVENTION</u>
  "DEPOSIT" should read --DEPOSITED--.

<u>COLUMN 1</u>
  Line 2, "DEPOSIT" should read --DEPOSITED--.

<u>COLUMN 3</u>
  Line 2, "Roll to Roll" should read --roll to roll--.

<u>COLUMN 5</u>
  Line 23, "formatin" should read --formation--.

<u>COLUMN 6</u>
  Line 56, "Composition" should read --composition--.

<u>COLUMN 8</u>
  Line 17, "are are" should read --are--.

<u>COLUMN 14</u>
  Line 64, "square" should read --square or rectangular--.

<u>COLUMN 21</u>
  Line 2, "take" should read --the--.

UNITED STATES PATENT AND TRADEMARK OFFICE
CERTIFICATE OF CORRECTION

PATENT NO. : 5,629,054

DATED : May 13,1997

INVENTOR(S): MASAHIRO KANAI

It is certified that error appears in the above-identified patent and that said Letters Patent is hereby corrected as shown below:

COLUMN 23
  Line 5, "can used" should read --can be used--;
  Line 41, "purpose-" should read --purpose.--;
  Line 67, "mroe" should read --more--.

COLUMN 24
  Line 50, "Ga(OC$_2$H$_5$)(C$_2$H$_5$)" should read --Ga(OC$_2$H$_5$)(C$_2$H$_2$)$_2$--.

COLUMN 25
  Line 42, "rate" should read --rare--;
  Line 45, "rate" should read --rare--.

COLUMN 35
  Line 14, "separating" should read --separating the--.

COLUMN 39
  Line 28, "retain merit" should read --retainment--.

COLUMN 40
  Line 6, "disposed" should read --disposed--.

COLUMN 42
  Line 5, "ps Apparatus" should read --¶ Apparatus--.

COLUMN 45
  Line 26, "apperatus" should read --apparatus--.

UNITED STATES PATENT AND TRADEMARK OFFICE
CERTIFICATE OF CORRECTION

PATENT NO. : 5,629,054

DATED : May 13, 1997

INVENTOR(S): MASAHIRO KANAI

Page 3 of 5

It is certified that error appears in the above-identified patent and that said Letters Patent is hereby corrected as shown below:

COLUMN 48
  Line 60, "$\Theta_2$" should read --$\theta_2$--.

COLUMN 49
  Line 10, "constaining" should read --containing--.

COLUMN 50
  Line 58, "shown." should read --shown--.

COLUMN 58
  Line 25, "not in" should read --not be in--;
  Line 52, "not in" should read --not be in--.

COLUMN 59
  Line 18, "supply." should read --supply.  In--.

COLUMN 68
  Line 32, "ef" should read --of--.

COLUMN 69
  Line 45, "propatating" should read "propagating".

COLUMN 72
  Line 10, "AG," should read --Ag,--.

COLUMN 73
  Line 36, "stabely" should read --stably--.

UNITED STATES PATENT AND TRADEMARK OFFICE
CERTIFICATE OF CORRECTION

PATENT NO. : 5,629,054

DATED : May 13, 1997

INVENTOR(S): MASAHIRO KANAI

Page 4 of 5

It is certified that error appears in the above-identified patent and that said Letters Patent is hereby corrected as shown below:

COLUMN 76
  Line 51, "Ac" should read --AC--.

COLUMN 80
  Line 41, "1x10$^{-6}$" should read --1x10$^{-6}$ Torr,--.

COLUMN 82
  Line 62, "temperataure" should read --temperature--.

COLUMN 83
  Line 41, "tca" should read --to a--.

COLUMN 84
  Line 42, "formation of" should read --formation of--.

COLUMN 86
  Line 17, "photoboltaic" should read --photovoltaic--.

COLUMN 89
  Line 49, "nots" should read --not--.

COLUMN 91
  Line 6, "anal" should read --and--.

UNITED STATES PATENT AND TRADEMARK OFFICE
CERTIFICATE OF CORRECTION

PATENT NO. : 5,629,054

DATED : May 13, 1997

INVENTOR(S): MASAHIRO KANAI

It is certified that error appears in the above-identified patent and that said Letters Patent is hereby corrected as shown below:

<u>COLUMN 123</u>
  Line 27, "method, said" should be deleted.

Signed and Sealed this

Sixteenth Day of December, 1997

*Attest:*

BRUCE LEHMAN

*Attesting Officer*  *Commissioner of Patents and Trademarks*